United States Patent [19]
Honmei et al.

[11] Patent Number: 6,037,850
[45] Date of Patent: Mar. 14, 2000

[54] SUPERCONDUCTING MAGNET APPARATUS AND METHOD OF REGULATING MAGNETIZATION THEREOF

[75] Inventors: Takao Honmei; Hirotaka Takeshima; Hajime Kawano; Yutaka Takuma; Munenori Kotabe, all of Tokyo; Naoki Maki, Tokai-mura; Nobuhiro Hara; Shigeru Kakugawa, both of Hitachi; Noriaki Hino, Mito, all of Japan

[73] Assignee: Hitachi Medical Corporation, Tokyo, Japan

[21] Appl. No.: 08/952,722

[22] PCT Filed: Mar. 21, 1997

[86] PCT No.: PCT/JP97/00951

§ 371 Date: Jan. 16, 1998

§ 102(e) Date: Jan. 16, 1998

[87] PCT Pub. No.: WO97/35328

PCT Pub. Date: Sep. 25, 1997

[30] Foreign Application Priority Data

Mar. 21, 1996 [JP] Japan ..................... 8-092043

[51] Int. Cl.$^7$ ........................................... H01F 1/00
[52] U.S. Cl. ........................................... 335/216; 324/320
[58] Field of Search ............................. 335/216; 62/51.1, 62/656, 51.2; 324/320

[56] References Cited

U.S. PATENT DOCUMENTS

| | | | |
|---|---|---|---|
| 4,077,231 | 3/1978 | Fletcher et al. | 62/514 R |
| 4,848,093 | 7/1989 | Simmonds et al. | 62/49.1 |
| 5,060,481 | 10/1991 | Bartlett et al. | 62/51.2 |
| 5,130,686 | 7/1992 | Leupold | 335/216 |
| 5,140,266 | 8/1992 | Dorri et al. | 324/228 |
| 5,552,709 | 9/1996 | Anderson | 324/321 |
| 5,633,588 | 5/1997 | Hommei et al. | 324/320 |
| 5,647,228 | 7/1997 | Sager et al. | 62/656 |

FOREIGN PATENT DOCUMENTS

| | | |
|---|---|---|
| 62-62570 | 3/1987 | Japan . |
| 63-263706 | 10/1988 | Japan . |
| 1-149405 | 6/1989 | Japan . |
| 4-49948 | 2/1992 | Japan . |

*Primary Examiner*—Lincoln Donovan
*Assistant Examiner*—Tuyen T. Nguyen
*Attorney, Agent, or Firm*—Antonelli, Terry, Stout & Kraus, LLP

[57] ABSTRACT

A small-sized high-precision superconducting magnet apparatus which can prevent an occurrence of the principal factor in generating a quench and can restrain the magnetic flux from varying with time, and a method of regulating the magnetization of such a superconducting magnet apparatus, by which the superconducting magnet apparatus can be uniformly magnetized. Superconducting magnet apparatus of the present invention has: a cooling container; a holding medium for holding a persistent current therein, which is placed in said cooling container and is operative to generate a magnetic flux in a uniform magnetic field region (FOV); static-magnetic-field generating means composed of a plurality of cylinders using superconducting composite plate materials; a cylinder supporting base for holding the plurality of cylinders; and temperature regulating devices (not shown in FIG. 67) embedded in the cylinders, respectively. Magnetization of the static-magnetic-field generating means is performed by induction-magnetizing. Further, the regulation of a magnetization value of the static-magnetic-field generating means is regulated by controlling the temperature of the cylinders by means of the temperature regulating devices.

76 Claims, 58 Drawing Sheets

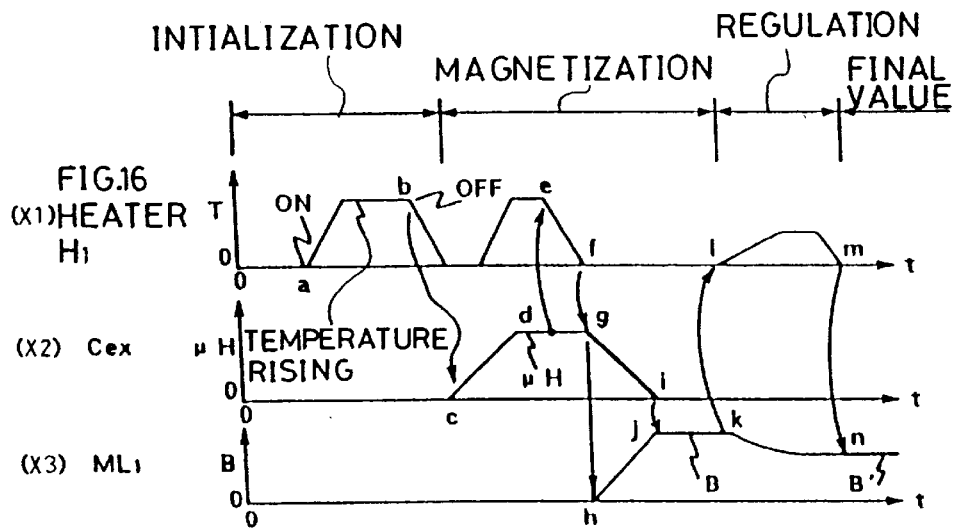
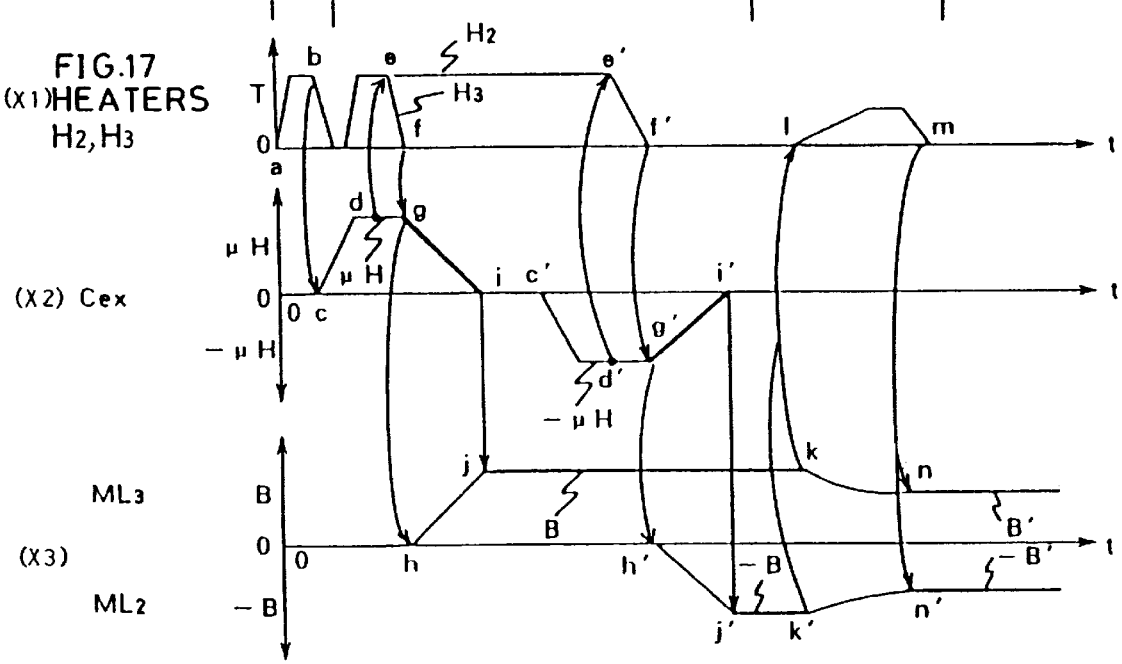

(A)  (B)

FIG.32
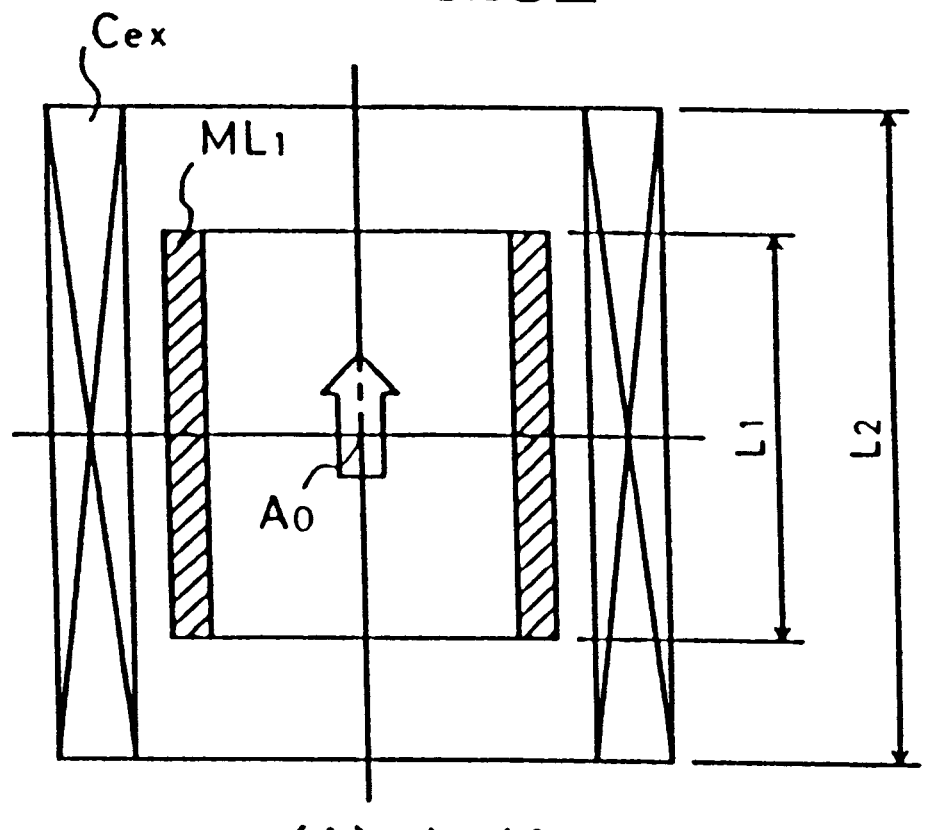
(A) $L_1 < L_2$
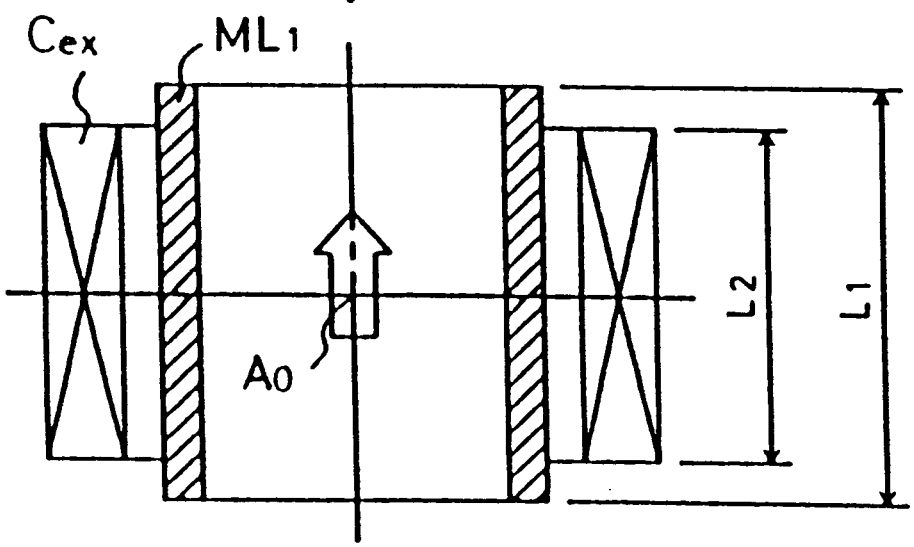
(B) $L_1 > L_2$

FIG.48
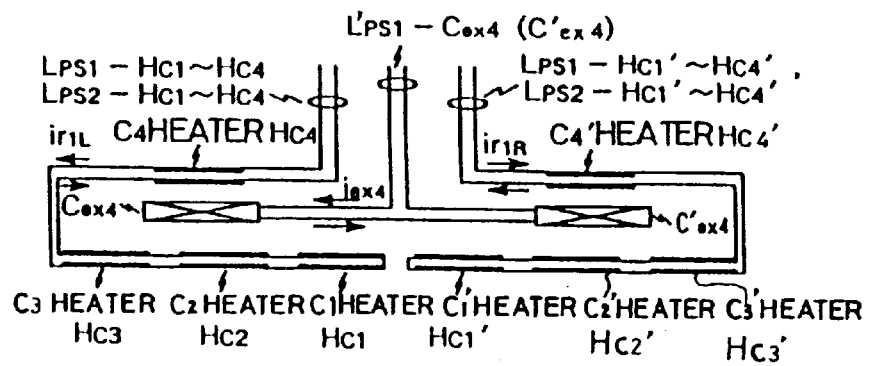
(A)
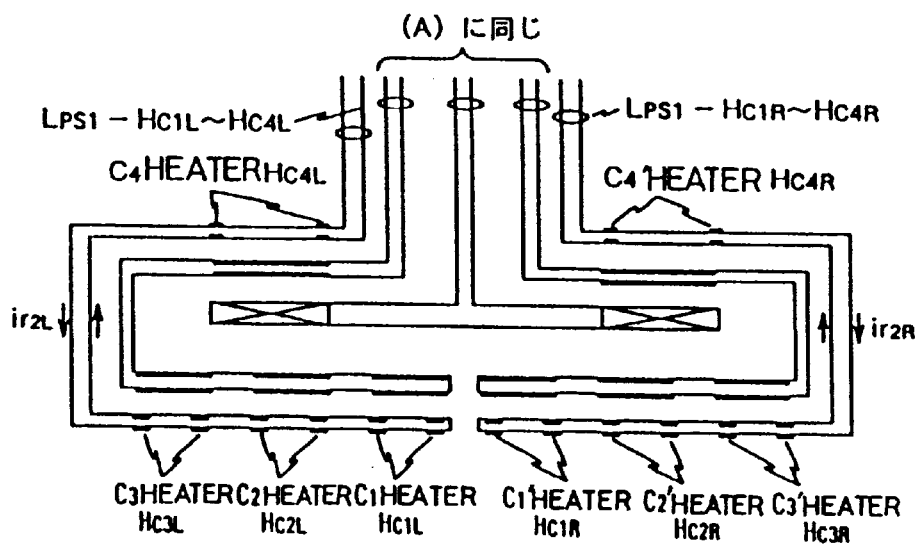
(B)
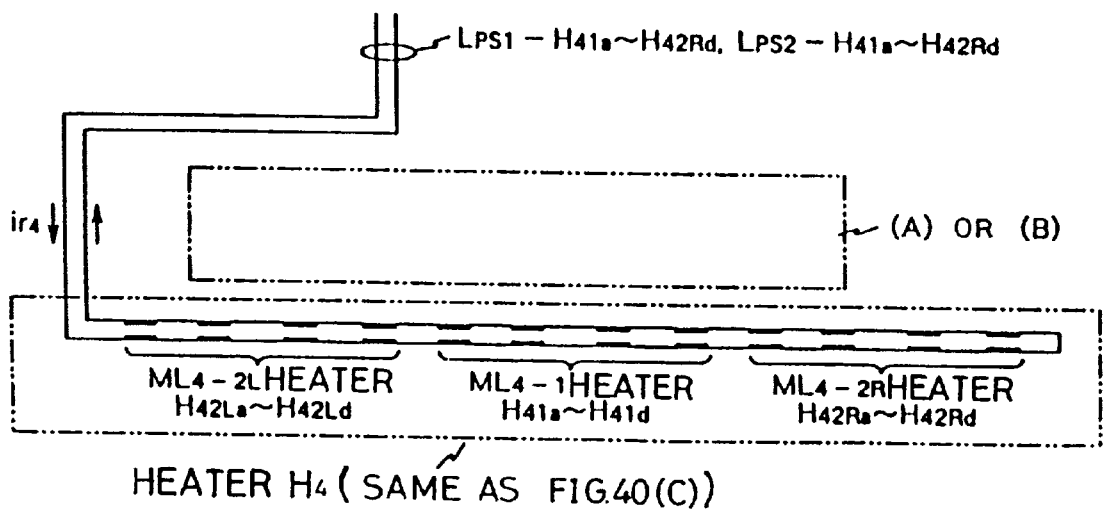
(C)

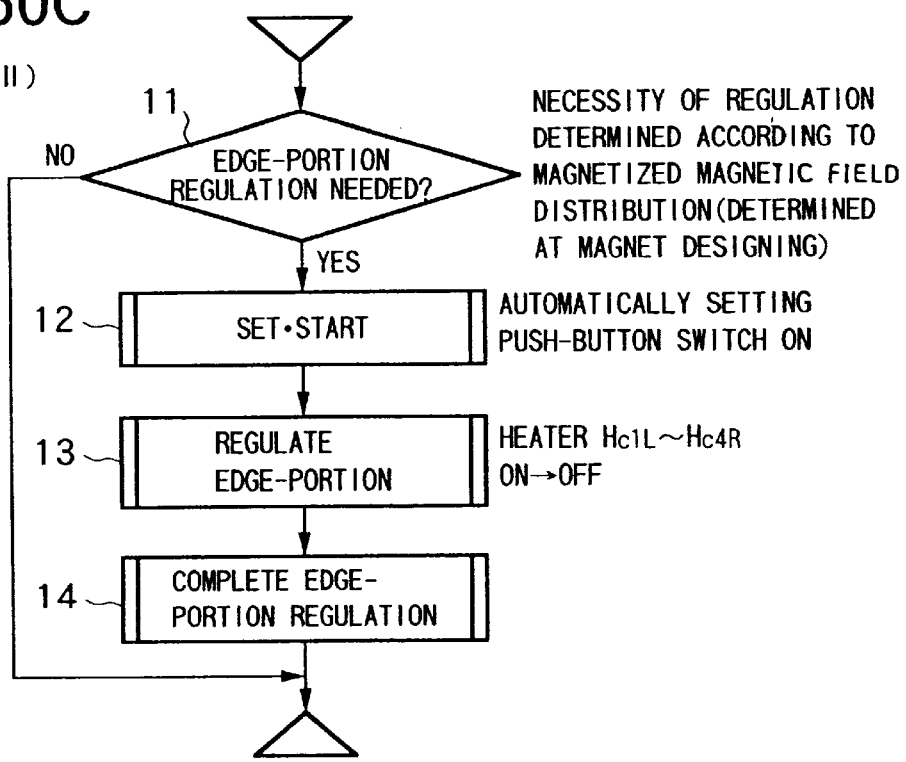
FIG.50C (PROCESS II)
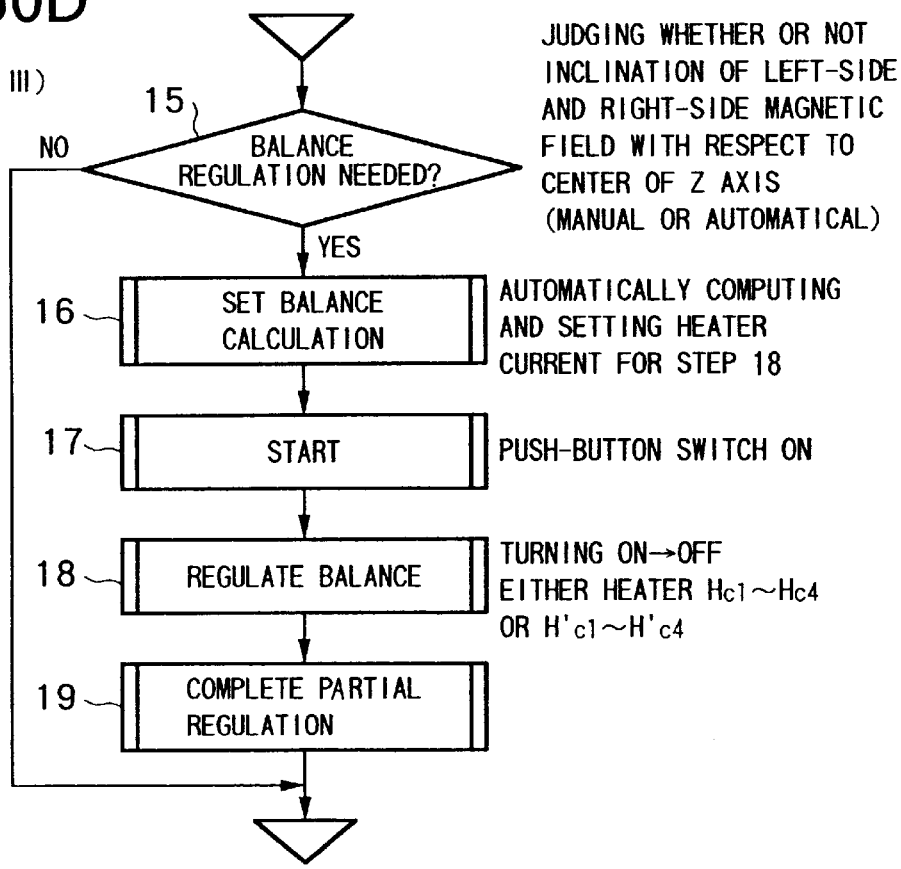
FIG.50D (PROCESS III)

FIG. 67
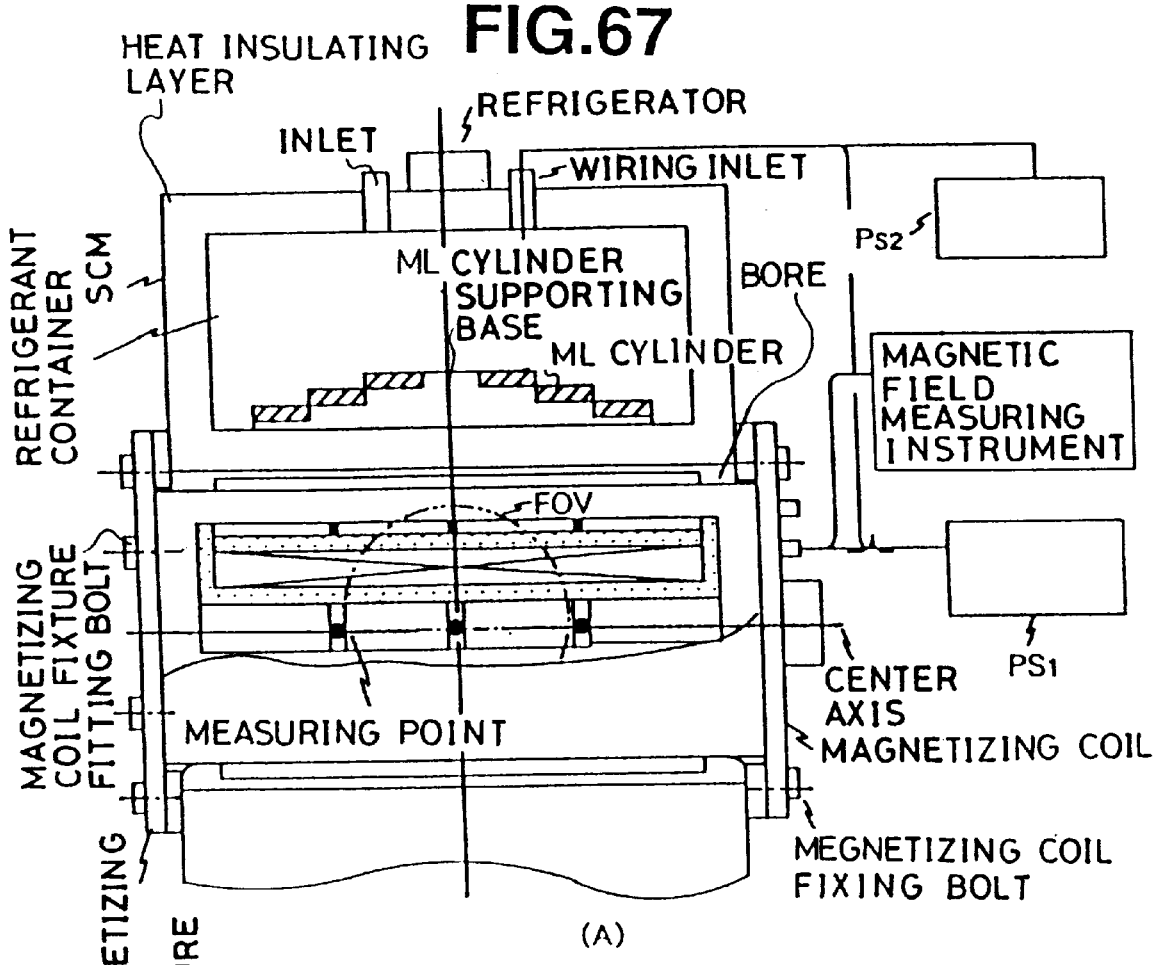
(A)
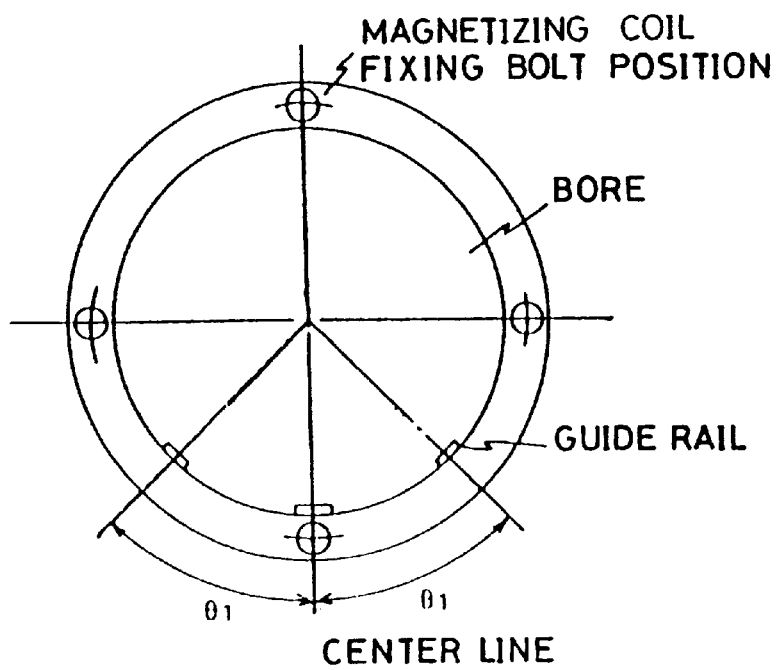
(B)

SUPERCONDUCTING MAGNET APPARATUS AND METHOD OF REGULATING MAGNETIZATION THEREOF

TECHNICAL FIELD

The present invention relates to a superconducting magnet apparatus used in various technical fields utilizing static magnetic fields and, more particularly, to a superconducting magnet apparatus that utilizes a superconducting composite element as a source for generating a static magnetic field, and to a method of regulating the magnetization thereof.

BACKGROUND ART

As is well known, superconducting magnet apparatuses are used in various fields. Generally known superconducting magnet apparatus is adapted so that superconducting wires are wound like a coil and is then dipped into liquid helium, which is contained in a refrigerant container and serves as a refrigerant for cooling superconducting materials, to thereby generate a magnetic flux, namely, a magnetic field in a previously set space, as disclosed in Japanese Unexamined Patent Publication No. 4-49948.

FIG. 68 illustrates an example of such a superconducting magnet apparatus. In a refrigerant container 11, a static-magnetic-field generating source 13 consisting of superconducting wire wound around a support 14 like coils is placed. Wire made of Nb3Sn or NbTi is used as the superconducting wire. Magnetic field generated by the aforesaid static-magnetic-field generating source 13 is formed in a static-magnetic-field space 18 along the central axis 19 thereof. Incidentally, the static-magnetic-field generating source 13 composed of a plurality of coils. Further, the magnetic filed formed in the static-magnetic-field-space 18 can be regulated by changing the number of turns of each of the coils. Moreover, a refrigerant, such as liquid helium, 12 for cooling superconducting materials is output from a refrigerant source 17 and is injected from a refrigerant injecting port 15 through cock 16 into the refrigerant container 11. Further, a magnetizing electric current to be supplied to the coils of the aforesaid static-magnetic-field generating source 13 is introduced thereto through a connector portion 21 and a persistent current circuit switch circuit 24 from an exciting power supply 20. The aforementioned persistent current circuit switch 24 is used when operating the static-magnetic-field generating source 13 in a persistent current mode. FIG. 69 shows an example of the persistent current circuit switch 24. Namely, the persistent current switch 24 is contained in the refrigerant container 11 together with the static-magnetic-field generating source 13 and is cooled by using the refrigerant 12 for cooling superconducting materials. Further, the aforesaid persistent current circuit switch 24 is obtained by winding a superconducting wire 28 together with a heater wire 29 like coils and by heat-insulating the wires by epoxy resin or the like. Superconducting wire made by using CuNi alloy as a base metal material is used as this superconducting wire 28. Further, a manganin heater wire is usually used as the heater wire 29. Static-magnetic-field generating source 13 is connected with the superconducting wire 28 and the exciting power supply 20 at persistent current joints P and Q, respectively. The switch 26 is provided at the side of the exciting power supply 20. The heater wire 29 is connected with a heater power supply 22 through a connector portion 23 (see FIG. 68), and a switch 27 is provided at the side of the heater power supply 22. When the heater wire 29 is heated, the temperature of the superconducting wire 28 becomes equal to or higher than a critical temperature Tc and thus the persistent current circuit switch 24 is brought into OFF-state. In contrast, when the heater wire 29 is not heated, the superconducting wire 28 is in a superconducting state, and thus the persistent current circuit switch 24 is put into ON-state.

To operate the static-magnetic-field generating source 13 in the persistent current mode, the following steps are performed.

(1) The static-magnetic-field generating source 13 and the persistent current circuit switch 24 are cooled by using the refrigerant 12 for cooling superconducting materials, and are put into the superconducting state.

(2) The switch 27 provided at the side of the heater power supply 22 is then turned on, so that the persistent current circuit switch 24 is put into OFF-state. Moreover, the switch 26 provided at the side of the exciting power supply 20 is turned on, so that the static-magnetic-field generating source 13 is excited by means of the exciting power supply 20 by applying electric current, so as to reach a rated current.

(3) Subsequently, the switch 27 provided at the side of the heater power supply 22 is turned off to thereby stop heating the heater wire. Thus, the superconducting wire 28 of the persistent current circuit switch 24 is brought into a conducting state (namely, ON-state). Moreover, the current flowing from the exciting power supply is decreased to 0. At that time, the electric current flowing through the superconducting wire 28 of the persistent current circuit switch 24 is raised to the rated current value of the static-magnetic-field generating source 13. In this state, the exciting power supply 20 can be detached from the apparatus.

However, the conventional superconducting magnet apparatus has the following problems, owing to the facts that the superconducting coil is used in the static-magnetic-field generating source 13 and that the persistent current circuit switch 24 is used to operate the apparatus in the persistent current mode.

(1) Magnetic flux decreases with time, owing to the resistance of the connecting portion of the superconducting coil.

(2) Principal factor in generating a quench are caused due to the contact potential difference occurring in the joint portion between CuNi alloy of the persistent current circuit switch 24 and Cu of the superconducting wire 28.

(3) Energizing current is reduced owing to disarray in the magnitude and direction of a magnetic field occurring in the connecting portion of the superconducting coil.

(4) Partial mechanical change in the coil due to wrong conditions of fixation of the coil results in local generation of heat. Further, the local generation of heat is promoted by a change in the state of a portion, in which heat is locally generated, of the coil from the normal conducting state to the superconducting state thereof. Thus, a principal factor in generating a quench is caused.

(5) Large part of principal steps of an operation of manufacturing a superconducting coil and a coil connecting operation and a coil holding operation have no choice but to be manually performed. Thus, it is difficult to obtain uniform manufacturing accuracy. Moreover, skilled workers are necessary for manufacturing superconducting magnet apparatuses with sufficiently high precision.

Thus, the present invention is accomplished to deal with such problems of the conventional apparatus. Accordingly, the present invention aims at providing a small-sized high-precision superconducting magnet apparatus which can prevent an occurrence of the principal factor in generating a quench and can restrain the magnetic flux from varying with time, and at providing a method of regulating the magnetization of such a superconducting magnet apparatus, by which the superconducting magnet apparatus can be uniformly magnetized.

DISCLOSURE OF INVENTION

To achieve the foregoing object of the present invention, in accordance with the present invention, there is provided a superconducting magnet apparatus that comprises: a cooling container being capable of cooling contents thereof so that the contents are brought into a superconducting state; static-magnetic-field generating device that is placed in the aforesaid cooling container and includes a superconducting composite serving as a holding medium for holding an electric current therein, which generates a magnetic flux in a previously set magnetic field region (hereunder referred to as a uniform magnetic field region) along the central axis thereof; and holding device for holding the aforesaid static-magnetic-field generating device in the aforesaid cooling container, wherein the aforesaid superconducting composite has a temperature regulating device, wherein the magnetization of the aforesaid static-magnetic-field generating device is performed by induction-magnetizing, and wherein the regulation of a magnetization value of the aforesaid static-magnetic-field generating device is enabled by controlling the temperature of the aforesaid superconducting composite by means of the aforesaid temperature regulating device.

In accordance with the present invention, the static-magnetic-field generating device is constituted by a superconducting composite. Further, the magnetization thereof is enabled by the induction-magnetizing which is an indirect magnetization method. Thus, the magnetization thereof is achieved without letting exciting current directly flow therethrough. Therefore, a superconducting coil formed by winding a superconducting wire like a coil is unnecessary, differently from the conventional apparatus. As a result, the problems such as the thermal resistance incident to the wiring between the magnetization power supply and the superconducting coil, the occurrence of a quench associated with the use of a persistent current circuit switch and difficulties related to the operation of winding a superconducting wire like a coil are solved. Thus, a superconducting magnet apparatus, which can restrain the magnetic flux from varying with time and can eliminate a primary cause of an occurrence of a quench, is obtained.

Further, the temperature regulating device is added to the superconducting composite which constitutes the static-magnetic-field generating device. Thus, after the superconducting composite is magnetized to thereby permit a persistent current to flow therethrough, the temperature of the superconducting composite is controlled by the temperature regulating device. Consequently, a persistent current can be regulated after the magnetization. This facilitates the regulation of a magnetization value of the superconducting magnet apparatus after the magnetization thereof. As a result, even in the case of employing the induction magnetizing, after the magnetization, the magnetization value can be freely controlled and adjusted to a desired value.

In the case of a superconducting magnet apparatus of the present invention, the aforesaid superconducting composite is a cylinder obtained by the working of a superconducting composite plate material into a cylinder. Static-magnetic-field generating device is constructed so that a plurality of cylinders (hereunder, these cylinders will be referred to as a first group of cylinders) are placed by making the central axes thereof coincide with one another in the longitudinal direction of each cylinder, and that a uniform magnetic field region is formed in the vicinity of a point of intersection of the central axis of this first group of cylinders and the central line perpendicular to the longitudinal direction of each cylinder. Desired strength of a static magnetic field and a desired direction of a magnetic flux are obtained in the uniform magnetic field region by magnetizing the first group of cylinders.

Superconducting magnet apparatus of this configuration is of the horizontal magnetic field type and is obtained by arranging the group of cylinders, which are made by using the superconducting composite plate materials, in the longitudinal direction thereof so that the center axes thereof coincide with one another. The uniform magnetic field region is formed nearly in the central portion of the group of cylinders.

Further, in the case of a superconducting magnet apparatus of the present invention, another group of plural cylinders of a larger diameter or a group of ring-like disks of a larger diameter, each of which has a central bore, (hereunder referred to as a second group of cylinders) are arranged around the periphery of the first group of cylinders by making the central axis of the second group of cylinders coincide with the central axis of the first group of cylinders. Moreover, a temperature regulating device is added to the second group of cylinder. Induction-magnetizing of the second group of cylinders is performed in such a manner as to generate a magnetic flux having a direction, by which a magnetic flux generated by the first group of cylinders are canceled, thereby reducing a leakage flux.

This configuration of the apparatus is obtained by adding the second group of cylinders to the superconducting magnet apparatus so as to reduce leakage fluxes.

Furthermore, in the case of a superconducting magnet apparatus of the present invention, the length of each of the cylinders of the first group is reduced without deteriorating the magnetic homogeneity of the uniform magnetic field region by performing the induction-magnetizing of one or more of the cylinders of the first group in such a manner that an electric current flowing through the aforesaid one or more thereof in a direction opposite to a direction in which an electric current flowing through each of the other cylinders of the first group.

In the case that only a combination of cylinders, through which persistent currents of same polarity flow, are used to form a uniform magnetic field region of the same magnetic homogeneity, the length of the static-magnetic-field generating device is long. However, the length of the static-magnetic-field generating device can be decreased by incorporating a cylinder, through which a persistent current of reverse polarity flows, into the combination of cylinders.

Further, in the case of a superconducting magnet apparatus of the present invention, one or more cylinders (hereunder referred to as a third group of cylinders), each of which has a length longer than the length of the placed cylinders of the first group but has an outside diameter shorter than the inside diameters of the cylinders of the first group and is further provided with a temperature regulating device, are placed inside the inner circumferences of the cylinders of the first group, wherein the third group of cylinders are released from the superconducting state thereof by being heated from the initiation of the magnetization to the completion of the regulation of the magnetizatio value by means of the aforesaid temperature regulation device, and wherein the third group of cylinders are cooled and returned to the superconducting state by stopping the heating thereof upon completion of the regulation of the magnetization.

In the case of the apparatus of this configuration, the third group of cylinders are placed inside the inner circumferences of the first group of cylinders which are principal composing elements of the static- magnetic-field generating device. Further, upon completion of the magnetization of the first group of cylinders, the third group of cylinders allowing most of the aforesaid magnetic fluxes, which are caused by the first group of cylinders and compose the uniform magnetic field region, to penetrate therethrough, are put into a superconducting state by means of the first group of cylinders. Thus, most of the aforesaid magnetic fluxes are captured by the third group of cylinders. Consequently, a change in magnetic flux in the first group of cylinders is compensated by the third group of cylinders. Consequently, the attenuation of the strength of the magnetic field in the uniform magnetic field region with elapse of time, and a change in the distribution of the magnetic field with lapse of time, which is caused by this attenuation, can be compensated.

Moreover, in the case of a superconducting magnet apparatus of the present invention, temperature regulating devices are added to and a group of disks having central bores are placed at both edge portions of the third group of cylinders, respectively, thereby increasing the rate of magnetic fluxes captured by the first group of cylinders for forming the uniform-magnetic-field region. Consequently, the attenuation of the strength of the magnetic field in the uniform magnetic field region with elapse of time, and a change in the distribution of the magnetic field with lapse of time, which is caused by this attenuation, can be compensated with higher precision.

In the case of a superconducting magnet system of the present invention, a pair of the superconducting magnet apparatuses recited in claim 1 are placed in such a manner as to make the central axes thereof coincide with each other and to face each other. Further, a uniform magnetic field region is provided in the vicinity of the midpoint between both of the pair of the superconducting magnet apparatuses facing each other. Superconducting composites are cylinders, each of which is obtained by the working of a superconducting composite plate material into a cylinder having suitable diameter and length measurements. The static-magnetic-field generating devices are constructed by three-dimensionally placing the aforesaid plurality of cylinders (hereunder referred to as a fourth group of cylinders) in such a way as to make the central axes thereof coincide with one another. Desired strength of a static magnetic field and direction of a magnetic flux are obtained in the uniform magnetic field region.

Superconducting magnet apparatus of this configuration is of the vertical magnetic field type and of the opposed type. Symmetrical static-magnetic-field generating devices are placed in such a manner as to face each other across the uniform magnetic field region. Further, each of the static-magnetic-field generating devices is constituted by a group of cylinders, similarly as in the case of the apparatus of the horizontal magnetic field type. However, two kinds of cylinders, which are different in the outside diameter and overlap in the longitudinal direction thereof, may be employed by selecting appropriate length measurement. Thus, the outside diameter and length measurements of the superconducting magnet apparatus can be reduced.

Furthermore, in the case of a superconducting magnet apparatus of the present invention, a group of cylinders or disks (hereunder referred to as a fifth group of cylinders) made of superconducting composite materials, to which a temperature regulating device is added, are disposed at a place, which is outwardly away from the uniform magnetic field region caused by a pair of the fourth groups of cylinders, in such a manner as to make the central axis thereof coincide with the center axis of the fourth group of cylinders. Induction-magnetizing of the fifth group of cylinders is performed in such a way as to generate a magnetic flux having a direction in which a magnetic flux generated by the fourth group of cylinders is canceled, thereby reducing leakage flux.

Additionally, in the case of a superconducting magnet apparatus of the present invention, the induction-magnetizing of one or more of the cylinders of the pair of the fourth group is performed so that an electric current, whose direction is opposite to the direction in which an electric current flowing through each of the other cylinders, flows therethrough, thereby reducing the outside diameter of the cylinders of the fourth groups without degrading the magnetic homogeneity of the uniform magnetic field region.

Further, in the case of a superconducting magnet apparatus of the present invention, one or more disk plates (hereunder referred to as a first group of disks), which have a diameter being nearly equal to the outside diameter of the cylinders of the fourth group and is further provided with a temperature regulating device and use superconducting composite plate materials, are disposed on a facing-surface-side front surface of the facing surfaces of the cylinders of the pair of the fourth groups in such a manner as to make the center axes thereof coincide with the center axes of the cylinders of the fourth group, wherein the disks of the first group are released from the superconducting state by heating thereof by means of the temperature regulating device from the initiation of the magnetization of the superconducting magnet apparatus to the completion of the regulation of the magnetization value thereof, and wherein the heating of the disks of the first group by the temperature regulating device is stopped upon completion of the regulation of the magnetization thereof, and wherein the disks of the first group are cooled and are returned to the superconducting state by stopping the heating thereof upon completion of the regulation of the magnetization.

Moreover, in the case of a superconducting magnet apparatus of the present invention, a sixth group of cylinders, to which a temperature regulating device is added, are placed on the outer periphery of each of the fourth and fifth groups of cylinders, and wherein the fourth and fifth groups of cylinders are surrounded by the first and sixth groups of cylinders, thereby increasing the degree of magnetic fluxes captured by the fourth and fifth groups of cylinders for forming the uniform magnetic field region.

Furthermore, in the case of a superconducting magnet apparatus of the present invention, a pair of the superconducting magnet apparatuses placed in such a manner as to face each other and to make the center axes thereof coincide with each other. Further, a uniform magnetic field region is provided in the vicinity of the midpoint between both of the pair of the superconducting magnet apparatuses facing each other. Superconducting composites are small cylinders, each of which is obtained by the working of a superconducting composite plate material into a cylinder having a diameter that is not more than (⅓) of the outside diameter of the static-magnetic-field generating device and by then adding a temperature regulating device thereto. The static-magnetic-field generating devices are constructed by a plurality of small cylinders (hereunder referred to as a seventh group of cylinders). Cylinders of the seventh group are arranged and spaced uniformly on a circumference of a circle which is concentric with the seventh group of cylinders. Moreover, the center axis of each of the cylinders are inclined to the center axes of the superconducting magnet apparatuses by a predetermined magnitude in such a manner as to extend toward the uniform magnetic field region. Cylinders of the seventh group are magnetized by the induction-magnetizing. Consequently, a desired strength of a static magnetic field and a desired direction of a magnetic flux are obtained in the uniform magnetic field region.

Superconducting magnet apparatus of this configuration is of the vertical magnetic field type and of the opposed type. The group of cylinders of the static-magnetic-field generating device are small cylinders which are arranged on the circumference of the circle in such a manner as to be spaced uniformly and as to be inclined in such a manner that the center axes thereof are directed to the uniform magnetic field region in order to form the uniform magnetic field region.

Furthermore, in the case of a superconducting magnet apparatus of the present invention, a plurality of other small cylinders having diameters, which are smaller than the diameter of the cylinders of the seventh group, are arranged on the circumference of a circle which is concentric with but is different in diameter from the cylinders of the seventh group, in such a way as to be spaced uniformly and placed halfway between two of the small cylinders of the seventh group and as to be inclined to the center axis of the superconducting magnet apparatus by a predetermined magnitude so that the center axis of each of the small cylinders are directed to the uniform magnetic field region.

With such a configuration, degradation in the circumferential homogeneity in the uniform magnetic field region, which occurs when arranging the group of small cylinders on the circumference, is prevented. Thus, the magnetic homogeneity can be enhanced.

Further, in the case of a superconducting magnet apparatus of the present invention, a temperature regulating device is added to a portion which is away from the uniform magnetic field region and is at the side opposite to the facing surface of the cylinder of the seventh group. Further, another one or more cylinders or one or more disks obtained by the working of superconducting composite plate materials are placed in such a way as to be concentric with the cylinders of the seventh group. Induction-magnetizing of the other cylinders or disks is performed in such a manner that an electric current flows therethrough in a direction in which the magnetic fluxes generated by the cylinders of the seventh group are canceled, thereby decreasing leakage fluxes.

Further, in the case of a superconducting magnet apparatus of the present invention, one or more disks (hereunder referred to as a second group of disks) obtained after the working of a superconducting composite plate material into a disk having an outside diameter nearly equal to that of the cylinders of the seventh group, to which temperature regulating devices are attached, are placed at a facing-surface-side edge portion of the cylinder of the seventh group in such a manner as to be coaxial with the center axis of the superconducting magnet apparatus, wherein the disks of the second group are released from the superconducting state thereof by being heated from the initiation of the magnetization to the completion of the regulation of the magnetization value by means of the aforesaid temperature regulating device, and, wherein, upon completion of the regulation of the magnetization value thereof, the heating of the disks of the second group is stopped and the disks of the second group are returned to the superconducting state by being cooled.

Moreover, in the case of a superconducting magnet apparatus of the present invention, a ninth group of cylinders, to which a temperature regulating device is added, are placed on the outer peripheries of the seventh and eighth of cylinders, and wherein the seventh and eighth groups of cylinders are surrounded by the cylinders of the second and ninth groups, thereby increasing the degree of magnetic fluxes captured by the seventh and eighth groups of cylinders for forming the uniform magnetic field region.

Furthermore, in the case of a superconducting magnet apparatus of the present invention, a magnetizing auxiliary coil is placed in the vicinity of the cylinder in the cooling container so as to magnetize the cylinder placed at a position, which is away from an externally placed magnetizing coil to be provided at the magnetization, or to magnetize the cylinder which needs magnetizing in reverse polarity, among the plurality of cylinders of the static-magnetic-field generating device.

With this configuration, the cylinder, which is difficult to be magnetized, can be easily magnetized by a magnetizing auxiliary coil in such a way as to have a predetermined magnetization value.

Further, in the case of a superconducting magnet apparatus of the present invention, a plurality of cylinders (hereunder referred to as small cylinders), each of which is obtained by the working of a superconducting composite plate material into a cylinder having a diameter that is not more than (⅓) of the outside diameter of the cylinders of the fourth and fifth groups and by thereafter adding a temperature regulating device thereto, are placed on a part or all of the outer peripheral portions of the fourth and fifth groups of cylinders in such a manner that the center axis of each of the small cylinders is directed toward the uniform magnetic field region, thereby correcting the magnetic field strength of the outer peripheral portion of the uniform magnetic field region.

With this configuration, the magnetic homogeneity of the outer peripheral portion of the uniform magnetic field region can be enhanced by suitably selecting the placement of the plurality of small cylinders in the superconducting magnet apparatus of the opposed type.

Moreover, in the case of a superconducting magnet apparatus of the present invention, the first and second groups of cylinders and temperature regulating devices respectively added to the cylinders of the first and second groups are divided into left-side and right-side groups by the center line of the static-magnetic-field generating device, which extends in the longitudinal direction thereof and servers as a boundary therebetween. Temperature regulating devices of each of the left-side and right-side groups are connected in series independent of the temperature regulating devices of the other of the left-side and right-side groups. Further, in the case that a temperature regulating device (hereunder referred to as an edge-portion temperature regulating device) for regulating the temperature of an edge-portion is added to each of the cylinders, the edge-portion temperature regulating devices are connected in series collectively. Moreover, in the case that the third group of cylinders are further arranged therein, temperature regulating devices added to the third group of cylinders are collectively connected in series. Then, leads are led out of the inside of the superconducting magnet apparatus to the exterior.

With this configuration, the necessary amount of leads led out of the superconducting magnet apparatus of the horizontal magnetic type is minimized. In addition, the temperature regulating devices can be controlled in all steps from the initiation of the magnetization regulating operation to the fixation of the distribution of the magnetic field.

Furthermore, in the case of a superconducting magnet apparatus of the present invention, temperature regulating devices added to each group of a pair of the fourth and fifth groups of cylinders or a pair of the seventh and eighth groups of cylinders are connected in series. Further, in the case where the edge-portion temperature regulating device is added to each of the cylinders, the edge-portion temperature regulating devices are connected in series collectively. Moreover, in the case that a set of the first group of disks and/or the sixth group of cylinders or the second group of disks and/or the ninth group of cylinders are arranged, the temperature regulating devices added to each set of the group of disks and/or the group of cylinders are connected in series collectively. Then, the leads are led out of the superconducting magnet apparatus.

This configuration relates to the leading-out of the leads from the superconducting magnet apparatus of the vertical magnet field type.

Further, in the case of a superconducting magnet apparatus of the present invention, all of passages for introducing direct currents to the temperature regulating devices added to the cylinders or to the disks from the magnetization power supply, which is operative to supply a direct current, to the wiring in the magnet are stranded together as reciprocating direct current passages. Moreover, two heater lines or leads are provided in parallel or stranded together as passages provided in the temperature regulating device in such a manner that reciprocating direct currents pass therethrough close to each other.

This configuration of the apparatus is adapted so that a magnetic field due to an electric current flowing through the temperature regulating device is prevented from exerting a bad influence upon a magnetizing magnetic field.

Moreover, in the case of a superconducting magnet apparatus of the present invention, the temperature regulating devices are divided into group units of the temperature regulating devices in such a way as to be most suitable for controlling currents respectively flowing therethrough. Furthermore, the temperature regulating devices of each group unit are connected in series collectively. Additionally, leads are led out of the superconducting magnet apparatus.

In the case of the apparatus of this configuration, a current control operation can be efficiently performed in the temperature regulating devices. In addition, a part of leads led out from the superconducting magnet apparatus to the exterior is minimized.

Further, in the case of a superconducting magnet apparatus of the present invention, stainless steel wires or high-temperature superconducting wires are used as leads to be led out of the superconducting magnet apparatus.

This configuration of the apparatus is devised so as to prevent heat from intruding into the apparatus from lead portions.

Moreover, in the case of a superconducting magnet apparatus of the present invention, there are used cylinders with temperature regulating devices, which are obtained by the working of superconducting composite plate materials into cylinder-shaped elements. Furthermore, one or more first temperature regulating devices for heating the entirety of the cylinder are placed and spaced uniformly in the circumferential direction and along the longitudinal direction of the cylinder. The controlling of a persistent current flowing in the circumferential direction in the cylinder can be achieved by introducing a direct current into the first temperature regulating devices and by controlling the direct current.

With this configuration, the temperature regulating devices are disposed in such a manner as to be orthogonal to a persistent current flowing in the circumferential direction of the cylinder. Thus, the persistent current can be efficiently controlled.

Furthermore, in the case of a superconducting magnet apparatus of the present invention, there are used disks with temperature regulating devices, which are obtained by the working of superconducting composite plate materials into disk-shaped elements. Further, one or more first temperature regulating devices for heating the entirety of the disk are placed radially from the center of the disk at uniform angular intervals along the circumferential direction thereof. The controlling of a persistent current flowing in the circumferential direction in the disk can be achieved by introducing a direct current into the first temperature regulating devices and by controlling the direct current.

Moreover, in the case of a superconducting magnet apparatus of the present invention, the aforesaid cylinder with temperature regulating devices is provided with one or more second temperature regulating devices for heating a limited part of an edge portion of the cylinder, which are are placed and spaced uniformly in the circumferential direction and along the longitudinal direction of the edge portion of the cylinder. The controlling of a persistent current flowing in the circumferential direction in the edge portion of the cylinder can be achieved by introducing a direct current into the second temperature regulating devices and by controlling the direct current.

Apparatus of this configuration is provided with temperature regulating devices dedicated to regulating the temperature of the edge portion of the cylinder for controlling an extremely-density persistent current flowing through the edge portion of the cylinder.

Furthermore, in the case of a superconducting magnet apparatus of the present invention, the aforesaid cylinder with the temperature regulating devices is divided in the longitudinal direction into two or three parts and is composed of a main body portion and one or two edge portions, in which second temperature regulating devices for heating edge portion are disposed at the edge portions. Further, the first temperature regulating device for heating the entirety of the cylinder is disposed in the combination of the main body portion and the one or more edge portions.

Moreover, a superconducting magnet apparatus of the present invention uses a temperature regulating device for heating a cylinder or a disk obtained by the working of a superconducting composite plate material. The temperature regulating device is obtained by combining a pair of electrically insulated heaters as a heater portion, and then working the heater portion by adjusting the length of the heater portion to the necessary size of a part, the temperature of which is to be regulated, of the cylinder or the disk, and subsequently, connecting leads with both ends of the heater portion, and further storing the heater portion in a protecting tube made of a high heat-conductivity material, such as copper or aluminum, and fixing the heater portion by filling a surrounding space thereof with a high-heat-conductivity synthetic resin.

This is the fundamental configuration of the temperature regulating device, and is strong for being mounted in a cylinder and is easy to handle.

Furthermore, in the case of a superconducting magnet apparatus of the present invention, the aforesaid temperature regulating device is obtained by shaping the two heaters like flat plates and further putting the protecting tube in a flat shape.

This configuration of the apparatus is suitable for embedding the temperature regulating device in a thin cylinder or a thin disk.

Further, in the case of a superconducting magnet apparatus of the present invention, the aforesaid temperature regulating device is constructed by arranging a lead in the middle portion between the two heaters, and only necessary areas of both edge portions are made to be heaters.

This configuration of the apparatus is employed in the case of using the edge-portion temperature regulating devices.

Moreover, in the case of a superconducting magnet apparatus of the present invention, there are used cylinders or disks with temperature regulating devices, which are cylinders or disks obtained by the working of superconducting composite plate materials into cylinder-shaped or disk-shaped elements, and by embedding the temperature regulating device therein in such a manner as to insert the temperature regulating device, between the superconducting composite plate materials.

Furthermore, in the case of a superconducting magnet apparatus of the present invention, cylinders or disks with temperature regulating devices are constructed by fixing the temperature regulating device with a high-heat conductivity synthetic resin after embedding the temperature regulating device into the cylinders or disks.

This configuration of the apparatus is employed for securely controlling the temperature of the cylinder or disk by means of the temperature regulating device in a short time.

Further, in the case of a superconducting magnet apparatus of the present invention, there is used a cylinder for the superconducting magnet apparatus, which is obtained by performing the working of superconducting composite plate materials into a plurality of cylinders that are integral with one another. Moreover, the inner circumferential surface of the cylinder is electrically insulated. Furthermore, a cylinder made of copper or aluminum is inserted into the cylinder as a fixture in such a manner as to closely adhere to and be integral with the cylinder.

This configuration of the apparatus results in increase in the strength of the cylinder and facilitates the mounting the cylinder onto a supporting base.

Furthermore, in the case of a superconducting magnet apparatus of the present invention, a cylinder made of stainless steel or copper or aluminum is fitted to the outer circumferential surface of the cylinder, thereby protecting the cylinder from an electromagnetic force caused owing to the strength of the magnetic field which is generated by the induction-magnetizing.

Further, in the case of a superconducting magnet apparatus of the present invention, the aforesaid cylinder is divided into a plurality of layer-cylinders in the direction of thickness of the aforesaid cylinder. Temperature regulating device is embedded into each layer-cylinder obtained by the division of the aforesaid cylinder. Spacer made of copper or aluminum is inserted into a space between each pair of adjacent layer-cylinders, which is other than a temperature-regulating-device embedded portion, in such a manner as to closely adhere to the pair of adjacent layer-cylinders. Air gap, into which the spacer is not inserted, of the temperature-regulating-device embedded portion is filled with a low-heat conductivity synthetic resin.

This configuration of the apparatus is suitable for making a thick cylinder.

Moreover, in the case of a superconducting magnet apparatus of the present invention, there are used cylinder or disk structures that are structures using a plurality of cylinders or disks for use in a superconducting magnet apparatus, which are obtained by the working of superconducting composite plate materials into cylinder-shaped or disk-shaped elements and are stacked by changing the circumferential position of each of the cylinders or disks by a predetermined magnitude of an angle from that of the adjacent cylinders or disks, thereby reducing of nonuniformity of characteristics at the working of the superconducting plate materials.

Furthermore, in the case of a superconducting magnet apparatus of the present invention, there is used a cylinder supporting base for supporting cylinders which are used in a superconducting magnet apparatus and are obtained by the working of superconducting composite plate materials into cylinder-shaped elements. Portions of the cylinder supporting base, which extend from the center thereof to both edge parts in the longitudinal direction thereof, are machined like staircases. Outside diameter of each of steps of the staircase-like portions decreases with distance thereof from the center thereof. Surface portion of each of the steps, which is orthogonal to the center axis thereof, is electrically insulated. Surface portion of each of the steps, which is parallel to the center axis thereof, is machined in such a manner that the aforesaid cylinder is fitted thereto.

This configuration of the apparatus, when applied to a superconducting magnet apparatus of a horizontal magnetic field type, provides a strong magnet which causes a uniform magnetic field region, whose magnetic homogeneity is high.

Further, in the case of a superconducting magnet apparatus of the present invention, the cylinder supporting based is provided with passages for passing leads of the temperature regulating devices in the electrically-insulated surface part of each step of the staircase-like portions.

In the case of employing this configuration, the wiring of leads can be achieved continuously within the superconducting magnet apparatus by minimizing the length thereof.

Moreover, in the case of a superconducting magnet apparatus of the present invention, the aforesaid cylinder supporting base is divided into two left-side and right-side portions on the center line extending in the longitudinal direction thereof, and thereafter two division elements are joined together on the aforesaid center line in such a manner as to be integral with each other.

In the case of employing this configuration of the apparatus, first, division elements are machined separately from each other. Thereafter, the division elements are joined together in such a way as to be integral with each other. Consequently, the working of the supporting base can be facilitated.

Further, in the case of a superconducting magnet apparatus of the present invention, a material of the aforesaid cylinder supporting base is a metal, or an alloy or a composite material, which has a coefficient of thermal expansion nearly equal to that of thermal expansion of the cylinder.

Moreover, in the case of a superconducting magnet apparatus of the present invention, the cylinders for the superconducting magnet apparatus, which are obtained by the working of the superconducting composite materials into cylinder-shaped elements to which the temperature regulating devices are respectively added, are fitted into the staircase-like portions of the aforesaid cylinder supporting base.

Furthermore, in the case of a superconducting magnet apparatus of the present invention, as the magnetization power supply for performing magnetization of the static-magnetic-field generating device by the induction-magnetizing, there is used a magnetization power supply that comprises: a first magnetizing current output circuit for supplying a magnetizing electric current to an externally placed magnetizing coil; a second magnetizing current output circuit for supplying a magnetizing electric current to a magnetizing auxiliary coil incorporated in a main unit of the superconducting magnet apparatus; two sets of fist temperature controlling current output circuits for supplying heating currents to two sets of first temperature regulating devices connected in series, which are obtained by dividing the temperature regulating devices respectively added to the group of cylinders (including the group of disks) of the static magnetic field generating device into two or left-side and right-side groups or sets; a second temperature controlling current output circuit for supplying heating currents to one set of second temperature regulating devices obtained by collectively connecting edge-portion temperature regulating devices in series, which are added to edge portions of the aforesaid group of cylinders (including the group of disks) for regulating temperatures of the edge portions thereof; and a third temperature controlling current output circuit for supplying heating currents to a set of third temperature regulating devices obtained by collectively connecting temperature regulating devices in series, which are added to a group of cylinders (including a group of disks) placed between the static magnetic field generating device and the uniform magnetic field region so as to compensate the magnetic field distribution in the uniform magnetic field region (claim 44).

This magnetization power supply is operative to supply electric currents to the temperature regulating devices and the magnetizing coil of the superconducting magnet apparatus and is also operative to control the electric currents. Magnetizing coils are the externally placed magnetizing coil and a magnetizing coil incorporated in the magnet apparatus. Further, the temperature regulating devices are the first temperature regulating devices for the group of cylinders to be used to generate a static magnetic field, the second temperature regulating devices for regulating the temperature of the edge portions, and the third temperature regulating devices for compensating the magnetic field distribution. Current output circuits are provided in the magnetization power supply correspondingly to each of the temperature regulating devices.

Further, in a case of a superconducting magnet apparatus of the present invention, the aforesaid magnetization power supply comprises: a setting circuit for setting a control values through a digital-to-analog conversion circuit for supplying electric currents to the current output circuits, respectively, and for performing a digital-to-analog conversion so as to control the electric currents, and through an AND circuit for computing logical products between signals indicating the initiation and completion of control operations; a computer circuit for supervising overall operations of setting these values and of controlling the currents; an output circuit for the computer circuit, which is used for connecting the aforesaid computer circuit, the setting circuit, the AND circuit and a display circuit for displaying an indication representing the conditions of the main unit of the superconducting magnet apparatus as a warning indication (including a guide indication); an input circuit for inputting measured values of a magnetic field in the main unit of the superconducting magnet apparatus to a computer; another input circuit for inputting operation information on the magnetization power supply thereto; a computer configuration control circuit; a storage circuit for storing software to be used to perform a magnetization regulating operation; and a power supply circuit for supplying power to these circuits.

This configuration is of a control circuit for various kinds of power output circuits of the magnetization power supply.

Moreover, in the case of a superconducting magnet apparatus of the present invention, a magnetic-field-strength measuring device for measuring the strength of a magnetic field at a controlled point in the aforesaid uniform magnetic field region is added to the externally placed magnetizing coil to be inserted in the uniform magnetic field region when magnetizing the static-magnetic-field generating device. Thus, during the magnetization, the strength of the magnetic field in the aforesaid uniform magnetic field region can be measured.

Furthermore, in the case of a superconducting magnet apparatus of the present invention, the total length of an externally placed magnetizing coil, which is used when magnetizing the static magnetic field generating device, is set as being equal to or less than the total length of the cylinder of the static magnetic field generating device. Thus, when magnetizing both edge portions in the longitudinal direction of the cylinder of the static magnetic field generating device, an electric current, which flows therethrough in the circumferential direction, is restrained from having extremely high density.

Further, in the case of a superconducting magnet apparatus of the present invention, after completion of magnetization, emergent-demagnetization temperature regulating devices are added to the group of cylinders (including the group of disks) of the static-magnetic-field generating device. The emergent demagnetization device for performing a demagnetizing operation in an emergency of the main unit of the superconducting magnet apparatus is connected to the aforesaid emergent-demagnetization temperature regulating device. When it is necessary to eliminate the magnetic field, an electric current needed for demagnetization of the main unit of the superconducting magnet apparatus is supplied from the emergent demagnetization device to the emergent-demagnetization temperature regulating device.

This emergent demagnetization device is adapted to perform a demagnetizing operation only in an emergency of the superconducting magnet apparatus. After the magnetization, this emergent demagnetization device is connected to the emergent demagnetization temperature regulating device provided in the superconducting magnet apparatus.

Moreover, in the case of a superconducting magnet apparatus of the present invention, the aforesaid emergent demagnetization device comprises: a constant current output circuit for supplying an electric current, which is necessary for controlling the temperature of the group of cylinders (including disks), to a load that is a resistor obtained by connecting the emergent demagnetization temperature regulating devices, which are added in series to the group of cylinders of the static magnetic field generating device provided in the main unit of the superconducting magnet apparatus; a battery having capacity by which an electric current for achieving the demagnetization in a time period of 1 to 2 minutes, is supplied to the constant current output circuit; a direct current power supply and a charging circuit which are used to charge the battery at all times; and a push-button switch having an off delay timer function corresponding to a delay time of about 1 minute. Furthermore, an electric current can be introduced from the battery to the constant current output circuit by turning on the push-button switch.

Furthermore, in the case of a superconducting magnet apparatus of the present invention, a maximum energizing current value and a maximum current capacity of a control current for the temperature regulating device added to the magnetization of the group of cylinders (including the group of disks) of the static-magnetic-field generating device, are selected as capacitance values within ranges in which the temperature regulating devices for regulating the magnetization are able to withstand the current needed for the emergent demagnetization during the energizing time of about 1 minute, and a change in the value of resistance of the temperature regulating device does not hinder the use of the temperature regulating device even after the emergent demagnetizing operation. Thus, the temperature regulating device is adapted to also act as an emergent demagnetization temperature regulating device.

With this configuration, the current capacity of the temperature regulating device for regulating the magnetization, which is provided in the superconducting magnet apparatus, is set in such a manner as to be higher than that of the temperature regulating device for the emergent demagnetization. This permits a device to perform the functions of both of the temperature regulating device for regulating the magnetization, and the temperature regulating device for the emergent demagnetization.

In accordance with the present invention, there is provided a method of regulating magnetization of a superconducting magnet apparatus having: a cooling container being capable of cooling contents thereof so that the contents are brought in a superconducting state; static-magnetic-field generating device that is placed in the aforesaid cooling container and includes a superconducting composite serving as a holding medium for holding an electric current therein, which generates a magnetic flux in a previously set magnetic field region (hereunder referred to as a uniform magnetic field region) along the central axis thereof; and holding device for holding the aforesaid static-magnetic-field generating device in the aforesaid cooling container, wherein the aforesaid superconducting composite has a temperature regulating device. This method comprises the steps of: magnetizing the aforesaid static-magnetic-field generating device by performing induction-magnetizing; and thereafter controlling the temperature of the aforesaid superconducting composite by controlling a current value flowing through the aforesaid temperature regulating device, thereby regulating an induced magnetization value of the aforesaid static-magnetic-field generating device in such a manner as to be within a desired range.

This constitution is a fundamental constitution of the method of regulating magnetization of a superconducting magnet apparatus of the present invention.

Further, in the case of a method of regulating magnetization of a superconducting magnet apparatus of the present invention, preliminary induction magnetizing is performed preliminarily. Then, a magnetic field setting value for the induction magnetizing is changed according to a result of the magnetization. Subsequently, final induction magnetizing is performed according to the changed setting value. Thus, the regulation of the magnetization value after the induction magnetizing is omitted.

Moreover, in the case of a method of regulating magnetization of a superconducting magnet apparatus of the present invention, a magnetic-field setting value for an initial induction magnetizing is set at a value which is higher than a desired magnetization value. After the magnetization, the superconducting composite is heated in accordance with temperature-critical-current-density characteristics. Moreover, by regulating a heating temperature, the magnetization value is lowered, so that a desired magnetization value is obtained.

This constitution is a fundamental principle of the regulation of a magnetization value according to the present invention.

Furthermore, in the case of a method of regulating magnetization of a superconducting magnet apparatus of the present invention, an externally placed magnetizing coil is incorporated into the superconducting magnet apparatus. Further, the method of regulating magnetization of the superconducting magnet apparatus is performed by connecting a magnetization power supply thereto. First, the externally placed magnetizing coil is mounted on the superconducting magnet apparatus in such a manner as to be concentric with the uniform magnetic field region therein. Furthermore, the external placed magnetizing coil is connected with the magnetization power supply. In a procedure by which the first and second groups of cylinders, or the fourth and fifth groups of cylinders or the seventh and eighth groups of cylinders are magnetized, first, the second or fifth or eighth group of cylinders are magnetized collectively. Then, the polarity of the externally placed magnetizing coil is inverted. Moreover, the first or fourth or seventh group of cylinders are magnetized collectively. Thus, the magnetization is performed so that margin regions, through which allows persistent currents to flow, are further provided concentratedly at the inside-diameter-side of the cylinders of each group, which are made by using the superconducting composite plate materials.

The superconducting magnet apparatus, the magnetization of which is regulated in this way, can compensate the attenuation of the strength of a magnetic field with elapse of time after the regulation of the magnetization by providing margin regions at the inner periphery side.

Further, in the case of a method of regulating magnetization of a superconducting magnet apparatus of the present invention, when the first and second groups of cylinders, or the fourth and fifth groups of cylinders or the seventh and eighth groups of cylinders are magnetized, the magnetization is performed on the cylinders in increasing order of diameter. Thus, each of the cylinders is magnetized independently in such a manner as to have the required strength of the magnetic field at the position thereof.

Moreover, in the case of a method of regulating magnetization of a superconducting magnet apparatus of the present invention, when the second or fifth or eigth group of cylinders are magnetized, the magnetization is performed thereon in increasing order of diameter in such a manner that the magnetization polarity of the cylinders of these groups is opposite to the magnetization polarity of the cylinders of the first or fourth or seventh group.

This constitution of the method has the effect of reducing the size of the superconducting magnet apparatus.

Furthermore, in the case of a method of regulating magnetization of a superconducting magnet apparatus of the present invention, when the first or fourth or seventh group of cylinders are magnetized, the magnetization is performed thereon in increasing order of diameter in such a manner that the magnetization polarity of a part of the cylinders is opposite to the magnetization polarity of the other cylinders.

Moreover, in the case of a method of regulating magnetization of a superconducting magnet apparatus of the present invention, each of the cylinders is divided in the direction of thickness thereof into a plurality of layers. The temperature regulating device is added to each of the plurality of layers obtained by the division. When the cylinders are magnetized, the layers are regarded as individual cylinders. Moreover, the magnetization is performed thereon in increasing order of diameter. Thus, each of the layers of the cylinders is magnetized independently in such a manner as to have the required strength of the magnetic field at the position thereof.

Furthermore, in the case of a method of regulating magnetization of a superconducting magnet apparatus of the present invention, the externally placed magnetizing coil is regarded as a coil for the magnetization of the cylinders of the first or fourth or seventh group. Further, the magnetizing auxiliary coil incorporated in the superconducting magnet apparatus is regarded as a coil for the magnetization of the cylinders of the second or fifth or eighth group. The magnetization is performed by setting the magnetization polarity of the magnetizing auxiliary coil as being opposite to the magnetization polarity of the externally placed magnetizing coil and by simultaneously controlling both of the magnetizing auxiliary coil and the externally placed magnetizing coil.

Further, in the case of a method of regulating magnetization of a superconducting magnet apparatus of the present invention, each of the cylinders of the first and second groups or the fourth and fifth groups or of the seventh and eighth groups is divided in the direction of thickness thereof into two cylinders. The temperature regulating device is added to each of the cylinders. First, between the two cylinders, the cylinder having a larger diameter is magnetized by the magnetizing coil in such a way as to have a magnetization value which is $(1/n)$ of the final magnetization value. Subsequently, the cylinder of a smaller diameter is magnetized by a magnetizing magnetic field obtained by adding the magnetizing magnetic field, which is caused by the magnetizing coil and has a magnetization value equal to $(1/n)$ of the final magnetization value, to the magnetizing magnetic field, which is caused by the cylinder of a larger diameter having a magnetization value equal to $(1/n)$ of the final magnetization value, in such a manner as to have a magnetization value which is $(2/n)$ of the final magnetization value. Thus, the cylinder is magnetized in such a way as to have a magnetization value which is $(2/n)$ of the final magnetization value. This operation is repeated sequentially n times. Thereby, any of the cylinders is magnetized by using the magnetizing coil, whose magnetization value is $(1/n)$ of the final magnetization value, in such a manner as to have the final magnetization value.

With this constitution, the cylinder can be magnetized by using a magnetizing magnetic field, whose magnetic field strength is low, in such a manner as to have a high magnetization value. Consequently, the capacity of the magnetizing coil and the magnetizing power supply can be reduced.

Moreover, a method of regulating magnetization of a superconducting magnet apparatus of the present invention is a method of regulating magnetization of a superconducting magnet apparatus, in which the magnetizing auxiliary coils are incorporated in the small cylinders composing the seventh and eighth groups of cylinders. Furthermore, the magnetization of the apparatus is performed by superimposing the strength of the magnetizing magnetic field, which is caused by the magnetizing auxiliary coil, on the strength of the magnetizing magnetic field which is caused by the externally placed magnetizing coil.

With this constitution of the method, the superconducting magnet apparatus using the small cylinders can be efficiently magnetized by incorporating the magnetizing auxiliary coils in the small cylinders.

Furthermore, a method of regulating magnetization of a superconducting magnet apparatus of the present invention is a method of regulating magnetization of a superconducting magnet apparatus in which the temperature of the cylinders or disks of the first to third groups of cylinders, or the fourth and fifth groups of cylinders and the first group of disks and/or the sixth group of cylinders or the seventh and eighth groups of cylinders and the second group of disks and/or the ninth group of cylinders is raised by heating the temperature regulating devices before the magnetization thereof. Thus, the state thereof is changed from the superconducting state into the normal conducting state. Thereafter, an initializing step of eliminating a past residual magnetic field is performed by stopping the heating thereof and by then performing the cooling thereof and changing the state thereof into the superconducting state again.

This initializing step is to eliminate the past residual magnetic field and is an indispensable step for performing uniform magnetization.

Furthermore, a method of regulating magnetization of a superconducting magnet apparatus of the present invention, the magnetization is controlled so that the cylinders or disks composing the third group of cylinders or the first group of disks and/or the sixth group of cylinders or the second group of disks and/or the ninth group of cylinders are held in a state exhibiting normal conducting characteristics from the initializing step to the completion of the regulation of magnetization, and that, after the completion of the regulation of magnetization, the cylinders or disks are returned to a state exhibiting superconducting characteristics.

This process is performed so as to fix the magnetic field distribution after the magnetization is regulated. Thus, a change in the strength of the magnetization after the magnetization with an elapse of time is compensated.

Further, in the case of a method of regulating magnetization of a superconducting magnet apparatus of the present invention, a step of imparting a desired magnetization value to the cylinders (hereunder referred to as a magnetizing step) is performed by carrying out a control operation of gradually lowering an exciting current for the magnetizing coil to zero upon completion of a control operation of raising the exciting current for the magnetizing coil and making the strength of the magnetizing magnetic field to reach a desired value and thereafter holding this state and stopping the heating by means of the temperature regulating devices to thereby cool the cylinders and changing the state thereof from the normal conducting state to the superconducting state, in addition to a control operation of raising the temperature of the cylinders and changing the state thereof from the superconducting state to the normal conducting state by using the temperature regulating devices added to cylinders (including disks) composing the first and second groups of cylinders or the fourth and fifth groups of cylinders or the seventh and eighth groups of cylinders after performing the initializing step.

This step is a step of magnetizing the cylinders for generating a static magnetic field in the superconducting magnet apparatus, and is an indispensable one for regulating the magnetization of the superconducting magnet apparatus of the present invention.

Moreover, in the case of a method of regulating magnetization of a superconducting magnet apparatus of the present invention, an operation of controlling the temperature of the cylinders and disks by means of the temperature regulating devices added to the cylinders and disks is performed according to a setting value by which the cylinder and disks are held in the normal conducting state at a temperature close to a temperature in the superconducting state, thereby minimizing the consumed amount of freezing mixture and the cooling energy.

With this constitution, the consumed amount of freezing mixture for cooling is reduced by performing a current controlling operation on the temperature regulating device in such a manner as to minimize the temperature rise of the cylinder and disks and the holding time during which the raised temperature thereof is held.

Furthermore, in the case of a method of regulating magnetization of a superconducting magnet apparatus of the present invention, a controlled amount of an exciting electric current for the magnetizing coil per unit of time is made to be less than an allowable value based on the characteristics of the superconducting composite plate of the cylinders and is set in a range in which the magnetization regulating time is minimized, thereby minimizing the amount of freezing mixture and cooling energy.

Further, in the case of a method of regulating magnetization of a superconducting magnet apparatus of the present invention, the magnetization value of each cylinder is controlled individually by performing an initializing step of raising the temperature of each of the cylinders, which are to be magnetized, by heating the temperature regulating device added thereto before the magnetization, and thus changing the state thereof from the superconducting state to the normal conducting state, and thereafter stopping raising the temperature thereof and then performing the cooling thereof to thereby returning the state thereof to the superconducting state; and a magnetizing step of changing the state of the cylinder by heating the temperature regulating device added thereto from the superconducting state to the normal conducting state, and increasing an exciting electric current for the magnetizing coil to thereby obtain the desired strength of a magnetic field, and subsequently holding this state and cooling the cylinder by causing the temperature regulating device to stop heating the cylinder, and then returning the state of the cylinder from the normal conducting state to the superconducting state again, and thereafter decreasing the exciting current for the magnetizing coil gradually to thereby impart a desired magnetization value to the cylinder; and repeatedly performing a process consisting of the initializing step and the magnetizing step on the cylinders, which need magnetizing.

This constitution of the method is employed for magnetizing cylinders individually in the case that there are a plurality of cylinders for generating a static magnetic field, and is referred to as separate and individual magnetizing.

Moreover, in the case of a method of regulating magnetization of a superconducting magnet apparatus of the present invention, in the case of a magnetization regulating process in which an extremely high density current occurs in edge portions of the cylinders (including disks) composing the first and second groups of cylinders, or the fourth and fifth groups of cylinders, or the seventh and eighth groups of cylinders, a step (hereunder referred to as an edge- portion regulating step) of reducing the extremely high density current by performing the temperature- controlling of only the edge portions of the cylinders by using the temperature regulating devices for regulating the edge portions, which are added to the edge portions of each of the cylinders, after the magnetizing step is performed.

This constitution of the method employs the step of reducing the extremely high density persistent current flowing through the edge portion of the cylinder for generating a static magnetic field in the superconducting magnet apparatus. Further, this step is performed if necessary.

Furthermore, in the case of a method of regulating magnetization of a superconducting magnet apparatus of the present invention, the temperature-controlling of only auxiliary cylinders is enabled by forming each of the cylinders in such a manner as to have a cylindrical central portion and auxiliary cylinders respectively provided at both ends thereof, and by adding temperature regulating devices for regulating the edge portions to the aforesaid auxiliary cylinders, respectively.

Additionally, in the case of a method of regulating magnetization of a superconducting magnet apparatus of the present invention, upon completion of the magnetizing step or the edge-portion regulating step, in the case that a difference between the magnetization values of left-side and right-side magnetic fields, which are caused by the first and second groups of cylinders arranged in the longitudinal direction of the superconducting magnet apparatus on the left-side and the right-side of the center line in the longitudinal direction thereof, is beyond a predetermined range, or in the case that a difference between the magnetization values of magnetic fields caused by two groups of cylinders which are the second and fourth groups of cylinders or the seventh and eighth groups of cylinders placed in the superconducting magnet apparatus in such a manner as to face each other, is beyond the predetermined range, there is further performed a step (hereunder referred to as a balance regulating step) of raising the temperature of the temperature regulating devices added to the cylinders composing the one group of cylinders, which generate a magnetic field causing a higher magnetization value, to thereby heat the cylinders and lower the magnetization value thereof in such a manner as to balance the magnetization value thereof with the magnetization value of the other group of cylinders.

This constitution of the method employs the step of regulating the distribution of the magnetic field in the superconducting magnet apparatus, especially, regulating the balance between the magnetization values of the left-side and right-side portions thereof or between the magnetization values the two groups cylinders facing each other. This step is performed, if necessary, by dividing the cylinders, which is intended for generating a static magnetic field, into two groups, and then regulating the balance by lowering the magnetization value of only one of the two groups.

Further, in the case of a method of regulating magnetization of a superconducting magnet apparatus of the present invention, upon completion of the magnetizing step, or the edge-portion regulating step or the balance regulating step, there is performed a step (hereunder referred to as an overall regulation step) of obtaining a predetermined magnetization value due to a magnetic field by raising the temperature of the entirety of each of the cylinders (including disks) composing the first and second groups of cylinders, or the fourth and fifth groups of cylinders, or the seventh and eighth groups of cylinders, by means of the temperature regulating device added thereto, and regulating the temperature thereof.

This constitution of the method employs a step of adjusting the magnetization value, which is obtained by performing the magnetizing step) to a predetermined value, and this step is performed by regulating the temperature of the groups of cylinders for generating a static magnetic field.

Further, in the case of a method of regulating magnetization of a superconducting magnet apparatus of the present invention, an upper limit value of a range of setting temperatures of the cylinders or the edge portions of the cylinders is set at a minimum value in a range thereof in which the cylinders do not lose superconducting properties, thereby preventing the magnetizing magnetic field from being eliminated when regulating the magnetization.

Moreover, a method of regulating magnetization of a superconducting magnet apparatus of the present invention is a method of regulating magnetization of the superconducting magnet apparatus, which is performed by combining the externally placed magnetizing coil (including a magnetizing auxiliary coil, which is incorporated in the magnet, if any, hereunder, both kinds of such magnetizing coils will be referred to as magnetizing coils) and the magnetization power supply with the apparatus. Operation process consists of the magnetizing step I, the edge-portion regulating step II, the balance regulating step III, the overall regulation process IV and the magnetic-field distribution fixing step V. In the magnetizing step I, the temperature regulating devices added to the groups of the cylinders and the groups of disks of the superconducting magnet apparatus, a magnetic-field measuring instrument and the magnetizing coils are connected with the magnetizing power supply. Then, the power supply switch of the magnetizing power supply is turned on. Subsequently, after a lapse of a time period of a predetermined length, a start push-button for initiating the regulation of magnetization is turned on. Moreover, current output values of the magnetizing coils and the temperature regulating devices, which are other than the edge-portion temperature regulating devices, are set at previously set values, respectively. Currents flowing through the temperature regulating devices except for the edge-portion temperature regulating devices are controlled so that the temperature of each of the cylinders and the disks of the superconducting magnet apparatus is raised and that the states thereof are changed from the superconducting state to the normal conducting state. Thereafter, a previously set magnetization value is set after a lapse of a necessary time. Then, a direct current is introduced to each of the magnetizing coils and is gradually increased. After the direct current reaches a predetermined value, electric currents respectively flowing the temperature regulating devices, which are other than the edge-portion temperature regulating devices, are controlled in such a way as to decrease gradually to zero. Thus, the properties of the cylinders and the disks are returned from the normal conducting state to the superconducting state. Then, the direct currents flowing through the magnetizing coils are controlled in such a manner as to decrease gradually to zero. Thus, a persistent current is generated in the circumferential direction of the cylinders and the disks and is held therein. Thereby, the uniform magnetic field region is magnetized according to the strength which is not less than a desired value. Thereafter, the strength of a magnetic field is measured at a controlled point in the uniform magnetic field region. Then, it is judged in the magnetizing power supply whether or not the measured strength of the magnetic field reaches a predetermined value. If a result of this judgement shows that the measured strength has not reached the predetermined value, the magnetization value is set again, and then the magnetization is repeated. In contrast, it reached the predetermined value, the operation proceeds to the next step. In the edge-portion regulating step II, first, it is determined in each superconducting magnet apparatus whether or not the regulation of the edge portions is necessary. If not, it is determined that the regulation of the edge portions is unnecessary. If necessary, the value of a direct current to be made to flow through the edge-portion temperature regulating device is set. Then, the edge potions of the cylinder are heated by letting the electric current, which has the set value, flow through the edge-portion temperature regulating device. Thus, a persistent current flowing through the edge portions is regulated. In the balance regulating step III, it is first judged from the value, which is measured at the controlled point in the uniform magnetic field region and is previously fetched, whether or not a balance between the magnetization values respectively corresponding to the left-side and right-side groups of the two facing groups of cylinders is achieved. Then, it is determined whether or not the balance regulation is necessary. If unnecessary, it is determined that the balance regulation is unnecessary. If necessary, the value of a direct current to be made to flow through the temperature regulating device added to the group or set of the cylinders or disks having higher magnetic-field strength is computed from the measured values of the magnetic field strength and the computed value is set. Then, the electric currents made to flow through the temperature regulating devices are controlled, so that the persistent currents flowing through the cylinders and disks are regulated. In the overall regulation step IV, first, a target value, to which the magnetization value is to be reduced, is set. Then, the difference between the set value and the present magnetization value is computed. Direct currents to be made to flow through the temperature regulating devices added to the cylinder and disks are set according to a result of the computation. Further, the electric currents flowing through the temperature regulating devices are controlled. Thus, the persistent currents flowing through the cylinders and the disks are controlled. As a result, the magnetization value is changed. Thereafter, the magnetization value is measured. Further, it is checked whether or not the value measured after the change reaches the predetermined value. If not, the same step is performed repeatedly. In contrast, if reached, the operation proceeds to the next step. In the magnetic-field-distribution fixation step V, the electric currents having flown through the temperature regulating devices added to the cylinders and the disks for compensating the magnetic field distribution are stopped. Moreover, the heating of the cylinders and the disks for compensating the magnetic field distribution is stopped. Instead, the state of the cylinders and the disks for compensating the magnetic field distribution are returned from the normal conducting state to the superconducting state by performing the cooling thereof.

This constitution of the method covers all steps of the magnetization regulating operation of the superconducting magnet apparatus. The edge-portion regulating step II and the balance regulating step III are performed, if necessary. Namely, the edge-portion regulating step 11 and the balance regulating step III may be omitted.

Moreover, in the case of a method of regulating magnetization of a superconducting magnet apparatus of the present invention, when setting each electric current value, limit values are determined correspondingly to all of the set values, respectively. Further, this method further comprises a step of checking whether or not the set value corresponding to each electric current exceeds the aforesaid limit value.

With this constitution of the method, abnormal values are prevented from being used as the set values. Further, the magnetization regulating operation can be achieved smoothly.

Furthermore, in the case of a method of regulating magnetization of a superconducting magnet apparatus of the present invention, the set values of a control direct electric current for each temperature regulating device, and a direct electric current for the magnetizing coil are divided by n.

Further, when performing a control operation of controlling the electric currents, the control operation is carried out by repeatedly performing a procedure of increasing each of the electric currents by (1/n) of the corresponding set value thereof at appropriate time intervals until reaching the corresponding set value.

With this constitution of the method, a magnetizing coil current and a temperature control current increase step-wise successively. Thus, each of the electric currents can be automatically controlled.

BRIEF DESCRIPTION OF DRAWINGS

FIG. 18 is a time chart illustrating a procedure for the regulation of magnetization of one cylinder;

FIG. 19 is a time chart illustrating a procedure for the regulation of magnetization of two cylinders in the case of magnetizing an outer cylinder in reverse polarity;

FIG. 32 is a diagram illustrating an example of a case in which magnetizing currents concentrated at the edge portions is restrained by changing the length of a magnetizing coil;

FIG. 48 is a diagram illustrating the connection of each of a temperature regulating device and a magnetizing coil, which is incorporated in a magnet, to a magnetization power supply;

FIGS. 50A–50F are flowcharts illustrating a method of regulating magnetization of a superconducting magnet apparatus of the horizontal magnetic field type;

FIG. 67 is a diagram illustrating an example of the structure of a superconducting magnet apparatus into which the combination of a cylinder and a cylinder supporting base is incorporated;

BEST MODE FOR CARRYING OUT THE INVENTION

Upon describing embodiments of the present invention in detail, fundamental phenomena, on which the present invention is based, will be first described hereinbelow on the basis of experimental results. Thereafter, the configuration of a superconducting magnet apparatus to which the aforesaid fundamental phenomena are applied, a method of magnetizing the superconducting magnet apparatus, a method of regulating the magnetized magnetic field, a method of compensating magnetic field attenuation, a method of compensating variation in magnetic field distribution, which results from the magnetic field attenuation, a magnetization power supply and an emergent demagnetization apparatus will be described by referring to the accompanying drawings.

Figure 1:
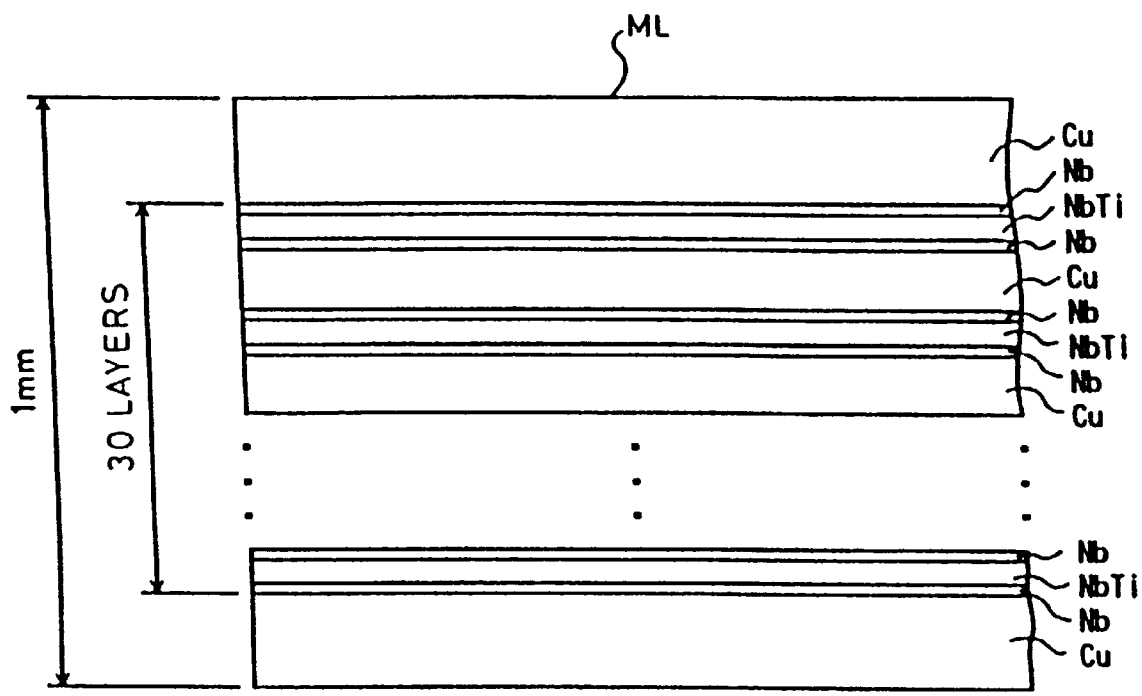
FIG. 1 is a sectional view of NbTi/Nb/Cu superconducting multilayer composite.

Apparatus of the present invention uses superconductor plate materials such as superconducting composite plate materials, or members obtained by machining such materials into cylinders or disks, differently from the conventional apparatus using superconducting wires. FIG. 1 shows a sectional view of NbTi/Nb/Cu superconducting composite as a typical example of a superconducting composite plate. NbTi/Nb/Cu superconducting composite multilayer (hereunder referred to simply as NbTi multilayers or as a superconducting multilayer composite, and sometimes abbreviated as ML plate or ML) is composed of the combination of 30 NbTi layers, 31 Cu layers and 60 Nb layers, and is constructed so that surface layers thereof are Cu layers, that Cu layers and NbTi layers are alternately stacked, and that Nb layer is interposed between Cu layer and NbTi layer. The aforesaid NbTi multilayers are worked into a plate, whose thickness is 1 mm or so, by performing the hot rolling and the cold rolling of the aforementioned multilayers.

In the case of the superconducting magnet apparatus of the present invention, the apparatus is assembled by performing the working of the NbTi multilayers into disks or cylinders, and uses the disks or cylinders as a static magnetic field generating source. The disk is cut out of a plate which is 1 mm in thickness. In the case of cylinders, the deep drawing of a single plate, whose thickness is 1 mm, or of a plurality of such plates, which are integral with one another, is performed. Then, the bottom portion of an obtained cup-like member is cut away therefrom. Thus, cylindrical NbTi multilayers are obtained. Method of making NbTi multilayers is described in detail in IEEE TRANSACTION ON APPLIED SUPERCONDUCTIVITY, Vol. 3, No. 1, March 1993, pp. 177 to 180.

As above stated in the description of the "Background Art", in the superconducting magnet apparatus using the superconducting wire, an electric current is poured into the superconducting coil from both ends thereof. Then, the electric current poured thereinto is conserved as a persistent current, by turning on persistent current circuit switches provided at both ends of the coil, which are thus short-circuited.

In contrast, in the case of the apparatus of the present invention, the disks or cylinders (hereunder referred to as cylinders or the like) made by using the aforementioned superconducting composite are used as carriers of a persistent current. In this case, an electric current is not directly poured into the aforesaid cylinders or the like, differently from the case of using the superconducting coil. Instead, the cylinders or the like are placed in a magnetizing magnetic field so that a persistent current is obtained indirectly in the cylinders or the like. This method is called "induction magnetizing".

There are several methods of performing the induction magnetizing. However, basically, there is the need for forming a magnetic field, which is caused by a magnetic field provided from the exterior, in the cylinders or the like made of the superconducting composites. To that end, if the aforementioned cylinders or the like are in a superconducting state, because of a diamagnetism phenomenon which is peculiar to the superconducting properties, it is necessary that the external magnetic field has strength sufficient to such an extent that an occurrence of a diamagnetic phenomenon is prevented in order to from the magnetic field in the cylinders or the like. Thus, although this method has simple constitution, the strength of the external magnetic field should be twice as much as the strength of the magnetizing magnetic field or more. Therefore, this method cannot be adopted from the points of view of cost effectiveness.

In accordance with the present invention, an area, which extends in the longitudinal direction of the cylinder constituted by the superconducting multilayer composite and has a narrow width in the direction perpendicular to the circumference of the transverse section of the cylinder, is heated. Thus, the properties of the heated part is changed from the superconducting properties to the normal conducting properties. Thereby, a current flowing in the circumferential direction of the cylinder is interrupted, so that a phenomenon, by which the entire cylinder looks like as if lost the superconducting properties, is caused. Thus, a magnetizing magnetic field generated by an external magnetric field is formed in the cylinder. Thereafter, the part erxhibiting the nomral conducting properties is cooled to a state, in which the part shows the superconducting properties, by stopping heating thereof. During the part is in this state, the strength of the external magnetic field is gradually lowered to zero. In this process, a magnetic flux formed in the cylinder presents a phenomenon by which the magnetic flux maintains the current status thereof in accordance with laws of electromagnetics. Namely, the external magnetic field corresponds to the magnetizing magnetic field in the case of the induction magnetizing. Reduction in the strength of the magnetic field, which corresponds to the lowering of the strength of the external magnetic field, causes a superconducting electric curent flowing in the circumferential direction in the cylinder. This current is concerved as a persistent current. Further, the strength of the magnetic field in the cylinder is conserved. As a resutlt, the cylinder can be utilized as a static-magentic-field generating source. This is not limited to the cylinder but a phenomenon which occurs in the case of employing the disk or the like.

Figure 2:
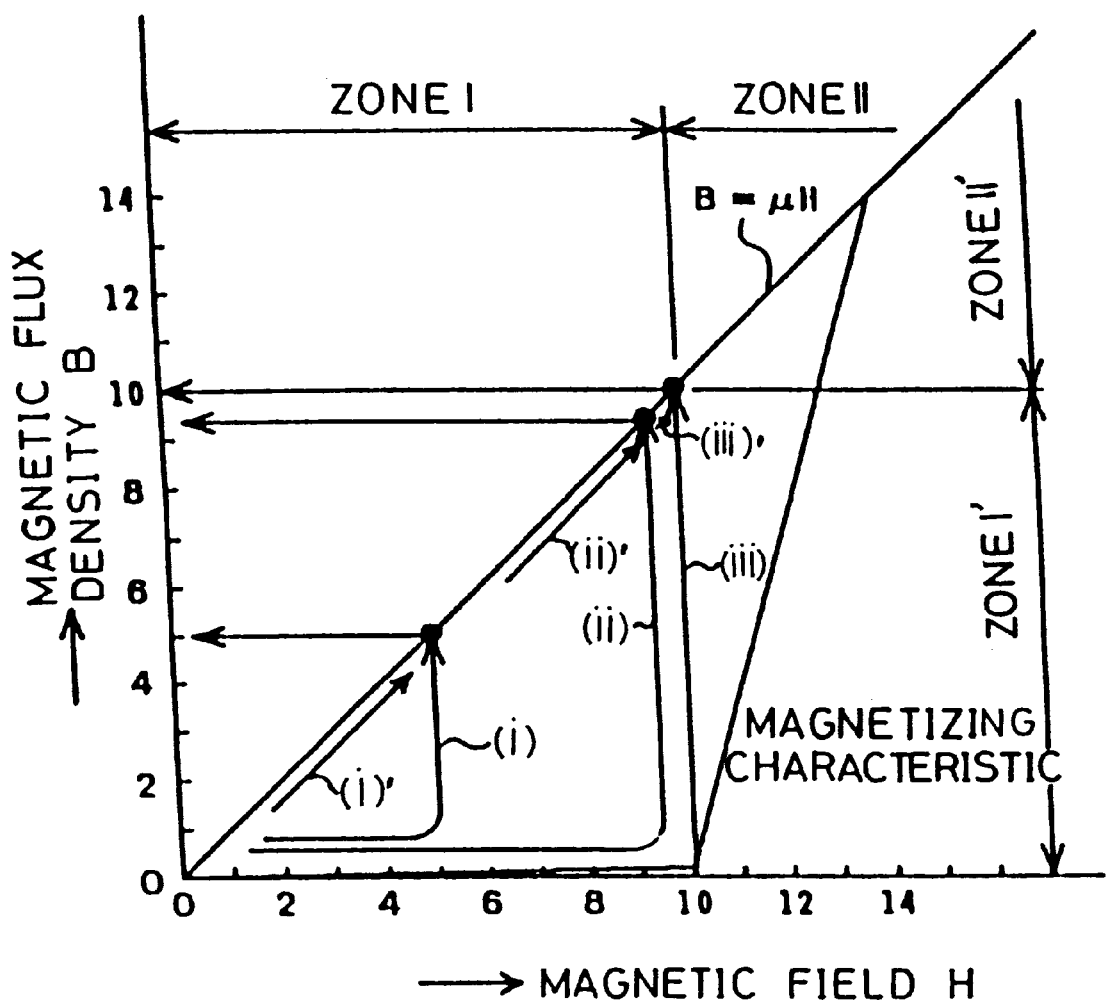
FIG. 2 is a diagram illustrating a range for magnetizing a cylinder constituted by a superconducting multilayer composite, of a magnetization characteristic.

The aforementioned phenomenon will be further described hereinbelow in detail by referring to FIG. 2. FIG. 2 is a diagram illustrating a range in which the cylinder consisting of the superconducting multilayer composite is magentized. In this figure, the axis of abscissa represents the external magnetic field H; and the axis of ordinate th magnetic flux density (magentic field strength) B. The chracterisctic line, which inclines to the axis of abscissa or ordinate 45⁻ designates B=ÊH. Incidentally, Ê denotes magnetic permeability. In this figure, a zone I-I' (namely, in a range where the abscissas are within a zone I; the ordinates are within a zone I' (hereunder, other ranges will be designated similarly)) is a zone to be utilized for magnetization according to the present invention. However, other zones I-II', II-I' and II-II' are not utilized in the present invention, because these zones depend on the magnetizing characteristics of the cylinder and the magnetic field H should be increased wastefully.

In FIG. 2, a zone, whose abscissas representing the external magnetic field H are not more than 10, cannot allow a magnetic flux, which is caused by the external magnetic field, to be introduced in the cylinder if the aforementioned cylinder is not heated. In the case of the present invention, for the purpose of utilizing this zone, a maximum magnetic susceptibility of the cylinder is made to correspond to an abscissa 10 on the axis of abscissas representing the external magnetic field H. This value corresponds to a value obtained by multiplying external magnetic field strength, which corresponds to the abscissa 10, by Ê. Further, FIG. 2 shows examples of cylinder magnetizing routes, each of which includes a procedure for heating the cylinders. In the case of routes (i) or (i)', the magnetization is performed in such a manner that the magnetization value is 50% of the maximum magnetization value. In the case of routes (ii) or (ii)', the magnetization is performed in such a manner that the magnetization value is 95% of the maximum magnetization value. In the case of routes (iii) or (iii)', the magnetization is performed in such a manner that the magnetization value is 100% of the maximum magnetization value. Incidentally, the difference in procedure between a group of the routes (i) to (iii) and another group of the routes (i)' to (iii)' resides in that, in the case of the former group, the cylinder is first put into the superconducting state and next, after the strength of the magnetic field H is raised, the cylinder is brought into the normal conducting state by heating the cylinder, and in that, in the case of the latter group, the cylinder is heated from the beginning, and then, the strength of the magnetic field H is raised during the cylinder is in the nomal conducting state.

The present inventin utilizes the principle of megntization, in which the cylinders of th superconducting multilayer composite are put into the normal conducting state by performing heating thereof, and a magnetic flux caused by an external magnetic field is introduced in to the cylinders, and, thereafter, the cylinders are returned to the superconducting state by stopping heating, and, thus, the introduced magnetic flux is enclosed in the cylinders, and a current for conserving the enclosed magnetic flux is maintained in the cylinders as a persistent current.

Figure 3:
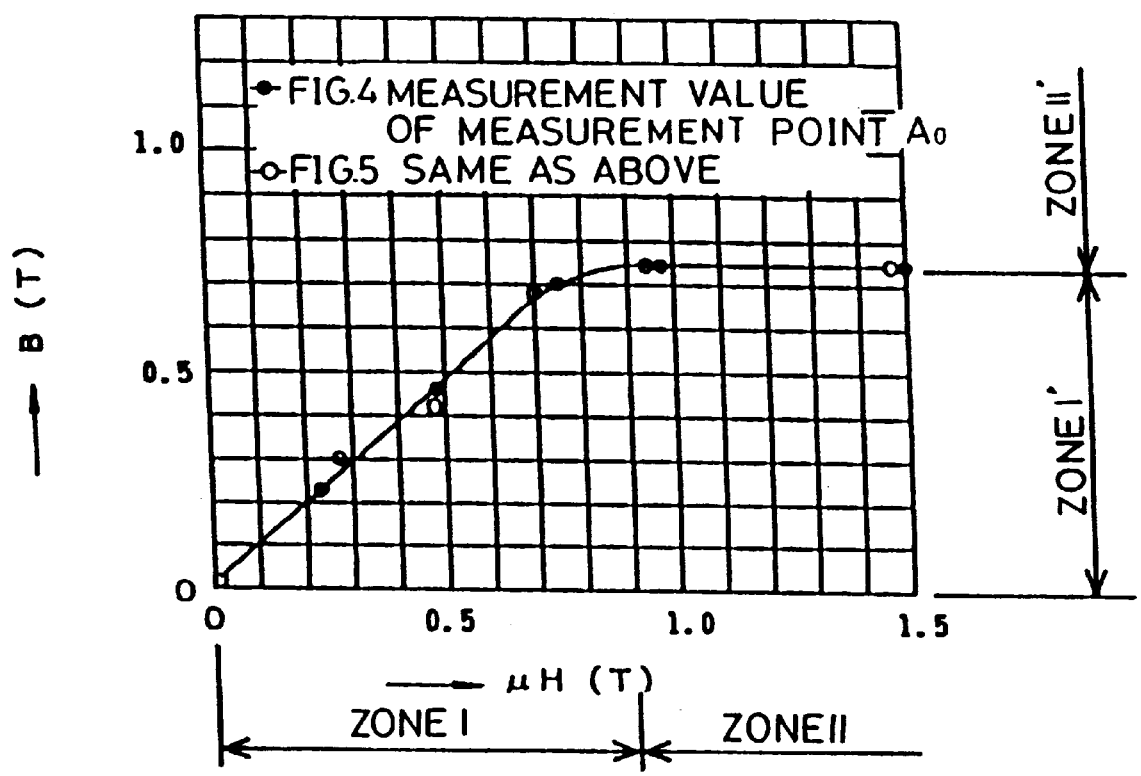
FIG. 3 is a diagram illustrating a result of an experiment in magnetizing a cylinder ML1.
Figure 4:
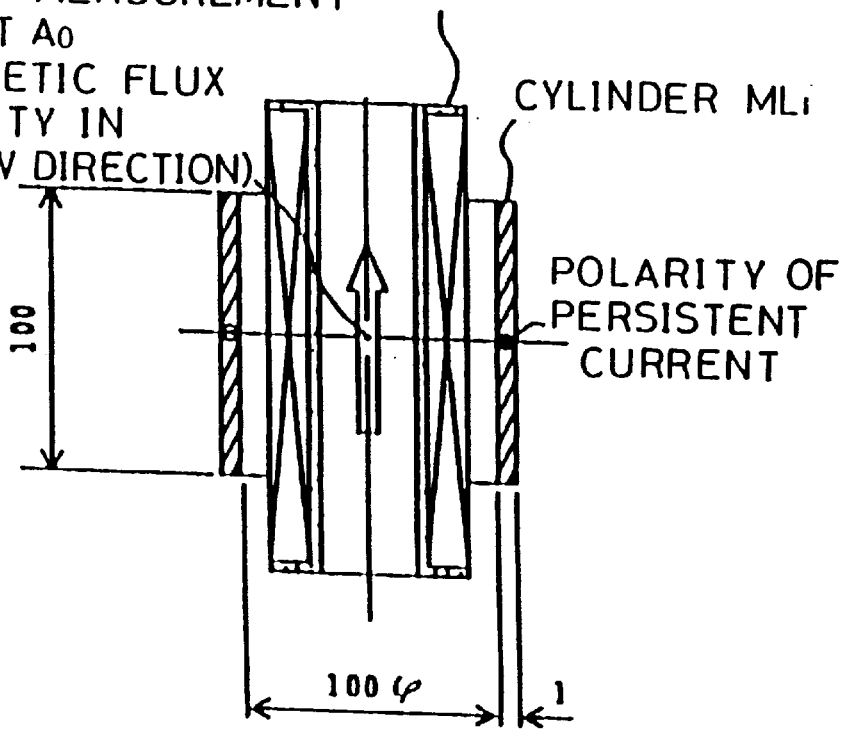
FIG. 4 is a diagram illustrating the placement of a magnetizing coil in the cylinder ML1.
Figure 5:
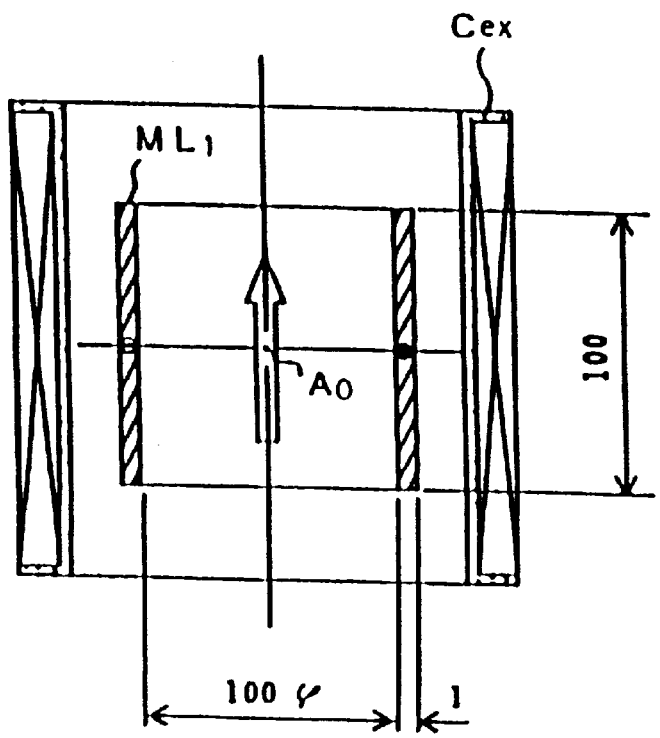
FIG. 5 is a diagram illustrating the placement of a magnetizing coil around the cylinder ML1.

FIGS. 3 to 5 are diagrams illustrating a first example of an experiment on the superconducting multilayer composite. In the case of this experiment, a magnetizing coil is placed outside or inside the cylinder composed of the superconducting multilayer composite. Then, the relation between the magnetizing magnetic field H and the magnetized magnetic flux density B is measured. FIG. 4 is a diagram illustrating the placement of a magnetizing coil Cex inside a cylinder ML1; and FIG. 5 a diagram illustrating the placement of the magnetizing coil Cex outside the cylinder ML1. In the following description, the case of FIG. 4 will be referred to as an internal magnetization; and the case of FIG. 5 referred to as an external magnetization. The cylinders ML1 have the same dimensions, namely, are 100 mm in inside diameter, 100 mm in length, and 1 mm in thickness. A persistent current flows in such a way that the direction of the magnetized magnetic flux is an upward direction. In each of the cases of FIGS. 4 and 5, a heater for heating the cylinder is added to the cylinder ML but is not shown in these figures.

FIG. 3 shows a result of the magnetization. The axis of abscissa represents values obtained by converting the external magnetic field H to the magnetic field strength ÊH in tesla (T); and the axis of ordinate the magnetic flux density B in tesla (T). In FIGS. 4 and 5, a measurement point A0 is the center position of the cylinder ML1. The magnetizing magnetic field was applied in such a manner that the magnetic field strength at the position of the measurement point A0 is ÊH. Upon completion of the magnetization, the conserved value at the position of the measurement point A0 is indicated by the magnetic flux density B on the axis of ordinate. Hereinafter, this value of the density B will be referred to as a magnetization value.

In FIG. 3, data in the case of the internal magnetization illustrated in FIG. 4 are indicated by black circles, while data in the case of the external magnetization illustrated in FIG. 5 are indicated by white circles. In the experiment, the external magnetic field was applied to the cylinder over the zones I and II. The magnetization value B rises linearly in the zone I, whereas the magnetization value B saturates in the zone II.

This experiment revealed that the magnetization was achieved efficiently in the zone I-I', and demonstrated that similar magnetization value B was obtained in each of the cases that the magnetizing coil was placed outside the cylinder ML1 and that the magnetizing coil was placed inside the cylinder ML1. This result is placed as a fundamental phenomenon for forming a superconducting magnet by using a cylinder.

It is not frequent that a superconducting magnet is formed by a single cylinder. If anything, it is frequent that a superconducting magnet is formed by combining a large number of cylinders. Thus, as a second example of an experiment on the superconducting multilayer composite, the case of placing two cylinders in such a manner as to be coaxial with each other, and then magnetizing the cylinders will be described hereinbelow by referring to FIGS. 6 and 7.

Figure 7:
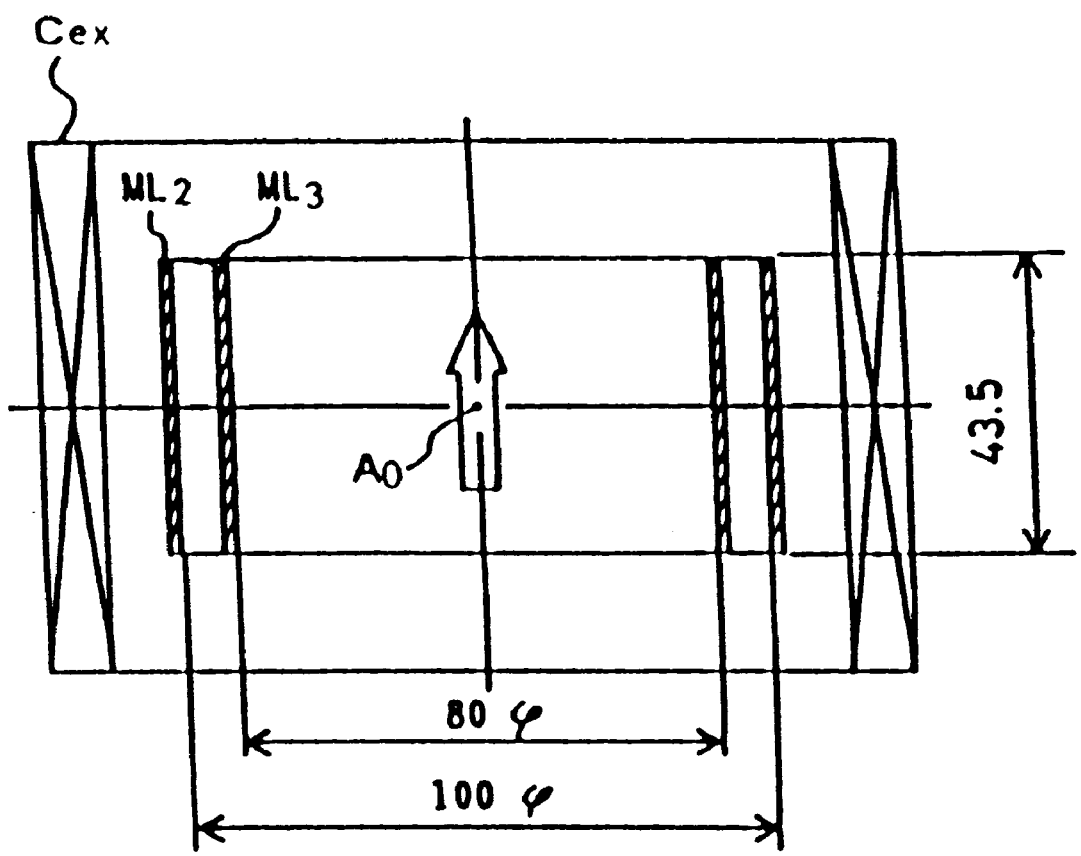
FIG. 7 is a diagram illustrating the placement of the double cylinder and a magnetizing coil.

FIG. 7 shows the placement of a double cylinder, in which two cylinders were disposed in such a manner as to be coaxial with each other, and a magnetizing coil. Namely, a cylinder (hereunder referred to as a large-diameter cylinder) ML2, which was 100 mm in outside diameter and 43.5 mm in length, and another cylinder (hereunder referred to as a small-diameter cylinder) ML3, which was 80 mm in outside diameter and 43.5 mm in length, were placed in such a manner as to be coaxial with each other. Further, a magnetizing coil Cex was placed outside the double cylinder. The magnetic field measurement point A was the center point of the cylinders ML2 and ML3.

Magnetization of the double cylinder was performed in the following two cases, namely, the case (hereunder referred to as the case of collectively magnetizing) that the aforementioned two cylinders were magnetized collectively, and the case (hereunder referred to as the case of separately and individually magnetizing) that the small-diameter cylinder ML3 was first magnetized, and thereafter, the large-diameter cylinder ML2 was magnetized in the same polarity.

Figure 6:
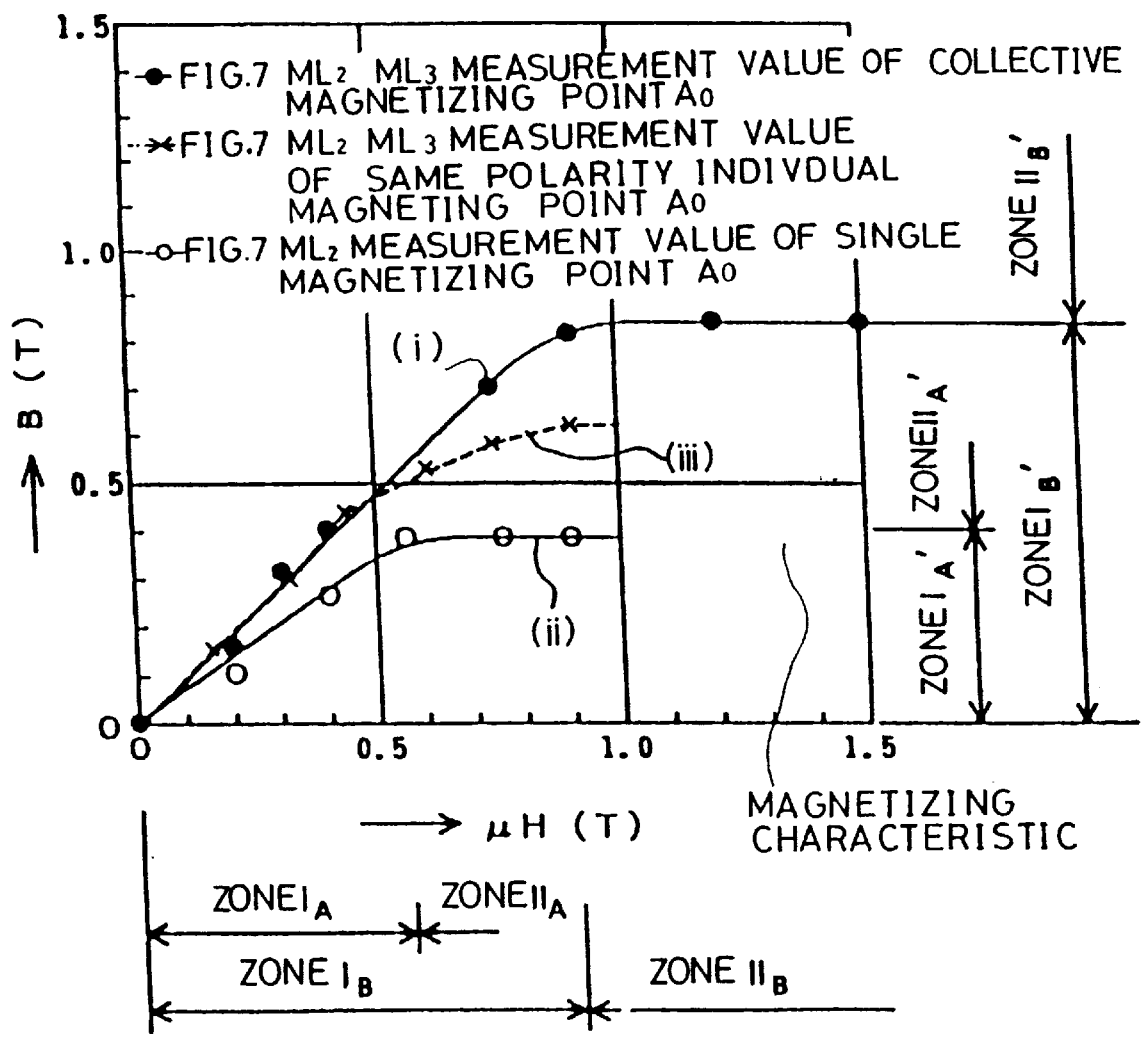
FIG. 6 is a diagram illustrating a result of an experiment in magnetizing a double cylinder.

FIG. 6 shows the magnetization values B obtained by this experiment. The designation by the axis of abscissa and the axis of ordinate is similar to that in the case of FIG. 3. Magnetization values measured at the measurement point A0, which is the center point of the cylinders, are shown in this figure. Measured values in the case of collectively magnetizing are indicated by black circles; the measured values in the case of separately and individually magnetizing are indicated by crosses; and measured values in the case of singly magnetizing of the large-diameter cylinder ML2 are indicated by white circles for comparison thereamong.

As is seen from FIG. 6, the magnetization value B obtained in the case of collectively magnetizing the double cylinder illustrated in FIG. 7 is nearly twice that obtained in the case of singly magnetizing one cylinder. In contrast, the magnetization value B obtained in the case of separately and individually magnetizing the cylinders in same polarity is intermediate between that obtained in the case of collectively magnetizing the double cylinder and that obtained in the case of singly magnetizing one cylinder.

Although the case of singly magnetizing the large-diameter cylinder ML2 is similar to the case illustrated in FIG. 3, the large-diameter cylinder ML2 and the small-diameter cylinder ML3 are magnetized as if a single cylinder, in the case of collectively magnetizing these cylinders. In the case of separately and individually magnetizing these cylinders in same polarity by magnetizing the large-diameter cylinder ML2 after magnetizing the small-diameter cylinder ML3, when magnetizing the large-diameter cylinder ML2, the small-diameter cylinder ML3 had been magnetized. Thus, the magnetizing magnetic flux at the time of magnetizing the large-diameter cylinder ML2 could not penetrate into the small-diameter cylinder ML3. Consequently, magnetic fluxes in an area, which was obtained by subtracting the area of the section of the small-diameter cylinder ML3 from the area of the section of the large-diameter cylinder ML2, was conserved in the large-diameter cylinder ML2.

Therefore, essentially, the measured value of the magnetic field at the measurement point A0 should be equal to that obtained in the case of singly magnetizing the small-diameter cylinder ML3. However, owing to the presence of the magnetic field formed by the magnet fluxes conserved in the large-diameter cylinders ML2, the magnetic fluxes forming the magnetic field in the small-diameter cylinder ML3 are concentrated onto the measurement point A0, which is the center point of the cylinders. As a result, the strength of the magnetic field at the aforementioned measurement point A0 becomes large.

In FIG. 6, divisions, which are provided on the axis of abscissa and the axis of ordinate, for defining the zones are shown. Zones IAIA' and IIAIIA' are established so as to show results of singly magnetizing the small-diameter cylinder ML3. Zones IBIB' and IIBIIB' are established so as to show results of magnetizing two cylinders ML2 and ML3.

It is effective in forming a superconducting magnet, which uses cylinders based on results of this experiment, and for forming a strong magnet to make a multiple cylinder by providing a cylinder over another cylinder, and to increase the transverse section of the cylindrical portion. Further, the area magnetized with a same magnetizing magnetic field value can be increased by separately and individually magnetizing cylinders composing the multiple cylinder. Moreover, the magnetizing magnetic field strength of inner cylinders of the multiple cylinders can be concentrated to center thereof. Thus, it is important to effectively utilize these phenomena.

Figure 8:
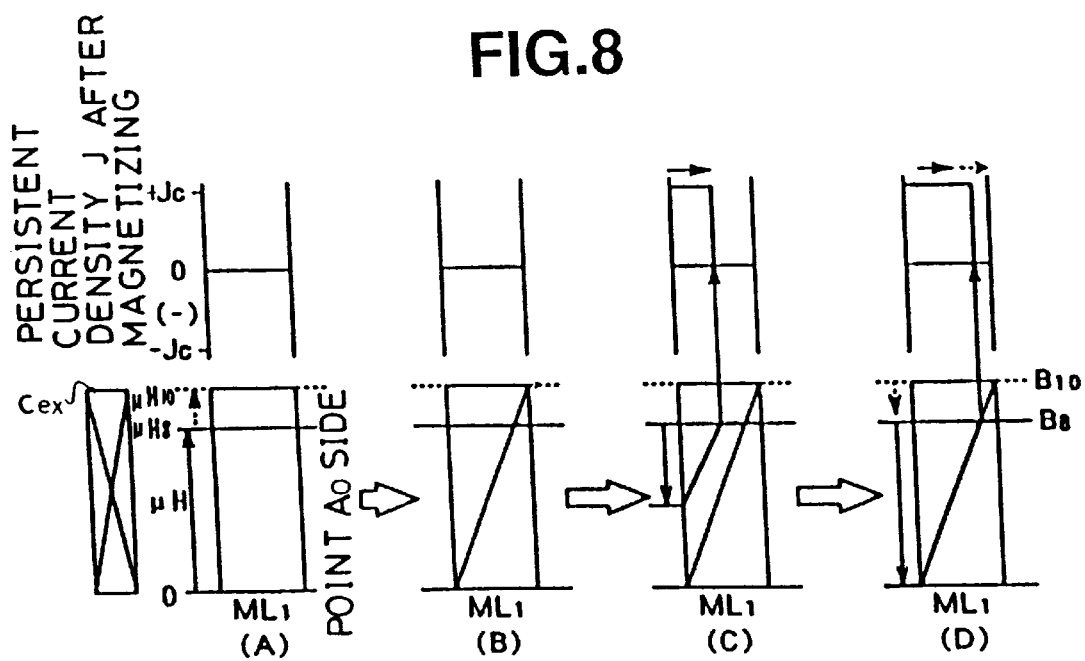
FIG. 8 is a diagram illustrating magnetization according to Bean model in the case of magnetizing one cylinder ML1 singly.

Next, an analysis of the current distribution in the direction of thickness of the cylinder, which is made by using Bean model, will be described by referring to FIGS. 8 to 10. FIG. 8 is a diagram illustrating magnetization in the case of magnetizing one cylinder ML1 singly. First, as shown in FIG. 8(A), the external magnetizing coil Cex is placed outside the outer periphery of the cylinder ML1. Then, an external magnetic field is applied to the cylinder ML1, simultaneously heating thereof. The magnetizing magnetic field $\mu H$ caused by Cex is set at a value which is 80% of the maximum magnetizing magnetic field ($\mu H8$) and is fixed thereat. The magnetizing magnetic field at that time is shown at a lower stage of FIG. 8(A). Persistent current density J of a persistent current flowing through the cylinder ML1 at that time is shown in an upper stage of FIG. 8(A) (hereunder, this is the same with the cases of FIG. 8B or later). As shown in FIG. 8(A), the cylinder ML1 is not magnetized, so that there are no magnetic fluxes distribution and no persistent current distribution.

As shown in FIG. 8(B), the heating of the cylinder ML1 is stopped, simultaneously holding the magnetizing magnetic field of the magnetizing coil Cex at $\mu H8$, so that the state of the cylinder ML1 is changed into the superconducting state. Thus, magnetic flux distribution having a uniform magnetic flux density $\mu H8$ is formed in the cylinder ML1. Hitherto, the cylinder ML1 is not magnetized. Thus, the persistent current is zero after the magnetization.

FIG. 8(C) illustrates a state in which the strength of the external magnetic field is lowered from $\mu H8$ in the state of FIG. 8(B). In the cylinder ML1, an electric current, which is operative to form a magnetic field corresponding to the strength drop of the external magnetic field, flows thereinto from the outer circumferential side of the cylinder ML1 and is present as a persistent current so as to hold the internal magnetic field $\mu H8$. At that time, the persistent current flows therethrough at the critical current density Jc (hereunder, a persistent current flows at the current density Jc).

FIG. 8(D) illustrates a state in which the strength of the external magnetic field further lowers and reaches zero. Thus, a persistent current for holding the internal magnetic field $\mu H8$ is caused and flows in the circumferential direction of the cylinder ML1. Consequently, a sequence of steps of magnetization is completed.

In the case of magnetizing with $\mu H=\mu H8$, the magnetic flux density is B8. Judging from the scale provided along the axis of ordinate, the magnet flux can be further captured. There is a margin by which the persistent current to be caused to flow therethrough can be increased by 20%. However, in the case of magnetizing with $\mu H=\mu H10$, the magnetic flux is B10. Thus, the cylinder ML1 holds the maximum magnetization value. Therefore, persistent currents are present in all regions in the direction of thickness of the cylinder ML1. Consequently, the cylinder comes to have no margin.

Figure 9:
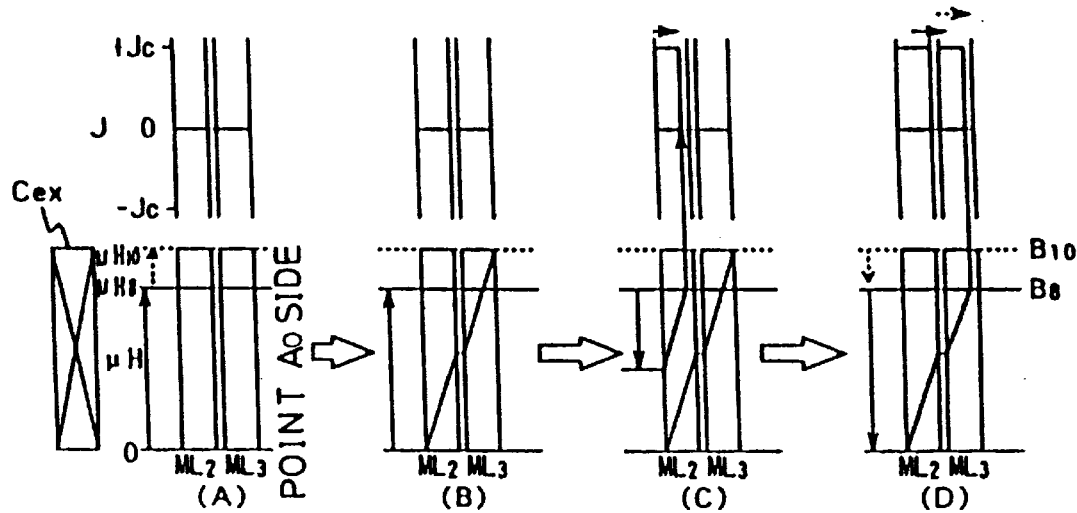
FIG. 9 is a diagram illustrating magnetization according to Bean model in the case of magnetizing two cylinders ML2 and ML3 collectively.

FIG. 9 illustrates the case that two cylinders ML2 and ML3 are collectively magnetized with $\mu H=\mu H8$. The case, in which the difference in outside diameter between the cylinders ML2 and ML3 is not so large, can be treated similarly as in the case of a single cylinder of FIG. 8. In this case, a persistent current comes to be present from the outer circumferential side. Thus, in the case where this cylinder is magnetized with $\mu H=\mu H8$, a margin occurs in the inner circumferential side of the cylinder ML3.

Figure 10:
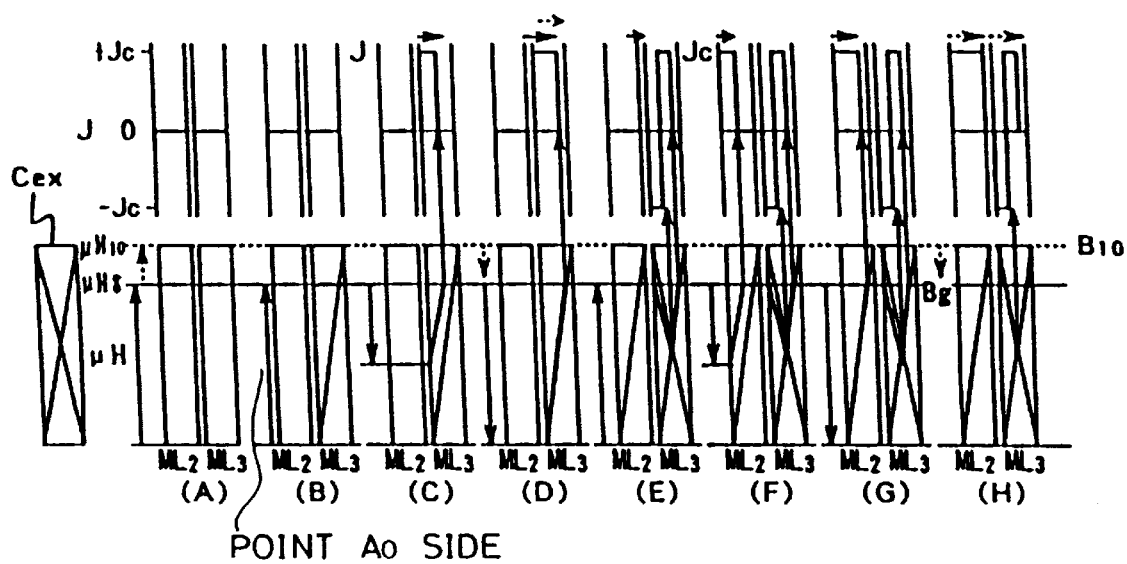
FIG. 10 is a diagram illustrating magnetization according to Bean model in the case of magnetizing two cylinders ML2 and ML3 separately and individually.

FIG. 10 illustrates the case that tow cylinders ML2 and ML3 are separately and individually magnetized with $\mu H=\mu H8$. The inner cylinder ML3 is magnetized in the normal conducting state by heating the outer cylinder ML2. Therefore, the magnetization of this case is the same as the magnetization of a single cylinder as illustrated in FIG. 8. Thus, FIGS. 10(A) to 10(D) illustrate a process in which the inner cylinder ML3 is singly magnetized.

FIGS. 10(E) to 10(G) illustrate a process in which the outer cylinder ML2 is magnetized. When the outer cylinder ML2 is heated upon completion of the magnetization of the inner cylinder ML3, the strength of the magnetizing magnetic field caused by the magnetizing coil Cex is raised to $\mu H8$, the heating o the cylinder ML2 is then stopped. Further, the cylinder ML2 is cooled and is thus brought into the superconducting state. Thus, the cylinders are put into the state of FIG. 10(E). The inner cylinder ML3 also has the outer-circumferential-side magnetic flux density $\mu H8$ while maintaining the inner-circumferential-side magnetic flux density $\mu H8$. Therefore, a persistent current of reverse polarity flows on outer-circumferential-side of the aforesaid cylinder ML3. Consequently, both of the current distribution and the magnetic flux density distribution in the cylinders are complex.

When lowering the strength of the magnetic field caused by the magnetizing coil Cex from $\mu H8$, the magnetic flux density on the outer-circumferential-side of the outer cylinder ML2 drops by that amount. To compensate this density drop, a persistent current for forming a magnetic field corresponding to the aforesaid density drop is induced in the aforesaid cylinder ML2. This persistent current emerges from the outer-circumferential-side of the cylinder ML2. FIG. 10(F) illustrates this state.

When the magnetic field of the magnetizing coil Cex is reduced to zero, the magnetization is completed. FIG. 10(G) illustrates the state at that time. As shown in FIG. 10(G), a margin concerning the distribution of persistent currents occurs on the inner circumferential side of each of the cylinders ML2 and ML3. FIG. 10(H) shows the persistent current distribution and the magnetic flux density distribution in the case of the magnetizing the cylinders to $\mu H=\mu H10$, for the purpose of comparison. In this case, the margin relating to the persistent current disappears. In the case of $\mu H10$, the cylinders are in a state in which no magnetic flux is further captured even if the strength of the magnetizing magnetic field is further raised. Therefore, it can be considered that the magnetizing magnetic field has a maximum value of capturable magnetic flux. Thus, the magnetizing magnetic field of $\mu H10$ can be regarded as a magnetic field corresponding to a magnetization rate of 100%. Hereunder, the magnetization in this case will be referred to as the "magnetization in the case of a magnetization rate of 100%". According to this, for example, in the case of $\mu H8$, the magnetization is referred to as the "magnetization in the case of a magnetization rate of 80%".

To summarize the aforementioned results of the experiments, (1) the margin relating to the persistent current occurs on the inner circumferential side of the cylinders in the case of collectively magnetizing the two cylinders; (2) in the case of collectively magnetizing two cylinders, the difference between diameters of which is small, a phenomenon being similar to that occurring in the case, in which the thickness of one cylinder is increased, is exhibited; (3) when magnetizing two cylinders separately and individually, both of the persistent current distribution and the flux density distribution are entirely different from those in the case of collectively magnetizing two cylinders, respectively, and the margin relating to the persistent current occurs on the inner circumferential side of each of the cylinders; and (4) in the case of a magnetization rate of 100%, there is no margin relating to the persistent current.

As illustrated in the aforesaid FIGS. 8 to 10, if the magnetization is performed, for example, with $\mu H8=B8$ (the magnetization rate is 80%), the margin relating to the persistent current is 20%. This margin for accepting a persistent current enables operations of compensating the attenuation of the magnetic field strength with lapse of time and a variation in the magnetic field distribution caused by this attenuation, and is a condition for generating a superconducting magnet which can maintain a stable magnetic field space for a long time.

Figure 11:
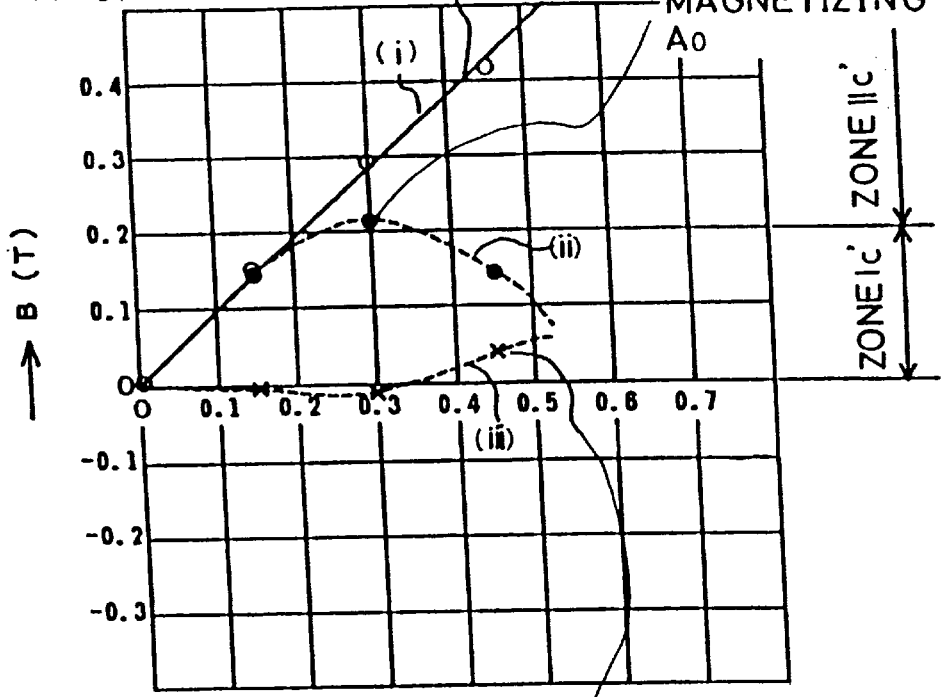
FIG. 11 is a diagram illustrating a result of an experiment in magnetizing a double cylinder in the case of magnetizing an outer cylinder thereof in reverse polarity.
Figure 12:
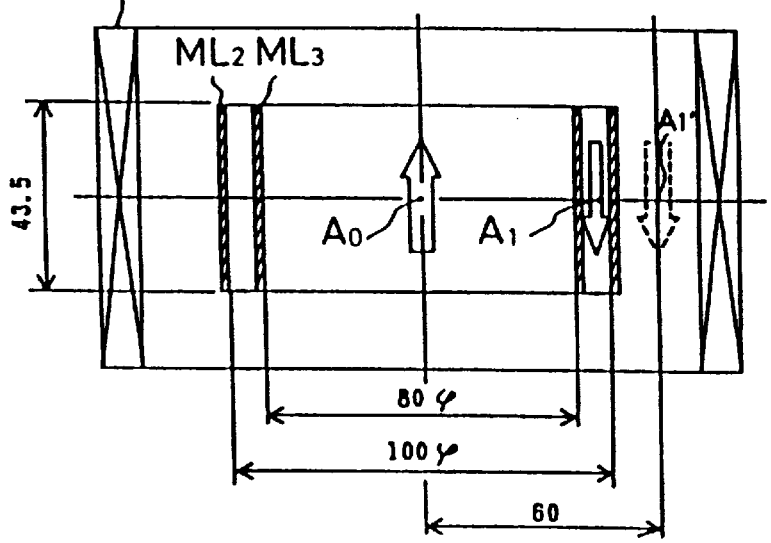
FIG. 12 is a diagram illustrating the placement of the double cylinder and a magnetizing coil in the case of magnetizing the outer cylinder thereof in reverse polarity.

Next, the magnetizing situation checked by experiment in the case, in which two cylinders ML2 and ML3 are magnetized individually and separately and in which the cylinder to be magnetized after the magnetization of the other cylinder is magnetized in reverse polarity, will be described hereinbelow with reference to FIGS. 11 and 12. FIG. 11 shows results of a magnetizing experiment; and FIG. 12 the placement of the cylinders ML2 and ML3 and the magnetizing coil Cex at the time of the magnetization. Cylinder ML3 is set so that the thickness thereof is twice the thickness of the cylinder ML2, for the reason to be described later. Incidentally, the drawing of a heater for heating is omitted in FIG. 12.

Although the placement of the cylinders ML2 and ML3 and the magnetizing coil Cex is similar to that illustrated in FIG. 7, a measurement point is provided at a point A1' on the outer circumference of the cylinder ML2 in addition to the measurement point A0 which is the center point. Measurement point A1' is provided, instead of a point A1 between the cylinders ML2 and ML3, with the intention of assuming the magnetic field strength at this point A1.

In FIG. 11, measured values indicated by whitecircles (corresponding to a characteristic curve (i)) are the magnetic field strength values measured at the measurement point A0 in the case of magnetizing the cylinder ML3 singly; measured values indicated by black circles (corresponding to a characteristic curve (ii)) are the magnetic field strength values measured at the measurement point A0 in the case of separately and individually magnetizing the cylinders in reverse polarity; and measured values indicated by crosses (corresponding to a characteristic curve (iii)) are the magnetic field strength values measured at the measurement point A1' in the case of separately and individually magnetizing the cylinder in reverse polarity. Although the characteristic curves (ii) and (iii) are due to the magnetization in reverse polarity and thus the used zone is located in a range extending to the left from the origin, the characteristic curves (ii) and (iii) are shown by reversing the polarity thereof, for making a comparison between the characteristic curve (i) and each of the characteristic curves (ii) and (iii).

The aforementioned separate and individual magnetization of the cylinders in reverse polarity is to magnetize the outer cylinder ML2 in reverse polarity after the inner cylinder ML3 is first magnetized singly. When magnetizing the cylinder ML3 singly, the magnetization value changes as indicated by the characteristic curve (i). Subsequently, when the cylinder ML2 is magnetized by the magnetizing magnetic field in reverse polarity, the magnetization value changes as indicated by the characteristic curve (ii). As shown in FIG. 11, values measured at the measurement point A0 in the case of using the zone IcIc' first changes along the characteristic curve (i) corresponding to the case of magnetizing the cylinder ML3 singly. As approaching the magnetization rate of 100%, the measured values go away from the characteristic curve (i). Further, in the zone IIc, the state, in which the cylinder ML3 is magnetized, is broken, and characteristics, by which the magnetization value decreases, are exhibited. This can be predicted from the fact that the characteristic curve (iii) representing the values measured at the measurement point A1' rises in the zone IIc.

Incidentally, in the zone Ic in which $\mu H=0.3$ (T) and the magnetization rate is not more than 100%, the values measured at the measurement point A0 are lower than the values on the characteristic curve (i) corresponding to the magnetizing of the cylinder ML3 singly. This phenomenon occurs owing to the facts that a total amount of magnetic fluxes of the magnetizing magnetic field in the cylinder ML3 does not change but the internal magnetic flux distribution in the cylinder ML3 changes under the influence of the magnetic field by which the cylinder ML2 is magnetized in reverse polarity. This is entirely different from the phenomenon of the fall of the value measured at the measurement A0 in the zone IIc.

Figure 13:
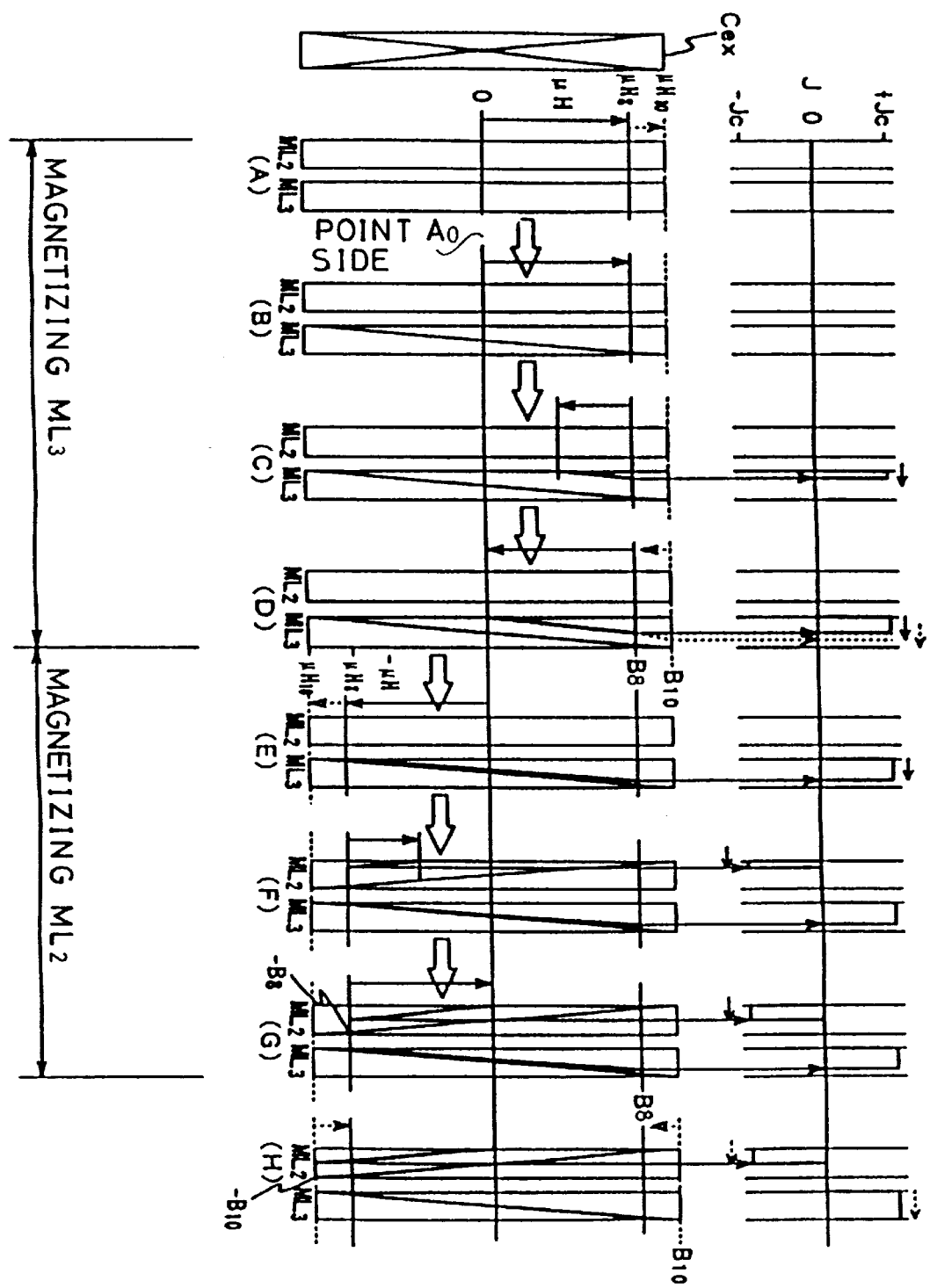
FIG. 13 is a diagram illustrating magnetization according to Bean model in the case of magnetizing the outer cylinder of the double cylinder in reverse polarity.

FIG. 13 illustrates the macroanalysis of the aforesaid experiment by using Bean model. The upper stage of this figure shows the persistent current density distribution in the cylinder, and the lower stage thereof the magnetic flux density distribution therein. FIGS. 13(A) to 13(D) illustrate the process of magnetizing the inner cylinder ML3, and are thus the same as FIGS. 10(A) to 10(D), respectively. Subsequently, as shown in FIG. 13(E), the magnetizing magnetic field is set at $(-\mu H8)$ and the heating of the cylinder ML2 is stopped and the cylinder ML2 is brought into the superconducting state so as to magnetize the cylinder ML3 in reverse polarity. In this state, the magnetic flux of $\mu H8$ is captured in the inside of the cylinder ML3. Further, the magnetic flux of $(\mu H8)$ is captured in a range from the outer circumference of the cylinder ML3 to the inner circumference of the cylinder ML2.

Referring next to FIG. 13(F), there is shown the state during a process in which the strength of the magnetizing magnetic field caused by the magnetizing coil Cex is gradually lower from $(-\mu H8)$ and approaches zero. In this state, a persistent current needed for compensating a magnetic flux corresponding to a change of the magnetizing magnetic field from $(-\mu H8)$ is induced onto the outer circumference side of the cylinder ML2 and is conserved. FIG. 13(G) illustrates the state in which the magnetizing magnetic field of the magnetizing coil Cex is reduced to zero. Thus, the magnetic flux density on the outer circumference of the cylinder ML2 becomes zero, and a persistent current corresponding to a change of the magnetizing magnetic field increased in the cylinder ML2 toward the inner circumference thereof. Thus, the magnetization is completed. The persistent current in the cylinder ML2 in this case changes in connection with the amount of the magnetic flux of the magnetic field captured between the cylinders ML2 and ML3, similarly as in the case of the persistent current for holding the magnetic field captured by the cylinder ML3 therein.

FIG. 13(H) illustrates the magnetic flux density distribution and the persistent current distribution when magnetized with the magnetization rate of 100%. In contrast with the fact that the persistent current flows in all regions of the cylinder ML2 at a current density +Jc, the persistent current flows in 50% of all regions of the cylinder ML3 at a current density (−Jc). It is known from the foregoing description that it is preferable for suitably magnetizing the outer cylinder in a polarity reverse to the polarity of the inner cylinder, to set the thickness of the inner cylinder at a value which is twice the thickness of the outer cylinder.

Figure 14:
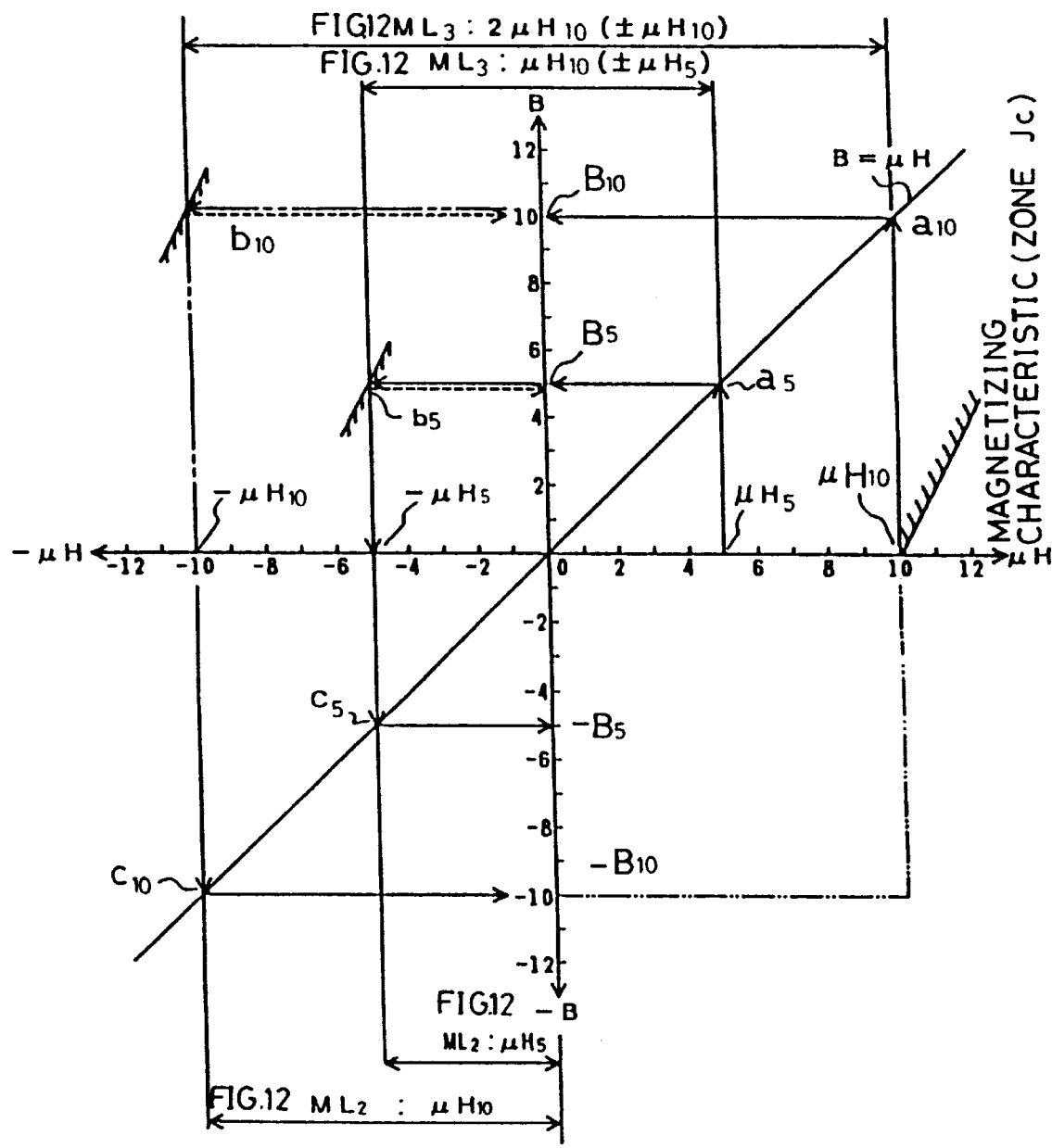
FIG. 14 is a diagram illustrating magnetization according to EH-B characteristics in the case of magnetizing the outer cylinder of the double cylinder in reverse polarity.

The aforementioned operation of magnetizing the cylinder in reverse polarity will be described hereunder by using ÊH-B characteristic diagram illustrated in FIG. 14. In this figure, the axis of abscissa represents the magnetic field $\mu$H generated by the magnetizing coil; the axis of ordinate the magnetic field B in which the cylinders are magnetized.

First, the case of magnetizing the cylinder by the magnetizing magnetic field ÊH5, whose magnetization rate is 50%, will be described hereinbelow. In FIG. 12, first, the inner cylinder ML3 is magnetized by applying the magnetizing magnetic field ÊH5 thereto. At that time, the aforesaid cylinder ML3 is magnetized in such a manner to have the magnetization value B5 through a path from the origin to a point B5 through points ÊH5 and a5 or a path from the origin to a point B5 through a point a5. Subsequently, in the state in which the outer cylinder ML2 is heated, the magnetizing magnetic field is changed to that (−$\mu$H5) in reverse polarity. At that time, the magnetic field provided outside the cylinder ML3 changes from the point B5 to a point b5. Thus, in the case of magnetizing the cylinder ML3 singly, the strength of the magnetizing magnetic field changes from $\mu$H5 to (−$\mu$H5). As a whole, the cylinder undergoes a change of the magnetizing magnetic field corresponding to $\mu$H10, and thus undergoes the magnetization with the magnetization rate of 100%.

Further, the procedure for magnetizing is changed, and the inner circumference of the cylinder ML2 is magnetized in reverse polarity in such a manner as to have a magnetizing magnetic field value (−B5), and the outer circumference of the cylinder ML3 is held at the same magnetization value (−B5), through a path from the point b5 to the point (−B5) through the point (−$\mu$H5) and the point C5. As a result, the inner cylinder ML3 and the outer cylinder ML2 are magnetized in such a way as to have the magnetization value B5 and the magnetization value (−B5), respectively. The inner cylinder ML3 obtains 50% of the magnetization value $\mu$H10 corresponding to the magnetization rate of 100% by changing the magnetizing magnetic field in a range whose width is $\mu$H10. The outer cylinder ML2 has the magnetizing magnetic field value (−$\mu$H5) and thus obtains 50% of the magnetizing magnetic field value by a change in the magnetizing magnetic field, which corresponds to the magnetization rate of 50%. Thus, there is no margin in the inner cylinder ML3. The outer cylinder ML2 is magnetized with the margin of 50%.

Next, the case of magnetizing the cylinder by the magnetizing magnetic field, whose strength is $\mu$H10, with the magnetization rate of 100% will be described hereinbelow. In this case, the cylinder is adapted to be able to respond to a change $\mu$H10 2 in the magnetizing magnetic field, by doubling the thickness of the inner cylinder ML3. First, when magnetizing the cylinder ML3 by applying the magnetizing magnetic field, whose strength is $\mu$H10 (the magnetization rate of 100%), thereto, the cylinder ML3 is magnetized to the magnetization value B10 through a path from the origin thereto through a point ÊH10 and a point a10, or a path from the origin thereto through the point a10. Subsequently, when magnetizing the outer cylinder ML2, the strength of the magnetizing magnetic field is changed to ($\mu$H10) and then returned to zero. Thus, the outer cylinder ML2 is magnetized to the magnetization value (−B10) (the magnetization value at the time of magnetizing the cylinder in reverse polarity with the magnetization rate of 100%) through a path from the point B10 to a point (−B10) through a point B10. As a consequence, both of the cylinders ML2 and ML3 can obtain the magnetization value corresponding to the magnetization rate of 100%. At that time, the inner cylinder ML3 undergoes a change $\mu$H10 2 in the magnetizing magnetic field. However, there is caused no problem in the magnetization, because the thickness thereof has been doubled.

To summarize the aforementioned phenomena, when magnetizing two cylinders individually, one of the cylinders can be magnetized in reverse polarity which is opposite to the polarity of the other cylinder. This magnetization in reverse polarity is very important for reducing the size of the magnet and increasing the magnetic homogeneity and has a utility value in constituting a superconducting magnet which uses cylinders.

In the foregoing description, the fundamental phenomena for magnetization have been described on the basis of results of experiments on samples. Next, a basic operation will be described hereunder by mainly describing the regulating of the magnetization value after magnetized.

Figure 15:
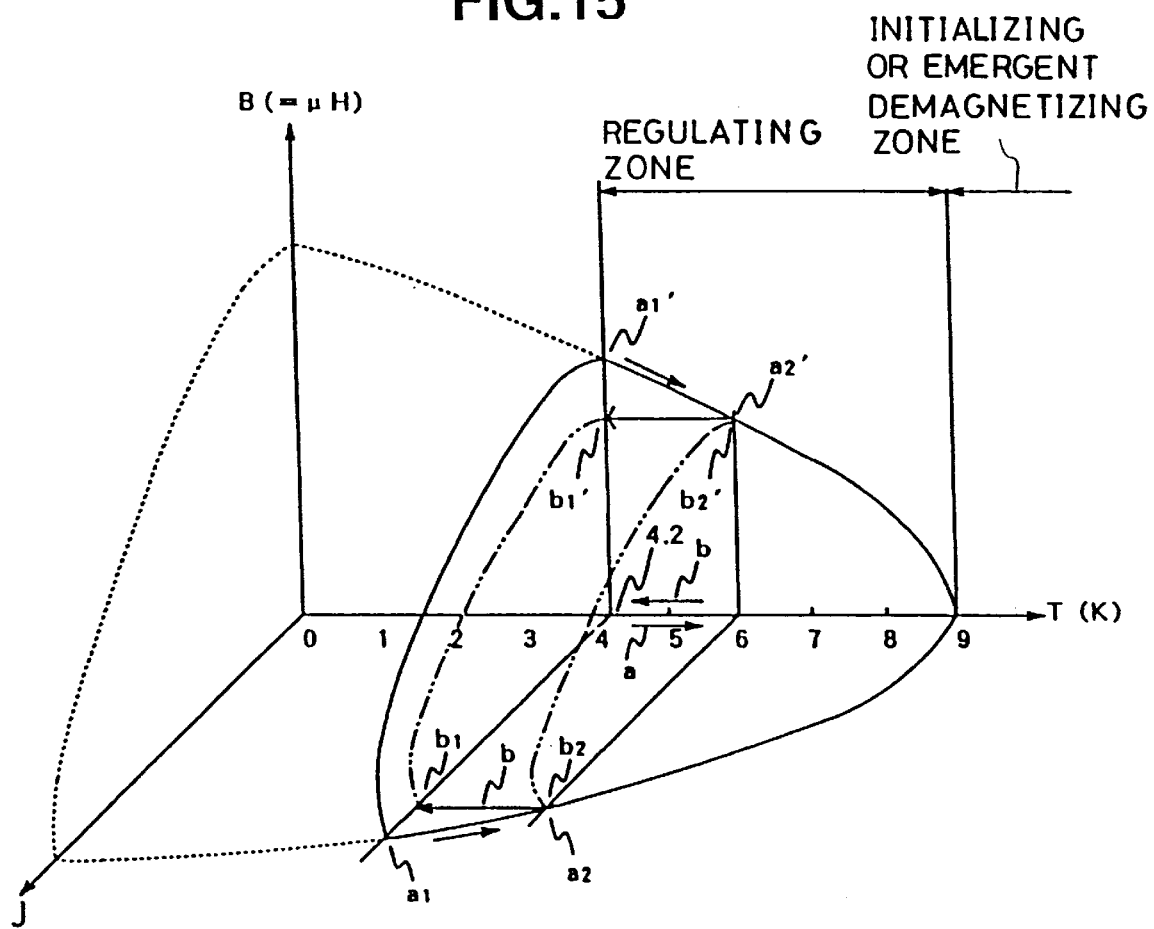
FIG. 15 is a diagram illustrating a diagram illustrating the correlation among temperature/magnetic-field-strength/persistent-current-density characteristics of NbTi.

When considering superconducting properties, a temperature T (K), a magnetic field strength ($\mu$H) and a persistent current density (J) are regarded as fundamental data and the superconducting properties are considered on the basis of the relation among these fundamental data. FIG. 15 illustrates the relation among these three data in the case of a superconducting wire NbTi (see "Superconductivity Engineering", Chapter 4, FIG. 4.1, p.68, edited by Japanese Institute of Electrical Engineers). In the case that NbTi is used by being immersed in liquid helium and being further cooled, it is said that a temperature T of 4.2 (K) is the lowest temperature, and that a temperature of 9 (K) is a limit value at which this material can operate with superconducting properties. Thus, a temperature zone, in which the magnetized magnetic field is demagnetized in an initialization process before the magnetization, or by operating an emergent demagnetization device for securing safety, is $T \geq 9$ (K).

Further, a regulating temperature range at the time of regulating the magnetization value upon completion of the magnetization is $4.2 \leq T \leq 9$ (K). For example, in the case that after magnetizing cylinders collectively, this collective magnetization value is regulated, if initially magnetized at T=4.2 (K), the maximum value of the persistent current density J is a1 and the maximum value of the magnetic field strength B is a1'. Then, as a result of regulating the temperature of the material by being heated, the persistent current density J changes from a1 to a2, and the magnetic field strength changes from a1' to a2' in the directions of arrows. Symbols a2 and a2' are replaced with symbols b2 and b2', respectively. Next, when the heating of this material is stopped and the temperature T of the material is returned to 4.2 (K) by cooling the material, each characteristic value changes in the direction of a corresponding arrow b. Thus, the magnetic field strength B changes from b2' to b1', and the persistent current density J varies from b2 to b1. As a result, a regulating operation is completed in a state in which the magnetizing magnetic field B is changed from a1' to b1' and a persistent current density J for causing magnetic fluxes of this magnetic field is changed from a1 to b1. Namely, b1' is a desired value of the magnetization value. Further, the width between a1' and b1' and the width between a1 and b1 are values of the margin. Incidentally, the points b1 and b1' move in parallel with the axis of the temperature T.

Figure 16:
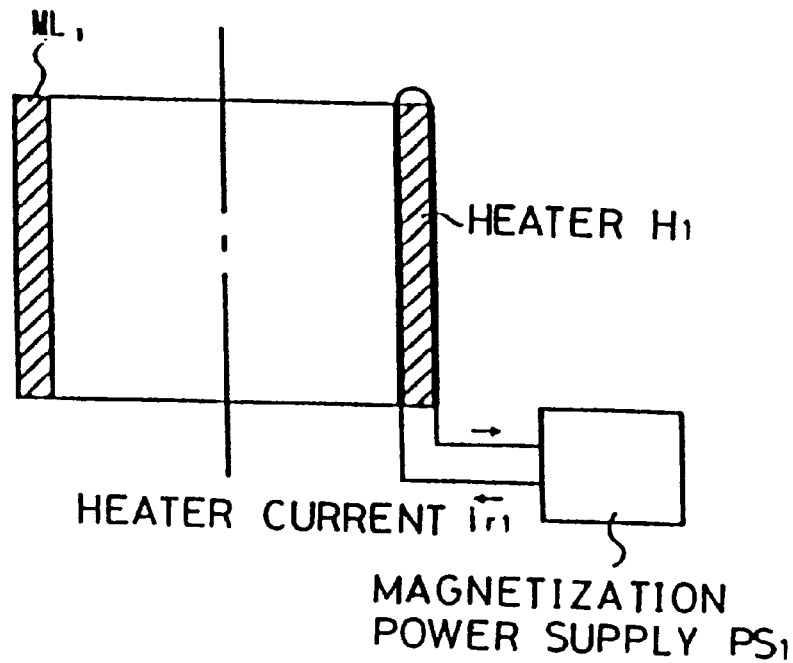
FIG. 16 is a diagram illustrating a method of regulating the temperature of a cylinder in the case that the number of cylinder is 1.
Figure 17:
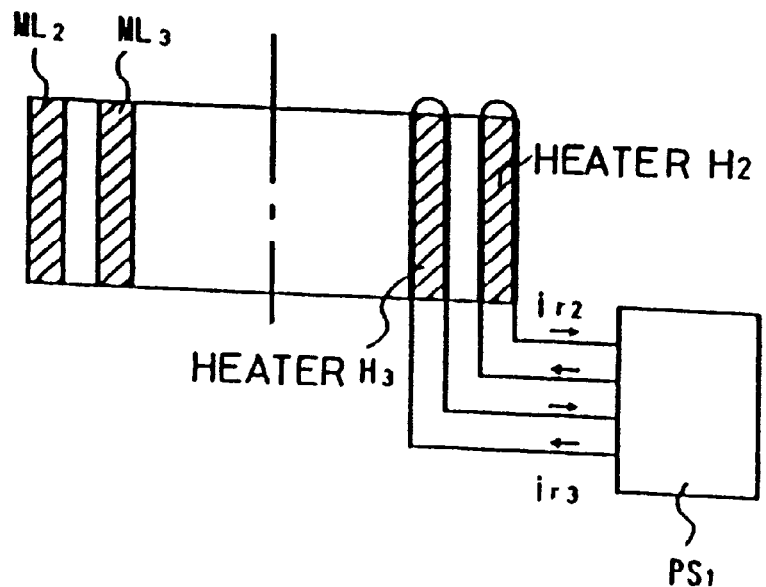
FIG. 17 is a diagram illustrating a method of regulating the temperature of cylinders in the case that the number of cylinders is 2.

Next, the manner of regulating the temperature of the cylinder will be described by referring to FIGS. 16 and 17. FIG. 16 illustrates the case that the number of cylinders is 1. FIG. 17 illustrates the case that the number of cylinders is 2. As shown in FIG. 16, a heater H1 is placed on the surface of the cylinder ML1. The heater H1 is placed nearly in parallel with the center axis of the cylinder ML1 and on the inner and outer circumferential surfaces in the same direction as viewed from the center axis, and is connected to a magnetization power supply PS1. When heated, a direct current ir1 is introduced thereto. In the case of FIG. 17, heaters H2 and H3 are placed on the surfaces of two cylinders ML2 and ML3, respectively. The heaters H2 and H3 are placed nearly in parallel with the center axes of the cylinders ML2 and ML3, respectively, similarly as the heater used in the case of mangnetizing a single cylinder, and are connected to the magnetization power supply PS1 individually. When heated, the heaters are controlled in such a manner that direct currents ir2 and ir3 are introduced thereto, respectively.

The regulation of magnetization of the cylinder is performed by heating a part of the cylinder lineraly by means of the heater. If the temperature T of the part of the cylinder is set as T≧9 (K), a persistent current flowing in the circumferential direction of the cylinder can be interrupted. Further, if the temperature T of the part of the cylinder is held within a range 4.2≦T≦9 (K), the density J of the persistent current flowing in the circumferential direction of the cylinder can be adjusted to a value corresponding to the aforesaid temperature T. The temperature of the part of each of the cylinders ML1, ML2 and ML3 is changed by suitably controlling the direct currents ir1, ir2 and ir3 to be introduced to the heaters H1, H2 and H3 in accordance with such a principle. Thereby, the density J of the persistent current flowing through each of the cylinders ML1, ML2 and ML3 is changed. As a result, the magnetization value of each of the cylinders ML1, ML2 and ML3 is regulated. At that time, the direct currents ir1, ir2 and ir3 are respectively supplied to the heaters H1, H2 and H3 as controlled values by means of the magnetization power supply Ps1.

Next, the procedure for magnetizing a single cylinder will be described hereunder. FIG. 18 is a time chart illustrating the procedure for regulating the magnetization of the single cylinder ML1. The procedure for regulating the magnetization is composed of initialization, magnetization and regulation of the magnetization value to be performed in this order. As the magnetization value, a final value after the magnetization thereof is obtained. In this figure, (X1) represents the state of the temperature rising of the cylinder ML1 by the heater H1 of FIG. 16; (X2) the state of the magnetizing magnet field caused by the magnetizing coil Cex; and (X3) the state of the magnetic density to which the cylinder ML1 is magnetized. Incidentally, "t" denotes time in FIG. 18.

First, the heater H1 is turned on at a point a of FIG. 18(X1). Thus, the temperature of the cylinder ML1 is raised. Then, at a point b, the heater H1 is turned off and the cylinder ML1 is cooled. Thus, the initialization of the cylinder ML1 is finished. Subsequently, the magnetizing magnetic field ÊH is increased by letting an exciting current flow through the magnetizing coil Cex at a point c of FIG. 18(X2). Further, the heater H1 of FIG. 18(X1) is turned on halfway the increase in the magnetizing magnetic field ÊH. Thus, the temperature of the cylinder ML1 is raised. Thereafter, the heater H1 is turned off at a point e of FIG. 18(X1), which corresponds to a point d where the magnetizing magnetic field ÊH reaches a maximum value. Moreover, the cylinder ML1 is cooled, and the temperature thereof is returned to a reference temperature (see a point f). The magnetizing current for the magnetizing coil Cex is gradually lowered from a point g (the magnetizing magnetic field ÊH reaches the maximum value) of FIG. 18(X2), which corresponds to the point f of FIG. 18(X1), to zero until reaches a point i. During that, the magnetization value of the cylinder ML1 of FIG. 18(X3) gradually rises from a point h and reaches the magnetization value B at a point j corresponding to the point i of FIG. 18(X2). Thus, the magnetization is completed.

In the magnetization, the cylinder is magnetized in such a way as to have the magnetization value B at which there is a little margin. Thereafter, the magnetization value is regulated in such a manner as to have a desired value. In the regulation of the magnetization, the heater H1 is turned on at one point of FIG. 18(X1) after the magnetization. Thus the heating of the cylinder ML1 is started, and the temperature thereof is gradually raised. By this heating, the magnetization value B of FIG. 18(X3) is gradually lowered from the point k, so that the heating of the heater H1 is continued until a point m at which the desired magnetization value B' is obtained. As a result, at a point n of FIG. 18(X3), the desired magnetization value B' is obtained. Thus, the regulation of the magnetization is completed.

Next, the procedure for magnetizing two cylinders will be described hereinafter. FIG. 19 is a time chart illustrating the procedure for regulating the magnetization of the coaxial two cylinders ML2 and ML3. The procedure for regulating the magnetization is composed of the initialization, the magnetization and the regulation of the magnetization value to be performed in this order, similarly as in the case of magnetizing a single cylinder. Incidentally, the case, at which the inner cylinder ML3 is magnetized similarly as in the case of FIG. 18, but the outer cylinder ML2 is magnetized in reverse polarity, will be described hereinbelow (the case, in which two cylinders are collectively magnetized, is similar to the aforementioned case of magnetizing a single cylinder, and thus the description thereof is omitted). In FIGS. 19(X1), 19(X2) and 19(X3), the axis of abscissa, and the axis of ordinate are similar to those of FIG. 18. Additionally, in FIGS. 19(X2) and 19(X3), a reverse-polarity range is used.

First, the heaters H2 and H3 are turned on at a point a of FIG. 19(X1). Thus, the temperatures of the cylinders ML2 and ML3 are raised. Then, at a point b, the heaters H2 and H3 are turned off and the cylinders Ml2 and ML3 are cooled. Thus, the initialization of the cylinders ML2 and ML3 is finished. Subsequently, the magnetizing magnetic field ÊH is increased in the positive direction by letting an exciting current flow through the magnetizing coil Cex at a point c of FIG. 19(X2). Further, the heaters H2 and H3 of FIG. 19(X1) are turned on halfway the rise of the strength of the magnetizing magnetic field ÊH. Thus, the temperatures of the cylinders ML2 and ML3 are raised. Thereafter, only the heaters H3 is turned off at a point e of FIG. 19(X1), which corresponds to a point d where the magnetizing magnetic field $\mu$H reaches a maximum value. Moreover, the cylinder ML3 is cooled, and the temperature thereof is returned to a reference temperature (see a point f). The magnetizing magnetic field by the magnetizing coil Cex is gradually lowered from a point g of FIG. 19(X2), which corresponds to the point f of FIG. 19(X1), to zero until reaches a point i. During that, the magnetization value of the cylinder ML3 of FIG. 19(X3) gradually rises from a point h and reaches the magnetization value B at a point j corresponding to the point i of FIG. 19(X2). Thus, the magnetization of the cylinder ML3 is completed.

Subsequently with the aforementioned process, the polarity of the magnetizing magnetic field generated by the magnetizing coil Cex of FIG. 19(X2) is reversed. Then, this magnetizing magnetic field is changed to (-$\mu$H), starting from a point e' ($\mu$H=0). The heating of the heater H2 is stopped from a point e' of FIG. 19(X1) corresponding to the point d' at which the magnetizing magnetic field caused by the magnetizing coil Cex reaches (-$\mu$H), and thus the temperature of the cylinder ML2 is returned to the reference temperature (a point f'). Thereafter, the magnetizing magnetic field caused by the magnetizing coil Cex is gradually returned to zero (a point i') from a point g' corresponding to the point f' of FIG. 19(X1). With this change in the magnetizing magnetic field, the magnetization value of the cylinder ML2 changes from zero at a point h' to (-B) at a point j. Thus, the cylinder ML2 is magnetized in such a manner as to have the magnetization value (-B). Thus, the magnetization of the cylinders ML2 and ML3 is completed.

The regulation of the magnetization value is performed similarly as in the case of magnetizing a single cylinder. Upon completion of the magnetization, the heaters H2 and H3 are turned on at one point of FIG. 19(X1) corresponding to the points k and k', and thus the heating is commenced, and the temperatures of the cylinders ML2 and ML3 are gradually raised. By this heating, the magnetization values B and (-B) of FIG. 19(X3) are gradually lowered from the points k and k' and thus the heating by the heaters H2 and H3 are continued to a point m at which the desired magnetization values B' and (-B') are obtained. As a result, the desired magnetization values B' and (-B') are obtained at points n and n' of FIG. 19(X3). Thus, the regulation of the magnetization value is completed.

In the foregoing descriptions of FIGS. 16 to 19, important matters for the superconducting magnet apparatus are as follows: (1) the mounting of heater to the cylinder should be performed by attaching the heaters in a line in the longitudinal direction of the cylinder, which is perpendicular to the circumferential surface of the cylinder, as illustrated in FIGS. 16 and 17 so that a temperature control current to be introduced to the heater, which should be a direct current, flows through the same reciprocating line on the inner and outer circumferential surface of the cylinder and should not affect the cylinder; (2) the steps of the initialization to the regulation of the magnetization value of the procedure should be performed in the order according to the time charts of FIGS. 18 and 19 in principle.

Figure 20:
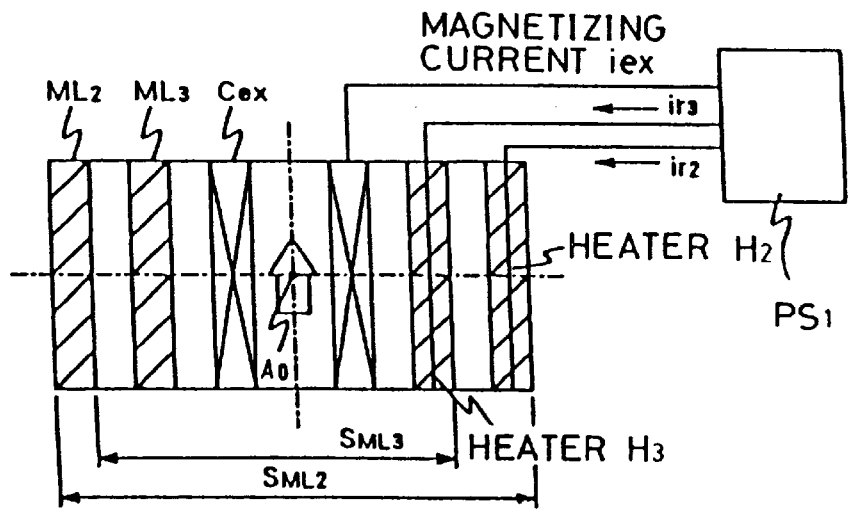
FIG. 20 is a diagram showing the placement of two cylinders ML2 and ML3, which are employed as samples magnetized by a repetitive magnetization method, a magnetizing coil and a magnetization power supply.
Figure 21:
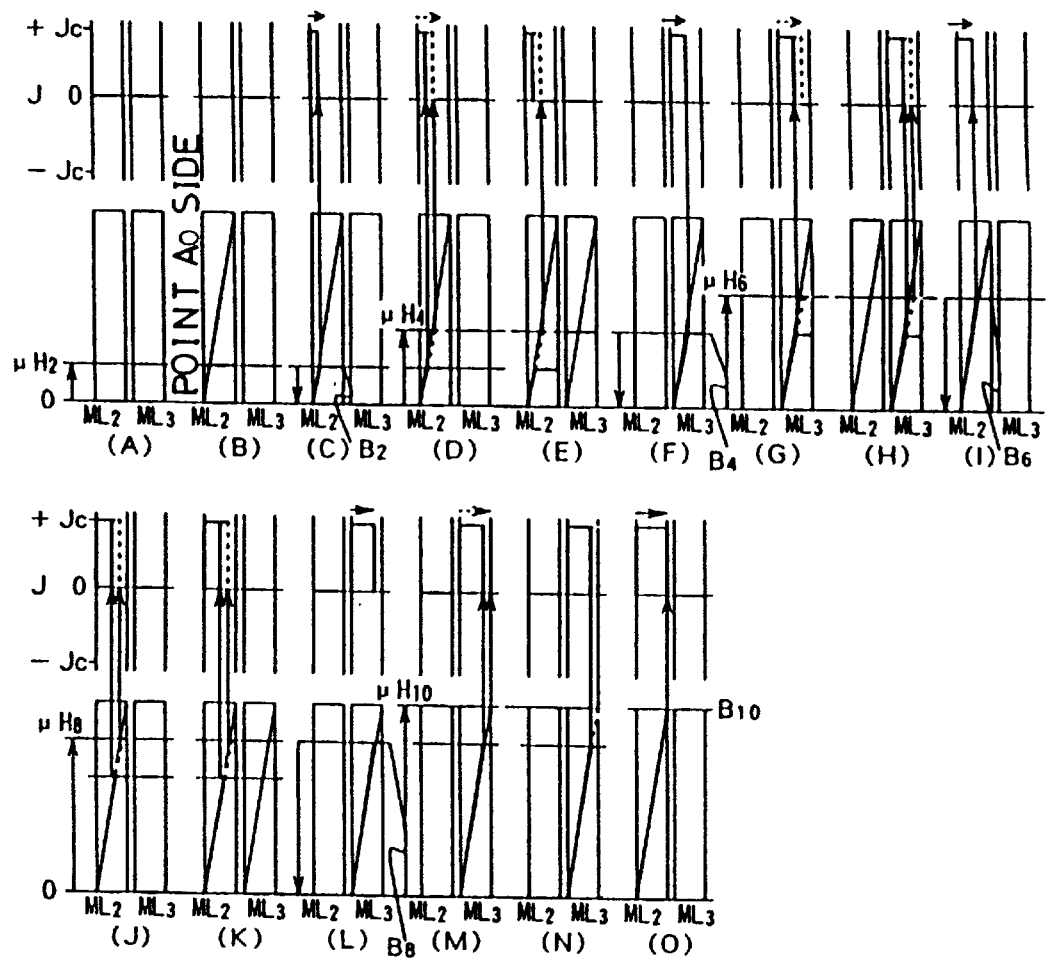
FIG. 21 is a diagram illustrating magnetization according to Bean model in the case of magnetizing two cylinders by the repetitive magnetization method.

Next, a repetitive magnetization method will be described hereinbelow with reference to FIGS. 20 to 22, as a new magnetizing method. FIG. 20 illustrates the placement of two cylinders ML2 and ML3, which serve as magnetizing samples, and a magnetizing coil Cex, and a magnetization power supply PS1. The cylinders ML2 and ML3 are placed in such a manner as to be coaxial with each other, and are different in diameter but have a same thickness. The magnetizing coil Cex is placed in the small-diameter cylinder ML3. Further, the heaters H2 and H3 are mounted in the cylinders ML2 and ML3, respectively. The magnetizing current iex and heater currents ir2 and ir3 are supplied from the magnetization power supply PS1.

In this repetitive magnetization method, if a final magnetizing magnetic field is $\mu$H10 (=B10), the magnetizing magnetic field caused by the magnetizing coil Cex is set at (1/n) of $\mu$H10. This magnetizing magnetic field is applied to the cylinders ML2 and ML3 n times, repeatedly. Thus, finally, one of the cylinders is magnetized in such a manner as to have the magnetization value ÊH10.

Next, a magnetizing operation according to the aforementioned repetitive magnetization method will be described by using Bean model diagram of FIG. 21 and a time chart of FIG. 22. Referring first to Bean model diagram of FIG. 21, after the cylinders ML2 and ML3 are initialized (a point a to a point b in FIG. 22(X1)), the strength of the magnetizing magnetic field generated by the magnetizing coil Cex is raised by $\mu$H2, that is (⅕) of the total strength $\mu$H10 of the magnetizing magnetic field as illustrated in FIG. 21(A). Thereafter, only the heating of the cylinder ML2 by means of the heater H2 is stopped. Then, the cylinder ML2 is cooled. Subsequently, as illustrated in FIG. 21(B), the magnetizing magnetic field $\mu$H2 is applied to the cylinder ML2 in such a manner as to penetrate there through (a point b through a point e to a point f in FIG. 22(Xi); and a point c through a point d to a point g in FIG. 22(X2)).

Next, as shown in FIG. 21(C), the magnetizin current iex for the magnetizing coil Cex is lowerd, so that the strength of the magnetizing magnetic field $\mu$H2 is gradually lowered. Thus, the magnetization value of the cylinder ML2 is obtained (a point f to a point i' in FIG. 22(X2); and a point c through a point d to a point g in FIG. 22(X3)).

Next, to raise the strength of the magnetizing magnetic field to ÊH4, the strength of the magnetizing magnetic field caused by the magnetizig coil Cex is raised by $\mu$H2 as illustrated in FIG. 21(D). Then, the magnetic field strength $\mu$H4 in the cylinder ML2 is obtained by adding the magnetization value B2 ($\mu$H2) of the cylinder ML2 to the magnetzing magnetic field $\mu$H2 caused by the magnetizing coil Cex, namely, $\mu$H2(ML2)+$\mu$H2(Cex)=$\mu$H4. Thereafter, the heating of the cylinder ML3 by means of the heater H3 is sotpped and then the cylinder ML3 is cooled (a point m to a point n in FIG. 22(X1); a point k through a point I to a point o in FIG. 22(X2); and a point i through a point j to a point p in FIG. 22(X3)). Then, the magnetizing magnetic field $\mu$H4 penetrates through the cylinder ML3 as illustrated in FIG. 21(E). Further, the cylinder ML2 is heated, and thus the magnetizing magnetic field ÊH2(ML2) due to the cylinder ML2 is gradually lowered to zero. Thereafter, the magnetizing magnetic field $\mu$H2(Cex) caused by the magnetizing coil Cex is gradually lowered to zero. Consequently, as illustrated in FIG. 21(F), the cylinder ML3 obtains the magnetization value B4 (a point m to a point s in FIG. 22(X1); a point o to a point r in FIG. 22(X2); a point p to a point t in FIG. 22(X3); and a point q to a point u in FIG. 22(X4)).

By following a procedure similar to the herein- abovementioned one, the cylinder ML2 obtains the magnetization value B6 as illustrated in FIG. 21(I). The magnetizing magnet field ÊH6 at that time is obtained by adding the magnetization value B4 ($\mu$H4) of the cylinder ML3 to the magnetizing magnetic field $\mu$H2 caused by the magnetizing coil Cex, namely, obtained from $\mu$H6=$\mu$H4(ML3)+$\mu$H2(Cex).

Moreover, by following another procedure similar to the herein-above-mentioned one, the cylinder ML3 obtains the magnetization value B8 in FIG. 21(L). Furthermore, the cylinder ML2 obtains the magnetization value B10 in FIG. 21(O). The magnetizing magnetic fields $\mu$H8 and $\mu$H10 at that time are obtained by: $\mu$H8=$\mu$H6(ML2)+$\mu$H2(Cex); and $\mu$H10=$\mu$H8(ML3)+$\mu$H2(Cex), respectively.

As a result of performing the aforementioned operations, the repetitive magnetization of the cylinders ML2 and ML3 is completed. Thus, the magnetization is finished in the state in which the cylinder ML2 obtains the magnetization value B10, and the cylinder ML3 is penetrated with the magnetization value B10. The persistent current density J in the cylinders varies in response to a sequence of these operations as illustrated in the upper stages of FIGS. 21 (A) to 21(O).

Next, the aforementioned operation will be described hereinbelow by referring to a time chart of FIG. 22. The heaters H2 and H3 are turned on at a point a of FIG. 22(X1). Thus, the temperatures of the cylinders ML2 and ML3 are raised. Then, at a point b, the heaters H2 and H3 are turned off and the heating of the cylinders is stopped. At a point c of FIG. 22(X2), which corresponds to a point b of FIG. 22(X1), the magnetizing coil Cex is energized to thereby raise the strength of the magnetizing magnetic field to $\mu$H2. Simultaneously, at a point a' (not shown) of FIG. 22(X1), the heaters H2 and H3 are also turned on to thereby heat the cylinders ML2 and ML3. Then, at a point e of FIG. 22(X1), which corresponds to a point d of FIG. 22(X2) where the magnetizing magnetic field $\mu$H reaches $\mu$H2, only the heating of the cylinder by means of the heater H2 is stopped and the cylinder ML2 is cooled (a point f). The magnetizing magnetic field $\mu$H2 is gradually lowerd to zero (a point i') from a point g of FIG. 22(X2) corresponding to a point f of FIG. 22(X1). With the lowering of this magneitc field $\mu$H2, the magnetization value B of the cylinder ML2 rises from a point h to a point i in FIG. 22(X3), so that the cylinder ML2 is magnetized in such a way as to have the magnetization value B2. Thus, the magnetizing of the cylinder ML2 is finished.

Subsequently, the magnetizing magnetic field $\mu$H caused by the magnetizing coil Cex is raised to $\mu$H2 again (a point k to a point l), from a point k of FIG. 22(X2), which corresponds to a point j of FIG. 22(X3) upon completion of the magnetization of the cylinder ML2. At that time, the magnetizing magnetic field becomes $\mu$H4 as a result of adding $\mu$H2(Cex) to $\mu$H2(ML2) ($\mu$H4=$\mu$H2(ML2)+$\mu$H2(Cex)). Then, the heating of the cylinder by means of the heater H3 is stopped at one point m of FIG. 22(X1), which corresponds to a point of FIG. 22(X2), and then the cylinder ML3 is cooled ( a point n). At a point q of FIG. 22(X4), which corresponds to the point n of FIG. 22(X1), the magnetization of the cylinder ML3 is commenced. The magnetization of the cylinder ML3 is performed by the magnetizing magnetic field $\mu$H2(Cex) caused by the magnetizing coil Cex and the magnetization value B2 (=$\mu$H2) of the cylinder ML2. The heating of the cylinder by means of the heater H2 is started from the point n of FIG. 22(X1), and the temperature thereof is raised to a point s by simultaneously controlling the temperature thereof. Thus, the magnetization value B2 of the cylinder ML2 is gradually lowered from a point p to a point t as illustrated in FIG. 22(X3). Concurrently with this, the magnetizing magnetic field $\mu$H2 due to the magnetizing coil Cex is gradually lowered from a point o to a point r in FIG. 22(X2). The magnetization value of the cylinder ML3 of FIG. 22(X4) rises from a point q to a point u by performing such a control operation.

Finally, the magnetization value B4 (=$\mu$H2(Cex+B2(ML2))) is obtained. Thus, the magnetization of the cylinder ML3, which obtains the magnetization value B4, is completed.

Figure 22:
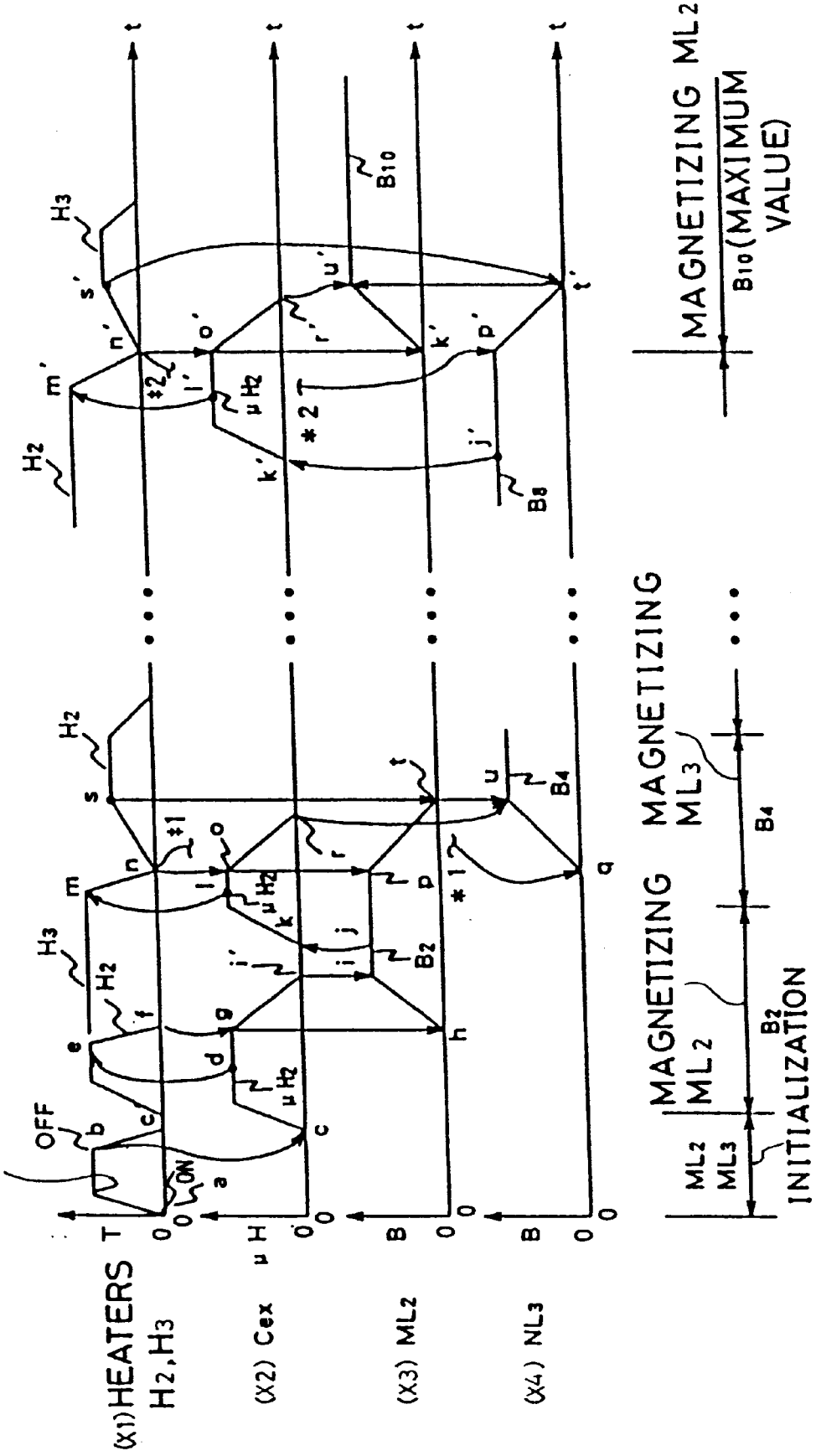
FIG. 22 is a time chart illustrating a procedure for the regulation of magnetization of two cylinders according to the repetitive magnetization method.

In the foregoing description, it has been described that a control operation from the point o to the point r in FIG. 22(X2) and another control operation from the point p to the point t are performed, simultaneously with each other. The present invention is not limited thereto. For example, the control operation from the point o to the point r may be performed earlier, and thereafter, the control operation from the point p to the point t may be performed. Alternatively, these control operations may be performed in reverse order. Further, the control time periods corresponding to these control operations may be somewhat shifted and may be partly overlapped. However, it is important that the control operations should be performed within an allowable range of the characteristics of the cylinders.

By repeatedly performing the aforementioned operations, the cylinder ML2 first obtains the magnetization value B6, and then the cylinder ML3 obtains the magnetization value B8. Subsequently, the cylinder ML2 obtains another magnetization value B10. Thus, the cylinder ML2 can finally obtain the magnetization value B10.

Incidentally, in this repetitive magnetization method, three cylinders may be provided. Moreover, four or more cylinders may be provided therein. Moreover, any cylinder may obtain a desired magnetization value (similarly, a plurality of cylinders may obtain desired magnetization values) by suitably determining a procedure for performing magnetization.

Furthermore, this repetitive magnetization method has the following advantageous effects for the entire superconducting magnet apparatus. Namely, the magnetizing magnetic field caused by the magnetizing coil can be set at (1/n) of the maximum magnetization value. Thus, the maximum output of the magnetizing coil can be reduced. Moreover, the cylinder ML3 is penetrated at the final stage of the method only by the magnetic flux having magnetic flux density B10. Therefore, the cylinder ML3 may provide a margin against the attenuation of the strength of the magnetic field.

Figure 23:
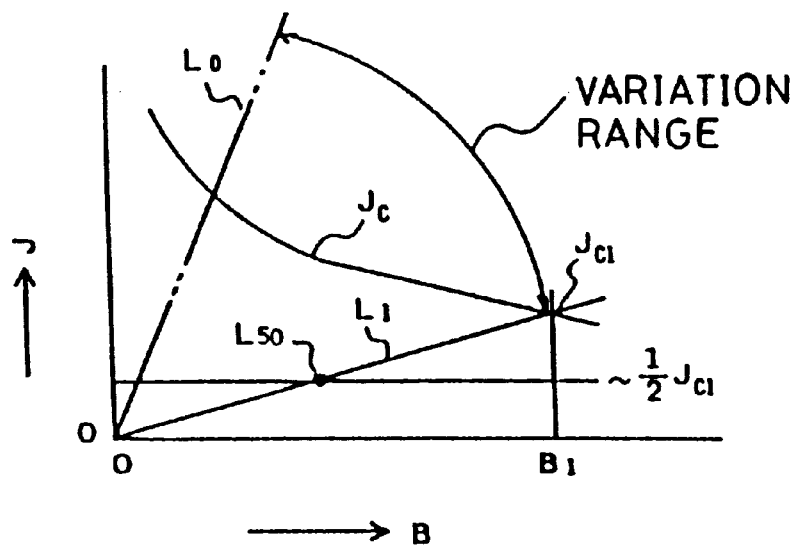
FIG. 23 is a diagram illustrating the relation between B-J characteristic and the load factor of a superconductor.

FIG. 23 shows the relation between the magnetic flux density B of the superconductor and the persistent current density J, which is generally exhibited. In the case that the value of the maximum current density (namely, the critical current density) of electric current, which is allowed to pass through the superconductor, is designated by Jc, a curve representing the relation between Jc and B is illustrated in this figure. As the strength of the magnetic field B increases, the maximum persistent current density Jc decreases. In the case of using the superconducting wire, for example, at the magnetic density value B1, a characteristic line L1 connecting the origin 0 with a point Jc1, which has a value of Jc corresponding to B1, is referred to as a load characteristic. The superconducting wire is used on condition that the persistent current value is (1/2)Jc1 at a point corresponding to a load factor of 50% (L50). Namely, the number of turns of a coil corresponding to necessary strength of a magnetic field is determined on the assumption that a persistent current, whose density is (1/2)Jc1, flows through a coil constituted by a superconducting wire.

Figure 24:
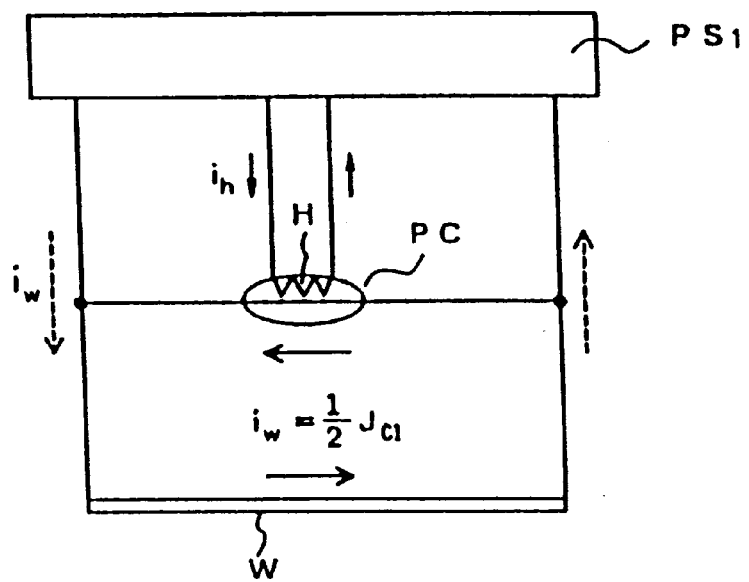
FIG. 24 is a diagram illustrating magnetization in the case of a coil using a conventional superconducting wire.

FIG. 24 shows a primary part of a superconducting magnet apparatus constituted by a combination of a superconducting coil W, a persistent current circuit switch PC and a magnetization power supply PS1. In the apparatus of FIG. 24, an electric current ih is introduced to a heater H of the persistent current circuit switch PC. Thus, the superconducting wire composing this persistent current circuit switch PC is brought into a normal conducting state. Further, a magnetizing current iw is poured into the superconducting coil W from the magnetization power supply PS1. When the current iw=(1/2)Jc1, the rise of the density of the current iw is stopped. Subsequently, a current ih flowing through the heater H of the persistent current circuit switch PC is interrupted. Thus, the state of the superconducting wire of the persistent current circuit switch PC is changed from the normal superconducting state to the superconducting state, so that the current iw flows through the persistent current circuit switch PC. Consequently, a persistent current (iw) flows through the superconducting coil W and is put into a state in which the current (iw) is independent of the magnetization power supply PS1.

In contrast, in the case of the induction magnetizing according to the present invention, the load characteristic curve considerably varies with the magnetic flux density B. For instance, the load characteristic curve varies in the range between L1 to L0 of FIG. 23. Thus, there is a problem how to render such variation of the load characteristic harmless to the superconducting magnet apparatus. Next, a method of solving this problem will be described hereinbelow.

Figure 25:
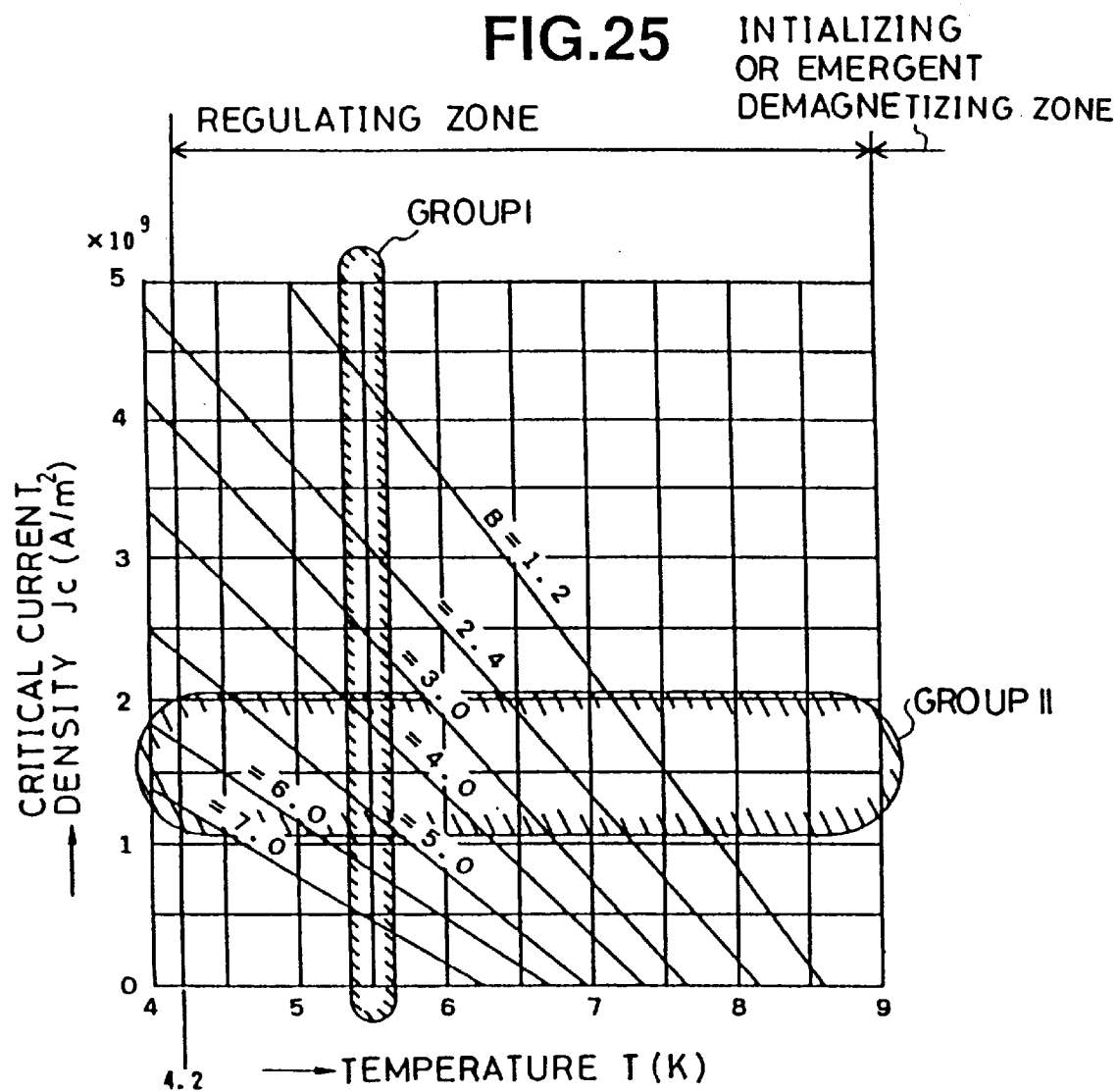
FIG. 25 is a diagram illustrating the relation between the temperature and the critical current density (a maximum value of a persistent current density) of NbTi.

In the foregoing description, regarding two methods of magnetizing cylinders, namely, a method of collectively magnetizing the cylinders, and a method of separately and individually magnetizing the cylinders, the differences in persistent current distribution therebetween have been indicated by using Bean Model (see FIGS. 9 and 10). There is presented a contrivance for solving the aforesaid problem by regulating a magnetization value in accordance with this difference. FIG. 25 shows the relation between the critical current density Jc and the temprature T in a superconductor by using the magnetic field strength B as a parameter (see "Superconductivity Engineering", Chapter 4, FIGS. 4 and 17, p.94, edited by Japanese Institute of Electrical Engineers). In FIG. 25, the axis of abscissa represents the temperature T; and the axis of ordinate the critical current density Jc. The superconductor is NbTi.

As is apparent from FIG. 25, similarly as in the case of FIG. 23, at a same temprature, as the magnetic field strength becomes lower, the critical current density Jc becomes larger. In contrast, as the magnetic field strength becomes higher, the critical current density Jc becomes smaller.

In the case of the superconducting magnet apparatus, which is composed of a plurality of cylinders, a group I of FIG. 25 is suited to a case hat cylinders, which are different in critical current density Jc from one another, are collectively magnetized by the magenitc field having the strength determined by the position and the magnetization value of each of the cylinders. Namely, even in the case that the critical current densities Jc of the cylinders remain differing from one another, the magnetic field can be regulated by heating the cylinder by means of the heater.

Further, the group II is a method of controlling the magnetization by making the critical current density Jc invariant and is suited to the regulation of the magnetic field in the cases that the cylinders are individually magnetized at a constant critical current density, or that the cylinders are divided and then the divided cylinders are individually magnetized at the constat critical current density.

Needless to say, there can be adopted a method of the type that is intermediate between the groups I and II, such as a method of performing the magnetization by changing the magnetization value of each cylinder and regulating the magnetization value in such a manner as to be suitable for the magnetization characteristic thereof even in the case that the cylinders are individually magnetized.

Figure 26:
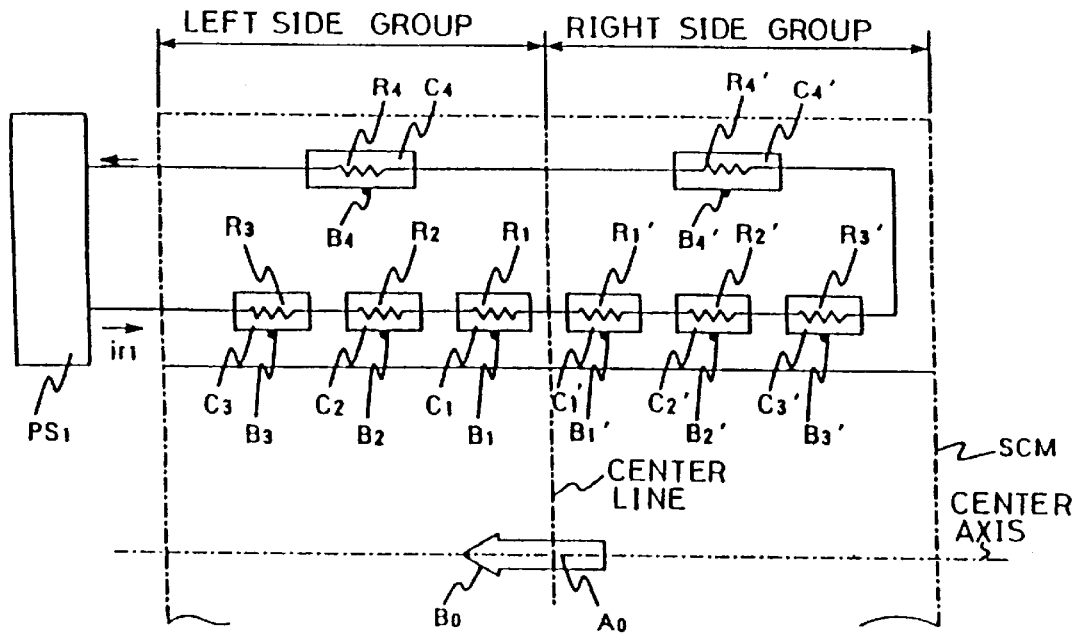
FIG. 26 is a diagram illustrating an example of the configuration of a superconducting magnet apparatus of the horizontal-magnetic-field type using a plurality of cylinders.

FIG. 26 shows a practical example of the configuration of the superconducting magnet apparatus. The superconducting magnet illustrated in FIG. 26 is of the horizontal magnetic field type and is, thus, sysmmetrical with respect to the center axis, namely, an upper half and a lower half thereof are symmetrical with each other with respect thereto, as viewewd in this figure. Therefore, FIG. 26 shows only the upper half thereof. As shown in FIG. 26, cylinders C1 to C4 compose a left-side group cylinder asssembly; and cylinders C1' to C4' compose a right-side group cylinder asssembly. Further, resitors R1 to R4 and resistors R1' to R4' of heaters are mounted in the cylinders C1 to C4 and cylinders C1' to C4', respectively. Thereby, the temperature control operation of the cylinders C1 to C4 and cylinders C1' to C4' is performed. Moreover, the magnetic field strength of the cylinders C1 to C4 and cylinders C1' to C4' are indicated by B1 to B4 and B1' to B4', respectively. The resistors R1 to R4 and R1' to R4' of the heaters are connected in series and are further connected to the magnetization power supply PS1. Therefore, a regulating current ir1 flowing through the heater has a same value for each of the resistors R1 to R4 and R1' to R4'.

Incidentally, for simplicity of description, it is assumed that the cylinders have a same length and a same thickness but are different only in diameter from one another. In such a case, the resistors R1 to R4 and R1' to R4' of the heater have the same resistance R1. Further, the value of the rise in temperature of the heater is determined by the power consumption of the resistors ir12,R1,t (t:heater ON time). Therefore, this apparatus corresponds to the case of the group I. Further, in the case of changing the resitance of each of the resistors R1 to R4 and R1' to R4' and obtaining necessary heating values respectively corresponding to the cylinders, the temperature-rise values vary with the cylinders, so that this case corresponds to the group II or an arbitrary combination of the groups I and II.

Figure 27:
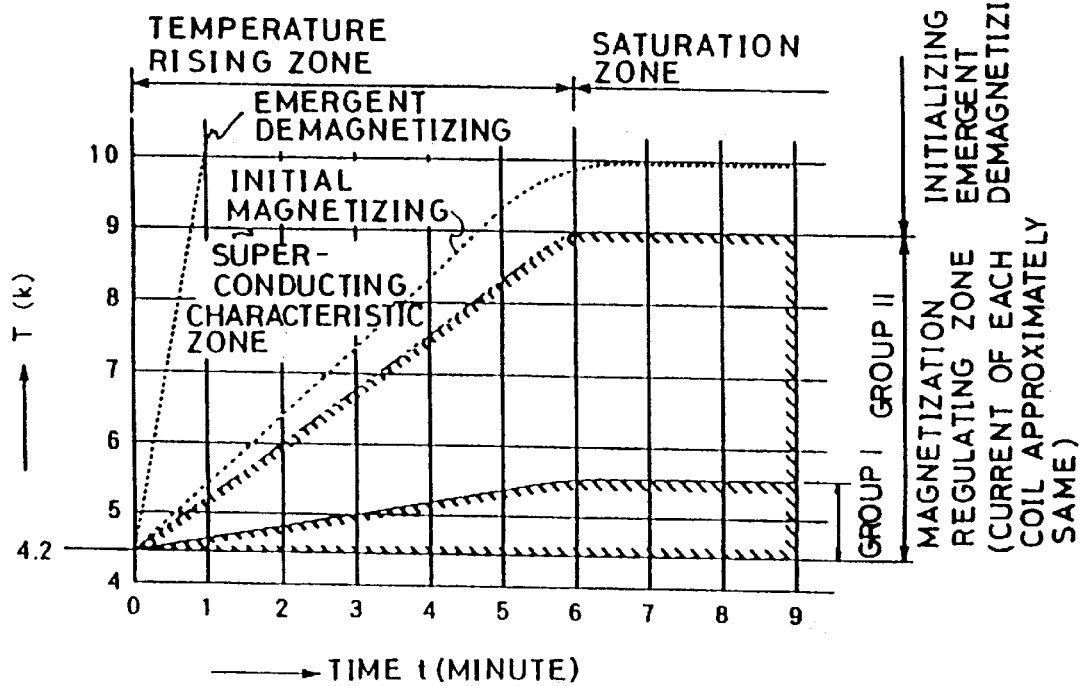
FIG. 27 is a diagram illustrating the relation between the temperature regulating division and the role of a heater.

These groups are illustrated in FIG. 27, in connection with application of the apparatus. The axis of abscissa is roughly divided into a temperature rising zone and a saturation zone, while the axis of ordinate is roughly divided into a magnetization regulating zone and an initialization or emergent demagnetization zone. Group I tends to become a relatively narrow temperature range, if there is a zone in which the strength B of the magnetic field is large. Thus, the magnetization and the resistance of resistors of heaters may have roughly the same value. Consequently, Group I is advantageous in manufacturing superconducting magnet apparatuses.

Meanwhile, in the case of Group II and the arbitrary combination of Groups I and II, although it is troublesome to select the temperature regulating range correspondingly to each of the cylinders, such a method has an advantage in magnetizing the cylinders individually.

Incidentally, examples of characteristics of the initialization and the emergent demagnetization are shown in this figure. Namely, in the case of the emergent demagnetization, an electric current, which is used for controlling the heater so that the temperature is raised to a value at which the magnetic field vanishes about within one minute, is selected as ir1. Further, in the case of the initialization, an electric current, which is used for controlling the heater so that the temperature is raised to a value at which the magnetic field vanishes about within several minute, is selected as ir1.

As above described, in accordance with this contrivance, the aforementioned problem to be resolved by this contrivance can be satisfactorily solved by determining the resistance of the resistors of the heater, which is provided in the temperature regulating device, in connection with the magnetizing conditions.

Figure 28:
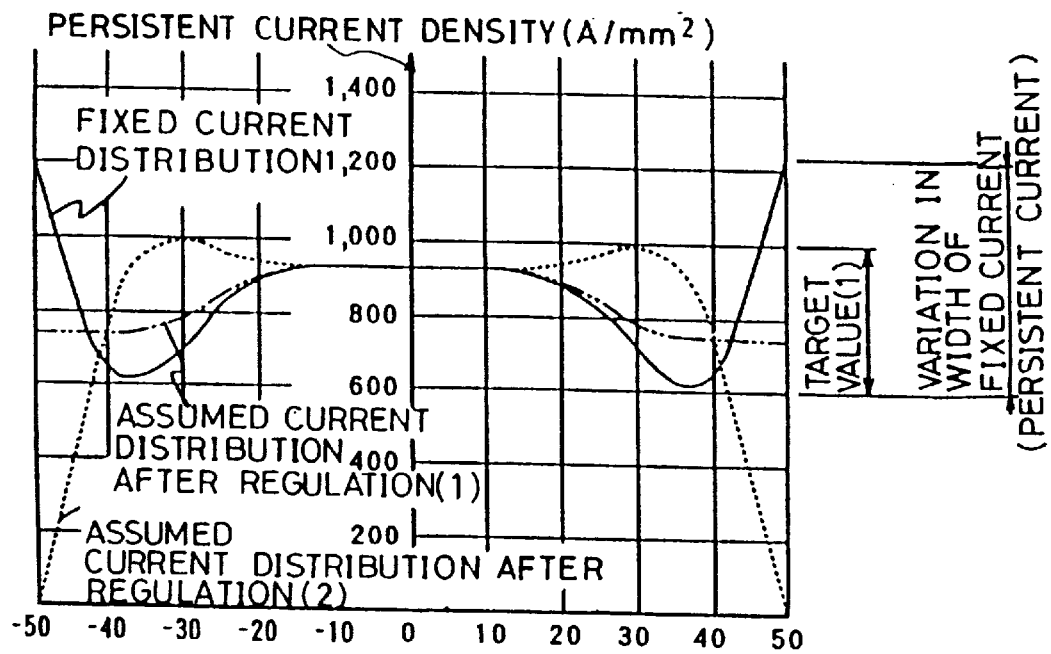
FIG. 28 is a diagram illustrating examples of the magnetizing persistent current distribution in a cylinder and of the regulation.
Figure 29:
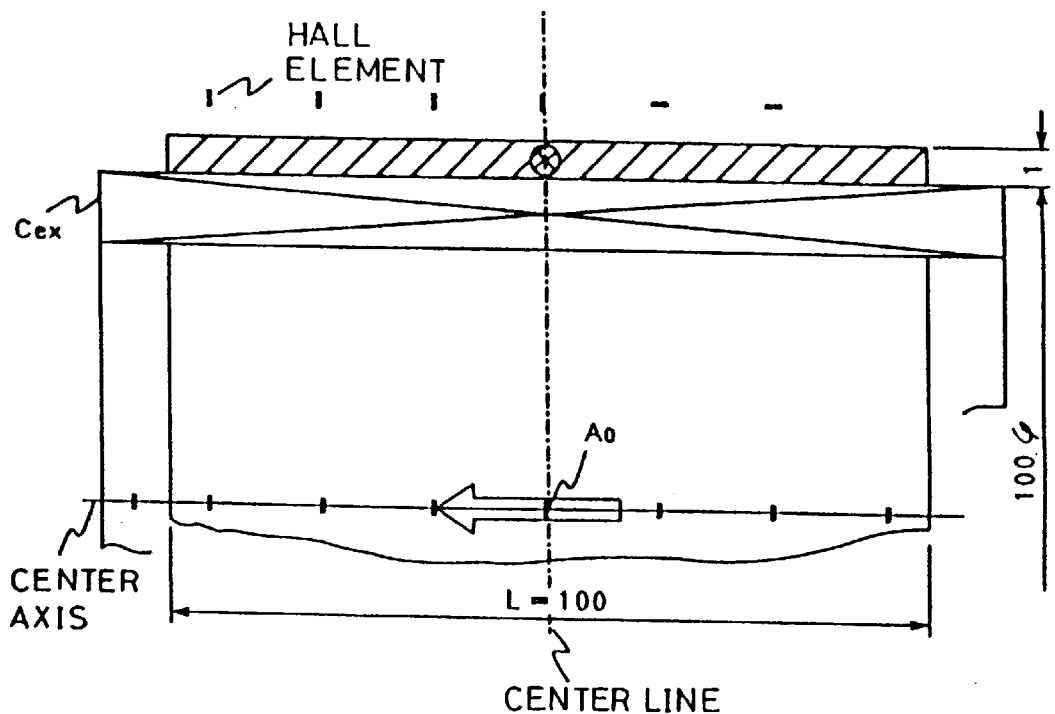
FIG. 29 is a diagram illustrating the placement of a cylinder, a magnetizing coil and a magnetic field detecting device when the magnetizing persistent current distribution in the cylinder is fixed.

Next, the current distribution in a cylinder after magnetized in the case of performing the induction magnetizing thereof will be described hereinbelow. FIG. 29 shows the placement of the cylinder, a magnetizing coil Cex and a magnetic-field detecting device. The cylinder has a total length L of 100 mm and is 100 mm in inside diameter and 1 mm in thickness. FIG. 28 shows the distribution of persistent currents in each part of the cylinder, which is obtained by a calculation from distribution values (measured by using Hall element) of the magnetizing magnetic field in each part thereof. In FIG. 28, the axis of abscissa represents a position along the direction of the center axis of the cylinder; the axis of ordinate the value of a persistent current density of a persistent current at each position, which flows in the circumferential direction of the cylinder. Solid line indicates the identified persistent current density distribution which has high-density portions at the edge portions thereof.

Incidentally, sometimes, edge-portion heaters intended specifically for regulating the magnetization values at the edge portions are added to the cylinder so as to uniform the persistent current density over the entire cylinder, which includes the edge portions, by adjusting the high-density value at these edge portions to a value included in a certain target zone or to a value being lower than a certain value obtained at another position in the cylinder.

The temperature regulated by the heater in this case should be within a range in which the cylinder does not lose the superconducting properties. In the case of the characteristics of the cylinder after regulating the magnetization, following the law that the total sum of the number of magnetic fluxes in a cylinder is constant, the number of magnetic fluxes in the entire cylinder hardly decrease. Thus, a reduction in the magnetic fluxes, which occurs in inner portions respectively being close to both edge portion of the cylinder, is compensated. In FIG. 28, examples of the persistent current distribution after regulating the magnetization are indicated by a two- dot chain line and a dashed line, respectively. The distribution indicated by the two-dot chain line is obtained by slightly lowering the high-density values at the edge portions of the cylinder to thereby reduce the variation width of the persistent current density. In contrast, the distribution indicated by the dashed line is obtained by lowering the high-density values at the edge portions of the cylinder to thereby expand the central uniform current density region.

Figure 30:
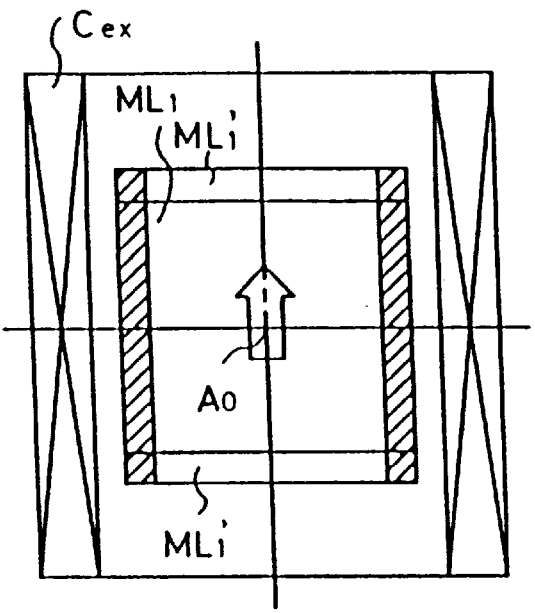
FIG. 30 is a diagram illustrating an example of a case in which a cylinder is divided into cylindrical body and edge portions and cylindrical portions specifically designed to the edge portions are placed at edges of the cylindrical body, respectively.

As an example of the configuration of the cylinder for regulating the temperature at the edge portion thereof with better accuracy, there is devised a configuration in which a cylinder is divided and cylinders for exclusive use at edge portions of the cylinder are attached to the edge portions thereof, respectively. Such cylinders are shown in FIG. 30. At both edge portions of the cylinder ML1, cylinders ML'1 for exclusive use at edge portions are placed at both edge portions thereof. Further, temperature regulating heaters are disposed at these cylinders ML'1, respectively.

Figure 31:
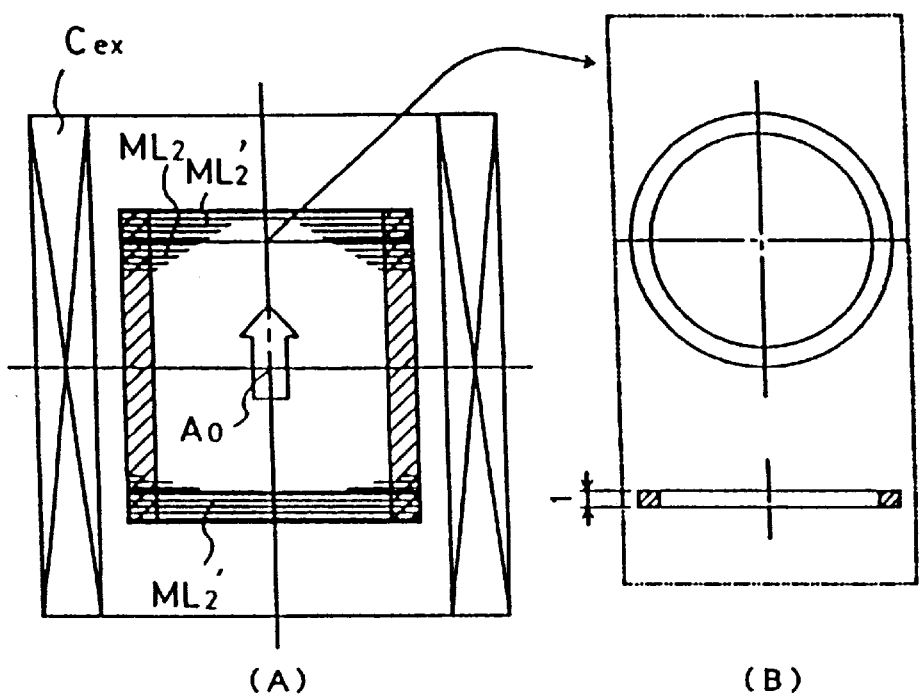
FIG. 31 is a diagram illustrating another example of the case in which a cylinder is divided into cylindrical body and edge portions and cylindrical portions specifically designed to the edge portions are placed at edges of the cylindrical body, respectively.

Moreover, the cylinder for exclusive use at the edge portion may be constituted by a plurality of stacked ring-like disks, instead of a single cylinder. The cylinder ML'2 for exclusive use at the edge portion is constituted by a plurality of stacked ring-like disks, each of which is made of a superconducting composite plate material that is 1 mm in thickness as illustrated in FIG. 31 (B). Needless to say, temperature regulating heaters are placed at the cylinder ML'2 to be disposed at both edge portions of the cylinder ML2, respectively, as shown in FIG. 31 (A).

Furthermore, the persistent current density distribution of the persistent current flowing in the cylinder can be changed by the way of arranging the magnetizing coil Cex. The persistent current concentrated at the edge portion of the cylinder emerges with a largest density, in principle, in the case that the cylinder is magnetized in a parallel magnetic field, whose direction is parallel to the longitudinal direction of the cylinder and whose length is sufficiently longer than that of the cylinder. This is because the persistent current flows in the edge portions concentratively to the limit of the magnetic field B of the cylinder in such a manner as to preserve the magnetizing magnetic field so that the magnetic field is not changed inside of the cylinder enclosed by the cylindrical surfaces.

Therefore, in the case that the magnetic field at the edge portions of a cylinder is compensated by the magnetic field generated by another cylinder, or alternatively, in the case that the magnetization is performed by setting the length L2 of the magnetizing coil Cex shorter than the length L1 of the cylinder ML1 as illustrated in FIG. 32(B),the magnetizing current can be restrained from concentrating at the edge portions of the cylinder ML1 (in the case of the arrangement in which L2, L1 as illustrated in FIG. 32(A), the concentration of the magnetizing current to the edge portion of the cylinder is promoted).

Figure 33:
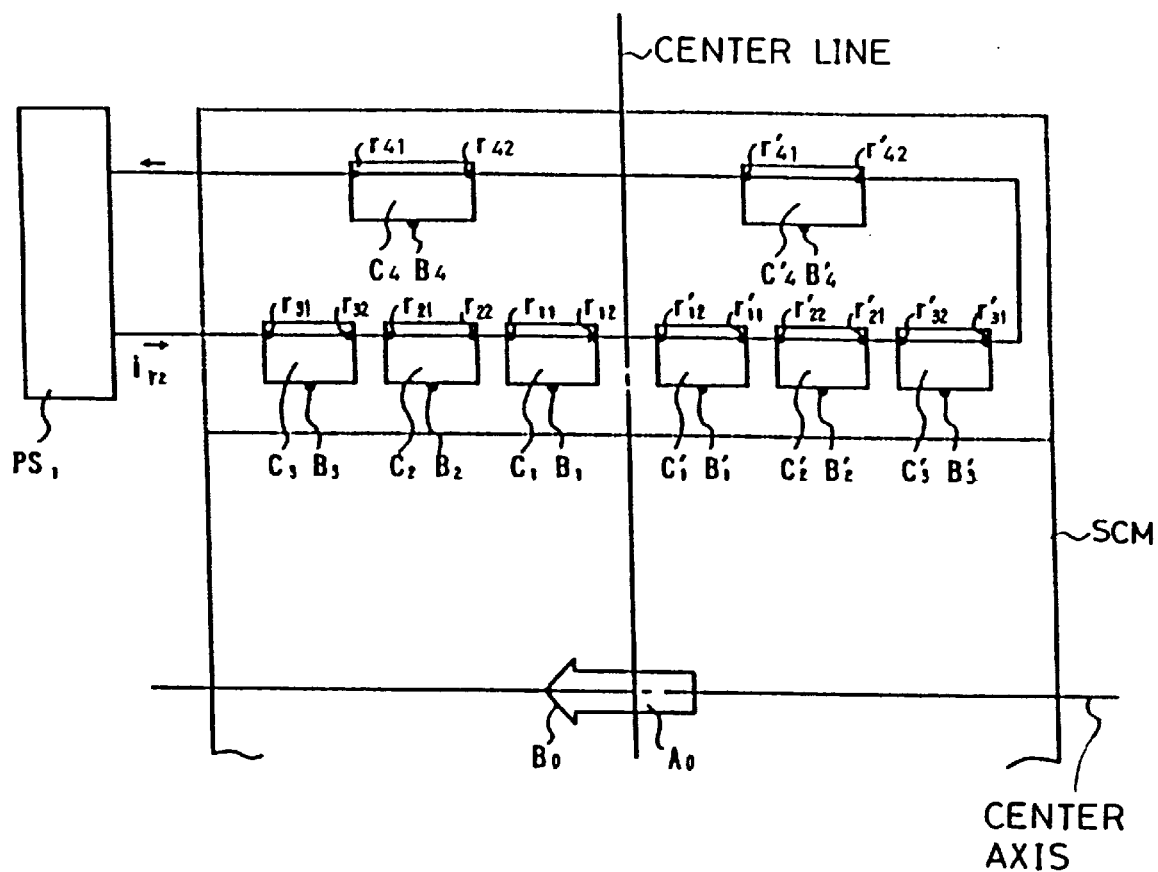
FIG. 33 is a diagram illustrating an example of the configuration of a superconducting magnet apparatus of the horizontal magnetic field type using a heater for regulating the magnetizing currents respectively concentrated at the edge portions.

FIG. 33 shows a practical example of the superconducting apparatus of the horizontal magnetic field type in which the heaters for exclusive use at the edge portions of the cylinder are placed thereat, respectively. In comparison with the constitution in FIG. 26, the apparatus of this figure is configured by adding resistors r11, r12 to r42, r'11 and r'12 to r'42 of the heater for exclusive use at the edge portions. These resistors are connected in series so that a regulating current ir2 is introduced thereto from the magnetizing power supply PS1.

The aforesaid partial regulation is not the indispensable condition. Further, if the persistent current flowing in the cylinder is distributed in a section of the cylinder as uniformly as possible, the potential gradient per unit length is uniform therein and the change in the persistent current with lapse of time is uniformed over the entire cylinder. This is therefore useful for stabilization of the magnetic-field strength and the magnetic homogeneity for a long time period.

Figure 35:
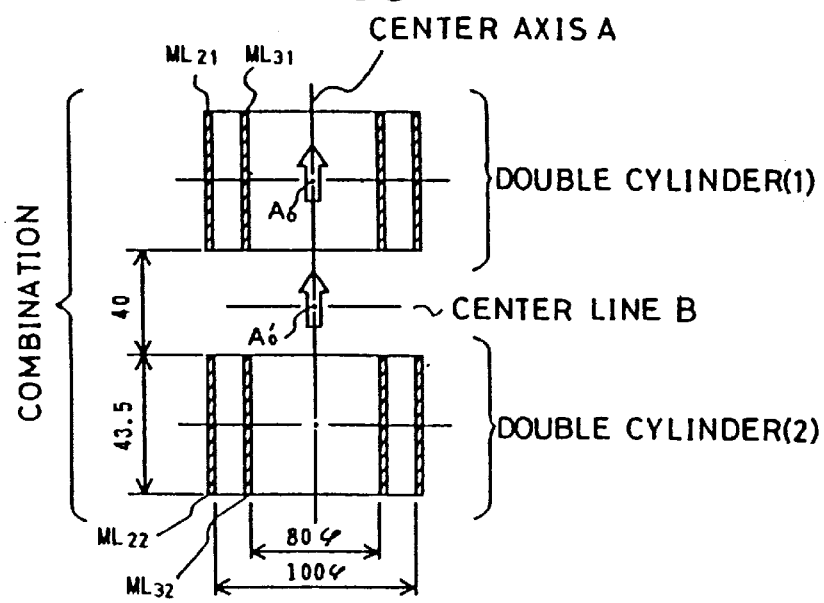
FIG. 35 is a diagram illustrating the placement of opposed double cylinders, which is employed as the basic configuration of a superconducting magnet apparatus of the vertical magnetic field type.

Next, the fundamental configuration when assuming the superconducting magnet apparatus of the vertical magnetic field type in which the cylinders are placed to face each other and the space between both of cylinders as a magnetic field, is illustrated in FIG. 35. As shown in FIG. 35, a double cylinder (1), which is composed of cylinders ML21 and ML31, and another double cylinder (2), which is composed of cylinders ML22 and ML32, are placed in such a manner as to be coaxial with each other by having the center axis A of each of the double cylinders as the common center axis and as to face each other by setting a line B as the center line. Thus, a combination of the two double cylinders is formed. The cylinders ML21 and ML22 are 100 mm in inside diameter and are 43.5 mm in length; and the cylinders are 80 mm in inside diameter and are 43.5 mm in length. The distance between the two double cylinders is 40 mm. After magnetized collectively by changing the magnetization rate of each of the two double cylinders placed as illustrated in FIG. 35, a change in the strength of the magnetic field at the center point A'o between the double cylinders of the aforementioned combination is measured. Further, a change in the strength of the magnetic field at the center point Ao of the double cylinder (1) is further measured after magnetized collectively by changing only the magnetization rate of the double cylinder (1) consisting of the cylinders ML21 and ML31.

Figure 34:
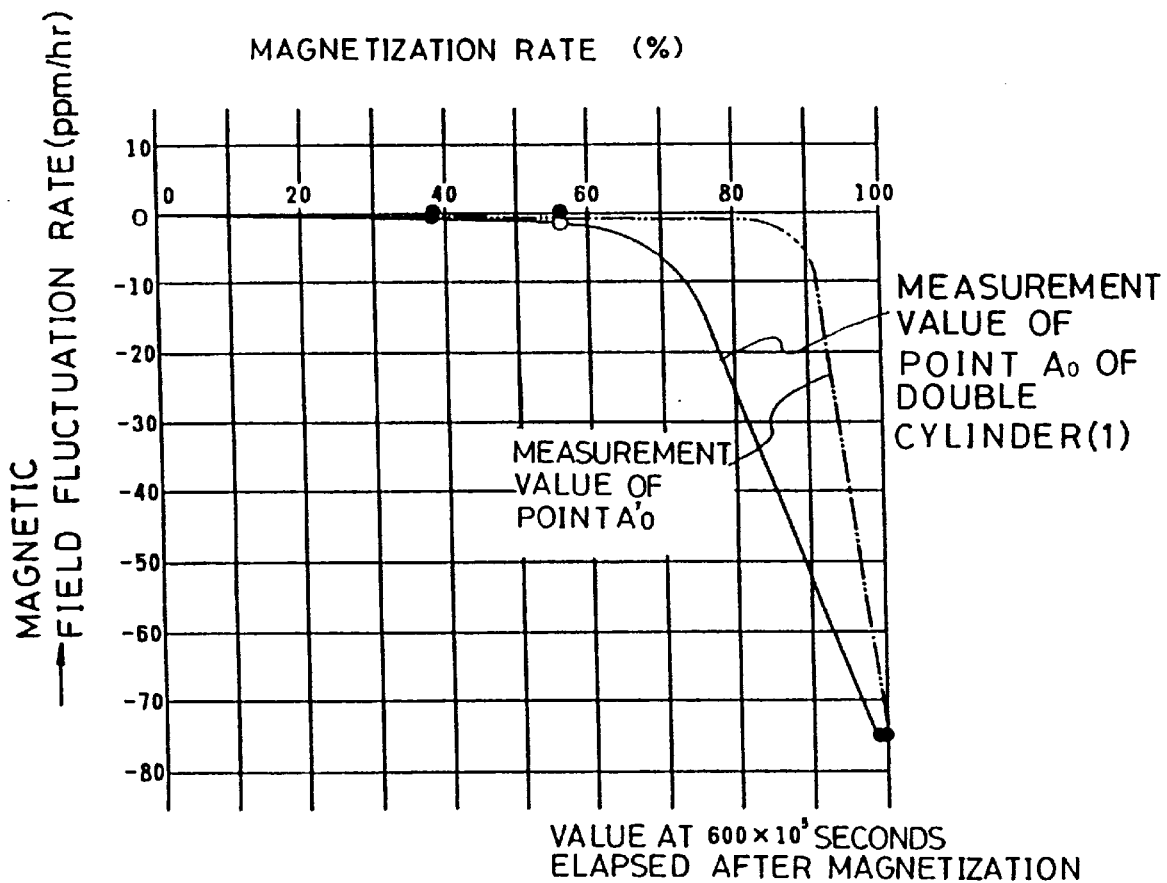
FIG. 34 is a graph illustrating an actually measured example of the relation between the magnetization rate and the magnetic-field attenuation characteristic of a double cylinder.

FIG. 34 shows results of the measurement in each of these cases. In FIG. 34, the axis of abscissa represents the magnetization rate; and the axis of ordinate the magnetic field variation rate. A solid line indicates values measured at the center point Ao of the double cylinder (1); a two-dot chain line the values measured at the center point A'o between the double cylinders of the combination. Further, the magnetic field variation rate (ppm/hr) illustrated in this figure was obtained when a time period of 6 105 seconds elapsed after the magnetization.

The magnetic field strength of the cylinder attenuates with lapse of time in each of these cases. First, when the magnetization rate is 100%, nearly the same value (about 75 ppm/hr) of the attenuation factor was exhibited in each of the cases. However, in a range where the magnetization rate is low, the magnetic field variation rate in the case of the combination of the two double cylinders is smaller than that of the case of the double cylinder (1). The difference in the magnetization rate therebetween is extremely clearly indicated in a range where the magnetization rate is 70 to 90%. This result reveals that the attenuation factor of the magnetized magnetic field of the cylinder in the case of placing the cylinders in such a way as to face each other as in the case of the two double cylinders of the aforementioned combination become smaller than that in the case of the double cylinder (1). Namely, this results shows that the attenuation factor of the magnetized magnetic field is improved by placing the cylinders in such a manner as to face each other.

Figure 36:
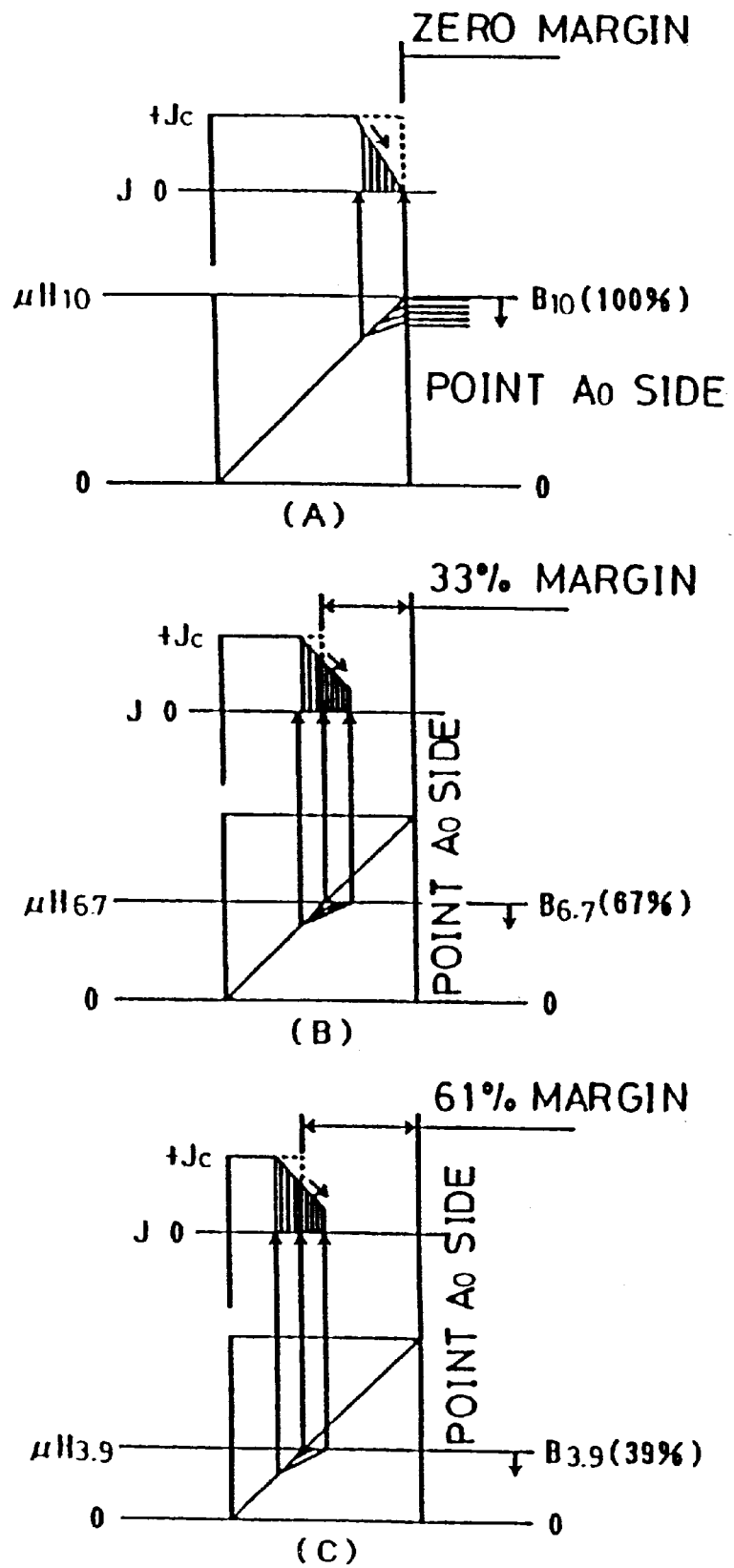
FIG. 36 is a diagram illustrating the relation between the magnetization rate and the magnetic- field attenuation characteristic by using Bean model.

FIG. 36 illustrates macroanalysis of the aforementioned results by using Bean model. FIG. 36(A) illustrates the macroanalysis in the case that the magnetization rate is 100%. In this case, as is seen from this figure, there are no margins for the persistent current density distribution and the magnetic flux density distribution. Thus, a change (or reduction) in the persistent current density distribution immediately causes a variation (or attenuation) in the magnetic flux density distribution. Thus, the variation in this magnetic field is known as the variation in the magnetic field at the point Ao in the cylinder. FIG. 36(B) illustrates the macroanalysis in the case that the magnetization rate is 67%. In this case, as is seen from this figure, there are margins of 33% therefor. Thus, a slight attenuation in the magnetic flux density distribution does not present as an attenuation in the magnetic field at the point Ao in the cylinder, because a margin portion in a section of the cylinder compensates the former slight attenuation in the magnetic field. Further, in the case of FIG. 36(C) in which the magnetization rate is 39 % and further larger margins (61%) are provided, an attenuation in the magnetic field at the point Ao does not emerge for a long time period which is longer as compared in the case of FIG. 36(B).

Figure 37:
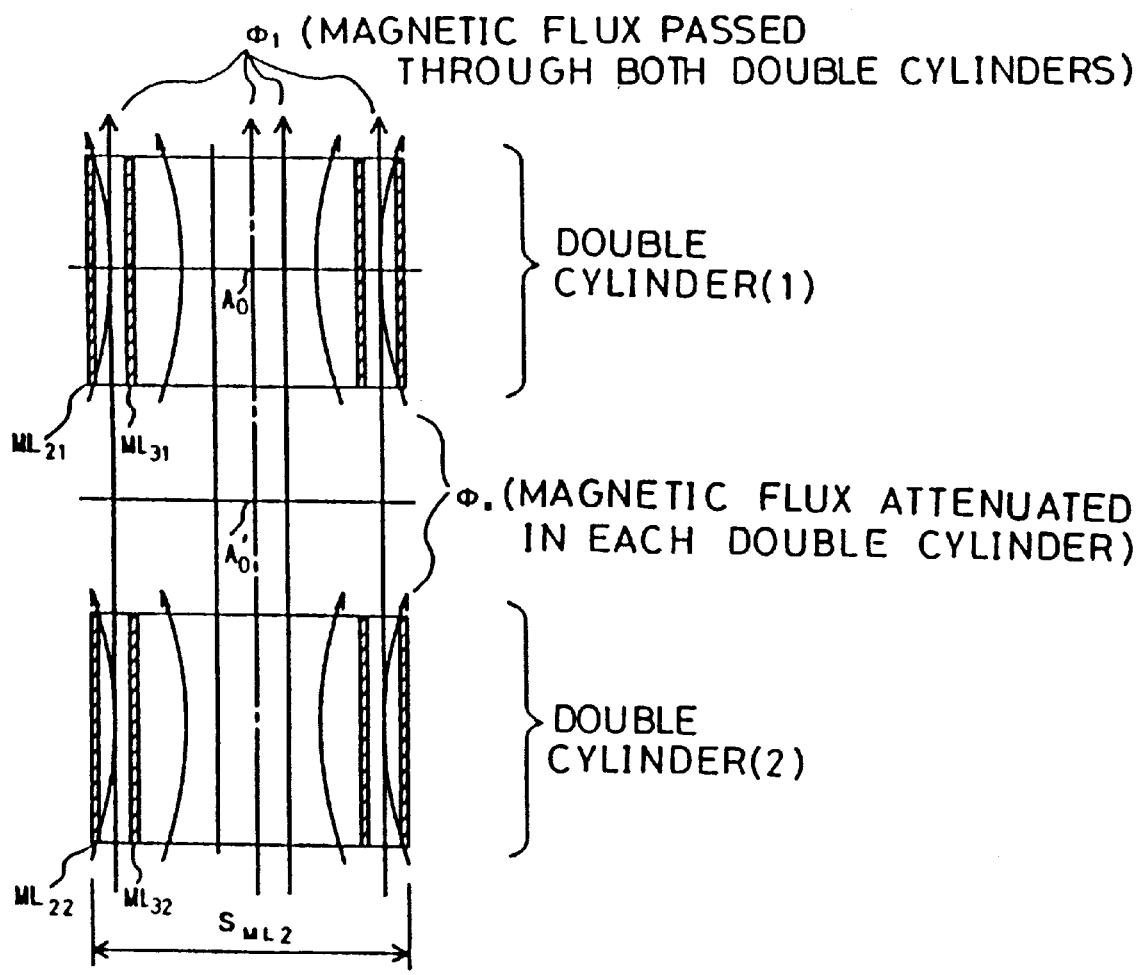
FIG. 37 is a diagram illustrating the magnetic flux distribution in the case of employing the placement of opposed double cylinders.

FIG. 37 shows the magnetic flux distributions in both of the case of the combination of the two double cylinders and the case of the double cylinder (1), with the intention of describing the difference in magnetization therebetween. In this figure, a magnetic flux $\ddot{E}1$ is defined as that having passed through both of the double cylinders (1) and (2); and a magnetic flux $\ddot{E}2$ is defined as that having passed through only one of the double cylinders (1) and (2) but having not passed through the other thereof. Between these magnetic fluxes, the magnetic flux $\ddot{E}1$ is composed of magnetic fluxes captured by the sections of the two double cylinders, so that an amount of the attenuation therein is considerably reduced in comparison with the case of using the magnetic flux which has passed through only one double cylinder, because of the fact that even if the magnetic field corresponding to one of the double cylinders having margins is attenuated, the magnetic field corresponding to the other double cylinder compensates this attenuation. Thus, the attenuation characteristics are such that the attenuated value is compensated up to the case where the magnetization rate is in the vicinity of 100%. Magnetic flux $\ddot{E}2$ affects the magnetic field distribution at the point A'o. However, regarding the magnetic field attenuation, the magnetic flux $\ddot{E}2$ presents an attenuation pattern in accordance with the attenuation characteristic of each of the double cylinders.

The aforementioned phenomenon regarding the attenuation in the magnetic field not only has effects in the superconducting magnet apparatus in which the cylinders are placed to face each other, but has similar effects in the superconducting magnet apparatus in which cylinders are arranged coaxially along the center axis. Incidentally, this phenomenon relates to compensation for attenuation in a total amount of magnetic fluxes in a section of a cylinder. Thus, strictly speacking, a distribution of magnetic field strength, namely, the distribution generally referred to as a magnetic field distribution varies, because the spatial coordinate, at which the attenuation in the magnetic field is compensated, is the same as the coordinate used before the attenuation therein.

Therefore, it is effective in minimizing the variation in the magnetic field distribution to perform the divisional, separate and individual magnetization method by dividing the cylinder by n in the thickness direction, and providing each of n partial cylinders with a margin and magnetizing each of the partial cylinders. In this case, the attenuation in the magnetic field is caused in each of the n partial cylinders, simultaneously. Thus, the time period for compensating the attenuation in the magnetic field is shortened and is equal to (1/n) of that in the case of collectively magnetizing the cylinders.

In contrast, in the case of collectively magnetizing the cylinders, the time period for compensating the attenuation in the magnetic field is n times that in the case of divisional, separate and individual magnetization as above described, whereas the spatial coordinates for generating a magnetic field are shifted by an amount which is larger than that in the case of divisional, separate and individual magnetization. Thus, the change in the magnetic flux distribution is increased owing to the large shift of the coordinates. Consequently, even in the case that the magnetization rate of each of the cylinders is determined by taking a maintenance cycle into consideration and that the attenuation in the magnetic field is set as being within a target value, only an unsatisfactory magnetic field is sometimes obtained. Hereinafter, a method of compensating the attenuation in the magnetic field in such a case will be described.

FIG. 38(A) is a diagram for illustrating a magnetizing method by which variation in the magnetic field distribution with lapse of time is small. In comparison with the constitution in FIG. 37, the configuration of this figure is obtained by adding a disk ML4-3 to the facing surface of each of the double cylinders (1) and (2). FIGS. 38(B) to 38(D) show the detailed structure of this disk ML4-3. The aforesaid disk ML4-3 corresponds to the aforementioned magnetic flux $\ddot{E}2$.

As shown in FIGS. 38(B) and 38(C), this disk has the following structure. Namely, this disk has a center bore and is thus shaped like a ring. The outside diameter of this disk is set as being equal to the outside diameter of each of the cylinders ML21 and ML22. Further, the bore diameter of this disk is set as being smaller than the outside diameter of the uniform magnetic field region (FOV) (incidentally, it is not always necessary to form this center bore in this disk). As shown in FIG. 38(B), four heaters H43a to H43d are placed in this disk. The heaters H43a to H43d are connected in series as illustrated in FIG. 38(D), and are supplied with a regulating current ir4 from the magnetizing power supply PS1 (not shown).

Figure 38:
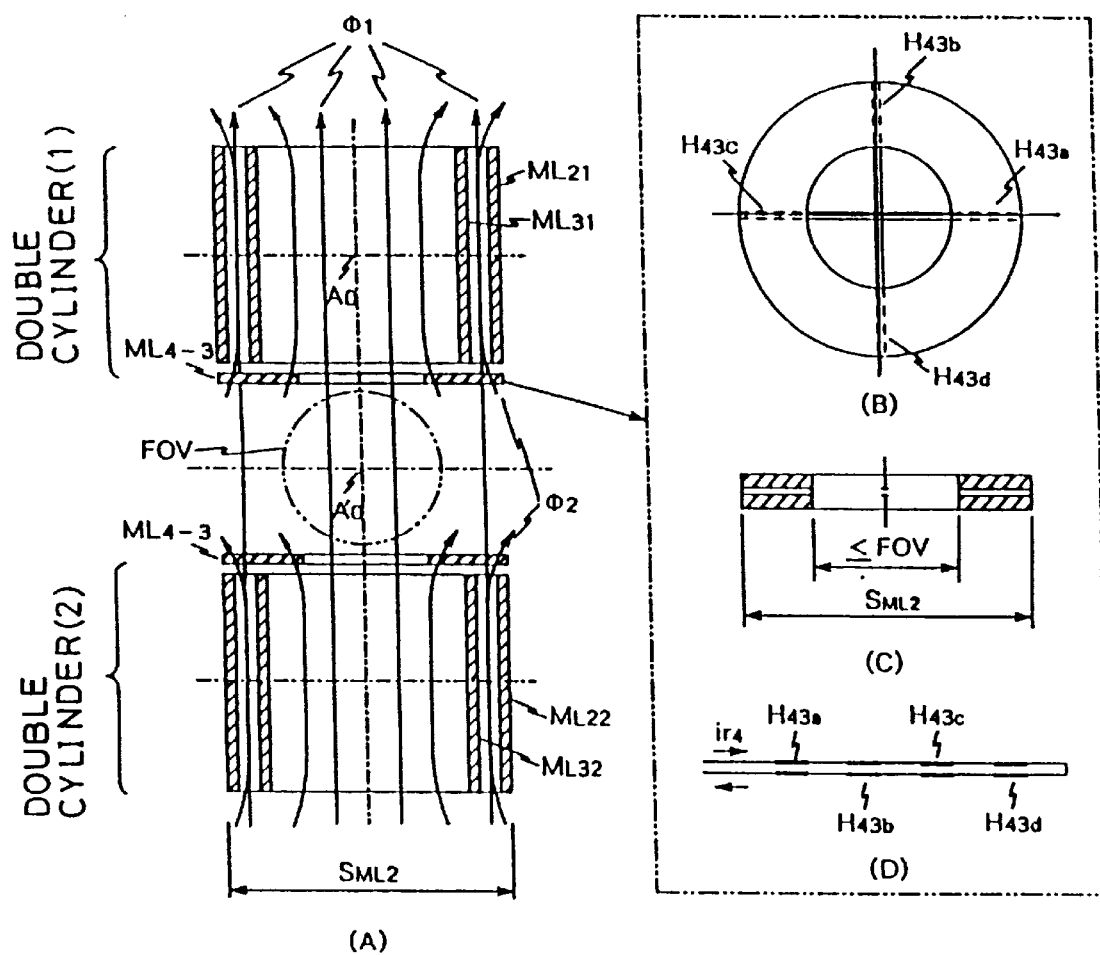
FIG. 38 is a diagram illustrating a method of compensating the magnetic-field attenuation in a uniform magnetic field region and a variation in a magnetic field distribution therein in the case of employing the placement of opposed double cylinders.

When the combination of the cylinders are configured as illustrated in FIG. 38, most of the primary magnetic fluxes forming a magnetic field of the uniform magnetic field region FOV, which corresponds to a used region, pass through the disk ML4-3. To allow most of the magnetic fluxes $\Phi 1$ and $\Phi 2$ to pass through the disk ML4-3, the temperature of the disk ML4-3 is regulated by synchronizing the heaters placed in the disk ML4-3 with the magnetization regulating process.

Figure 39:
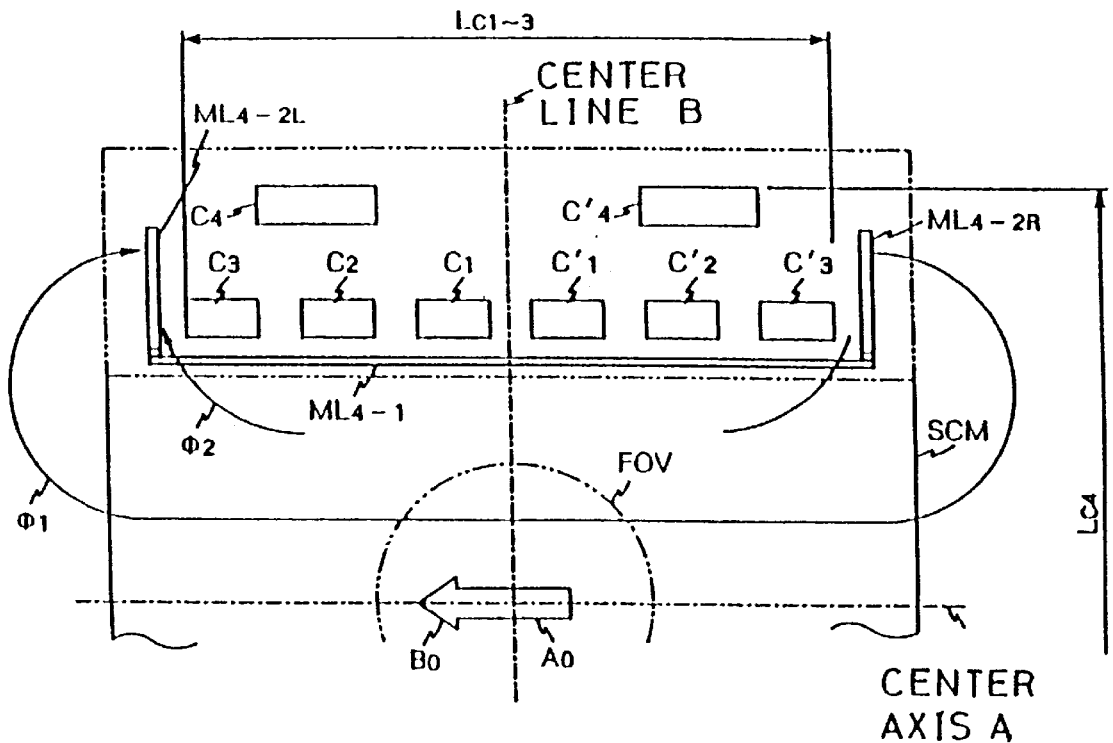
FIG. 39 is a diagram illustrating an example of the configuration of a superconducting magnet apparatus of the horizontal magnetic field type for compensating the magnetic-field attenuation in a uniform magnetic field region and a variation in a magnetic field distribution therein.

FIG. 39 illustrates an example of the configuration of a superconducting magnet apparatus of the horizontal magnetic field type, to which the magnetizing method illustrated by FIG. 38 is applied.

As illustrated in FIG. 39, a cylinder ML4-1, which is longer than the length of the arrangement Lc1-3 of a group of cylinders C1 to C4 and C'1 to C'4, is disposed at the inner circumferential side of the group of the cylinders. Thus, the apparatus is adapted to permit mainly the magnetic flux $\Phi 2$ to pass the cylinder ML4-1. Further, when it is necessary to let the magnetic flux $\Phi 1$ to pass therethrough, disks ML4-2L and ML4-2R are provided at both sides of the cylinder ML4-1, respectively, in such a manner as to be close to the outer circumference of the cylinder ML4-1, thereby letting mainly the magnetic flux $\Phi 1$ pass therethrough.

Figure 40:
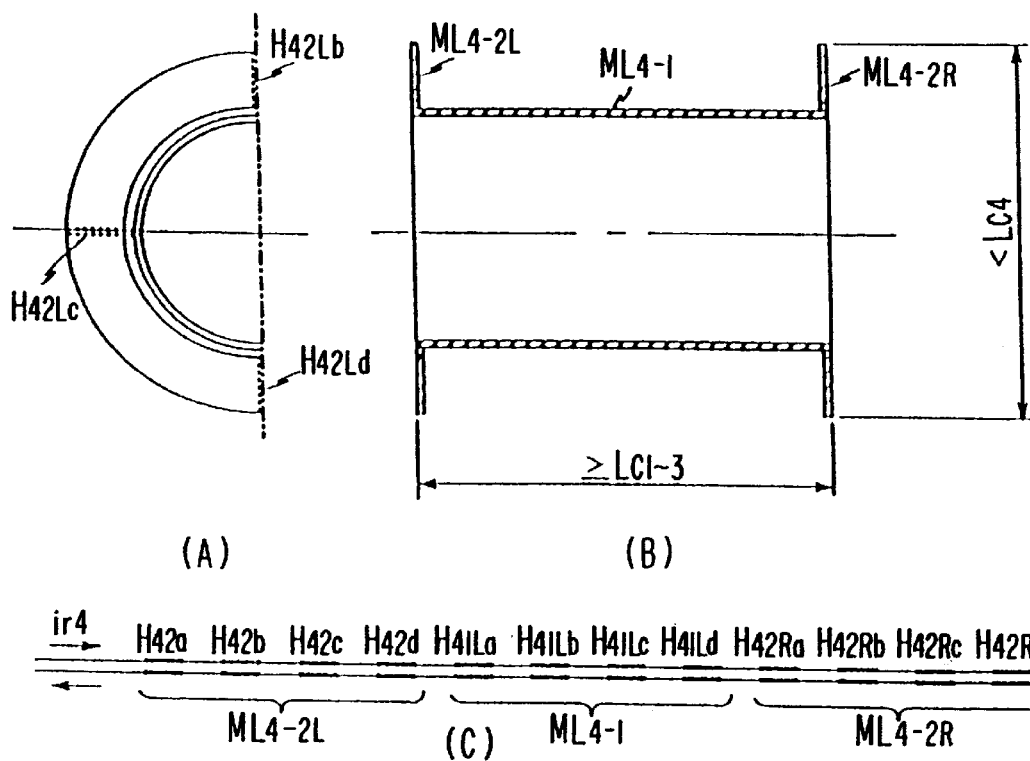
FIG. 40 is a diagram illustrating an example of the placement of a cylinder, a disk and a heater in the superconducting magnet apparatus of the horizontal magnetic field type for compensating a variation in the magnetic field distribution.

FIGS. 40(A), 40(B) and 40(C) illustrate the configuration of only the added cylinder ML4-1 and the disks ML4-2L and ML4-2R. FIG. 40(A) is a side view of (a half of) this cylinder; FIG. 40(B) is a sectional view of the entire cylinder; and FIG. 40(C) is a diagram illstrating how the heaters attached to the cylinder ML4-1 and the disks ML4-2L and ML4-2R are connected with one another. In this embodiment, similarly as in the case of the embodiment of FIG. 38(D), the heaters H42a to H42d are arranged in the cylinder and the disks, and the resistors of the heaters are connected in series, the regulating currrent ir4 is led from the magnetization power supply PS1 (not shown) thereto. Further, the temperature of the cylinder and the disks is regulated by using these heaters in synchronization with the process of regulating the magnetization of the cylinders C1 to C4 and C'1 to C'4. Consequently, the magnetic flux $\Phi 2$ passes through the cylinder ML4-1, and the magnetic flux $\Phi 1$ passes through the disks ML4-2L and ML4-2R.

Figure 41:
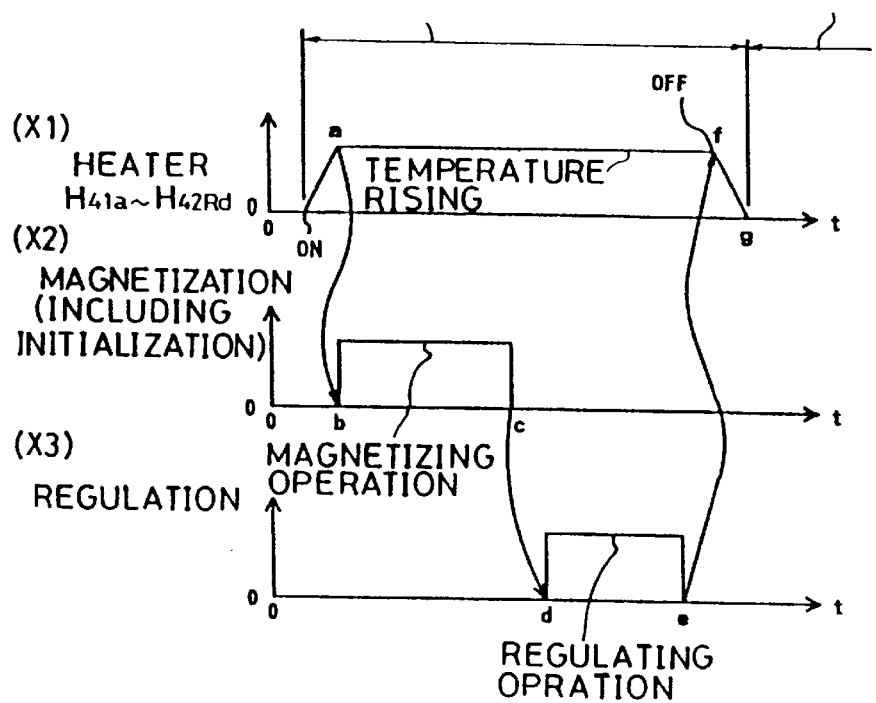
FIG. 41 is a time chart illustrating an operation of controlling the temperature of a heater of FIG. 40 and a magnetizing operation and a regulating operation.

FIG. 41 illustrates the relation among the temperature regulating operation, the magnetizing operation and the regulating operation after the magnetization. FIG. 41 (X1) shows a time chart illustrating the temperature regulating operation; FIG. 41(X2) a time chart illustrating the magnetizing operation (including an initializing procedure); and FIG. 41(X3) a time chart illustrating the operation of regulating the magnetization value. First, as illustrated in FIG. 41(X1), the temperature of the heaters for regulating the cylinder ML4-1 and the disks ML4-2L and ML4-2R is raised throughout the magnetizing operation and the regulating operation, and thus maintains the aforesaid cylinder and disks in a state in which the cylinder and disks exhibit the normal conducting properties. The influence of the group of cylinders C1 to C4 and C'1 to C'4 on the magnetizing operation and the regulating operation is precluded by making the cylinder and disks lose the superconducting properties in this way. As shown in FIG. 41(X1), the temperature of the heater for regulating the temperature is raised to a point a. Thereafter, an operation of magnetizing the group of cylinders Cl to C4 and C'1 to C'4 is performed from a point b to a point c of FIG. 41 (X2). Further, an operation of regulating the magnetization value is performed from a point d to a point e of FIG. 41 (X3). Upon completion of these operations, a control current for each of the heaters is interrupted from a point f of FIG. 41(X1). Further, the cylinder and disks are cooled and are then turned to a state in which the cylinder and disks exhibits the superconducting properties. Thus, the apparatus is adapted so that the magnetic fluxes of the uniform magnetic field region FOV after regulating the magnetization pass through the cylinder ML4-1 and the disks ML4-2L and ML4-2R.

As above described, when a variation in the magnetic field occurs in the uniform magnetic field region FOV due to some factors in a state in which the magnetic fluxes of the uniform magnetic field region FOV are allowed to pass through the cylinder ML4-1 and the disks ML4-2L and ML4-2R, an operation of compensating the variation in the magnetic field in the spatial coordinates of the cylinder ML4-1 and the disks ML4-2L and ML4-2R, through which the aforesaid magnetic fluxes pass, is performed. As a result, a variation in the magnetic field distribution, which is resulted from the attenuation of the magnetic field of the group of the cylinders serving as a magnetic field generating source, can also be compensated.

Further, the aforesaid configuration of FIG. 39 performs an operation of protecting the magnetic field strength and the magnetic field distribution of the uniform magnetic region FOV against the disturbance magnetic field due to the installation environment, and thus implements the action of absorbing the influence of the disturbance magnetic field.

The aforementioned superconducting magnet apparatus is most suitable for an analyzer and a magnetic resonance imaging apparatus, to which a nuclear magnetic resonance phenomenon exhibiting characteristics, such as the magnetic field distribution and the attenuation of the magnetic field, as important characteristics is applied.

Superconducting composite plate materials used in a superconducting magnet apparatus of the present invention exhibit superconducting properties which are different according to manufacturing methods. Thus, when applying the superconducting composite plate materials to the superconducting magnet apparatus, various contrivances are needed. Hereinafter, an embodiment of a superconducting composite plate material will be described.

Figure 42:
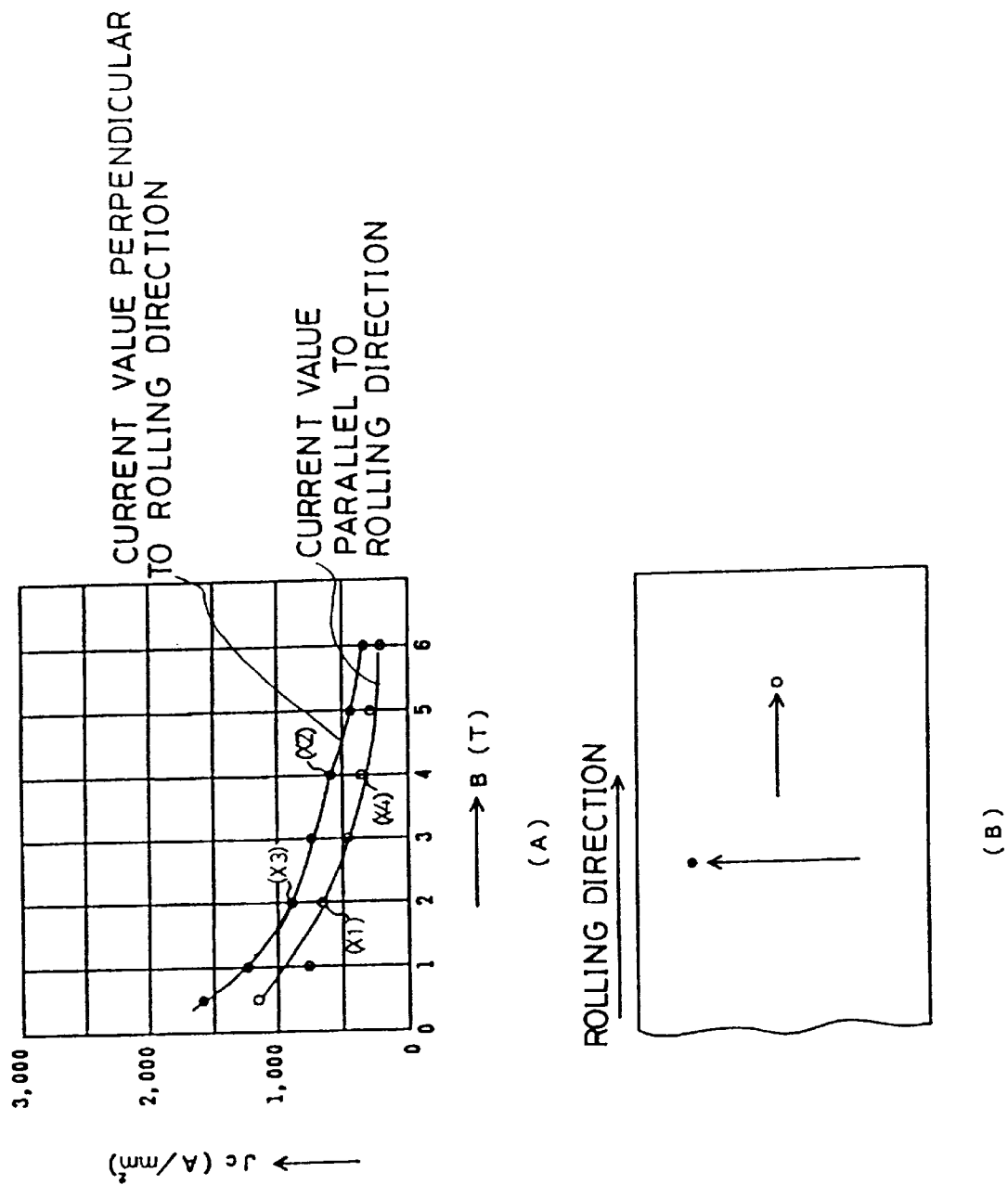
FIG. 42 is a graph illustrating B-Jc characteristics of NbTi in a direction parallel to and a direction perpendicular to a rolling direction in which a superconducting composite plate material is rolled.

Generally, the working in the direction of thickness of the superconducting composite plate material is performed through a rolling process. Thus, when magnetized, the persistent current density Jc in a rolling direction is different from that in a direction perpendicular to the rolling direction. FIG. 42 shows an example of the actually measured value. FIG. 42(A) illustrates the relation between the magnetization value B and the persistent current density value Jc after magnetized. FIG. 42(B) shows the relation between the rolling direction and the magnetizing direction. In FIG. 42(A), the axis of abscissa represents the magnetization value B (T); and the axis of ordinate represents the persistent current density value Jc (A/mm2). In this figure, white circles designate data representing the value of an electric current flowing in parallel with the rolling direction, and black circles designate data representing the value of an electric current flowing in a direction perpendicular to the rolling direction. As compared with each other, the value of the current flowing in the direction perpendicular to the rolling direction is larger than that of the other current with respect to the same magnetization value B.

In the case that a cylinder is made by such a superconducting composite plate material, both of the aforesaid properties are alternately exhibited in the circumferential direction of the cylinder. This phenomenon is due to the shape of the impurity Ti-a presents on the surface of NbTi which is a material of the superconducting composite plate. Thus, even if there is a variation in the values of the properties owing to a variation in the rolling operation, as a result of the fact that superconducting composite plate undergoes the rolling operation, it is difficult to eliminate occurrences of this phenomenon. However, this phenomenon occurs on the circumferential surface of the cylinder. Therefore, in the case of performing the induction magnetizing of this cylinder, the magnetization is completed in the direction parallel to the rolling direction. If the relation between the rolling direction and the value of the current is applied by using the characteristic diagram of FIG. 42(A), and the magnetization is completed in such a manner as to have the magnetization value B=2T, a magnetizing current corresponding to a point (X1) on the circumferential direction. In contrast, a magnetizing current flowing in the direction perpendicular to the rolling direction becomes a current corresponding to a point (X3), whose value is larger than that at a point (X2), so that a sufficient margin is provided therein. Conversely, if the magnetization is completed in such a manner as to have the magnetization value B=4T in a direction perpendicular to the rolling direction, a magnetizing current corresponding to a point (X2) flows on the circumference of the cylinder. Further, a magnetizing current flowing in a direction parallel to the rolling direction corresponds to a point (X4), whose value is smaller than the value at the point (X2). Thus, unless the magnetizing magnetic field is lowered, the magnetizing current flowing on the circumferential surface of the cylinder exceeds the critical current density Jc.

In this case, as the circumferential directions of the cylinder, there are two directions parallel to the rolling direction. Further, there are two directions perpendicular to the rolling direction. Thus, in the case where a persistent current flows in the circumferential direction of the cylinder, the critical current density value Jc varies with the position in the circumferential direction. Therefore, the ratio (corresponding to the magnetization rate) between the persistent current and the critical current varies with each of points. As a result, the influence of the persistent current on the attenuation of the magnetic field varies with each point in the circumferential direction. Consequently, the magnetic field distribution varies.

Figure 43:
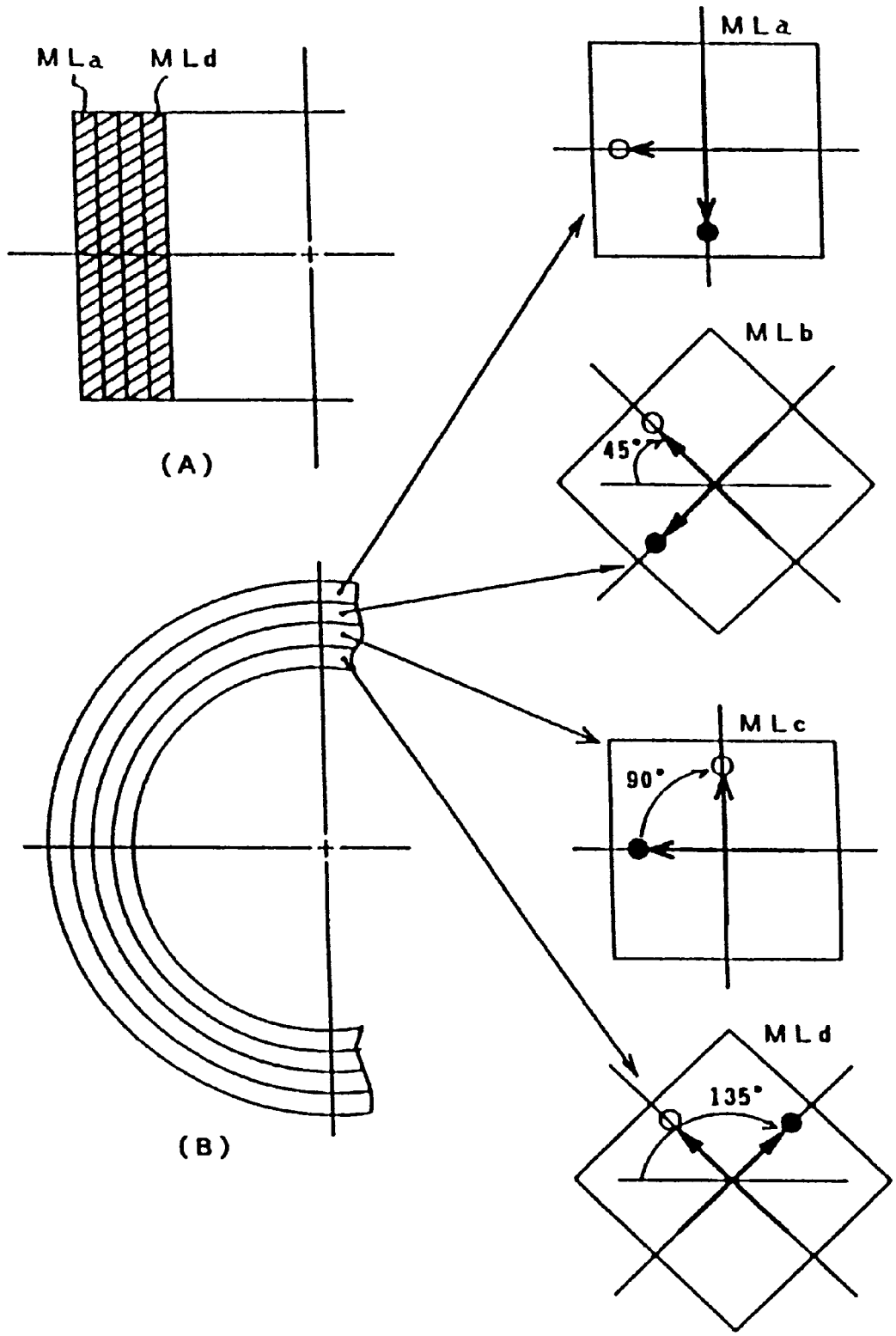
FIG. 43 is a diagram illustrating a method of eliminating differences of characteristics depending on directions, in which a superconducting composite plate material is rolled, by improving the configuration of cylinders.
Figure 44:
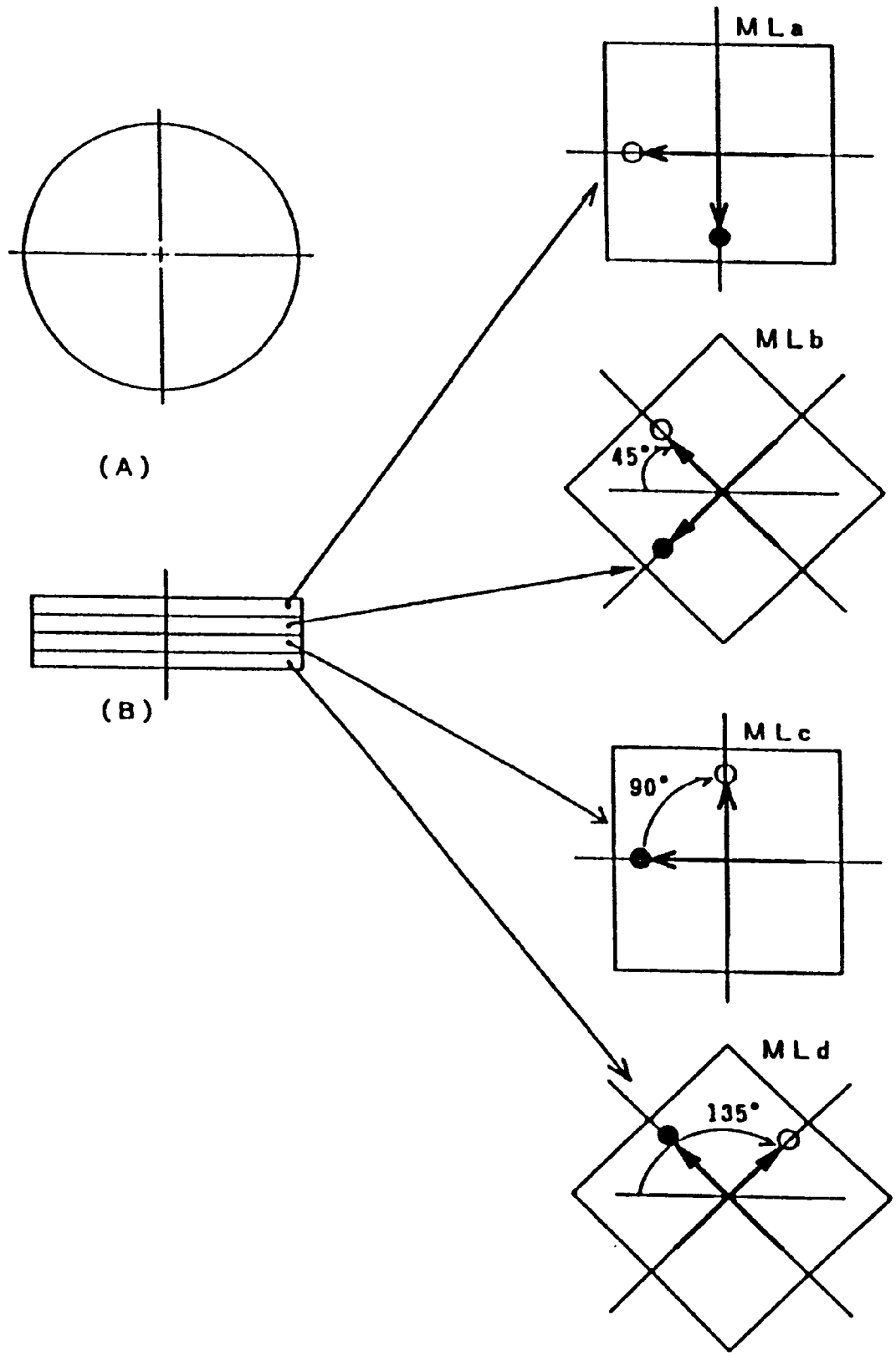
FIG. 44 is another diagram illustrating a method of eliminating differences of characteristics depending on directions, in which a superconducting composite plate material is rolled, by improving the configuration of cylinders.

Contrivance of improving the configuration of the cylinder or disk to uniform the characteristics on the circumferential surface of the cylinder or disk as much as possible, for the aforementioned reason. FIGS. 43 and 44 illustrate practical examples of this contrivance. FIG. 43 shows an application of this contrivance to a cylinder. FIG. 44 shows an application of this contrivance to a disk. As shown in FIG. 43, the entire cylinder is composed of four cylindrical bodies whose rolling directions are different from one another. FIG. 43(A) shows a longitudinal section of the entire cylinder. FIG. 43(B) is a diagram showing the rolling direction in which a superconducting composite plate constituting each of the four cylindrical bodies is rolled. As shown in this figure, the entire cylinder is constituted by a combination of four cylindrical bodies MLa to MLd. The rolling directions of the superconducting composite plates, which constitute each of the four cylindrical bodies, are set in 45° interval. Namely, the circumferential direction of the cylindrical body MLa is parallel to the rolling direction thereof. Further, the circumferential direction of the cylindrical body MLb is turned 45° from the rolling direction. Similarly, the circumferential direction of the cylindrical body MLc is turned 90°. Moreover, similarly, the circumferential direction of the cylindrical body MLd is turned 135°. With this configuration, four cylindrical bodies, whose rolling directions are different from one another, are stacked. Overall characteristics in the circumferential direction of the entire cylinder is uniformed equivalently.

As shown in FIG. 44, the entire disk is composed of four disk-shaped bodies, whose rolling directions are different from one another, similarly as in the case of the entire cylinder. FIG. 44(A) is a top view of the entire disk. FIG. 44(B) is a section thereof. The rolling directions of the disk-shaped bodies, which constitutes the entire disk, is set in 45° interval. The rolling directions of the disk-shaped bodies MLb, MLc and MLd are turned 45°, 90° and 135° with respect to the disk-shaped body MLa, respectively. In this case, the entire disk is equivalent to the entire disk obtained by stacking a disk unit of four disk-shaped body MLa which are turned 0°, 45°, 90° and 135°, respectively. With such a configuration, the disk can obtain effects similar to those in the case of FIG. 43.

When making the aforesaid cylindrical bodies or disk-shaped bodies MLa to MLd, the method of performing the working of n-pieces of plates by changing the rolling direction of each of the plates and stacking the plates in the direction of thickness in such a manner as to be integral therewith can solve the inevitable characteristic problem in manufacturing the members more easily than the method of making the cylindrical bodies or disk-shaped bodies by a single superconducting composite plate.

In the foregoing description, there have been detailedly described results of the magnetization, the principles of a regulating method of leading the magnetization value to a final target value, the attenuation of the magnetic field after the magnetization, and a magnetic field compensating method in the magnetization/regulation process from the initialization process, and the means for mitigating the influence on the magnetic field analysis, which is generated in the superconducting composite plate working process. Thereamong, the temperature of the superconductor has been regulated using a heater. Especially, it is an important problem for effective application of heater serving as heating elements how the temperature regulating devices are mounted in the cylinder or the disk. Moreover, it is also an important problem how the temperature regulating device is configured. Hereinafter, means for solving these problems will be described.

Figure 45:
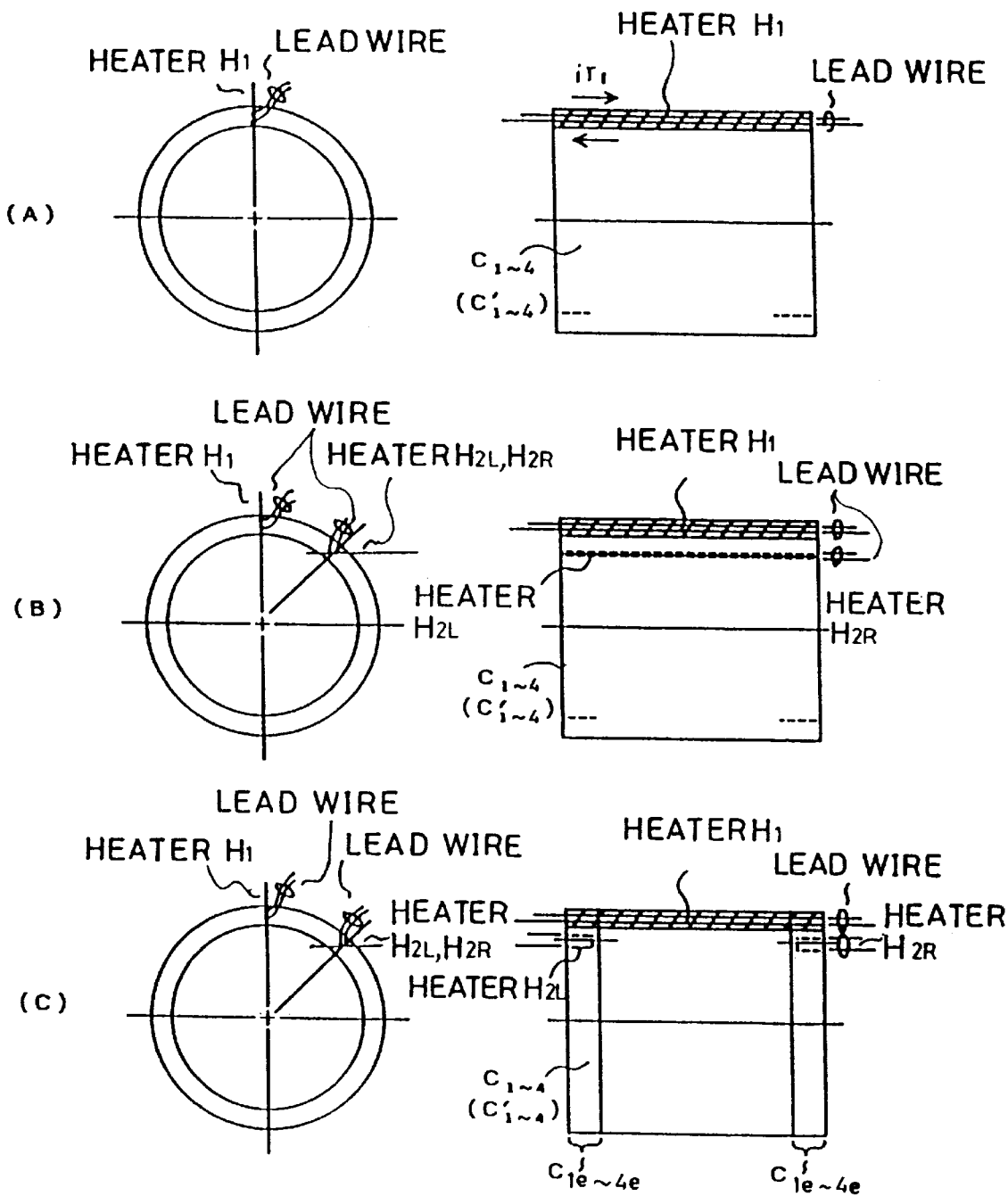
FIG. 45 is a diagram illustrating examples of manners of mounting temperature regulating devices in a cylinder.

FIG. 45 shows an example of the mounting of the temperature regulating device in the cylinder. FIG. 45(A) illustrates the case that the temperature regulating device is placed over the overall length of the cylinder. In this figure, one of the group of the cylinders C1 to C4 and C1' to C4' is illustrated (this is the same with the following drawings). The cylinders C1 to C4 (C1' to C4') are composed of cylinders of a plurality of layers. Thus, an recess portion is formed in a nearly central part thereof. Further, a heater H1 is embedded in the recess portion, so that the heater H1 is made to adhere closely to the cylinders. Moreover, the cylinders C1 to C4 (C1' to C4') are heated by the entire circumference of the heater acting as a heating element. A direct current ir1 for regulating the temperature is reciprocated in a same place, so that the influence of the electric current ir1 is not left in the cylinders C1 to C4 (C1' to C4'). Preferably, leads of the heater Hi are led out of both edge portion of the cylinders C1 to C4 (C1' to C4') so as to be connected with other portions of the apparatus.

FIG. 45(B) illustrates the case that two kinds of temperature regulating devices for regulating the edge surfaces of the cylinders C1 to C4 (C1' to C4') are arranged. Further, the heater H1 is embedded in the cylinders C1 to C4 (Cl' to C4') over the entire length thereof. Namely, the heater is of the embedded type, similarly as of the case of FIG. 45(A). Further, temperature regulating devices for regulating the edge portions are embedded in a place other than a place, in which the heater H1 is arranged, in the direction of the circumference of each of the cylinders C1 to C4 (C1' to C4'). The temperature regulating devices for regulating the edge portions are of the same configuration as of the heater H1, for the convenience of construction. Namely, the middle portion thereof is constituted by a superconducting wire, to both edges of which edge-portion heaters H2L and H2R are connected. These edge-portion heaters H2L and H2R are embedded in the cylinders C1 to C4 (C1' to C4') in the same way as the heater H1. Moreover, the regulating current ir2 should be made to reciprocate and pass through the same place.

FIG. 45(C) illustrates the case that each of the cylinders C1 to C4 (C1' to C4') is divided into a central portion and two edge portions C1e to C4e (C1e' to C4e') and that a temperature regulating device is arranged in each of the entire cylinders C1 to C4 (C1' to C4') and another temperature regulating device is arranged in each of two edge portions C1e to C4e (C1e' to C4e'). The heater H1 is embedded in each of the overall cylinders C1 to C4 (C1' to C4'), similarly as in the case of FIG. 45(A). Further, two heaters H2L and H2R are embedded in the two edge portions C1e to C4e (C1e' to C4e'), respectively and individually. The heaters H1, H2L and H2R are embedded in different places in the circumferential direction of each of the cylinders C1 to C4 (C1' to C4'), similarly as in the case of FIG. 45(B). In the case of FIG. 45(C), each of the heaters H2L and H2R is configured in such a manner as to be folded back and reciprocated in a corresponding one of the edge portions C1e to C4e (C1e' to C4e') along the longitudinal direction thereof. Further, this folded-back heater structure may be applied to the case of FIG. 45(B).

Figure 46:
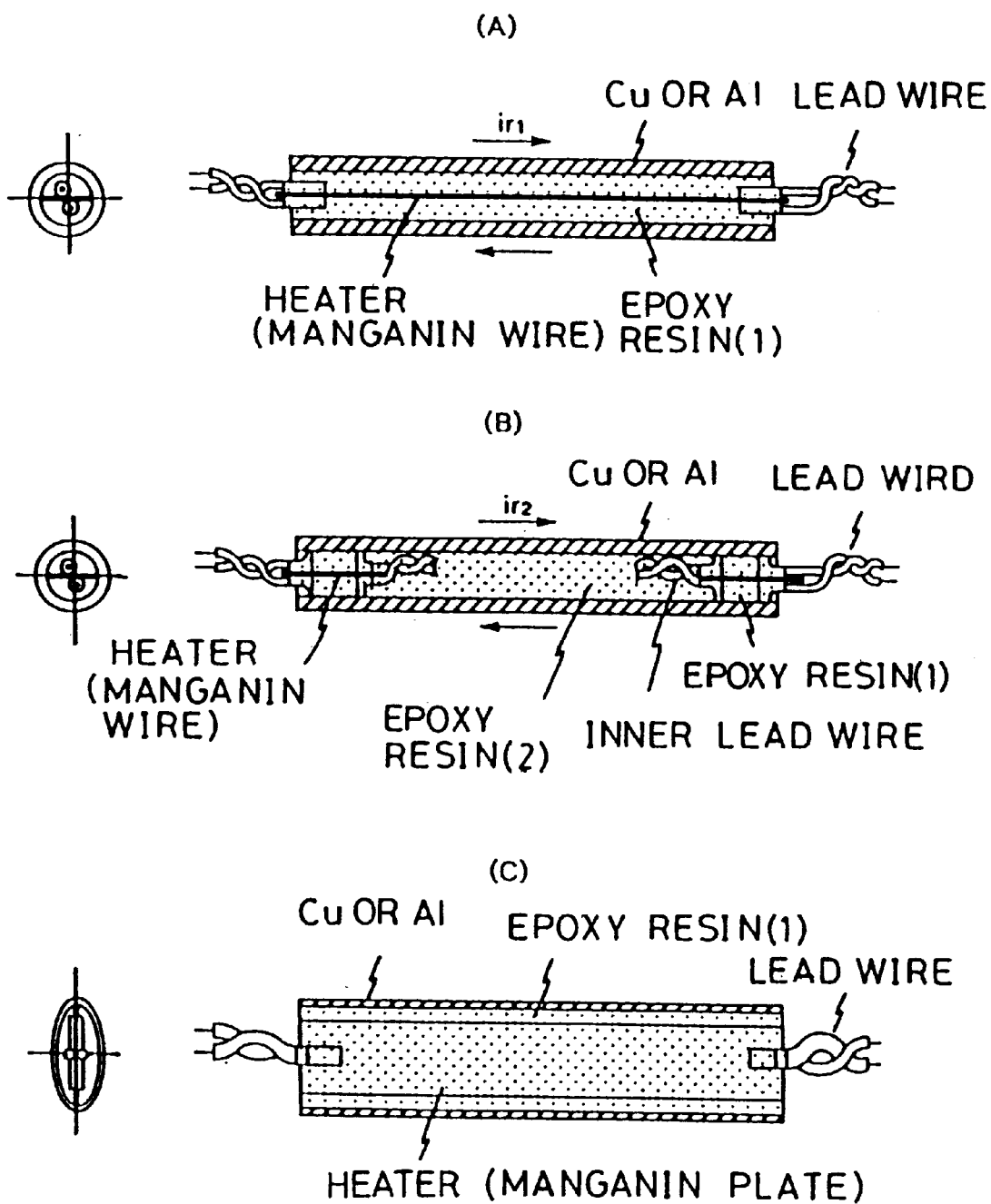
FIG. 46 is a diagram illustrating examples of the configuration of the temperature regulating device.

Next, the temperature regulating devices embedded in the cylinders and disks will be described hereinafter by referring to FIG. 46. FIG. 46 shows embodiments of the temperature regulating device. FIG. 46(A) shows the configuration of the temperature regulating device for heating the cylinders C1 to C4 (C1' to C4') over the overall length thereof. Namely, a resistor such as manganin wire is placed in a copper or aluminum tube has a heater. Further, the armor of the heater itself is electrically insulated and is connected with leads at both ends thereof. This armor is constructed by filling an aluminum tube with a material for improving heat conduction, for example, an epoxy resin (1), into which copper or aluminum powder is mixed, and fixing the heater in the cylinder. Heater wires are placed so that two wires are reciprocated in the same position. Furthermore, a regulating current ir1 is made to flow through the heater wires.

FIG. 46(B) illustrates the case that the heaters of FIG. 46(A) having a necessary length are placed in both of the edge portions. In the middle portion of the cylinder, the lead is embedded by being twisted, and is connected with the heaters. Similarly as in the case of FIG. 46(A), the armor is obtained by filling a copper or aluminum tube with an epoxy resin (1). A part, in which the lead is placed, of the middle portion, is filled with an epoxy resin material (2) obtained by impregnating glass or wool, whose heat conduction is relatively poor, with epoxy resin, while a part in which the heater is placed is filled with the epoxy resin (1).

FIG. 46(C) illustrates the case that a manganin plate, whose surface is insulated, is used as a heater, and is placed in a flat pipe which is made of copper or aluminum and is filled with an epoxy resin (1) to thereby fix the heater.

With the configuration of the temperature regulating device as illustrated in FIG. 46, the management and treatment are facilitated. Further, the mounting and fixing of the temperature regulating devices are facilitated. Although the configuration of FIG. 46 seems to provide overprotection, it is expected that the size of the cylinder is relatively large. Further, it is not expedient from the viewpoint of quality control to use bare heaters. Moreover, in view of the fact that the heater is a most important factor for enabling the superconducting magnet apparatus to act as a magnet, this configuration is not overprotection at all. Mounting of the heaters in the cylinders or disks is achieved by boring a hole (preferably, this hole is formed simultaneously with the working of the cylinder or disk collectively), which is fit with the outer periphery of the temperature regulating device, and then applying an epoxy resin (1) onto the outer circumferential portion of the temperature regulating device and further embedding the temperature regulating device into the hole to thereby fix the temperature regulating device.

Figure 47:
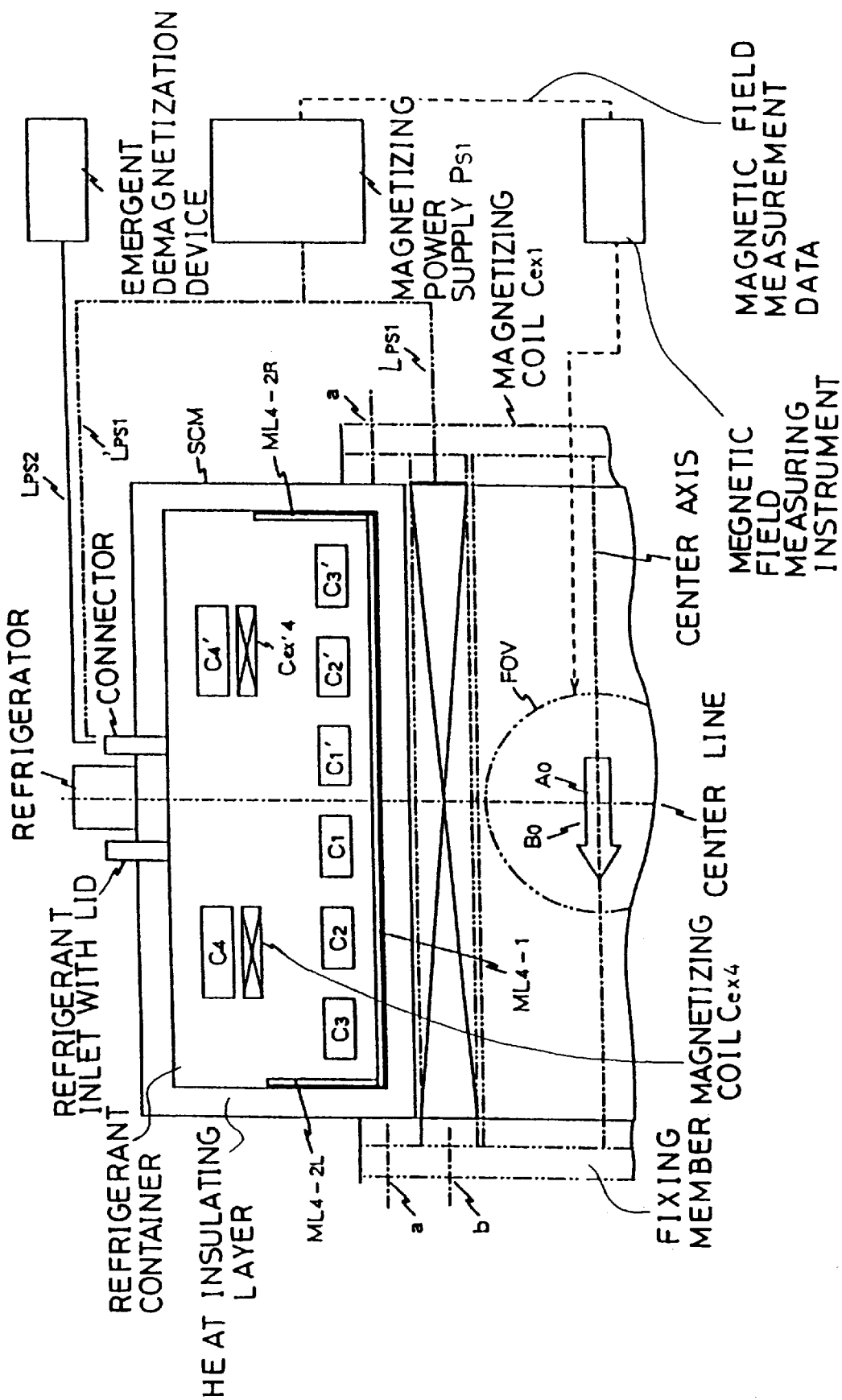
FIG. 47 is a block diagram showing the configuration of a superconducting magnet apparatus of the horizontal magnetic field type and a set of devices for regulating magnetization.

Next, a sequence of magnetization regulating operations of a practical superconducting magnet apparatus using cylinders and disks, into which the aforementioned temperature regulating devices are incorporated, will be described hereinbelow. FIG. 47 is a block diagram illustrating the configuration of the superconducting magnet apparatus of the horizontal magnetic field type, and a set of instruments for regulating the magnetization. As shown in this figure, a main unit SCM of the superconducting magnet apparatus is composed of: a group of cylinders C1 to C3 and C1' to C3'; cylinders C4 and C4' for reducing leakage of magnetic field; a refrigerant container for enclosing these cylinders and a superconducting refrigerant; an heat insulating layer; a refrigerator; and a refrigerant inlet. Instruments for regulating the magnetization are a magnetizing coil Cex1; magnetizing coils Cex4 and Cex'4 for magnetizing cylinders C4 and C4'; a magnetization power supply PS1; a magnetic filed measuring instrument; an emergent demagnetization device PS2; and connectors for introducing power to the magnetizing coils Cex4 and Cex'4. Further, a cylinder ML4-1 and disks, ML4-2L and ML4-2R for preventing variation in the magnetic field distribution are placed inner circumferential portion of the group of cylinders C1 to C3 and C1' to C3'.

In the configuration of FIG. 47, a uniform magnetic field, whose strength and direction are indicated by B0 and an arrow, are caused by the group of cylinders C1 to C3 and C1' to C3' in the uniform magnetic field region FOV including the center point A0 of the main unit SCM of the superconducting magnet apparatus. The magnetizing coil Cex1 for magnetizing the group of cylinders C1 to C3 and C1' to C3' are to be placed externally or outside the cylinders, and are placed on the inner circumference of the main unit SCM of the superconducting magnet apparatus, and are fixed at n1 places at a point a in the circumferential direction and fixed by fixing members at a point b at n2 places in the circumferential direction. The magnetizing coils Cex4 and Cex'4 for magnetizing C4 and C4' are placed as magnetizing coils incorporated in the magnet (namely, the magnetizing auxiliary coils) are placed in the superconducting refrigerant in the neighborhood. Magnetizing currents for the magnetizing coils Cex1, Cex4 and Cex'4 are supplied from the magnetization power supply PS1 through connecting cables Lps1 and L'ps1, respectively. Currents for the group of heaters (not shown) to be used to regulate the temperature of each of the group of cylinders C1 to C4 and C1' to C4' are supplied from the magnetization power supply PS1. Moreover, a heater heating current for the emergent demagnetization is supplied from the emergent demagnetization device PS2 through a connecting cable Lps2. Magnetizing current and heater current are supplied and introduced from the connector.

The refrigerant container accommodates a superconducting refrigerant such as liquid helium and is covered with a heat insulating layer. The superconducting refrigerant is cooled by the and a vaporized refrigerant is exhausted from an exhaust port (not shown).

Electric currents are supplied to the temperature regulating devices mounted in the cylinder ML4-1 and the disks ML4-2L and ML4-2R from the magnetization power supply PS1 through the connecting cable L'ps1.

Connection between the main unit SCM of the superconducting magnet apparatus and the magnetization power supply PS1 is as follows. Namely, during regulating the magnetization, magnetizing currents and heater control currents are supplied through the connecting cables Lps1 and L'ps1 from the magnetizing power supply PS1. Further, an operation of controlling such electric currents is performed. Upon completion of the regulation of the magnetization, the main unit is connected with the emergent demagnetization device PS2 through the connecting cable Lps2. Heater regulating current is supplied, and an operation of controlling this current is performed.

FIG. 48 shows the detailed manner of the connection of the magnetizing coils Cex4 and Cex'4 and the temperature regulating devices mounted in the group of cylinders C1 to C4 and C1' to C4', the cylinder ML4-1 and the disks ML4-2L and ML4-2R, with the magnetization power supply PS1 and the emergent demagnetization device PS2 in the main unit SCM of the superconducting magnet apparatus. First, FIG. 48(A) illustrates the connection in the main unit SCM of the superconducting magnet apparatus in the case that it is unnecessary to regulate currents for the edge portions of the group of cylinders C1 to C4 and C1' to C4' in the configuration of FIG. 47 and that the compensation for the magnetic field distribution is not needed. Magnetizing current iex4 is supplied from the magnetization power supply PS1 through the connecting cable L'ps1 to the magnetizing coils Cex4 and Cex'4 connected in series. Heater regulating currents are supplied to the group of cylinders C1 to C4 and the group of cylinders C1' to C4', respectively and separately. Resistors of the heaters Hc1, Hc2, Hc3 and Hc4 of the cylinders C1 to C4 are connected in series, and a temperature regulating current ir1L is supplied thereto from the magnetizing power supply PS1 through the connecting cable L'ps1. Similarly, a temperature regulating current ir1R is supplied to the resistors of the heaters Hc1', Hc2', Hc3' and Hc4' of the cylinders C1' to C4'. With such a configuration, the balance in strength between the left-side and right-side magnetic fields can be regulated by adjusting the currents ir1L and ir1R and the magnetisation value can be regulated after the magnetization.

FIG. 48(B) illustrates the configuration in the case that it is necessary to regulate the currents for the edge portions of the cylinders, differently from FIG. 48(A). In FIG. 48(B), a central part thereof is similar to that of FIG. 48(A), and heaters for regulating the edge portions of the cylinders, which are illustrated in an outer periphery thereof is added. Resistors of the heaters Hc1L, Hc2L, Hc3L and Hc4L for the edge portions of the group of cylinders C1 to C4 are connected in series, and a temperature regulating current ir2L is supplied thereto from the magnetizing power supply PS1 through the connecting cable L'ps1. Similarly, a temperature regulating current ir2R is supplied to the resistors of the heaters Hc1R, Hc2R, Hc3R and Hc4R of the cylinders C1' to C4'. In this case, the heaters Hc1L to Hc4L and the heaters Hc1R to Hc4R are classified as two groups of the heaters. Further, the resistors of the heaters of each group is connected in series. The present invention is not limited thereto. All of resistors of both groups of the heaters may be connected in series. Moreover, such heaters may be provided only in the edge portions of the cylinders. For the purpose of performing partial regulation after the magnetization, such heaters are used before the balance between the left-side and right-side cylinders is regulated.

FIG. 48(C) illustrates a structure intended for further reducing the variation in the magnetic field distribution, and is added to the configurations of FIGS. 48(A) and 48(B). Structure illustrated in FIG. 48(C) is provided with the composing elements as many as possible, and is composed of heaters H41a to H41d for the cylinder ML4-1 and heaters H42La to H42Ld and H42Ra to H42Rd for disks ML4-2L and ML4-2R. Differently from this configuration, the disks ML4-2L and ML4-2R are sometimes not added to the apparatus. All of these heaters are connected in series. Before starting the magnetizing operation, a control electric current ir4 is introduced thereto from the magnetization power supply PS1. This current is maintained until the regulation of the magnetization is completed. As a result, the cylinder ML4-1 and the disks ML4-2L and ML4-2R are maintained in a state, in which the normal conducting properties are exhibited, until the regulation of the magnetization is completed. Thereafter, the control current ir4 for the heaters is adjusted to zero so that all of the magnetic fluxes related to the magnetic field in the uniform magnetic field region FOV. Then, the operation of perfroming the functions of the heaters is stopped.

Figure 49:
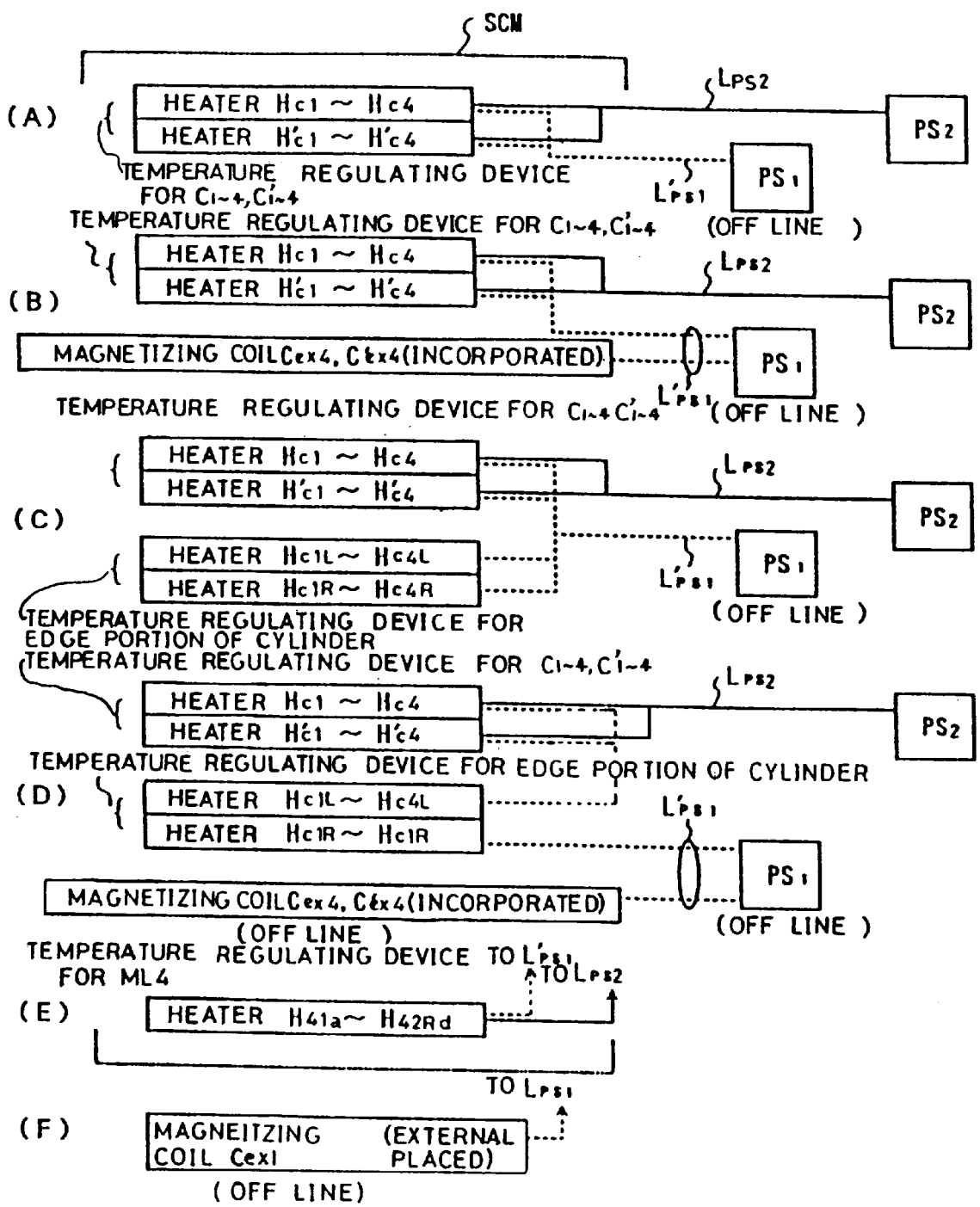
FIG. 49 is a diagram summarily illustrating the connection of each of a group of temperature regulating devices and a magnetizing coil, which is incorporated in a magnet, to a magnetization power supply.

Referring to FIG. 49, the connection of the groups of heaters of the main unit SCM of the superconducting magnet apparatus with the magnetization power supply PS1 and the emergent demagnetization device PS2, which are external devices, is summarized therein. In this figure, solid lines designate on-line connections; and dashed lines off- line connections.

FIG. 49(A) illustrates the case that the heaters Hc1 to Hc4 and Hc1' to Hc4' are mounted in the group of cylinders C1 to C4 and C1' to C4' without the auxiliary magnetizing coils Cex4 and C'ex4 (to be described later). The magnetization power supply PS1 is on-line connected thereto; and the emergent demagnetization device PS2 is off-line connected thereto.

FIG. 49(B) illustrates the case that the auxiliary magnetizing coils Cex4 and C'ex4 are added, differently from the case of FIG. 49(A). These auxiliary magnetizing coils Cex4 and C'ex4 are off-line connected to the magnetization power supply PS1.

FIG. 49(C) illustrates the case that the heaters Hc1L to Hc4L and Hc1R to Hc4R for regulating the edge portions of the cylinders C1 to C4 and C1' to C4' are added, differently from the case of FIG. 49(A). These heaters Hc1L to Hc4L and Hc1R to Hc4R for regulating the edge portions are off-line connected to the magnetization power supply PS1.

FIG. 49(D) illustrates the case that the auxiliary magnetizing coils Cex4 and C'ex4 are added, differently from the case of FIG. 49(C). These auxiliary magnetizing coils Cex4 and C'ex4 are off-line connected to the magnetization power supply PS1, similarly as in the case of FIG. 49(B).

FIG. 49(E) illustrates the case that the heaters H41$a$ to H41$d$, H42La to H42Ld and H42Ra to H42Rd for regulating the temeprature of the cylinder ML4-1 and the disks ML4-2L and ML4-2R are added, differently from the cases of FIGS. 48(A) to (D). These heaters are off-line connected to the magnetization power supply PS1. Incidentally, the aforesaid cylinder ML4-1 and the disks ML4-2L and ML4-2R can be added in all cases of FIGS. 49(A) to 49(D) and are added, if necessary.

FIG. 49(F) illustrates the connection between the magnetizing coil Cex1 and the magnetizing power supply PS1, which is always used in each of the combination of the cases of FIGS. 49(A) to 49(E). Further, both of the magnetizing coil Cex1 and the magnetizing power supply PS1 are off-line connected with each other.

Figure 50A:
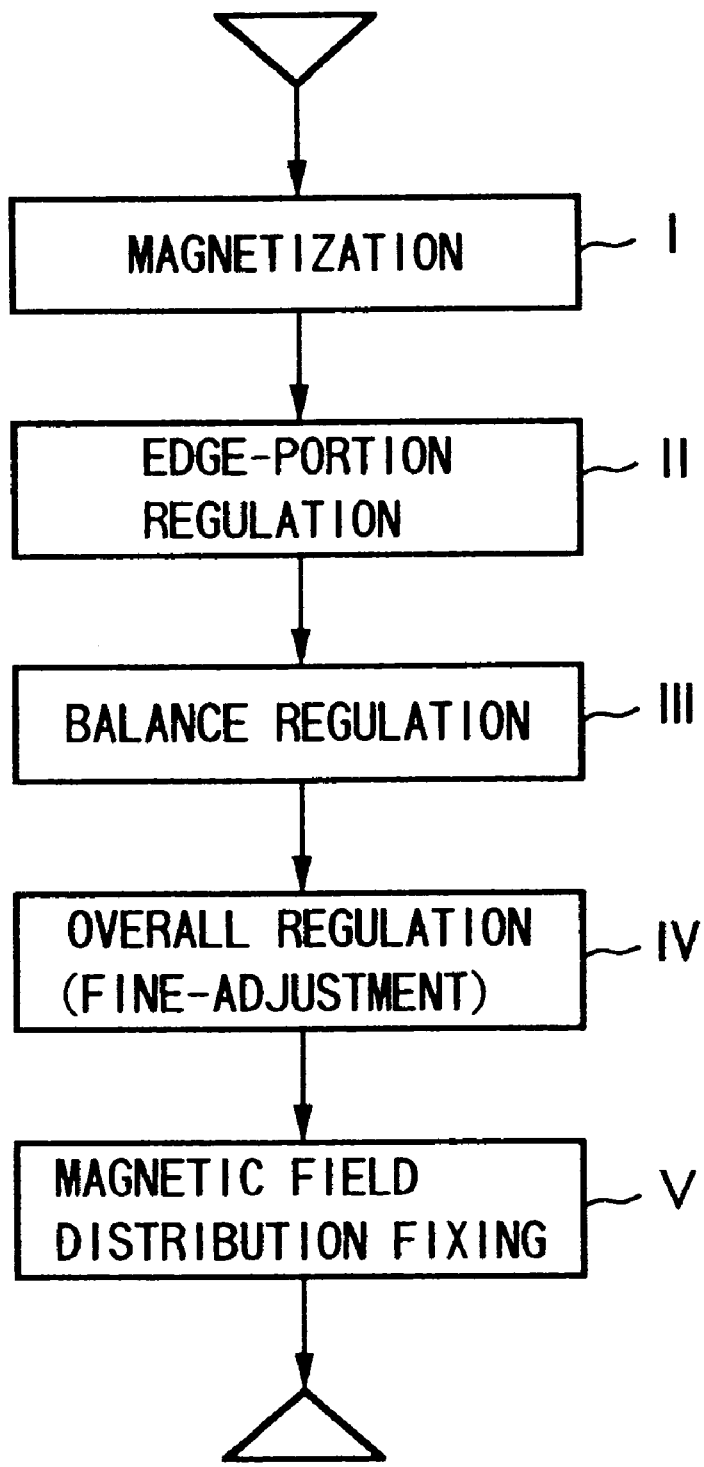

Next, a method used for perfomring the magnetization regulation operation of, for example, the superconducting magnet apparatus of the horizontal manetic field type illustrated in FIG. 47 will be described. FIGS. 50 to 55 are flowcharts and time charts of the magnetization regulating operation. FIG. 50 is a flowchart of the entire magnetization regulating operation. FIG. 50(A) is a flowchart summarizing the entire magnetization regulating operation which is normally divided into 5 processes. Process I is a magnetization process; process II an edge-portion regulation process; process III a balance regulation process; and process IV an overall regulation (fine-adjustment) process; and process V a magnetic field distribution fixing process. FIGS. 50(B) to 50(F) show the detailed flow chart of each process.

Figure 50B:
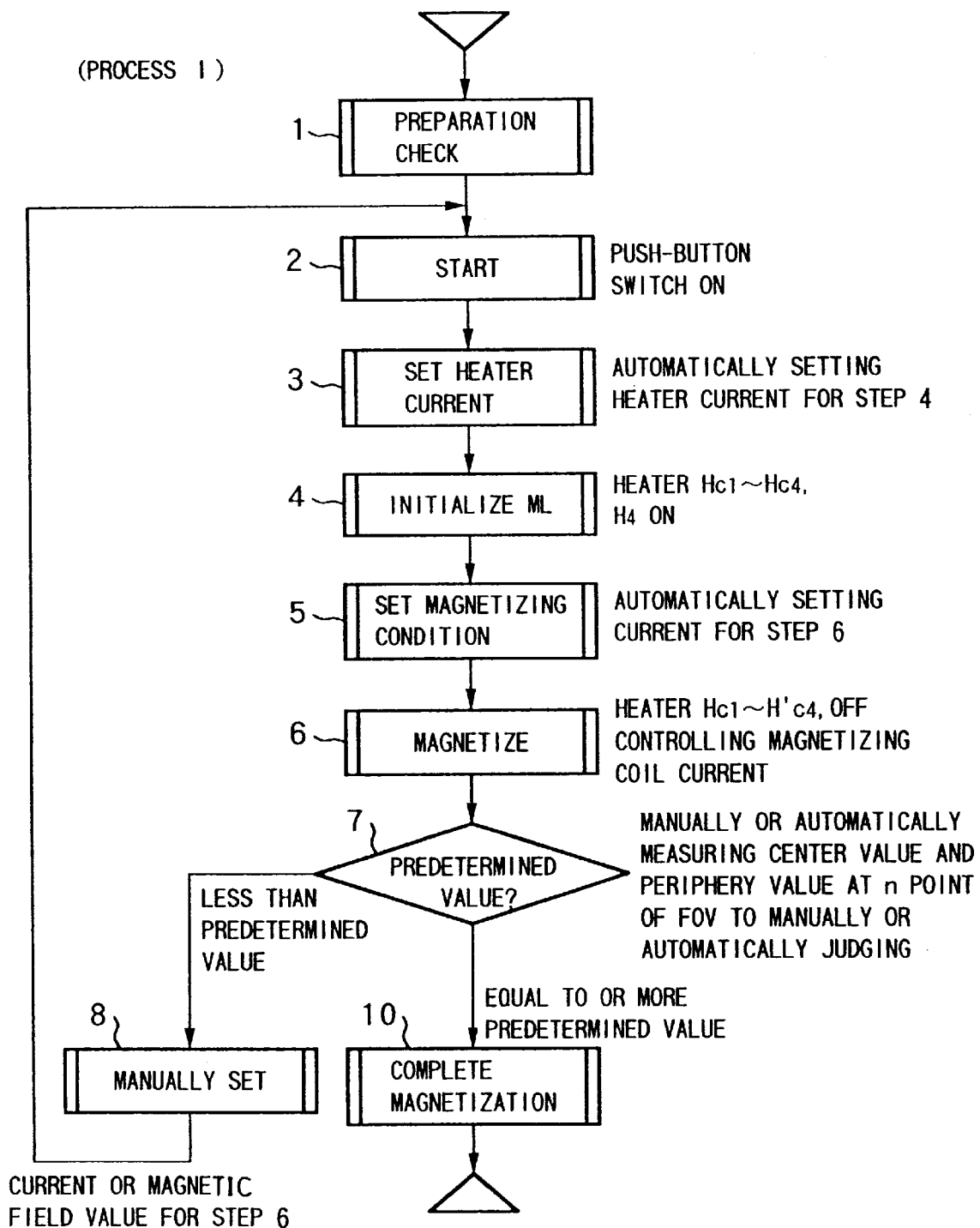

FIG. 50(B) is a flowchart of the magnetization process which is a process I. This magnetization process is to initialize the group of cylinders and then magnetize the group of cylinders. In this figure, step 1 is a check step in which it is checked visually or the like how the conditions of each of the instruments (namely, the magnetization power supply and the magnetizing coils) to be used in the magnetization operation are prepared, and whether the connections thereamong through the connecting cables are performed in accordance with the prescription. If so, the process advances to the next step. Step 2 is a start step in which a starting push-button switch provided in the magnetizing power supply PS1 is turned on to thereby start the magnetization operation.

Step 3 is a heater current setting step, and step 4 is a ML initializing step. In ML initializing step, a group of heaters mounted in the group of cylinders and so on (C1 to C4 and C1' to C4', ML4-1, ML4-2L, ML4-2R and so on) are heated so as to bring the states of the cylinders into the state, in which the normal conducting properties are exhibited, thereby performing the magnetization process and the magnetization regulating operation in the following steps. Thus, in the heater current setting step, namely, in step 3, the value of a current to be made to flow through the heater is set in the magnetizing power supply PS1. Then, in step 4, namely, in the ML initializing step, currents having the set value are made to flow through each of the heaters (Hc1 to Hc4, H'c1 to H'c4, Hc1L to Hc4L, Hc1R to Hc4R, Hc41$a$ to H41$d$, H42La to H42Ld, H42Ra to H42Rd). Thus, the group of cylinders are put into the state, in which the normal conducting properties are exhibited. Thereafter, the heating thereof by means of heaters is stopped. Further, the cylinders are cooled and thus are returned into a state in which the superconducting properties are exhibited. Incidentally, the regulation of the cylinder ML4-1 and the disks ML4-2L and ML4-2R are performed only in Process V, namely, in the magnetic field distribution fixing process. Therefore, it is necessary to maintain the cylinder ML4-1 and the disks ML4-2L and ML4-2R in the state, in which the normal conducting properties are exhibited, until then. Consequently, the heating of only the heaters Hc41$a$ to H41$d$, H42La to H42Ld, H42Ra to H42Rd is continued until Process V starts.

Step 5 is a magnetiing condition setting step in which the conditions for the magnetizing current to be made to flow through the magnetizing coils Cex1, Cex4 and C'ex4, and the conditions for the temperature regulating current to be made to flow through the group of heaters Hc1 to Hc4 and H'C1 to H'c4 are set (in this step, the condition of the collective magnetization or the divisional, separate and individual magnetization is set). Step 6 is a magnetization step in which the magnetizing current iex1 and iex4 for the magnetizing coils Cex1, Cex4 and C'ex4, and the temperature regulating currents ir1L and ir1R for the heaters Hc1 to Hc4, H'c1 to H'c4 are made to flow therethrough from the magnetizing power supply PS1 in accordance with the magnetization conditions set in step 5, and thus the magnetization of the group of cylinders C1 to C4 and C1' to C4' is performed. Namley, the magnetization of the group of cylinders C1 to C4 and C1' to C4' is effected as follows. Magnetizing magnetic field is generated by letting the magnetizing currents iex1 and iex4 flow through the magnetizing coils Cex1, Cex4 and C'ex4. Then, the temperature regulating currents ir1L and ir1R for the heaters Hc1 to Hc4, H'c1 to H'c4 is made to flow through the magnetized magnetic field, so that the cylinders C1 to C4 and C1' to C4' are once brought into the state, in which the normal conducting properties are exhibited. Thereafter, the currents ir1L and ir1R for the heaters Hc1 to Hc4, H'c1 to H'c4 are interrupted, so that the cylinders C1 to C4 and C1' to C4' are returned to the state, in which the superconducting properties are exhibited.

Step 7 is a magnetization value judging step in which it is judged manually or automatically whether or not the sterngth of the magnetic field at the mangetization value managment points provided at the center and the periphery portion of the uniform magnetic field region FOV of the superconducting magnet apparatus reaches a predetrmined value. Magnetic field measuring means is placed at each point and further, the magnetic field is manually or automatically measured. Then, the measured values are compared with the predetermiend value. If these measured values reach the predetermined value, the magnetization is completed in the following step 10. If not, the process returns to step 2, through step 8 which is the manually setting step, so as to perform the magnetization again. In step 8, the magnetizing current or the magnetizing magnetic field value at the time of magnetization are manually reset. In the aforesaid step 7, if it is judged that the measured values reach the predetermined value, the magnetization is completed in step 10. Further, in step 10 which is the magnetization completing step, the apparatus takes a pause, and thereafter, proceeds to Process II.

FIG. 50(C) is a flowchart of Process II, namely, an edge-portion regulating process. In this edge-portion regulating process, a persistent current flowing in the edge portions of the group of cylinders C1 to C4 and C1' to C4' concentratively is regulated in such a manner as to have a lower value. First, in step 11, a necessity-of-regulating-edge-portion checking step. If necessary, an edge-portion regulating operation is performed. If unnecessary, the process directly proceeds to Process III. It is usually determined from the magnetizing magnetic field distribution whether or not the edge portion regulating operation is necessary. Therefore, the necessity of regulating the edge portions is determined at the time of designing the superconducting magnet.

If judged as necessary in step 11, the process goes forward to step 12, namely, a set and start step in which the conditions for regulating the edge portions are set, and a starting push button switch is turned on. In the edge-portion regulating operation, the persistent current flowing through the edge portions are regulated by letting the temperature regulating current flow through the heaters Hc1L to Hc4L and Hc1R to Hc4R for regulating the edge-portions of the group of cylinders C1 to C4 and C1' to C4. Thus, the temperature regulating current value and the time period, during which the current is made to flow, are set.

Step 13 is an edge-portion regulating step in which the temperature regulating currents to be made to flow through the heaters Hc1L to Hc4R and Hc1R to Hc4R are controlled in accordance with the edge-portion regulating conditions set in step 12. Step 14 is an edge-portion regulation completion step in which it is confirmed that the persistent current flowing in the edge portions of the group of cylinders C1 to C4 and C1' to C4 are adjusted to the predetermined value (this confirmation is performed by measuring the magnetic field), thereafter, the temperature regulating currents for the heaters are reset to zero, thereby completing the edge-portion regulating operation. Usually, processing in steps 13 and 14 are performed by an automatic operation.

FIG. 50(D) is a flowchart of Process III, namely, a balance regulating process. In this balance regulating process, the balance between the magnetic fields on the left side and the right side of the the center line perpendicular to the center axis of the superconducting magnet of the horizontal magnetic field type is automatically calculated from the measured magnetic field . Then, the temperatures of the group of cylinders C1 to C4 and C1' to C4 are regulated separately by the heaters. Thus, the balance between the magnetic fields formed in the uniform magnetic field region is regulated. First, in step 15 which is a necessity-of-balance-regulation checking step, if necessary, the regulation of the balalce is performed. If not, the process directly goes to Process IV. Necessity for regulating the balance therebetween is judged by calculating the inclination of each of the left-side and right-side magnetic fields on the basis of the measured values of the magnetic field and then determining whether or not the inclination is within a tolerance. If not, it is necessary to regulate the balance therebetween.

If necessary, the process proceeeds to step 16 which is a balance calculation and setting step. In this step, the values of the persistent current flowing through the group of the cylinders C1 to C4 and C1' to C4 are calculated on the measured values of the magnetic field. Further, it is computed what amount the value of the persistent current flowing through the group of the cylinders C1 to C4 and C1' to C4 should be lowered, and at what degree the temperature of the group of the cylinders C1 to C4 and C1' to C4 should be maintained for that purpose, and what amount of the control current should be made to flow through the heaters mounted in the group of the cylinders C1 to C4 and C1' to C4 to that end. Moreover, the heater current values ir1L and ir1R to be made to flow through the heaters Hc1 to Hc4 provided on the left-side and the heaters H'c1 to H'c4 provided on the right-side, respectively, are set. Furthermore, the time period during which such currents are made to flow therethrough is set. In this step, the calculation and the setting is usually performed automatically.

Next, the process proceeds to step 17 which is a start step. In this step, the starting push-button switch is turned on so as to commence the balance regulating operation. In step 18, namely, a balance regulating step, the heater current ir1L or ir1R is made to flow through the heaters Hc1 to Hc4 of the left-side group or the heaters H'c1 to H'c4 of the right-side group. Then, one of the left-side and right-side magnetic fields is demagnetized, so that the balance therebetween is regulated. In step 19 which is a partial regulation completion step, the magnetic fields after the balance therebetween is regulated are measured. Then, it is confirmed that the inclinations of the left-side and right-side magnetic fields are within a tolerance. Thus, Process III, namely, a balance regulation process is completed.

Figure 50E:
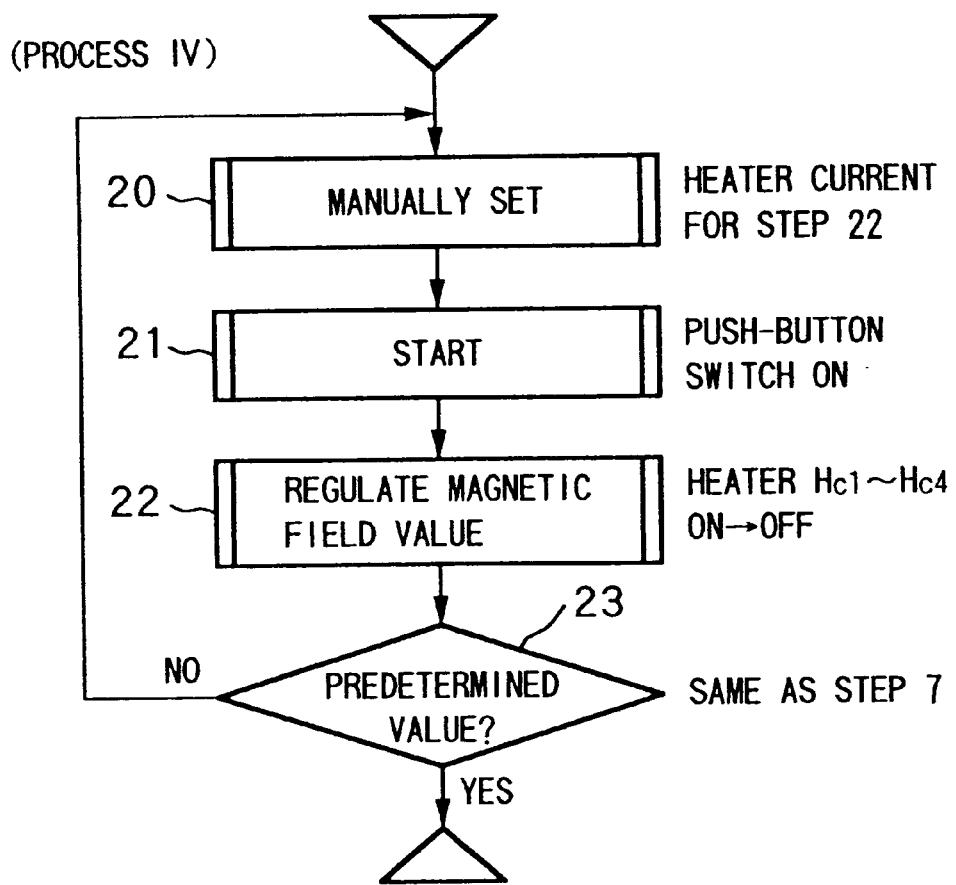

FIG. 50(E) is a flowchart of Process IV, namely, an overall regulation process. In this overall regulation process, the fine-adjustment of the magnetization value is peformed so that the magnetizaton value of the magnetic field of the superconducting maget apparatus becomes equal to a final magnetization value which is a target value. In this overall regulation process, the currents ir1L and ir1R for the heaters Hc1 to Hc4 and H'c1 to H'c4 correspoding to the group of cylinders C1 to C4 and C1' to C4' are regulated. First, in step 20, which is a mannual setting step, the final magnetization value of the superconducting magnet apparatus is set manually or automatically. If set, the currents ir1L and ir1R to be made to flow through the heaters Hc1 to Hc4 and H'c1 to H'c4 for heating the group of cylinders C1 to C4 and C1' to C4 are obtained by calculation based the difference between this final magnetization value and the measured value of the magnetic field. In step 21 which is a start step, the starting push-button switch is turned on to thereby start performing the overall regulation process. In step 22 which is a magnetic field value regulating step, the heater currents ir1L and ir1R set in step 20 are made to flow through the heaters Hc1 to Hc4 and H'c1 to H'c4, thereby performing the fine-adjustment of the magnetization value of the superconducting magnet apparatus. In step 23, it is judged by comparing the magnetization value after the fine-adjustment with the measured value of the magnetic field whether or not the aforesaid magnetization value after the fine-adjustment is equal to the final magnetization value, similarly as in step 7. If reached, the process proceeds to the next process. If not, the process returns to step 20. Then, Process IV is repeated.

Figure 50F:
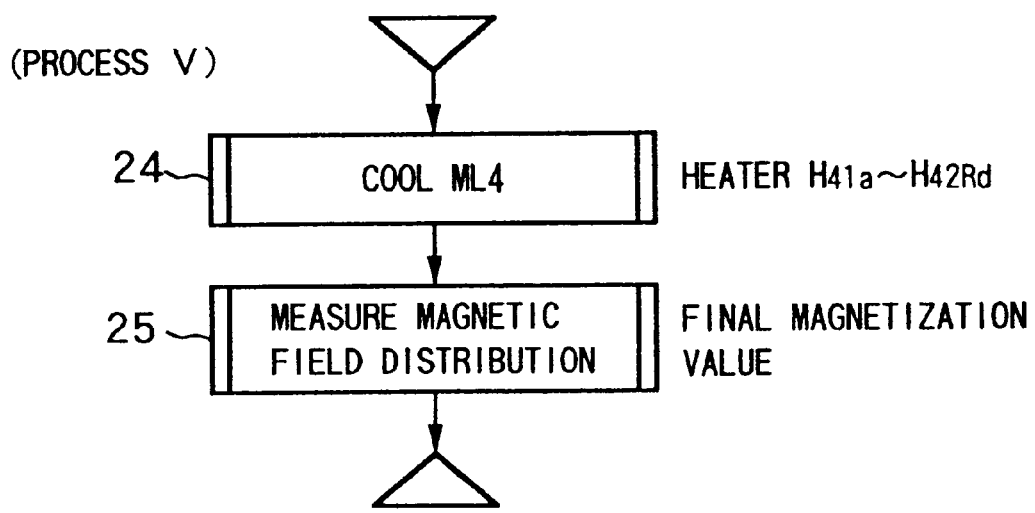

FIG. 50(F) is a flowchart of Process V, namely, a magnetic field distribution fixing process. This magnetic field distribution fixing process, the magnetization value of the magnetic field of the superconducting magnet apparatus, and the magnetic field distribution are fixed in such a manner as not to change with time. Step 24 is ML4 cooling step in which the heating of the heaters H41a to H41d, H42La to H42Ld and H42Ra to H42Rd for the cylinder ML4-1, the disks ML4-2L and ML4-2R is stopped, and the cylinder ML4-1, the disks ML4-2L and ML4-2R are then cooled in such a manner as to be put into the state in which the superconducting properties are exhibited. By this operation, the magnetic fluxes penetrating through the cylinder ML4-1, and the disks ML4-2L and ML4-2R are fixed. The change (attenuation) with time in strength of the magnetic field distribution of the uniform magnetic region can be compensated. In step 25 which is a magnetic field measuring step, the magnet field distribution of the superconducting magnet apparatus is measured. Thus, the overall magnetization step is completed.

Figure 51:
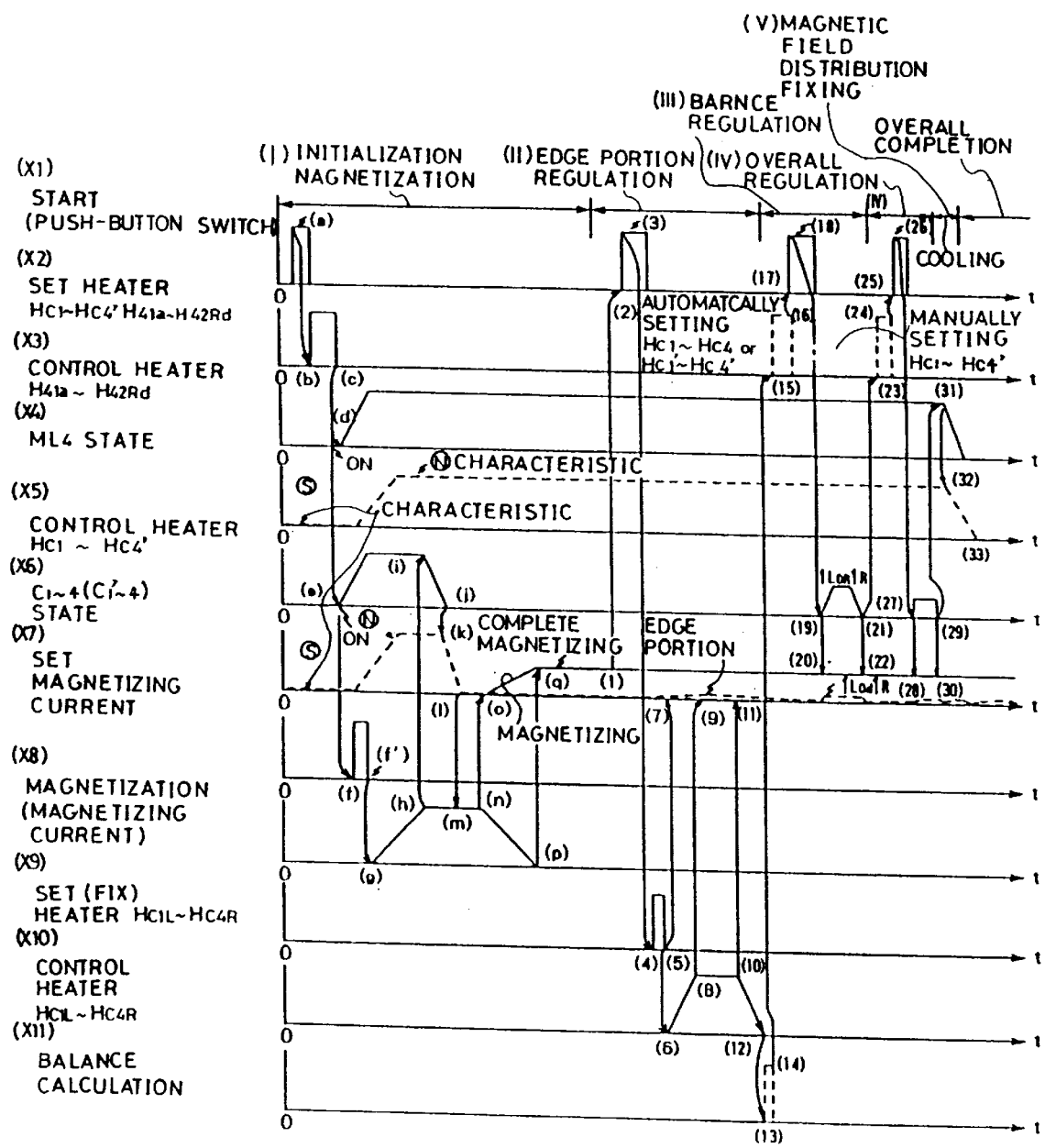
FIG. 51 is a time chart corresponding to the flowchart of FIG. 50.

Next, FIG. 51 shows a time chart corresponding to the flowchart of FIG. 50. As shown in FIG. 51, FIG. 51 (X1) shows a time chart of an operation of starting push-button switch; FIG. 51 (X2) a time chart of the initialization of the group of cylinders and the cylinder ML4-1 and the disks ML4-2L and ML4-2R (hereunder referred to as a cylinder ML4); FIG. 51(X3) a time chart of an operation of controlling currents for the heaters H41$a$ to H41$d$, H42La to H42Ld and H42Ra to H42Rd; FIG. 51(X4) a time chart of a change in state (namely, the normal conducting state or the superconducting state) of the cylinder ML4; FIG. 51(X5) a time chart of an operation of controlling currents for the heaters Hc1 to Hc4 and H'c1 to H'c4 used to heat the group of cylinders C1 to C4 and C1' to C4'; FIG. 51(X6) a time chart of a change in state (namely, the dashed line represents such a change between the normal conducting state or the superconducting state; and the solid line represents a change in the magnetization value) of the group of the cylinders C1 to C4 and C1' to C4'; FIG. 51(X7) a time chart of an operation of setting magnetizing current conditions for the magnetizing coils Cex1, Cex4 and C'ex4; FIG. 51(X8) a time chart of a state of a magnetizing current for each of the magnetizing coils Cex1, Cex4 and C'ex4; FIG. 51(X9) a time chart of an operation of setting electric current conditions for the heaters HcL1 to Hc4L and Hc1R to Hc4R to regulate edge portions; FIG. 51 (X10) a time chart of an operation of controlling the currents for the heaters Hc1L to Hc4L and Hc1R to Hc4R; and FIG. 51 (X11) a time chart of a calculation of the balance between the left-side and right-side magnetic fields.

Regarding a time chart of FIG. 51, the operation will be described hereinbelow by dividing the operation into (I) an initialization/magnetization process, (II an edge portion regulating process, (III) balance regulating process, (IV) overall regulation process, and (V) a magnetic field fixing process, similarly as in the case of the description of the flowchart of FIG. 50.

(I) Initialization/Magnetization Process

Figure 52:
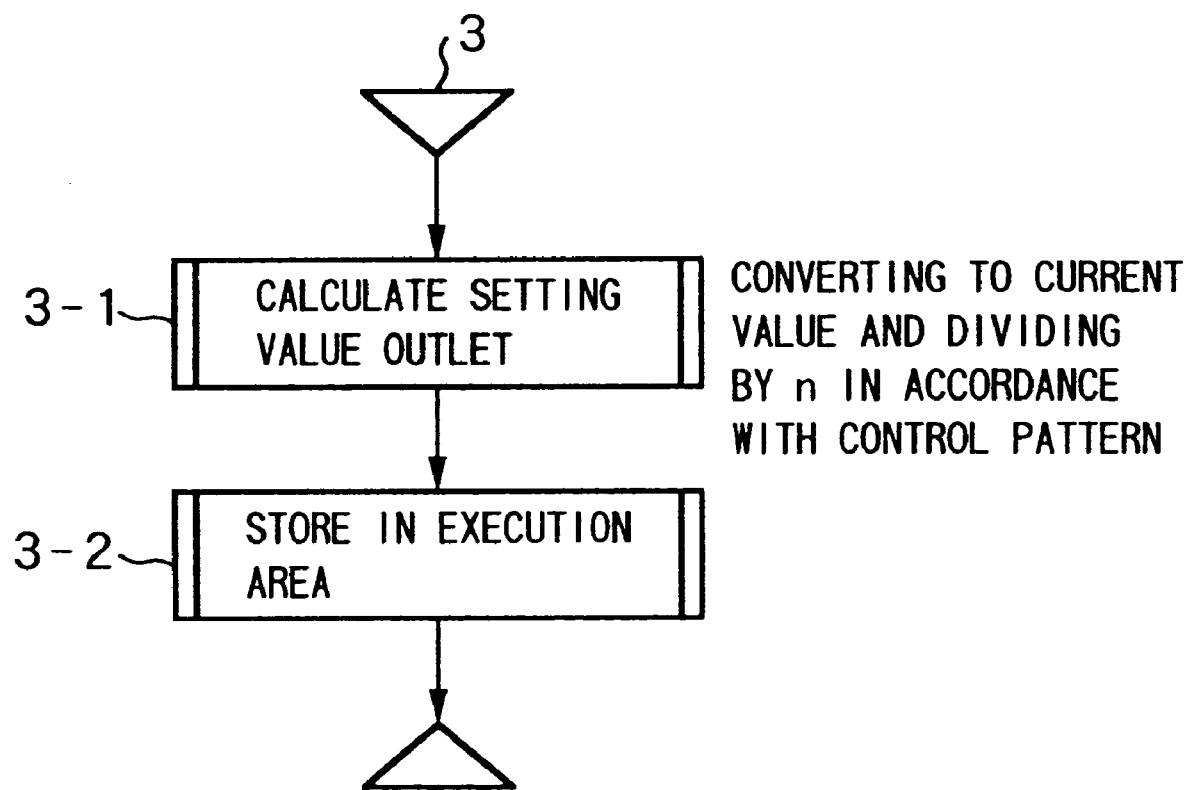
FIG. 52 is a detailed flowchart illustrating a heater current setting process to be performed in step 3 of FIG. 50.

When turning a push button switch on for issuing a starting signal at a point a of FIG. 51(X1), the process proceeds to a point b of FIG. 51(X2). Incidentally, the apparatus has a setting value table of currents to be made to flow through the heaters Hc1 to Hc4, H'c1 to H'c4, H41$a$ to H41$d$, H42La to H42Ld, H42Ra to H42Rd so as to perform the initialization at preliminarily computed values). Operation of setting the set values at a control table for an automatic operation is completed between points b and c. This portion corresponds to step 3 of FIG. 50(B). FIG. 52 illustrates an example of the detailed flowchart of step 3. In step 3-1 of FIG. 52, (previously determined temperature set values for group of cylinders or the like are read and converted into values of control currents for the heaters. Moreover, the value of the heater current is divided by n in accordance with an optimum control pattern. Subsequently, in step 3-2, a current obtained by the division is stored in an execution area (incidentally, "execution" means to perform a control operation actually). Next, when the heater current setting operation is completed at a point c in FIG. 51 (X2). At a point d of FIG. 51 (X3), the heating of the cylinder ML4 by means of the heater is commenced. In addition, at a point e of FIG. 51 (X5), the heating of the heaters Hc1 to Hc4 and H'c1 to H'c4 respectively corresponding to the group of cylinders C1 to C4 and C1' to C4' is started. Moreover, a heater current ir4 is controlled (according to the set value of FIG. 51(X2)) for the heating of the heaters of FIG. 51(X3) to be performed so as to change the state of the cylinder ML4 from the state, in which the superconducting properties (S characteristic shown in this figure) are exhibited, to the state, in which the normal conducting properties (N characteristic shown in this figure) are exhibited. Furthermore, heater currents ir1L and ir1R are controlled according to the set values of FIG. 51 (X2) for the heating of the heaters of FIG. 51 (X6) to be performed so as to change the state of the cylinder ML4 from the state corresponding to S characteristic through the state corresponding to N characteristic to the state corresponding to S characteristic again to thereby perform the demagnetization of the residual magnetic field of the group of cylinders C1 to C4 and C1' to C4'.

Next, the process goes to a point f in FIG. 51 (X7). Then, the setting of the magnetizing currents iex1 and iex4 for the magnetization coils Ces1, Cex4 and C'ex4 is started and thereafter, completed at a point f'. This setting of the magnetizing currents is performed similarly as in the case of FIG. 52. Namely, the set values of the magnetizing current is divided by n in accordance with the optimum control pattern and resultant values are stored in the execution area, and thus the setting is completed. Next, the process advances to a point g in FIG. 51(X8), and thence the magnetizing currents are made to flow therethrough from the point g to a point h, so that the magnetizing magnetic field is raised to the necessary strength of the magnetic field, which is needed for magnetizing. When the value of the magnetizing magnetic field reaches the predetermined value, the magnetization is performed from a point h through a point i of FIG. 51 (X5), a point j, a point k of FIG. 51 (X6), a point 1, a point m of FIG. 51 (X8), a point n, a point o of FIG. 51 (X6), a point p of FIG. 51(X8), a point q of FIG. 51(X6) in this order. Thus, the magnetization is completed.

Figure 53:
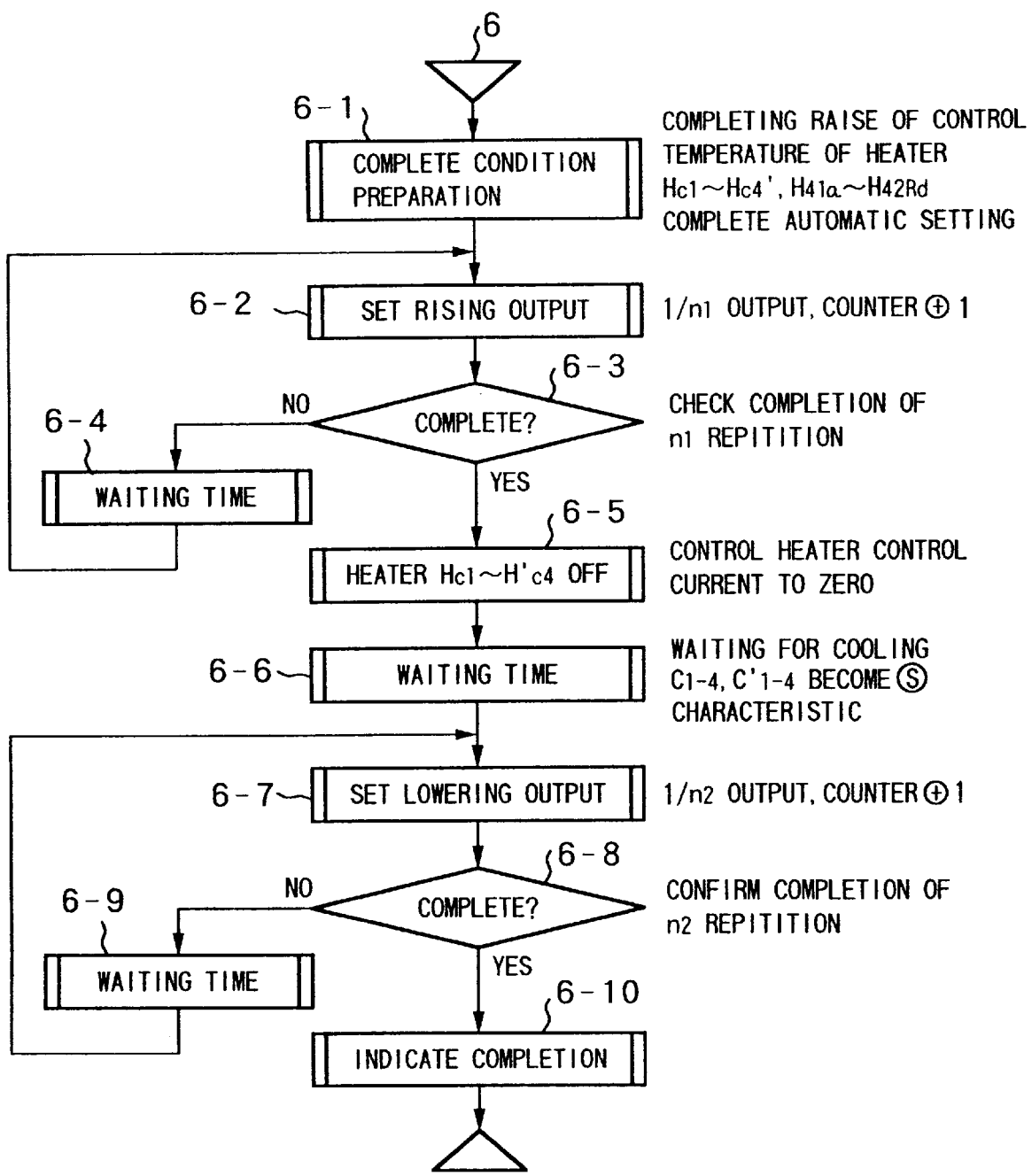
FIG. 53 is a detailed flowchart illustrating a magnetizing process to be performed in step 6 of FIG. 50.

FIG. 53 is a detailed flowchart of the magnetization step, namely, step 6. In FIG. 53, a step 6-1 corresponds to a point g of FIG. 51 (X8), whereupon the raise of the heater currents ir1L, ir1R and ir4 is completed. This is a point of time at which the automatic setting of the magnetizing current is completed. In step 6-2, (1/n1) of the magnetizing current is set and output to an output circuit of the magnetization power supply PS1 as a rising output. Moreover, an output rise management counter is incrementd by 1. By this operation, (1/n1) of the magnetizing current is introduced to the magnetizing coils Cex and Cex4 and C'ex4 from the magnetization power supply PS1. In steps 6-3 and 6-4, the aforementioned operation is repeated n1 times by intermitting for a magnetizing magnetic field rise waiting time. Upon completion of n1 repitions, the rise of the magnetizing magnetic field is completed (corresponding to a point h of FIG. 51 (X8)).

Next, in step 6-5, the heater currents ir1L and ir1R are controlled in such a manner as to decreased to zero, with intention of returning the states of the group of cylinders C1 to C4, C1' to C4' to the state corresponding to N characteristic to the state corresponding to S characteristic. In step 6-6, the apparatus waits for a moment (corresponding to a point m of FIG. 51 (X8)) until S characteristic becomes exhibited after the temperature of the group of cylinders C1 to C4 and C1' to C4' is lowered. Thus, the preparation for magnetization is completed. Magnetization is performed by capturing the magnetic fluxes of the magnetizing mangetic field in the section of the cylinder, which is formed by the group of cylinders C1 to C4 and C1' to C4'. Thus, in steps 6-7, 6-8 and 6-9, while the group of cylinders C1 to C4 and C1' to C4' are maintained in the state in which S characteristic is exhibited, the magnetizing magnetic field caused by the magnetizing coils is lowered. The control of the magnetic field is performed simultaneously with the rise time. In step 6-7, (1/n1) of the magnetizing current is set and output to the output circuit of the magnetization power supply PS1 as a lowering output. Moreover, an output lowering management counter is incremented by 1. By operating this opeation, the magnetizing current is lowered by (1/n2). Subsequently, in step 6-8, it is judged whether or not the lowering operation is completed. If not, the process proceeds to step 6-9, wherein the apparatus waits for a time period during the magnetizing magnetic field lowers. Then, the operation of lowering the magnetizing current is completed by iterately performing a sequence of steps 6-7, 6-8 and 6-9 by n2 times. Upon completion of repeating the operation n2 times, the completion of the magnetization is indicated in step 6-10 (corresponding to a point q of FIG. 51(X6)). When the magnetization is completed, the process advances to the next process.

(II) Edge-Portion of Cylinders (C1 to C4 and C1' to C4') Regulating Process

Necessity of regulating the edge-portions is automatically judged on the basis of the preset information. Only if necessary, a step starting push-button switch is turned on at a point (2) of FIG. 51 (X1) (corresponding to a point (3)). When the starting switch turning on, the control currents for heaters Hc1L to Hc4L and Hc1R and Hc4R for regulating the edge portions for the group of the cylinders C1 to C4 and C1' to C4 are set from a point between a point (4) and a point (5) of FIG. 51 (X9). When the setting of the control currents is completed at the point (5), the control currents ir1L and ir1R for the heaters Hc1L to Hc4L and Hc1R and Hc4R are controlled from a point (6) of FIG. 51 (X9). Further, while maintaining the group of the cylinders C1 to C4 and C1' to C4 in the range in which S characteristic is exhibited, only the temperature of the edge portions is raised (corresponding to a point (8) of FIG. 51 (X10)). As a result, the persistent current flowing in the edge portions of the group of the cylinders C1 to C4 and C1' to C4 can be lowered to a predetermined value (corresponding to the change from a point (7) to a point (11) through a point (9)) by heating the edge portions for a predetermined time period from a point (8) to a point (10). Thereafter, the control currents ir1L and ir1R for the heaters are lowered to zero from a point (10) to a point (12). The setting of the heater currents in the edge-porion regulating process is almost the same as of Process I namely, the initialization/magnetization process except that the set values are preliminarily determine for regulating the edge portions. Thus, algorithm of sequence of operations for setting and controlling th heater currents is the same as used in Process (I) namely, Initialization/ magnetization process.

(III) Balance-Left-side-And-Right-side Regulating Process

In the process of regulating the balance between the left-side and right-side magnetic fields, by inputting measurement data representing the magnetization value measured at the management point to the magnetizing power supply PS1 and then calculating the difference in magnetization value between the left-side and right-side magnetic fields and checking whether or not the calculated difference is within a tolerance. At a point (13) of FIG. 51(X11), the difference between magnetization values is calculated on the basis of the aforesaid measured values, and further, the necessity of the regulation of the balance therebetween is judged. If necessary, the process proceeds to a point (15) of FIG. 51 (X2). Then, the conditions necessary to regulate the balance therebetween are calculated. Control currents for the heaters Hc1 to Hc4 and H'c1 to H'c4 are set. This corresponds to step 16 of FIG. 50(D) and is illustrated in detail in FIG. 54.

Figure 54:
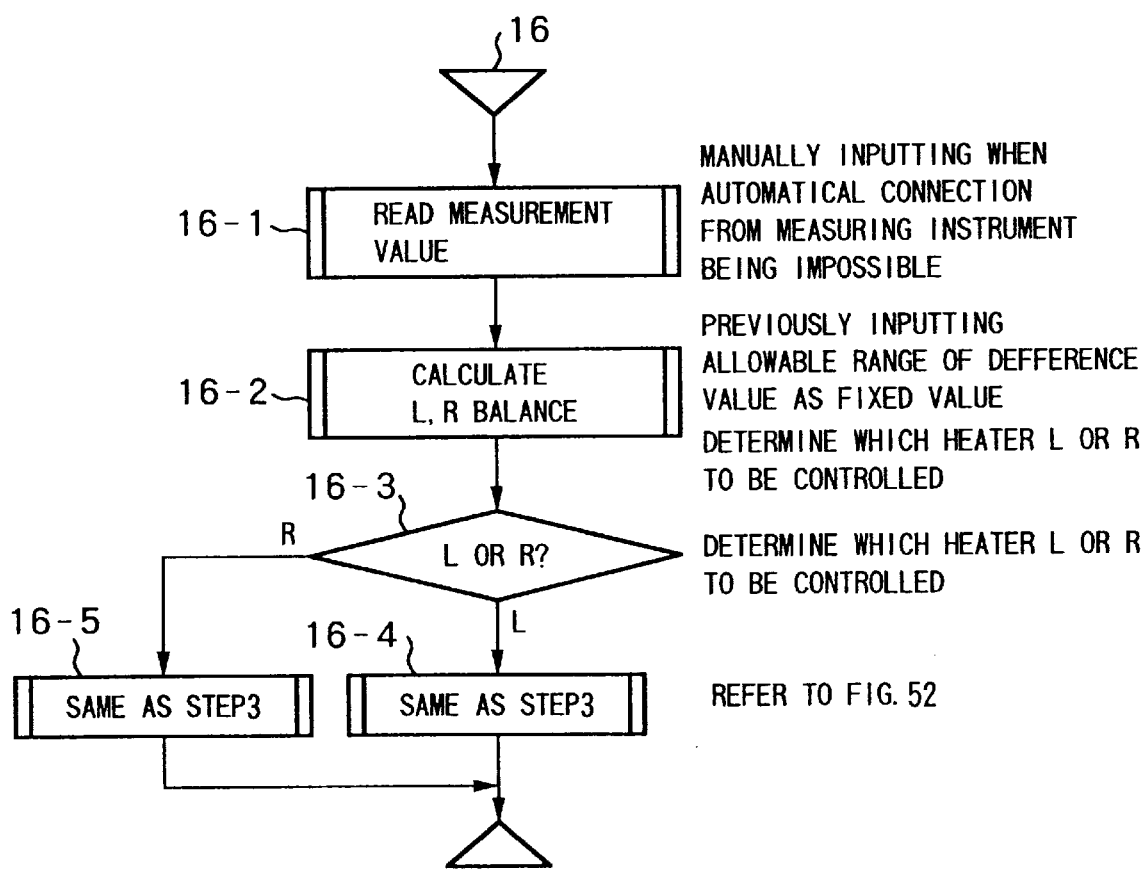
FIG. 54 is a detailed flowchart illustrating a balance calculating/setting process to be performed in step 16 of FIG. 50.

FIG. 54 is a detailed flowchart of a balance calculation setting step of the aforesaid step 16. First, the measurement data on the magnetic field formed by the superconducting magnet apparatus is read in step 16-1. Generally, the data is automatically read from the measuring instrument. If impossible, the data may be read manually. In step 16-2, the difference between the left-side and right-side magnetic fields is calculated. Then, it is checked what strength of the magnetic field should be regulated based on the calculated difference. In step 16-3, it is checked which of the strength of the left-side and right-side magnetic fields is higher. Then, it is determined from a result of this check which group of the heaters should be controlled. In steps 16-4 and 16-5, control conditions for the heaters to be regulated are set on the basis of a result obtained in step 16-2. Further, the set values are entered in the execution area. Operations to be performed in steps 16-4 and 16-5 are similar to step 3 of the initialization/magnetization process. Thus, the algorithm used in steps 16-4 and 16-5 are the same as used in step 3 of the initialization/magnetization process.

Upon completion of the setting of the control conditions for the heaters to be regulated in a point (16) of FIG. 51 (X2), the process advances to a point (17) of FIG. 51 (X1), whereupon the starting push-button switch is turned on. Then, currents ir1L and ir1R flow through the heaters Hc1 to Hc4 or H'c1 to H'c4 to be regulated from a point (19) of FIG. 51 (X5). The group of cylinders C1 to C4 and C1' to C4' are thus heated. This control operation on the heater currents can be performed according to the same algorithm as of the operations to be performed from a point e to a point j of FIG. 51 (X5). The group of cylinders C1 to C4 and C1' to C4' can be regulated while these cylinders are maintained in the state in which S characteristic is exhibited.

This regulation is completed at a point (21).

(IV) Overall Regulation Process

Figure 55:
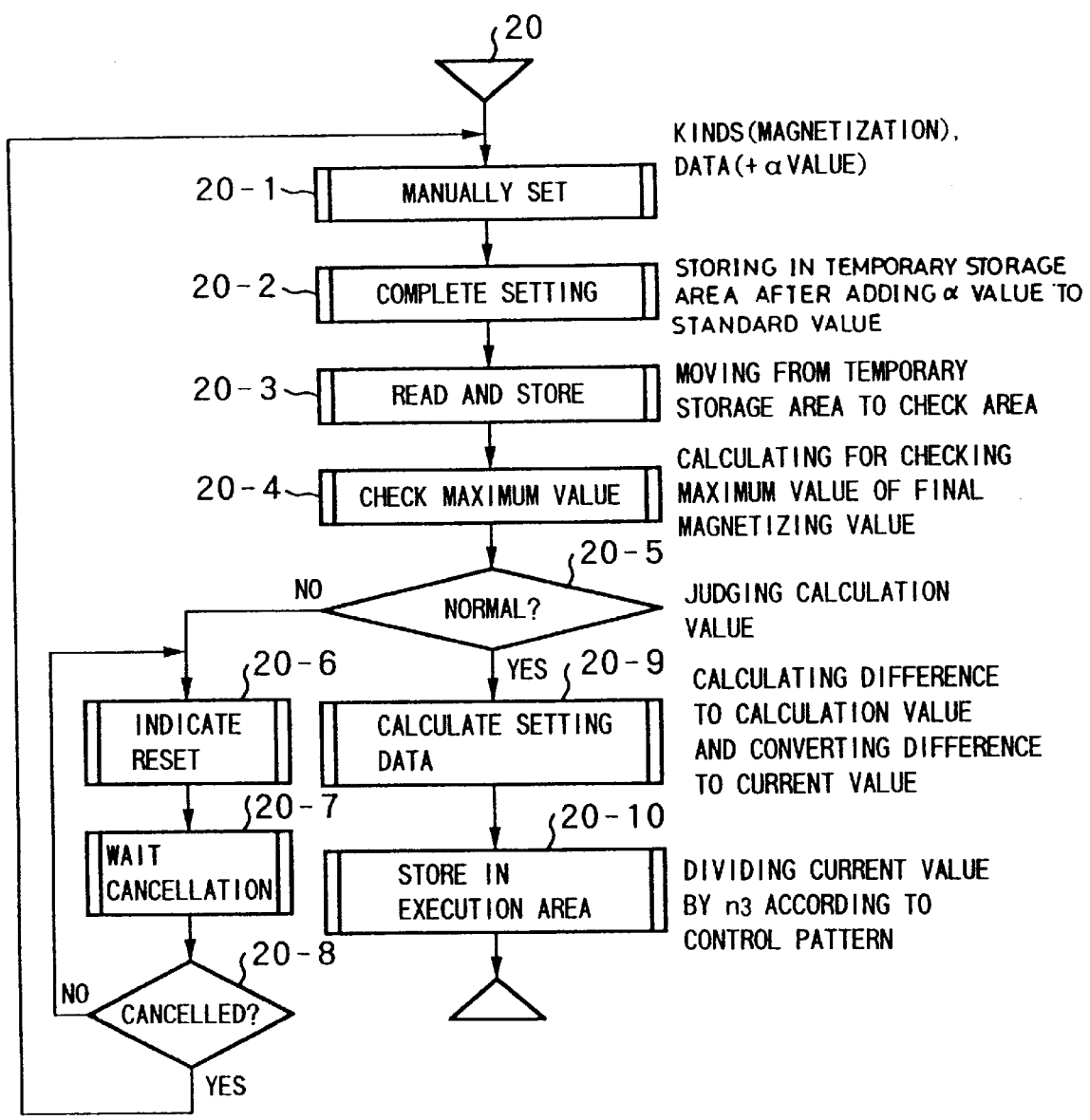
FIG. 55 is a detailed flowchart illustrating a manual setting process to be performed in step 20 of FIG. 50.

Final value of the magnetization in the overall regulation process is automatically set by preliminarily determining a standard value. However, occasionally, it is necessary to set (a standard value +α value). In this case, an amount of +α is set by manually. After this +α value is added to the standard value from a point (23) to a point (24), it is checked whether or not (the standard value +α value) is within the maximum value of the final magnetization value. If within a management value, the difference between the measured value of the magnetization value and (the standard value +α value) is calculated. Then, the difference therebetween is converted into the control currents ir1L and ir1R for the heaters mounted in the group of cylinders C1 to C4 and C1' to C4'. The value of the control current for the heaters is divided by n3 in accordance with optimum control pattern, and resultant values are stored in the execution area. If the set value is an abnormal value, this setting is canceled and the manual setting is performed again. FIG. 55 is a flowchart of this operation.

As shown in FIG. 55, in step 20-1 which is a manual setting step, +α value is manually set as data. Subsequently, in step 20-2 which is a setting completion step, +α value is added to a standard value. Thereafter, a resultant value is stored in a temporary storage area. In step 20-3 which is a read and store step, (the standard value +α value) is read out from a temporarily storage area and is moved to a checking area. In step 20-4 which a maximum value checking step, a calculation to check the maximum value of the final magnetization value is performed. In step 20-5, a comparison between the maximum value of the final magnetization value and (the standard value +α value) is made, and it is then checked whether or not (the standard value +α value) is within the maximum value of the final magnetization value. If normal, the process proceeds to step 20-9. In contrast, if abnormal, the process advances to step 20-6. If set value is an abnormal value, it is indicated in step 20-6 that the value should be reset. Then, the set value is canceled in step 20-7. Subsequently, it is confirmed in step 20-8 that the set value has been canceled. Then, the process is returned to step 20-1. In contrast, if the set value is a normal value, the difference between the measured value and the set value is calculated in step 209 which is a set data computing step. Then, the difference therebetween is converted into the control current value for the heaters. This control current value is divided by n3 in accordance with the control pattern. The value obtained by the division is stored in the execution area in step 20-10.

When the setting of the heater control current is completed at a point (24), the process advances to a point (25) of FIG. 51 (X1), whereupon the starting push-button switch is turned on. Then, the process proceeds from a point (26) to a point (27) of FIG. 51(X5). Then, the heaters Hc1 to Hc4 and H'c1 to H'c4 mounted in the group of cylinders C1 to C4 and C1' to C4' are controlled at the same heater current value. During a time period from a point (27) to a point (29), the magnetization values of the group of cylinders C1 to C4 and C1' to C4' are regulated for a time period from a point (28) to a point (30). The controlling of the heater current is performed according to algorithm (nearly the same as of FIG. 53) by which (1/n3) of the control current value is output each time. The temperature of the group of cylinders C1 to C4 and C1' to C4' is controlled within a range in which S characteristic is exhibited.

(V) Magnetic Field Distribution Fixing Step

Upon completion of the overall regulation of the magnetization value, the process advances from a point (29) of FIG. 51 (X5) to a point (31) of FIG. 51(X3). At a point (31), the control current for the heater mounted in the cylinder ML4 is controlled in such a manner as to lower to zero. With the lowering of the control current, in FIG. 51 (X4), the cylinder ML4 returns from the state, in which N characteristic is exhibited (a point (32)), to the state, in which S characteristic is exhibited (a point (33)). The magnetic field distribution in the uniform magnetic field region is fixed by this cylinder ML4. Thus, the attenuation of the magnetic field distribution is compensated. The entire magnetization regulation operation is completed by this process.

Figure 56:
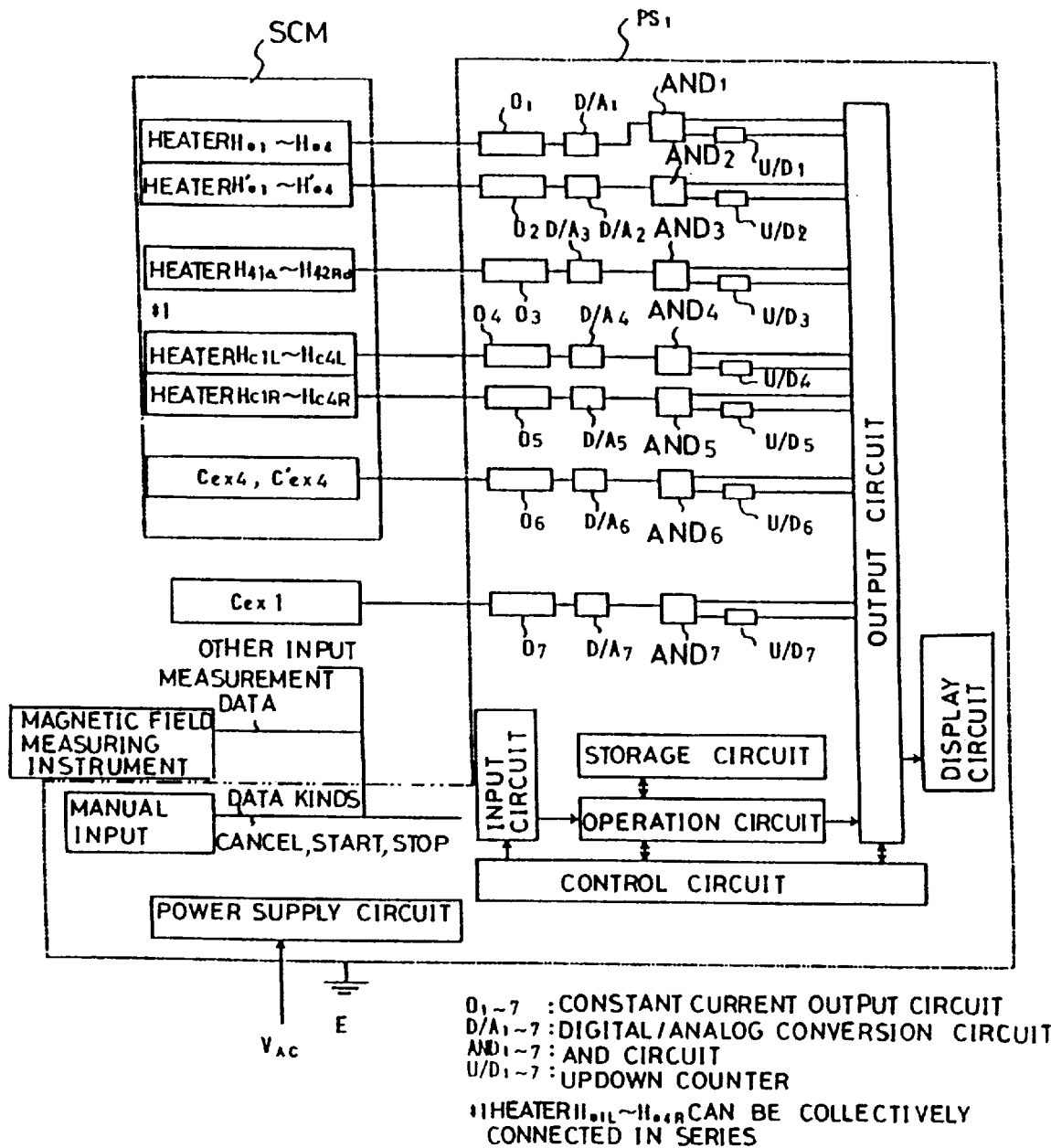
FIG. 56 is a block diagram illustrating the configuration of a magnetizing power supply for magnetizing a superconducting magnet apparatus.

FIG. 56 is a block diagram illustrating a magnetizing power supply PS1 to be used for performing the aforementioned algorithm. As shown in FIG. 56, the magnetizing power supply PS1 is composed of constant current output circuits 01 to 07, digital/analog conversion circuits D/A 1 to D/A 7 (which are sometimes unnecessary), AND circuits for managing a control time period AND1 to AND7, updown counters U/D1 to U/D7, a computer system of which the main part is an operation circuit, an output circuit serving to output data from the computer system, a display circuit, an input circuit for inputting data or the like from the magnetic measuring instrument, a control circuit for controlling a computer, a storage circuit and a power supply circuit. As input to the input circuit, manual input data and other input data (for example, the level of liquid helium in the superconducting magnet apparatus) are input in addition to the aforementioned data. Further, the aforementioned constant current output circuit 01 to 07 are connected with the magnetizing coils Cex1, Cex4 and C'ex4, the heaters Hc1 to Hc4, H'c1 to H'c4, Hc1L to Hc4L, Hc1R to Hc4R, H41, H42L and H42R in the main unit SCM of the superconducting magnet circuit. Further, algorithms of FIGS. 50 and 52 to 55 are stored in the storage circuit as software.

Figure 57:
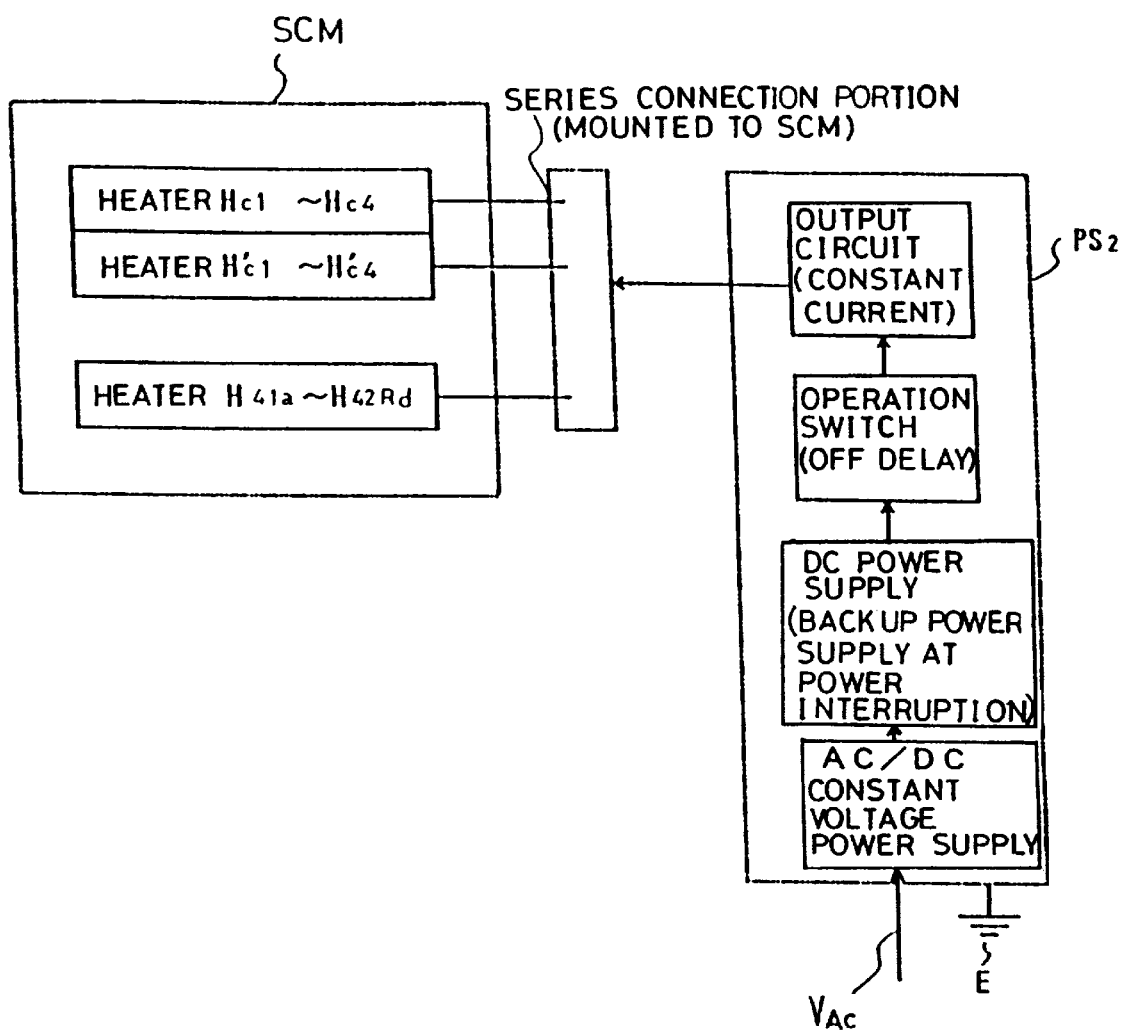
FIG. 57 is a block diagram illustrating the configuration of an emergent demagnetization device.

FIG. 57 is a block diagram of the emergent demagnetization device PS2. In the case that due to any causes, some person is sucked into the superconducting magnet apparatus together with magnetic substances, magnetic bodies are sucked thereinto, and other abnormal states occur in actual conditions in which the superconducting magnet apparatus is used, the abnormal state is continued if the magnetic field remains present as it is. Thus, the elimination of the magnetic field becomes necessary. To that end, the emergent demagnetization device PS2 is used. To demagnetize the group of cylinders C1 to C4 and C1' to C4' and the cylinder ML4, this emergent demagnetization device PS 2 heats these cylinders for a certain time (for example, 1 to 2 minutes), and achieves such an object. Heater to be used for heating are Hc1 to Hc4, H'c1 to H'c4, H41, H42L and H42R. Electric current for heating is introduced to these heaters, simultaneously. To that end, upon completion of the aforementioned sequence of the magnetization regulating operation, the heaters Hc1 to Hc4, H'c1 to H'c4, H41, H42L and H42R in the main unit SCM of the superconducting magnet apparatus are connected in series and is connected with the output circuit of the emergent demagnetization device PS2. For this connection, a series coupling portion is provided at the heater circuit side. The output circuit of the emergent demagnetization device PS2 is a constant current circuit connected with a DC power supply with battery backup (backup power supply in the event of power interruption) through push button switch with 1 to 2 minute off-delay guard. Further, a constant voltage power supply for converting AC to DC to generate a DC constant voltage is connected to the aforementioned DC power supply.

The conventional superconducting magnet apparatus comprising a superconducting coil obtained by winding a superconducting wire, has advantages in that an ordinary on/off switch is used as an operation switch, and that a battery, whose capacity is smaller by one order of magnitude than that of the present invention, as a backup battery. However, such a conventional superconducting magnet apparatus has defects in that the winding has large inductance, and that the inner structure thereof is complex because of the presence of an protection resistor added for preventing the wire from locally burning out or a protection circuit constituted by a semiconductor. In contrast with this, the apparatus of the present invention has profound advantage in that the heaters for control operation can be used in common as the heaters for regulating the magnetization, and that thus no protection means for emergent demagnetization is needed.

In the foregoing description, there have been described the method of regulating the magnetization of the superconducting magnet apparatus of the horizontal magnetic type, and the safety system for the use thereof after the magnetization is regulated. Procedure consisting steps of initializing and magnetizing at an arbitrary value other than a prescribed value, and placing such operations as a preliminary magnetization, and then performing a main magnetization by assuming and calculating a final magnetization value based on this magnetization value is employed as the procedure of the present invention after the regulation of the magnetization. Thus, there is provided a superconducting magnet apparatus which can be used even if omitting a regulation step. Final magnetization value in this case is a value obtained by taking installation environment into consideration in the preliminary magnetization.

Figure 58:
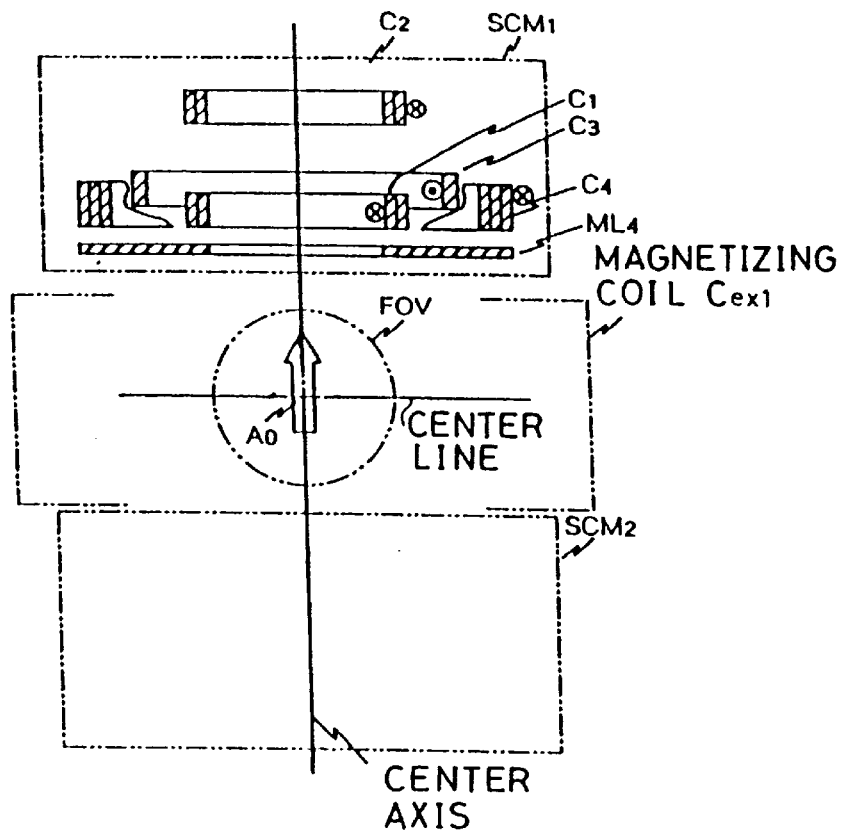
FIG. 58 is a diagram illustrating an example of the configuration of an opposed superconducting magnet apparatus of the vertical horizontal magnetic field type to which cylinders are applied.

FIG. 58 shows an example of the configuration of the opposed superconducting magnet apparatus of the vertical magnetic field type, to which cylinders are applied. As shown in FIG. 58, an upper superconducting magnet SCM1 and a lower superconducting magnet SCM2 are placed across the uniform magnetic field region FOV in such a manner as to face each other. The upper magnet SCM1 is nearly symmetrical with the lower magnet SCM2. Thus, only the inner structure of the upper magnet SCM1 is illustrated in the drawing. The upper magnet SCM1 is composed of cylinders C1, C2, C3 and C4 and a disk ML4 disposed so as to be coaxial to the center axis. Persistent current flowing through the cylinder runs in the circumferential direction of the cylinder. However, a persistent current is made flow through a part of the cylinders in the direction opposite to the direction in which persistent currents run in the other cylinders. Thereby, the size of the apparatus is reduced (in FIG. 58, a persistent current flowing through the cylinder C3 in the reverse direction).

Group of cylinders C1 to C4 are placed in such a manner as to generate a uniform high magnetic field in the uniform magnetic field region FOV. The disk ML4 is placed in such a way as to fix the magnetic field distribution in the uniform magnetic field region FOV. The functions of the cylinders and disk are similar to those of the cylinders and disks of the apparatus of the horizontal magnetic field type. Further, each of the cylinders C1, C2, C3 and C4 is usually constituted by a combination of one or more cylindrical bodies. Magnetizing coil Cex is placed in the uniform magnetic field region FOV, and performs the magnetization similarly as in the case of the aforesaid apparatus of the horizontal magnetic field type. When magnetizing, the cylinders are usually magnetized in the increasing order of the diameter. Furthermore, the configurations of the magnetizing power supply and the emergent demagnetization device are the same as of the FIGS. 56 and 57, respectively. Flowchart and the time chart of the magnetization regulating operation are similar to those of FIGS. 50 to 55.

Figure 59:
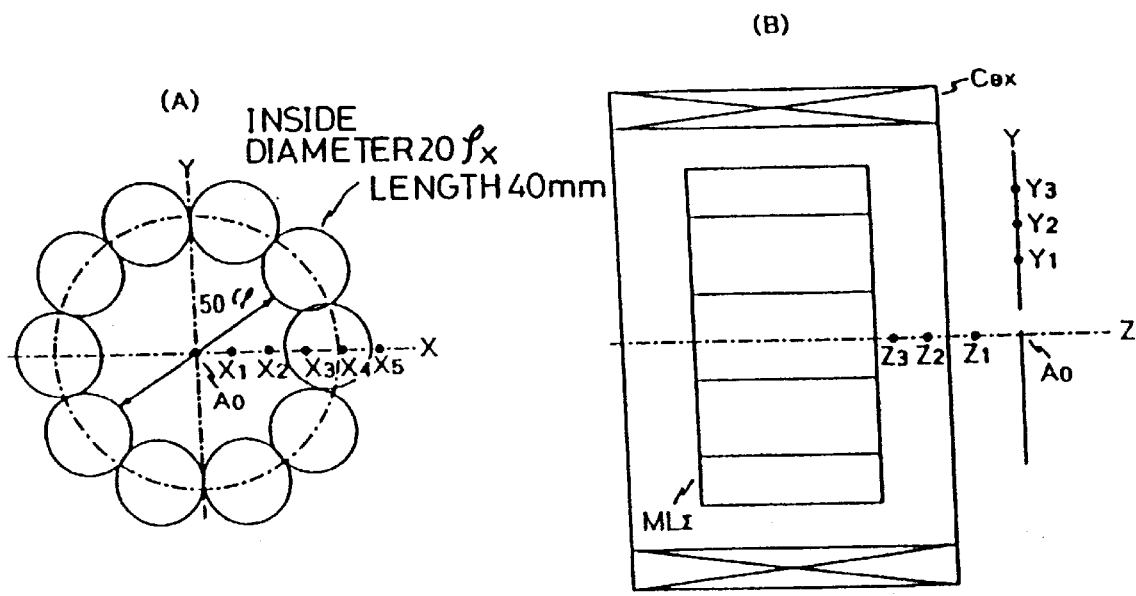
FIG. 59 is a diagram illustrating an example of the placement of a group of small cylindrical samples in an experiment in magnetization thereof.

FIGS. 59 to 62 illustrate examples of configuring a superconducting magnet apparatus by placing a plurality of opposed small cylinders each having a relatively small diameter. FIG. 59 illustrates the arrangement of small cylinder samples, the placement of the magnetizing coil Cex and the measuring position when a magnetizing experiment is conducted. FIG. 59(A) shows the arrangement in X-Y coordinate plane of one of the groups of small cylinders placed in such a manner as to face each other. Ten small cylinders, which are 20 mm in diameter and 40 mm in length are arranged in such a manner as to be in contact with a circle whose inside diameter is 50 mm. The center of each of the small cylinders is placed on X-axis ; and a circumpoint of each of the small cylinders is located on Y-axis. FIG. 59(B) is a side view of one of the groups of the small cylinders placed in such a manner as to face each other and a section of the magnetizing coil Cex disposed therearound. The group of small cylinders are arranged around a point A0 in such a manner as to be symmetrical with respect to Z-axis serving as the center axis. In FIGS. 59(A) and (B), coordinates X1 to X5, Y1 to Y3 and Z1 to Z3 designate the coordinates of the magnetic field measuring points.

Figure 60:
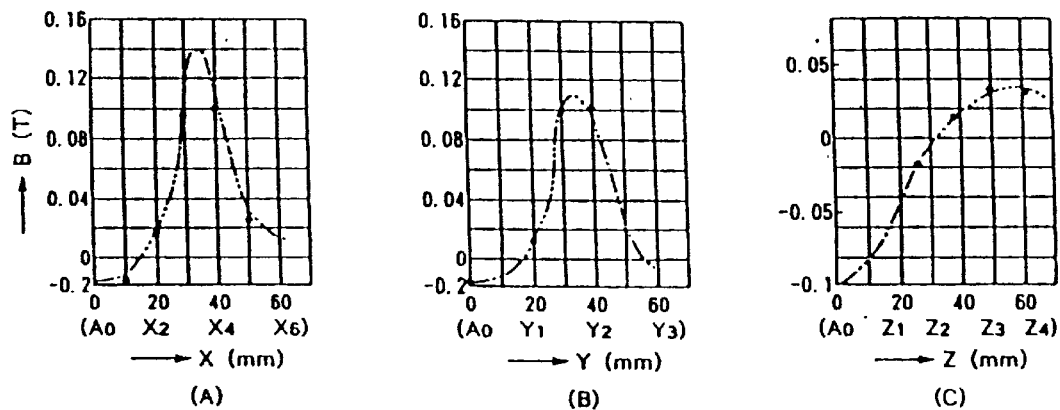
FIG. 60 is a diagram showing measured values of a magnetic field in an experiment in magnetization of a group of small cylindrical samples.

FIG. 60 shows the measured values of the magnetic field in the magnetizing experiment. These measured values are obtained by measuring the strength of the magnetic field at the measuring points after magnetizing the group of the small cylinders by letting the predetermined magnetizing current in the magnetizing coil Cex. FIG. 60(A) shows values measured on X-axis; FIG. 60(B) values measured on Y-axis; and FIG. 60(C) shows values measured on Z-axis. Results of the measurement are roughly in agreement with a result of calculation separately. As shown in FIGS. 60(A) to 60(C), there is a sharp peak at a distance of about 35 mm from the center point A0 on X- and Y-axes. In contrast, the measured values are small and vary gently on Z-axis. Moreover, in the vicinity of the center point A0, the measured value becomes negative. Furthermore, the measured values become positive in the case that the distance from the center point A0 exceeds about 30 mm. This is because of the fact that, as is seen from FIG. 59(A), the direction of electric current flowing through a part, whose transverse section is in contact with the inner circle having a diameter of 50 mm, of each of the small cylinders is opposite to that of electric current flowing through another part, whose transverse section is in contact with the outer circle having a diameter of 90 mm (50 mm+20 mm 2), of each of the small cylinders. Further, at a part (for example, a point on Y-axis) at which two small cylinders are in contact with each other, the directions of the currents flowing through the two small cylinders are opposite to each other. Thus, the magnetic fields respectively correspond thereto are canceled, so that the strength of the magnetic field is low.

Figure 61:
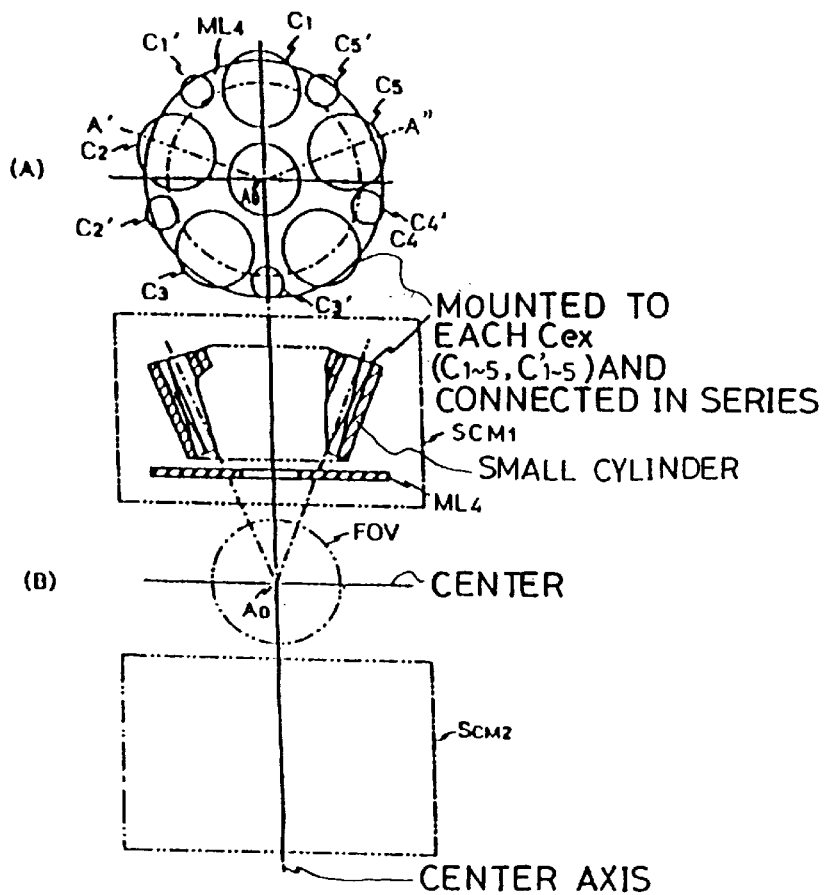
FIG. 61 is a diagram showing the configuration of a superconducting magnet apparatus of the opposed type using a group of small cylinders.

FIG. 61 shows another example of the arrangement of the groups of small cylinders. FIG. 61(A) is a plan view thereof; and FIG. 61(B) is a side view thereof. As illustrated in FIG. 61(B), the upper magnet SCM1 and the lower magnet SCM2 are placed across the center point A0 in the uniform magnetic field region FOV in such a manner as to face each other. Each of the magnets is composed of the group of small cylinders and the disk ML4 of FIG. 61(A). Furthermore, the group of the small cylinders consist of large-diameter small cylinders C1 to C5 and the group of small-diameter small cylinders C1' to C5'. Each group of the cylinders are placed in such a manner as to be inclined to the center axis and toward the center point A0 in the uniform magnetic field region FOV. In the case of this embodiment, the magnetic field formed by the small cylinders has directivity. Thus, the small cylinders are inclined in such a manner as to be directed to the uniform magnetic field region. Further, to prevent the reduction in the magnetic field distribution between the large-diameter small cylinders, small-diameter small cylinders C1' to C5' are placed therebetween.

In the superconductive magnet apparatus of this embodiment, the magnetization can be achieved by placing the externally placed magnetizing coil Cex in the uniform magnetic field region FOV. However, another effective magnetizing method is to mount the magnetizing coil Cex in each of the small cylinders. In the case of this magnetizing method, the magnetizing coils Cex1 to Cex5 and Cex1' to Cex5' are mounted onto the inner circumferential sides of small cylinders C1 to C5 and C1' to C5'. The magnetizing coils are connected in series, and electric currents are supplied thereto from the magnetizing power supply. The strongest feature of this embodiment resides in that the superconducting magnet apparatus of the present invention has the following advantages. Namely, the section to be allotted to each of the small cylinders C1 to C5 and C1' to C5' is small. The quantity of the magnetic flux formed by one small cylinder at the time of forming the magnetizing magnetic field is small. Thus, the magnetizing coils of the type, which is incorporated in the magnet, is more advantageous. Further, the ratio of the length to the diameter of the small cylinder can be set at a relatively large value, so that the attenuation of the magnetic field can be made to be small and that the rate of effectively utilizing materials is high in the case of making the cylinders by using superconducting composite plates.

Figure 62:
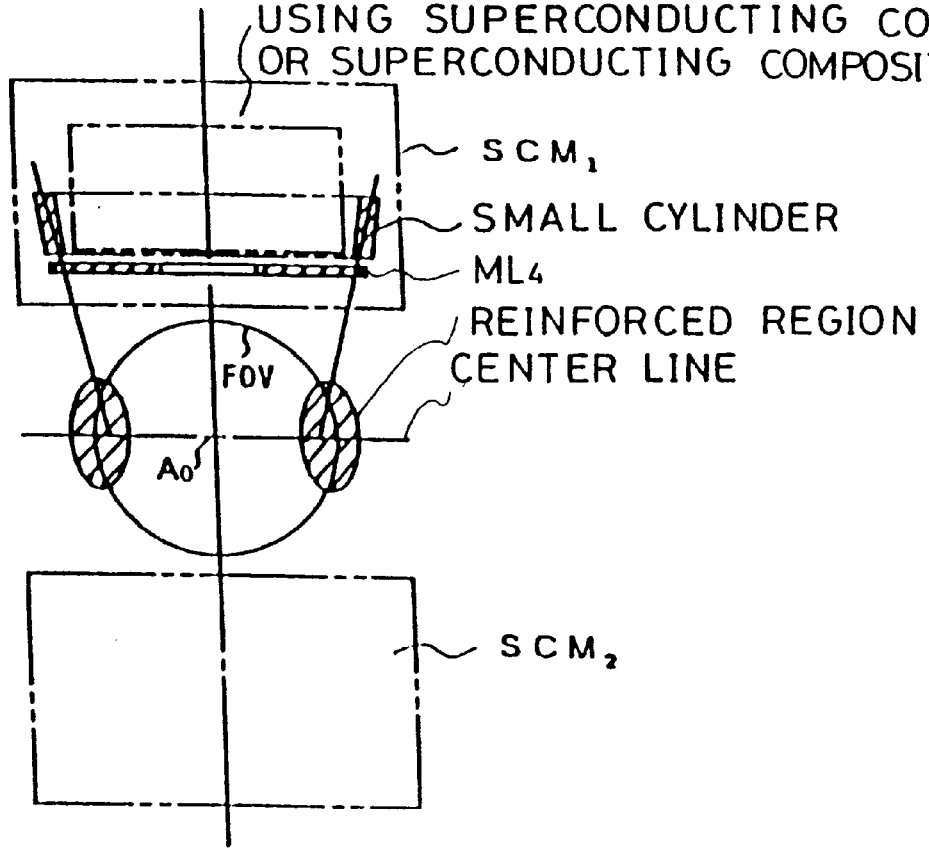
FIG. 62 is a diagram showing another configuration of a superconducting magnet apparatus of the opposed type using a group of small cylinders.

FIG. 62 shows a third example of groups of the small cylinders. This figure is a side view of the superconducting magnet apparatus of this embodiment. Primary parts of the upper magnet SCM1 and the lower magnet SCM2 are composed of groups of cylinders, which are made of superconducting coils or superconducting composite plates, and a disk ML4. Further, a group of small cylinders are used as auxiliary means. The group of small cylinders are placed around a primary magnet. The magnetic field in the peripheral portion of the uniform magnetic region FOV are reinforced by utilizing the high directivity thereof. With such a configuration, the diameter of each of the upper magnet SCM1 and the lower magnet SCM2 can be decreased.

Further, a small cylinder made of an oxide high-temperature superconductor can be used as the aforesaid small cylinders. As compared with the cases of FIG. 47 (of the horizontal magnetic field type) and FIG. 58(of the vertical magnetic field type), the latitude in selecting the materials of the superconducting composite can be further increased. Moreover, in the case of configure of FIGS. 61 and 62, a superconducting magnet apparatus can be easily constructed by combining a high-temperature superconductor, by which a small cylinder can be easily produced, with a metallic (or alloy) superconductor by which a large-diameter cylinder can be easily produced.

Figure 63:
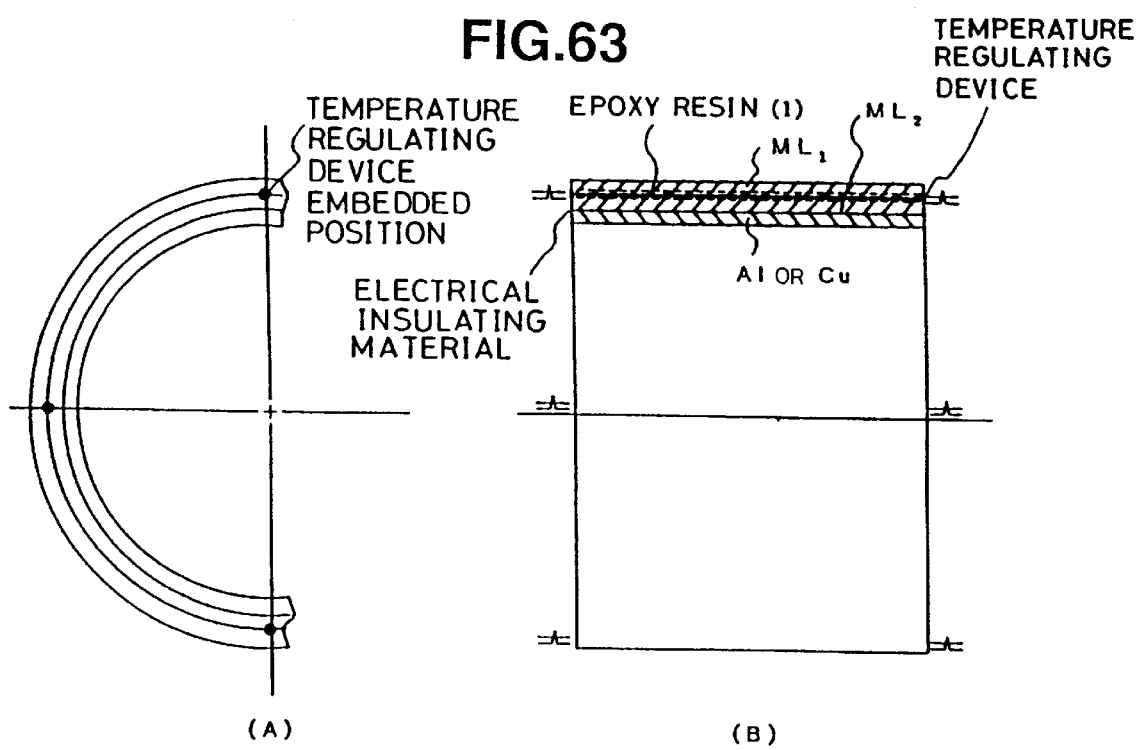
FIG. 63 is a diagram illustrating an example of a structure in which a temperature regulating device and a metallic cylindrical member are added to a cylinder.
Figure 64:
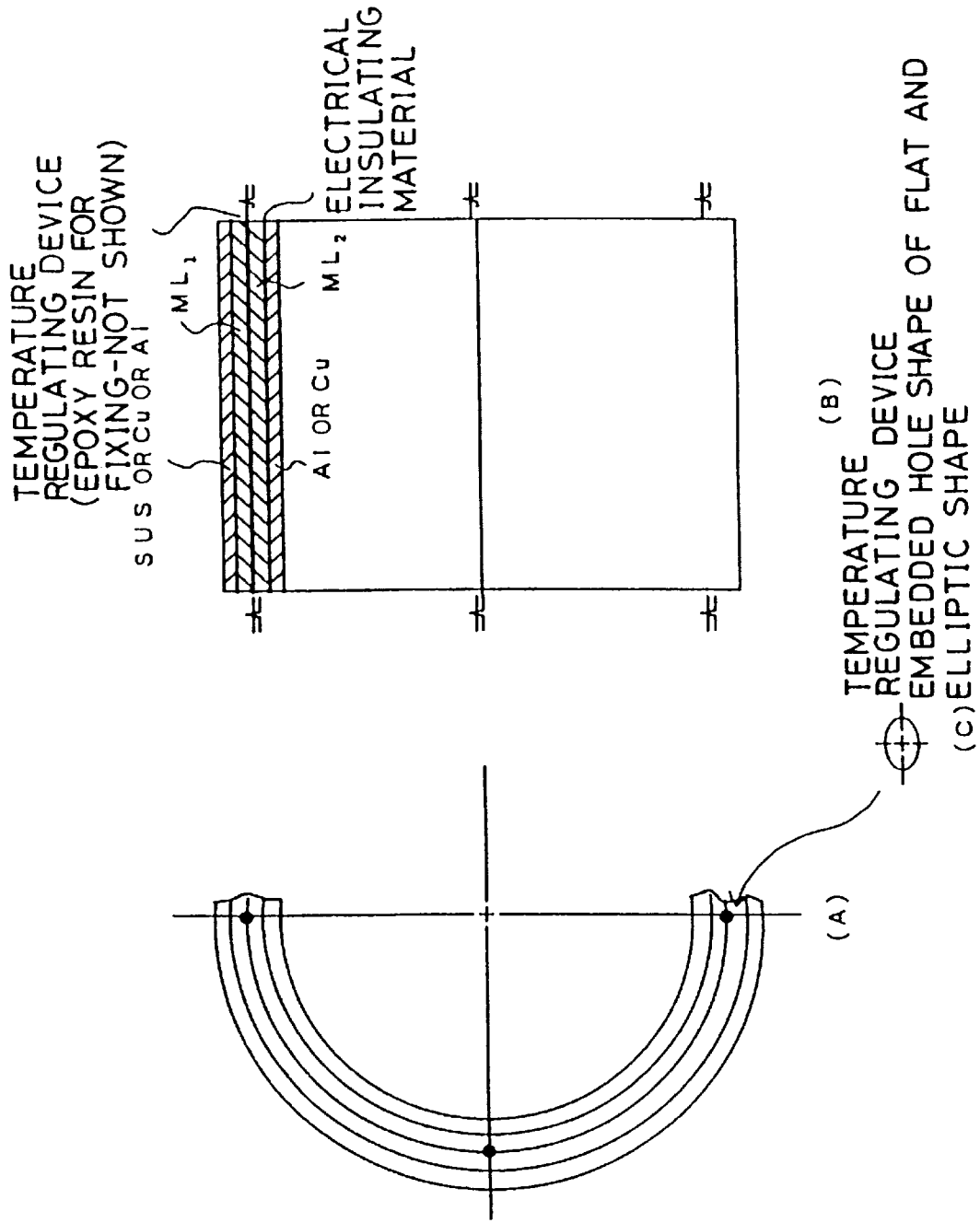
FIG. 64 is a diagram illustrating an example of a construction in which a reinforcement against an electromagnetic force is provided in the structure of FIG. 63.
Figure 65:
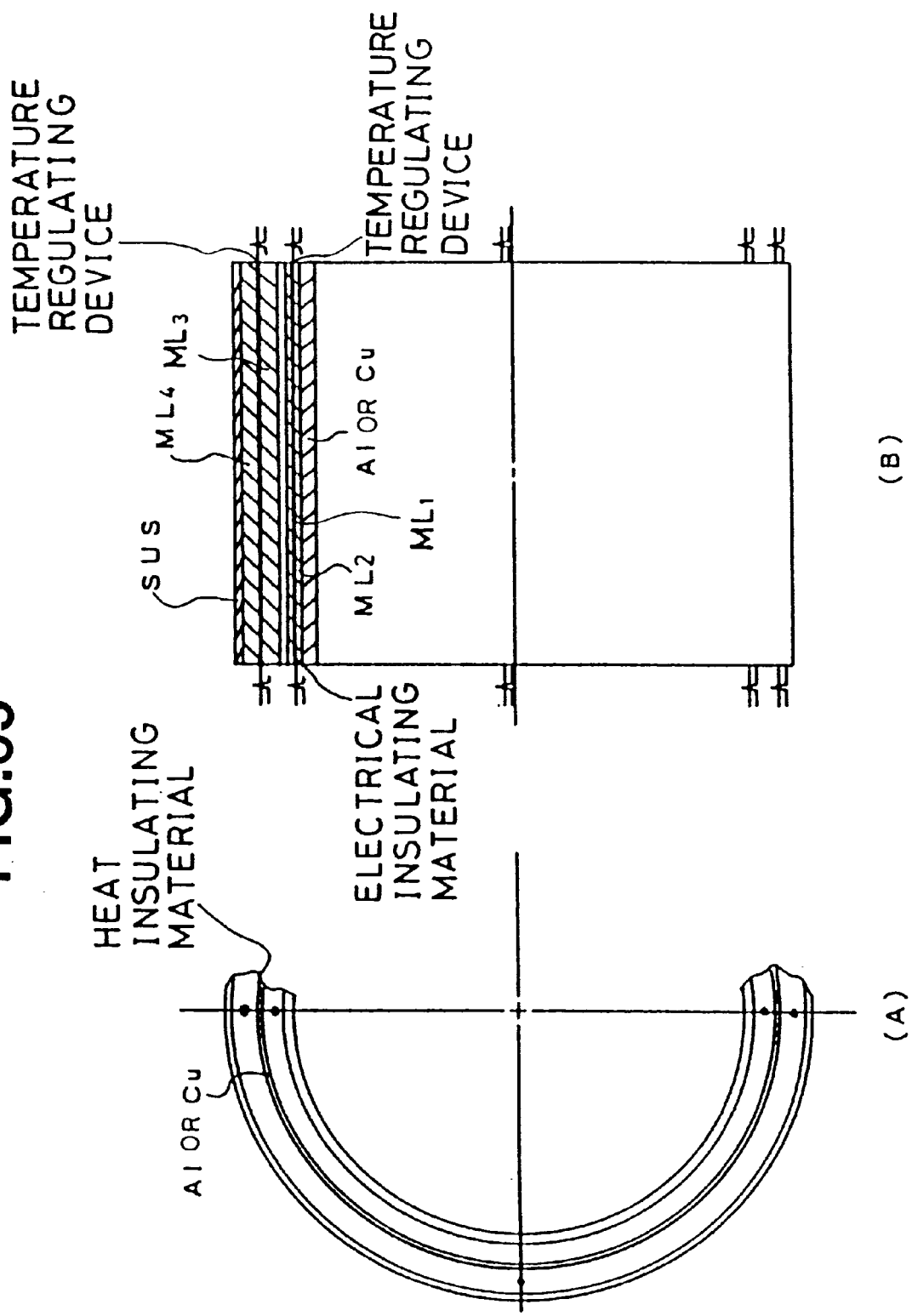
FIG. 65 is a diagram illustrating an example of a structure for integrating a plurality of cylinders with one another.

FIGS. 63 to 65 show examples of the detailed configuration of a cylinder. FIG. 63 is an example of the configuration in which the electromagnetic force from the outer periphery of the cylinder is received by a body placed on the inner circumference of the cylinder. FIG. 63(A) is a transverse section thereof; and FIG. 63(B), a side section thereof. As shown in FIG. 63(B), a temperature regulating device is embedded between the cylinders ML1 and ML2 in such a manner as to be interposed therebetween and is fixed by using an epoxy resin (1). Cylinder made of aluminum or copper is inserted into the inner circumferential side of the cylinder through electrical insulating materials by press fitting and is integral with the cylinders ML1 and ML2. Temperature regulating devices are embedded in four places in such a way as to be arranged in 90° intervals in the circumferential direction. This embedding hole is usually shaped like a circle.

FIG. 64 illustrates an example of the configuration in which the electromagnetic force exerted onto a cylinder is received by bodies placed on the inner and outer circumferences of a cylinder. FIG. 64(A) is transverse sectional view thereof; and FIG. 64(B) is a side sectional view thereof. The placement of temperature regulating devices in a cylinder and the insertion of a cylinder made of aluminum or copper into the inner cirucumferentioal side of the cylinder by press fitting are similar to those as in the case of FIG. 63. In the case of this embodiment, a cylinder made of stainless steel or aluminum or copper, which is sufficiently thick in such a manner as to overcome an electromagnetic force and as not to be deformed by an electromagnetic force, is inserted into the outer circumferential sides of the cylinders ML1 and ML2 by press fitting, and is integral with the cylinders. FIG. 64(C) shows the shape of a hole, in which the temperature regulating device is embedded, and this example of the hole has a flat and elliptic shape and is effective in the case that the cylinder is thin.

FIG. 65 illustrates the case that a further cylinder is placed on the outer circumference of the cylinder of FIG. 65 and a cylinder made of stainless steel, or aluminum or copper is placed on the outer circumference of the further cylinder similarly as in the case of FIG. 64. The combination of the cylinders ML1 and ML2 in the inner circumference side and the cylinder made of aluminum or copper is similar to that of FIG. 63. A cylinder made of aluminum or copper acting as a spacer is provided on the outer circumference of the combination. Further, a heat insulating material made of glass fiber and so on is arranged only on the outer circumference of a part, in which the temperature regulating device is embedded, and is fixed by an epoxy resin. Other cylinders ML3 and ML4 are placed on the outer circumference of the spacer. Furthermore, a cylinder made of stainless steel or aluminum or copper is placed on the outer circumference of the cylinders ML3 and ML4. Temperature regulating devices embedded in the inner circumferential-side cylinders ML1 and ML2, and the temperature regulating devices embedded in the outer-circumferential-side cylinders ML3 and ML4 are placed at the same angular positions with respect to the circumferential direction of the cylinder, respectively, and are thermally insulated with a heat insulating material.

Figure 66:
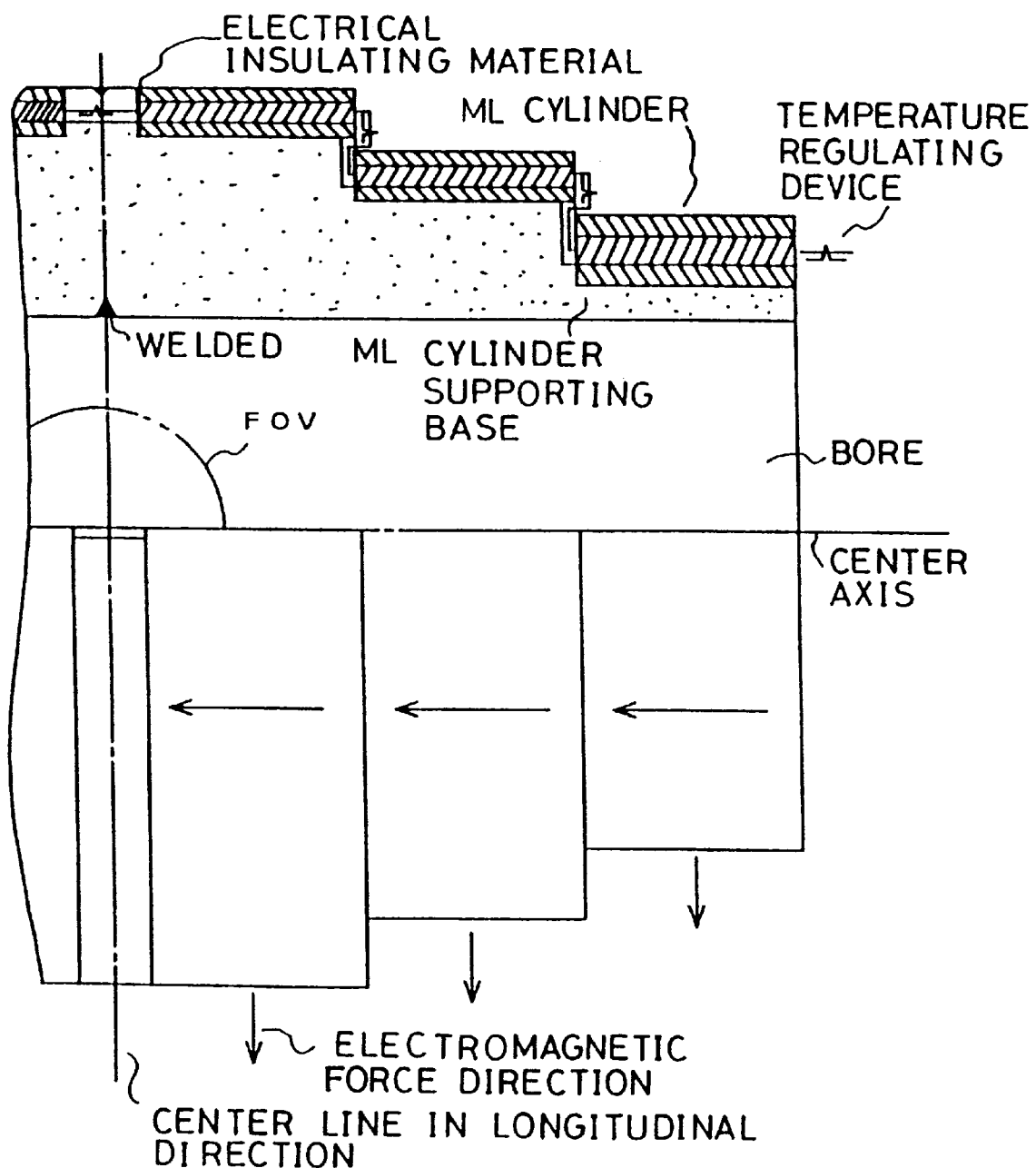
FIG. 66 is a diagram illustrating an example of a structure in which a group of cylinders are mounted on a cylinder supporting base.
Figure 68:
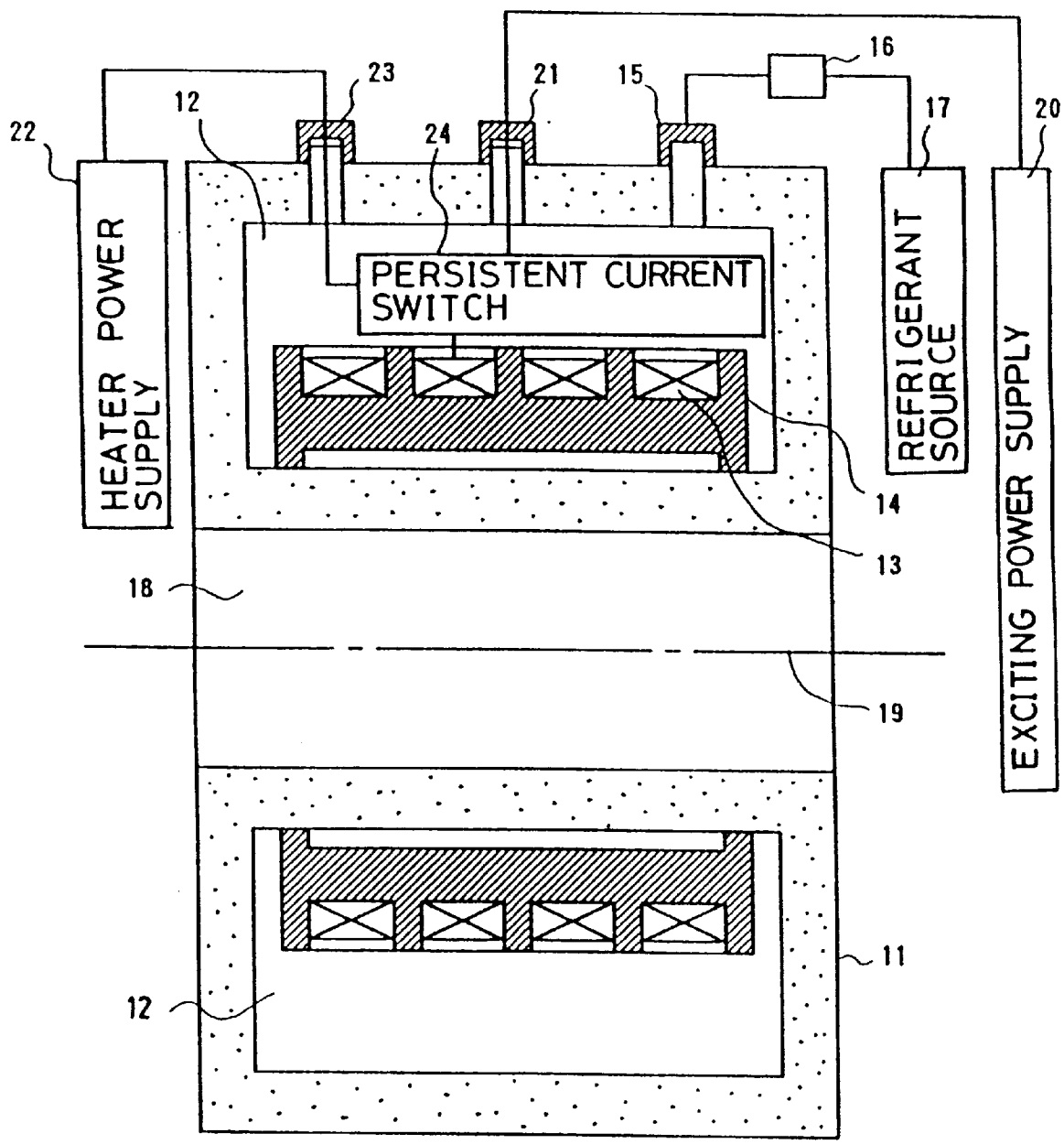
FIG. 68 is a diagram illustrating an example of the configuration of a superconducting magnet apparatus using a conventional superconducting wire.
Figure 69:
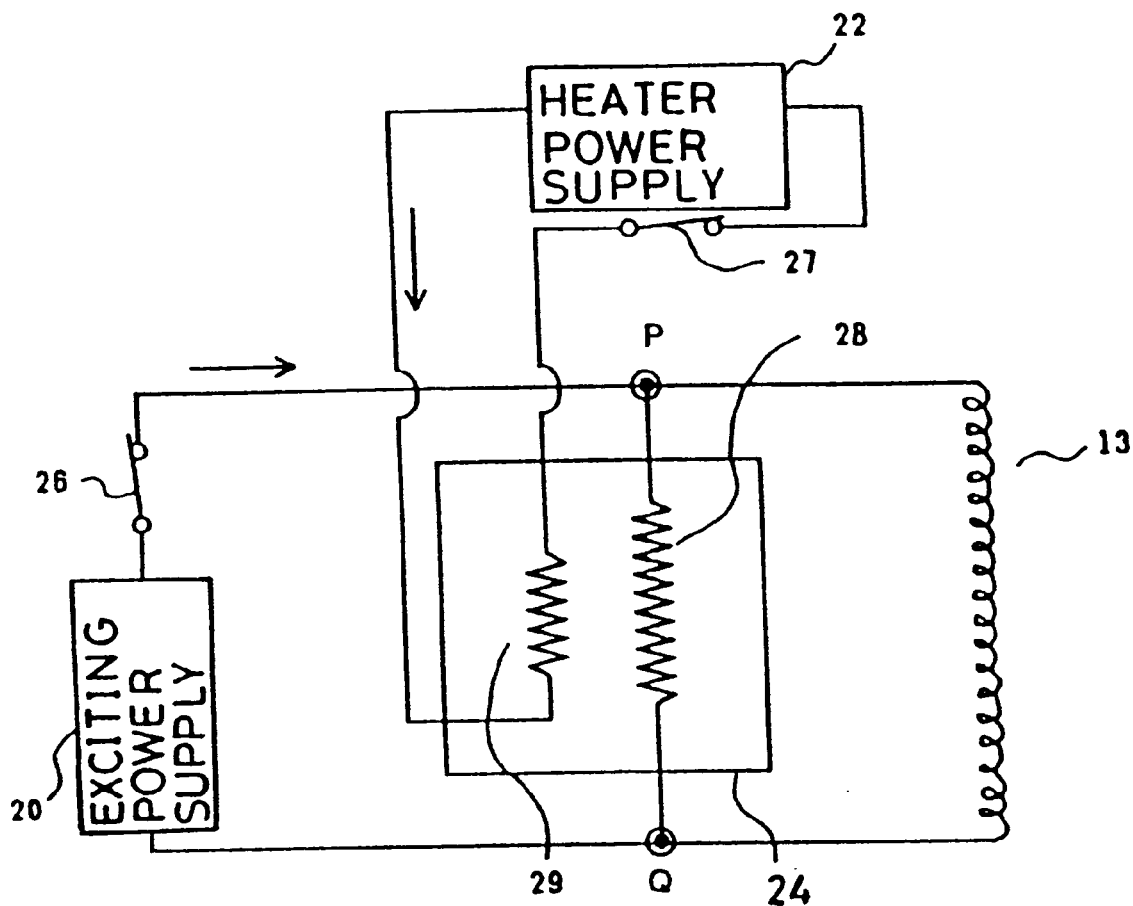
FIG. 69 is a circuit diagram showing an example of the structure of a persistent current circuit switch.

FIG. 66 shows an example of a structure in which a cylinder illustrated in FIGS. 63 to 65 is mounted on the cylinder supporting base. The structure of this embodiment is obtained by assuming that the superconducting magnet apparatus is bilaterally symmetrical with respect to the center line in the longitudinal direction. Thus, FIG. 66 illustrates a right-hand half of the structure, as viewed in this figure. The cylinder supporting base has cylindrical holes formed along the center axis in the inside thereof. Further, the outward form of this structure is shaped like stairs so that the outside diameter decreases with reduction in distance from the edge thereof. The cylinder supporting base is made of alminium. The surface, which is parallel to the center line in the longitudinal direction, of each step of the cylinder supporting base is electrically insulated. Further, cylinders, which are different in inside diameter from one another, are fitted in sequence to each step of the cylinder supporting base in the decreasing order of the inside diameter by press fitting. With such a configuration, the electromagnetic force acts in the directions of arrows. Thus, cylinders can be fixed to the cylinder supporting base stably against the electromagnetic force. This step-like structure provides a good distribution to the uniform magnetic field region FOV. The structure of FIG. 66 is bilaterally symmetrical. Therefore, the cylinders and the base may be formed in such a manner as to be integral with one another. Alternatively, the left-side portion of this cylinder supporting base and the right-side portion thereof may be separately produced and then connected at a central portion in the longitudinal direction by welding.

FIG. 67(A) shows an example of a structure in which the combination of the cylinders and the cylinder supporting base of FIG. 66 is incorporated into a superconducting magnet apparatus. The combination of the cylinders and the cylinder supporting base is enclosed in the refrigerant container and is refrigerated by a refrigerant injected from a liquid inlet. Refrigerant is refrigerated by a refrigerator. Refrigerant container is supported in a cooling container via heat insulating layer. Control current is introduced to the temperature regulating devices embedded in the cylinder through a wiring port from the magnetizing power supply PS1. Further, after magnetized, the temperature regulating device is connected with the emergent demagnetization device PS2.

The magnetizing coil Cex is fixed in the vicinity of the uniform magnetic field region FOV of the superconducting magnet apparatus SCM by making the center axis coincide with the center of the magnetizing coil Cex. A guide rail, into which the magnetizing coil Cex is inserted, is attached in the bore of the superconducting magnet apparatus SCM as illustrated in FIG. 67(B). Convex portions for fixing the magnetizing coil Cex are attached to both end surfaces of the bore of the superconducting magnet apparatus SCM. The magnetizing coil Cex is inserted from one end of the bore of the superconducting magnet apparatus SCM while magnetizing coil fixture is disengaged. After inserted, the magnetizing coil fixture is engaged therewith and thus the magnetizing coil Cex is fixed in the superconducting magnet apparatus SCM. Thus, the magnetizing coil Cex covers the uniform magnetic filed region FOV. Thus, the magnetic field measuring element (for example, a hall element) is mounted on the position corresponding to magnetic field management point of the magnetic coil Cex. Thus, the magnetic field can be checked without detaching the magnetizing coil Cex during the magnetization. Needless to say, the final regulation of the magnetic field is performed by detaching the magnetizing coil Cex after the magnetization, and installing a precision measuring magnetic field sensor.

As above described, the basic characteristics of a cylinder are checked by experiment. Further, the method of regulating the magnetization of a superconducting magnet apparatus, to which this cylinder is applied, has been described systematically. In the foregoing description, the example of application of a superconducting composite plate material has been described. The present invention, however, can be applied to superconducting plate materials or cylinders in general. Thus, the present invention can be applied to the case that the materials are replaced with high-temperature superconductors.

[Industrial Applicability]

In accordance with the present invention, cylinders, to which superconducting composite plate materials are applied, are arranged effectively so as to obtain a target uniform magnetic field region. Further, induction magnetizing is performed so as to utilize these cylinders as a magnetic-field generating source. The temperature of the cylinders is controlled by mounting the temperature regulating devices therein. This enables the superconducting magnet apparatus to regulate the magnetization value thereof after the magnetization thereof. Consequently, there is achieved a shift from a conventional superconducting magnet apparatus, which uses coils made of superconducting wires, to a new superconducting magnet apparatus utilizing cylinders as a magnetic-field generating source. Use of the aforementioned cylinders gets rid of winding operations, and enables the manufacturing of a magnetic-field generating source by ordinary processing work, such as a molding operation using a die, a machining operation and an assembling operation. Consequently, high-manufacturing-precision superconducting magnet apparatus can be produced without skilled workers.

Moreover, the superconducting magnet apparatus of the present invention can preclude a quench phenomenon by mounting the temperature regulating device in the cylinder and connecting this device to the emergent demagnetization device and performing the magnetization by the induction magnetizing, and adopting a structure for preventing an occurrence of deformation due to the electromagnetic force of the cylinder.

Furthermore, the variation in the magnetic field and in the magnetic field distribution can be compensated by placing cylinders or disks between the uniform magnetic field region and the magnetic-field generating source and fixing the magnetization value.

What we claimed are:

1. A superconducting magnet apparatus comprising: a cooling container for cooling contents thereof to a superconducting state; static-magnetic-field generating means, disposed in said cooling container and including at least one superconducting composite element having a superconducting composite structure serving as a holding medium for holding an electric current therein, for generating a magnetic flux in a predetermined uniform magnetic field region along a central axis thereof; and holding means for holding said static-magnetic-field generating means in said cooling container; wherein said at least one superconducting composite element provided with a temperature regulating device proximate thereto for heating said at least one superconducting element to control the temperature thereof, wherein said static-magnetic-field generating means is magnetized by induction-magnetizing, and wherein the magnetization value of said static-magnetic-field generating means is adjusted by controlling the temperature of said at least one superconducting composite element by means of said temperature regulating device.

2. A superconducting magnet apparatus according to claim 1, wherein said at least one superconducting composite element of said static-magnetic-field generating means comprises at least one first cylinder made of a superconducting plate material and disposed in said cooling container with the central longitudinal axes thereof being coincident with one another, and wherein a static magnetic field of desired strength and direction of a magnetic flux is obtained in a uniform magnetic field region by magnetizing the at least one first cylinder.

3. A superconducting magnet apparatus according to claim 2, wherein at least one second cylinder of a larger diameter or at least one ring-like disk of a larger diameter, each of which has a central bore, are arranged around the periphery of said at least one first cylinder with the central longitudinal axis of the at least one second cylinder being coincident with the central longitudinal axis of said at least one first cylinder, wherein a temperature regulating device is provided for the at least one second cylinder, and wherein induction-magnetizing of the at least one second cylinder is is carried out by said static-magnetic-field generating means in such a manner as to generate a magnetic flux having a direction by which a magnetic flux generated by the at least one first cylinder is canceled, thereby reducing leakage flux.

4. A superconducting magnet apparatus according to claim 2 or 3, wherein the at least one first cylinder includes a plurality of cylinders, the length of each of the first cylinders is reduced without deteriorating magnetic homogeneity of the uniform magnetic field region by performing induction-magnetizing of one or more of the first cylinders so that an electric current flows through said one or more of the first cylinders in a direction opposite to a direction in which an electric current flows through each of the other first cylinders.

5. A superconducting magnet apparatus according to claims 2 or 3, wherein at least one further cylinder, which has a length which is longer than the lengths of the first cylinders but has an outside diameter which is shorter than the inside diameters of the first cylinders and is further provided with a temperature regulating device, is disposed inside the inner circumferences of the first cylinders, wherein said further cylinder is released from a superconducting state by being heated from the initiation of magnetization to the completion of regulation of magnetization by said temperature regulation device, and wherein said further cylinder is cooled and returned to the superconducting state by stopping the heating thereof upon completion of regulation of magnetization.

6. A superconducting magnet apparatus according to claim 5, wherein one or more disks, to which temperature regulating devices are added, are disposed at respective edge portions of said further cylinder, said disks having central bores greater in diameter than the outside diameter of said further cylinder and being made of superconducting composite plate materials, and wherein the main magnetic flux of the magnetic fluxes forming the magnetic field in the uniform-magnetic-field region caused by the first cylinders are captured by said disks and said further cylinder.

7. A superconducting magnet system, wherein a pair of the superconducting magnet apparatuses as recited in claim 1 are disposed with central longitudinal axes thereof being coincident with each other and so as to face each other, wherein a uniform magnetic field region is provided in the vicinity of the midpoint between the pair of the superconducting magnet apparatuses facing each other, wherein the superconducting composite element of said static-magnetic field generating means in each superconducting magnet apparatus includes one or more first cylinders made of a superconducting plate material and disposed in the cooling container of a respective superconducting magnet apparatus with the central axes thereof being coincident with one another, and wherein a static magnetic field of desired strength and direction is obtained in the uniform magnetic field region.

8. A superconducting magnet system according to claim 7, wherein one or more second cylinders or one or more disks, made of superconducting composite plate materials and which are provided with a temperature regulating device proximate thereto for heating said superconducting composite elements to control the temperature thereof, are disposed at a location which is outwardly displaced from the uniform magnetic field region provided between the pair of superconducting magnet apparatuses, with the central axis thereof coincide with the center axis of the first cylinders in each superconducting magnet apparatus, and wherein induction-magnetizing of the second cylinders by said static-magnetic-field generating means results in a magnetic flux being generated thereby in a direction in which a magnetic flux generated by the first cylinders is canceled, thereby reducing leakage flux.

9. A superconducting magnet system according to claim 8, wherein the first cylinders comprise a plurality of cylinders, the static-magnetic-field generating means performs induction-magnetizing of one or more of the first cylinders group is performed so that an electric current, whose direction is opposite to the direction in which an electric current flows through each of the other cylinders, flows therethrough, thereby reducing the outside diameter of the first cylinders without degrading magnetic homogeneity of the uniform magnetic field region.

10. A superconducting magnet system according to claim 9, wherein one or more first disks, which are made of superconducting composite plate material and have a diameter nearly equal to the outside diameter of the first cylinders and are further provided with a temperature regulating device, are disposed on a facing-surface-side front surface of the facing surfaces of the pair of superconducting magnet apparatuses with the center axes thereof being coincident with the center axes of the first cylinders, wherein the first disks are released from a superconducting state by heating thereof by means of the temperature regulating device from the initiation of magnetization thereof to completion of regulation of magnetization thereof, and wherein heating of the first disks by the temperature regulating device is stopped upon completion of regulation of magnetization thereof, and wherein the first disks are cooled and are returned to a superconducting state.

11. A superconducting magnet system according to claim 10, wherein one or more third cylinders, to which a temperature regulating device is added, are placed on the outer periphery of each of the first and second cylinders, said third cylinders having inside diameters greater than the outside diameters of the first and second cylinders and being made of superconducting composite plate materials, and wherein the first and second cylinders are surrounded by the first disks and the third cylinders, wherein the first disks and the third cylinders are released from a superconducting state by heating thereof by means of the temperature regulating device from the initiation of magnetization thereof to the completion of regulation of magnetization thereof, and wherein heating of the first disks and the third cylinders by the temperature regulating device is stopped upon completion of regulation of magnetization thereof, and wherein the first disks and the third cylinders are cooled and are returned to a superconducting state.

12. A superconducting magnet system, wherein a pair of the superconducting magnet apparatuses as recited in claim 1 are are disposed to face each other with the central longitudinal axes thereof coincident with each other, wherein a uniform magnetic field region is provided in the vicinity of the midpoint between the pair of the superconducting magnet apparatuses facing each other, wherein the superconducting elements of said static-magnetic-field generating means in each superconducting magnet apparatus comprise one or more first small cylinders, each of which is formed of superconducting composite plate material and has a diameter that is not more than ($\frac{1}{3}$) of the outside diameter of the static-magnetic-field generating means and is provided with a temperature regulating device in the vicinity thereof for heating the superconducting composite elements to control the temperature thereof, wherein the first small cylinders are arranged and spaced uniformly on the circumference of a circle which is concentric with said central longitudinal axes, wherein, the center axis of each of the first small cylinders is inclined to the central longitudinal axes of the superconducting magnet apparatuses by a predetermined magnitude in such a manner as to extend toward the uniform magnetic field region, wherein the first small cylinders are magnetized by the static-magnetic-field generating means, wherein a static magnetic field of desired strength and desired direction of magnetic flux is obtained in the uniform magnetic field region.

13. A superconducting magnet system according to claim 12, wherein one or more other small cylinders having diameters which are smaller than the diameter of said first small cylinders are arranged on a circle which is concentric with but is different in diameter from the circle on which said first small cylinders are disposed, so as to each be spaced uniformly between two of the first small cylinders and to be inclined to the central longitudinal axis of a superconducting magnet apparatus by a predetermined magnitude so that the center axis of each of said other small cylinders are directed to the uniform magnetic field region.

14. A superconducting magnet system according to claim 13, further including a temperature regulating device provided at a location which is spaced from the uniform magnetic field region at a side opposite to a facing surface of said first small cylinders, wherein one or more second small cylinders or one or more disks formed of superconducting composite plate materials are disposed to be concentric with said first small cylinders, and wherein said static-magnetic-field generating means effects induction-magnetizing of said second small cylinders or disks in such a manner that magnetic fluxes are generated in a direction in which the magnetic fluxes generated by said first small cylinders are canceled, thereby decreasing-leakage fluxes.

15. A superconducting magnet system according to claim 14, and wherein one or more second disks formed of a superconducting composite plate material and having an outside diameter nearly equal to that of said first small cylinders and with which temperature regulating devices are provided, are placed at a facing-surface-side edge portion of said first small cylinders so as to be coaxial with the center axis of said superconducting magnet apparatus, wherein said second disks are released from the superconducting state by being heated from the initiation of magnetization thereof to the completion of regulation of magnetization thereof by said temperature regulating devices, and wherein, upon completion of regulation of magnetization thereof, heating of said second disks is stopped and said second disks are returned to a superconducting state by being cooled.

16. A superconducting magnet system according to claim 15, wherein one or more fourth cylinders with which a temperature regulating device is provided, are placed on the outer periphery of each of the first and second small cylinders, said fourth cylinders having inside diameters greater than the outside diameters of the first and second small cylinders and being made of superconducting composite plate materials, and wherein the first and second small cylinders are surrounded by the second disks and the fourth cylinders, wherein the second disks and the fourth cylinders are released from the superconducting state by heating thereof by said temperature regulating device from initiation of magnetization thereof to completion of regulation of magnetization thereof, and wherein heating of the second disks and the fourth cylinders by the temperature regulating device is stopped upon completion of regulation of magnetization thereof, and wherein the second disks and the fourth cylinders are cooled and are returned to a superconducting state.

17. A superconducting magnet system according to claim 16, wherein a magnetizing auxiliary coil is placed in the vicinity of a cylinder in the cooling container so as to magnetize a cylinder located at a position which is spaced from an externally placed magnetizing coil provided for the magnetization, or to magnetize a cylinder which needs magnetizing in a reverse polarity, among the plurality of cylinders of the static-magnetic-field generating means.

18. A superconducting magnet system according to claim 11, wherein one or more further small cylinders, each of which is formed of a superconducting composite plate material and has a diameter that is not more than ($\frac{1}{3}$) of the outside diameter of the first and second cylinders and is provided with a temperature regulating device, are disposed on a part or all of the outer peripheral portions of the first and second cylinders in such a manner that the center axis of each of the further small cylinders is directed toward the uniform magnetic field region, thereby correcting the magnetic field strength of the outer peripheral portion of the uniform magnetic field region.

19. A superconducting magnet apparatus according to claim 6, wherein the first and second cylinders and temperature regulating devices respectively provided for the first and second cylinders are divided into left-side and right-side groups along a center line of the static-magnetic-field generating means, which extends in the longitudinal direction thereof and serves as a boundary therebetween, wherein the temperature regulating devices of each of the left-side and right-side groups are connected in series independent of the temperature regulating devices of other ones of the left-side and right-side groups, wherein edge-portion temperature regulating devices are connected in series collectively, wherein the further cylinders are further arranged therein, temperature regulating devices are provided for the further cylinders and are collectively connected in series, with leads thereof led out to the exterior.

20. A superconducting magnet system according to claim 16, wherein the temperature regulating devices of each group of a pair of the first and second cylinders or a pair of the first and second small cylinders are connected in series, wherein a temperature regulating device for regulating the temperature of the edge-portion is added to each of the cylinders, the edge-portion temperature regulating devices are connected in series collectively, wherein a set of the first disks and/or the further cylinders or the second disks and/or the fourth cylinders provided with temperature regulating devices are connected in series collectively with leads thereof led out therefrom.

21. A superconducting magnet system according to claim 16, wherein all conductors for introducing direct currents to the temperature regulating devices of the cylinders or disks from a magnetization power supply, which is operative to supply a direct current, are stranded together as reciprocating direct current conductors, and wherein two heater lines or leads are provided in parallel or stranded together as conductors provided in a temperature regulating device in such a manner that reciprocating direct currents pass therethrough close to each other.

22. A superconducting magnet system according to claim 21, wherein said temperature regulating devices are divided into group units of temperature regulating devices so as to control currents respectively flowing therethrough, wherein the temperature regulating devices of each group unit are connected in series collectively, and wherein leads thereof are led out therefrom.

23. A superconducting magnet system according to claim 19, 20 or 22, wherein stainless steel wires or high-temperature superconducting wires are used as leads of the temperature regulating devices which are led out therefrom.

24. A superconducting magnet apparatus according to claim 2, further comprising one or more first temperature regulating devices, for heating all of a cylinders located and spaced uniformly in a circumferential direction and along the longitudinal direction of a cylinder, wherein control of a persistent current flowing in the circumferential direction in a cylinder can be achieved by introducing a direct current into the first temperature regulating devices and by controlling the direct current.

25. A superconducting magnet apparatus according to claim 2, wherein disks are provided with temperature regulating devices, which disks are formed of superconducting composite plate materials, wherein one or more first temperature regulating devices for heating all of a disk are disposed radially from the center of the disk at uniform angular intervals along a circumferential direction of the disk, wherein control of a persistent current flowing in the circumferential direction in the disk can be achieved by introducing a direct current into the first temperature regulating devices and by controlling the direct current.

26. A superconducting magnet apparatus according to claim 24, wherein a cylinder with a first temperature regulating device is provided with one or more second temperature regulating devices for heating a limited part of an edge portion of the cylinder, which second regulating devices are placed and spaced uniformly in a circumferential direction and along a longitudinal direction of an edge portion of the cylinder, and wherein control of a persistent current flowing in the circumferential direction in the edge portion of the cylinder can be achieved by introducing a direct current into the second temperature regulating devices and by controlling the direct current.

27. A superconducting magnet apparatus according to claim 26, wherein a cylinder with temperature regulating devices is divided in the longitudinal direction into two or three parts and is composed of a main body portion and one or two edge portions, in which second temperature regulating devices for heating an edge-portion are disposed at said edge-portions, and wherein a first temperature regulating device for heating the entirety of the of the cylinder is disposed in the area of the main body portion and one or more edge portions.

28. A superconducting magnet apparatus according to claim 24 or 25, having a temperature regulating device for heating a cylinder or a disk formed of a superconducting composite plate material, and wherein the temperature regulating device comprises a pair of electrically insulated heaters operating as a heater portion, and having a length of the heater portion corresponding to the size of a part, the temperature of which is to be regulated, of the cylinder or the disk, with leads being connected with both ends of the heater portion, the heater portion being stored in a protecting tube made of a high heat-conductivity material, and being fixed thereon with a high-heat-conductivity synthetic resin.

29. A superconducting magnet apparatus according to claim 28, wherein the two heaters of said temperature regulating device are shaped like flat plates and the protecting tube is in a flat shape.

30. A superconducting magnet apparatus according to claim 28, wherein said temperature regulating device has a lead in the middle portion between the two heaters, and only necessary areas of both edge portions operate as heaters.

31. A superconducting magnet apparatus according to claim 2, wherein said superconducting composite elements comprise cylinders with temperature regulating devices, which cylinders are formed of superconducting composite plate materials with the temperature regulating device, which is recited in one of claims 28 to 30, being embedded between the superconducting composite plate materials.

32. A superconducting magnet apparatus according to claim 2, wherein said superconducting elements comprise disks with temperature regulating devices, which disks are formed of superconducting composite plate materials with the temperature regulating device, which is recited in one of claims 28 to 30, being embedded between the superconducting composite plate materials.

33. A superconducting magnet apparatus according to claim 2, wherein said superconducting elements comprise cylinders or disks with temperature regulating devices fixed therein with a high-heat-conductivity synthetic resin.

34. A superconducting magnet apparatus according to claim 2, wherein said superconducting elements comprise a cylinder formed of a plurality of cylinders of superconducting composite plate materials that are integral with one another, with an inner circumferential surface of the cylinder being electrically insulated, and further having an inner cylinder made of copper or aluminum inserted into said cylinder so as to closely adhere to and be integral with said cylinder.

35. A superconducting magnet apparatus according to claim 34, wherein a cylinder made of stainless steel or copper or aluminum is fitted to an outer circumferential surface of said cylinder, thereby protecting said cylinder from an electromagnetic force caused owing to the strength of the magnetic field which is generated by the induction-magnetizing.

36. A superconducting magnet apparatus according to claim 34 or 35, wherein said cylinder is divided into a plurality of layer-cylinders in the direction of thickness of said cylinder, wherein a temperature regulating device is embedded into each layer-cylinder, wherein a spacer made of copper or aluminum is inserted into a space between each pair of adjacent layer-cylinders, comprising a temperature-regulating-device embedded portion, so as to closely adhere to a pair of adjacent layer-cylinders, wherein an air gap, into which the spacer is not inserted, of the temperature-regulating-device embedded portion, is filled with a low-heat-conductivity synthetic resin.

37. A superconducting magnet apparatus according to claim 2, wherein said superconducting elements comprise a plurality of cylinders formed of superconducting composite plate materials are stacked with a circumferential position of each of the cylinders being changed by a predetermined angle from that of adjacent cylinders, thereby reducing nonuniformity of characteristics at the working of the superconducting plate materials.

38. A superconducting magnet apparatus according to claim 2, wherein said superconducting elements comprise a plurality of disks formed of superconducting composite plate materials are stacked with a circumferential position of each of the disks being changed by a predetermined angle from that of adjacent cylinders or disks, thereby reducing nonuniformity of characteristics at the working of the superconducting plate materials.

39. A superconducting magnet apparatus according to claim 37, further comprising a cylinder supporting base for supporting cylinders formed of superconducting composite plate materials, wherein portions of the cylinder supporting base, which extends from the center thereof to both edge parts in the longitudinal direction thereof, are machined to form steps like staircases, wherein an outside diameter of each of the steps of the staircase-like portions decreases with the distance from the center thereof, wherein a surface portion of each of the steps, which is orthogonal to the center axis thereof, is electrically insulated, wherein a surface portion of each of the steps, which is parallel to the center axis thereof, is machined and has said cylinder is fitted thereto.

40. The superconducting magnet apparatus according to claim 39, wherein said cylinder supporting base is provided with passages for passing leads of temperature regulating devices in the electrically-insulated surface part of each step of the staircase-like portions.

41. A superconducting magnet apparatus according to claim 39 or 40, wherein said cylinder supporting base is divided into two left-side and right-side portions on a center line extending in the longitudinal direction thereof, and thereafter two division elements are joined together on said center line so as to be integral with each other.

42. A superconducting magnet apparatus according to claim 41, wherein the material of said cylinder supporting base is a metal, or an alloy or a composite material, which has a coefficient of thermal expansion nearly equal to that of thermal expansion of a cylinder.

43. A superconducting magnet apparatus according to claim 42, wherein cylinders formed of superconducting composite materials and which have temperature regulating devices, are fitted into the staircase-like portions of said cylinder supporting base.

44. A superconducting magnet apparatus according to claim 2, wherein a magnetization power supply is provided for performing magnetization of the static-magnetic-field generating means by induction-magnetizing, which magnetization power supply comprises: a first magnetizing current output circuit for supplying a magnetizing electric current to an externally placed magnetizing coil; a second magnetizing current output circuit for supplying a magnetizing electric current to a magnetizing auxiliary coil incorporated in a main unit thereof; two sets of first temperature controlling current output circuits for supplying heating currents to two sets of first temperature regulating devices connected in series, for the first group of cylinders for static magnetic field generating means divided into left-side and right-side groups or sets; a second temperature controlling current output circuit for supplying heating currents to one set of second temperature regulating devices by collectively connecting edge-portion temperature regulating devices in series at edge portions of said first group of cylinders for regulating temperatures of the edge portions thereof; and a third temperature controlling current output circuit for supplying heating currents to a set of third temperature regulating devices connected in series, which are added to cylinders placed between the static magnetic field generating means and the uniform magnetic field region so as to compensate the magnetic field distribution in the uniform magnetic field region.

45. A superconducting magnet apparatus according to claim 44, wherein said magnetization power supply comprises: a setting circuit for setting control values through a digital-to-analog conversion circuit for supplying electric currents to current output circuits, respectively, and for performing digital-to-analog conversion to control the electric currents, and through an AND circuit for computing logical products between signals indicating initiation and completion of control operations; a computer circuit for supervising overall operations of setting said control values and of controlling said currents; an output circuit for said computer circuit, which is used for connecting said computer circuit, said setting circuit, said AND circuit and a display circuit for displaying an indication representing conditions of a main unit thereof as a warning indication and a guide indication; an input circuit for inputting measured values of a magnetic field in a main unit thereof to a computer; another input circuit for inputting operation information on the magnetization power supply thereto; a computer configuration control circuit; a storage circuit for storing software to be used to perform a magnetization regulating operation; and a power supply circuit for supplying power to these circuits.

46. A superconducting magnet apparatus according to claim 2, further comprising a magnetic-field-strength measuring device for measuring the strength of a magnetic field at a controlled point in said uniform magnetic field region, an externally placed magnetizing coil inserted in the uniform magnetic field region when magnetizing the static-magnetic-field generating means, so that, during magnetization, the strength of the magnetic field in said uniform magnetic field region can be measured.

47. A superconducting magnet apparatus according to claim 46, wherein the total length of said externally placed magnetizing coil, which is used when magnetizing said static magnetic field generating means, is set as being equal to or less than the total length of a cylinder of the static magnetic field generating means, whereby, when magnetizing both edge portions in the longitudinal direction of a cylinder of the static magnetic field generating means, an electric current, which flows therethrough in the circumferential direction, is restrained from having an extremely high density.

48. A superconducting magnet apparatus according to claim 47, further comprising emergent-demagnetization temperature regulating devices for the first group of cylinders of said static-magnetic-field generating means, wherein the emergent-demagnetization temperature regulating devices perform a demagnetizing operation in the case of an emergency of a main unit thereof which is connected to said emergent-demagnetization temperature regulating devices, and wherein, when it is necessary to eliminate the magnetic field, an electric current needed for demagnetization of the main unit thereof is supplied from the emergent demagnetization device to the emergent-demagnetization temperature regulating devices.

49. A superconducting magnet apparatus according to claim 48, wherein said emergent demagnetization device comprises: a constant current output circuit for supplying an electric current, which is necessary for controlling the temperature of the first group of cylinders to a load that includes a resistor obtained by connecting the emergent demagnetization temperature regulating devices, which are provided in series to the first group of cylinders of the static magnetic field generating means provided in the main unit thereof; a battery having a capacity by which an electric current for achieving demagnetization in a time period of 1 to 2 minutes, is supplied to a constant current output circuit; a direct current power supply and a charging circuit provided to charge the battery at all times; and a pushbutton switch having an off delay timer function corresponding to a delay time of about 1 minute, wherein an electric current can be introduced from the battery to the constant current output circuit by turning on the pushbutton switch.

50. A superconducting magnet apparatus according to claim 48, wherein a maximum energizing current value and a maximum current capacity of a control current for the temperature regulating device for magnetization of the first group of cylinders of the static-magnetic-field generating means, are selected as capacitance values within ranges, in which the temperature regulating devices for regulating magnetization are able to withstand a current needed for emergent-demagnetization during an energizing time of about 1 minute, and a change in the value of resistance of a temperature regulating device does not hinder use of the temperature regulating device even after an emergent-demagnetizing operation, wherein the temperature regulating device is adapted to also act as an emergent-demagnetization temperature regulating device.

51. A method of regulating magnetization of a superconducting-magnet apparatus having: a cooling container for cooling contents thereof so that the contents are brought in a superconducting state; static-magnetic-field generating means disposed in said cooling container and including one or more elements having a superconducting composite structure serving as a holding medium for holding an electric current therein, for generating a magnetic flux in a predetermined uniform magnetic field region along a central axis thereof; and holding means for holding said static-magnetic-field generating means in said cooling container; wherein said superconducting composite elements are provided with a temperature regulating device in the vicinity thereof for heating the superconducting composite elements to control the temperature thereof, said method comprising the steps of: magnetizing said static-magnetic-field generating means by performing induction-magnetizing; and thereafter controlling the temperature of said superconducting composite elements by controlling said temperature regulating device so as to adjust a magnetization value of said static-magnetic-field generating means.

52. A method of regulating magnetization of a superconducting magnet apparatus according to claim 3, wherein preliminary induction magnetizing is performed preliminarily, and then, a magnetic field setting value for the induction magnetizing is changed to a changed setting value according to a result of the magnetization, and subsequently, final induction magnetizing is performed according to the changed setting value, wherein, the regulation of the magnetization after the induction magnetizing is omitted.

53. A method of regulating magnetization of a superconducting magnet apparatus, according to claim 52, wherein a magnetic-field setting value for an initial induction magnetizing is set at a value which is higher than a desired magnetization value, wherein, after the magnetization, the superconducting composite elements are heated in accordance with temperature-critical-current-density characteristics, and wherein, moreover, by regulating the heating temperature, the magnetization value is lowered, so that a desired magnetization value is obtained.

54. A method of regulating magnetization of a superconducting magnet apparatus as defined in claim 3, wherein an externally placed magnetizing coil is incorporated into the superconducting magnet apparatus, the method of regulating magnetization of the superconducting magnet apparatus comprises the steps of: mounting the externally placed magnetizing coil on the superconducting magnet apparatus so as to be concentric with the uniform magnetic field region therein, connecting the external magnetizing coil with a magnetization power supply, magnetizing first and second cylinders, the fourth and fifth groups of cylinders or the seventh and by first magnetizing the second cylinders collectively, and then, inverting the polarity of the externally placed magnetizing coil whereby the first cylinders are magnetized collectively, wherein magnetization is performed so that margin regions, in which persistent currents flow, are provided concentratedly at the inside-diameter-side of the cylinders.

55. A method of regulating magnetization of a superconducting magnet apparatus, according to claim 54, wherein, when said first and second cylinders, are magnetized, the magnetization is performed on the cylinders in increasing order of diameter, so as to have a required strength of the magnetic field at a predetermined position thereof.

56. A method of regulating magnetization of a superconducting magnet apparatus, according to claim 55, wherein, when the second cylinders are magnetized, the magnetization is performed thereon in such a manner that the magnetization polarity of the second cylinders is opposite to the magnetization polarity of the first cylinders.

57. A method of regulating magnetization of a superconducting magnet apparatus, according to claim 55 or 56, wherein, when the first cylinders are magnetized, the magnetization is performed in increasing order of diameter in a manner that the magnetization polarity of some of the first cylinders is opposite to the magnetization polarity of the other cylinder.

58. A method of regulating magnetization of a superconducting magnet apparatus, according to claim 55, wherein each of the cylinders is divided in the direction of thickness thereof into a plurality of layers, wherein the temperature regulating device is added to each of the plurality of layers obtained such the division, wherein, when the cylinders are magnetized, the layers are regarded as individual cylinders, wherein, moreover, the magnetization is performed thereon in increasing order of diameter, and wherein, each of the layers of the cylinders is magnetized independently in such a manner as to have a required strength of the magnetic field at a predetermined position thereof.

59. A method of regulating magnetization of a superconducting magnet apparatus, according to claim 54, wherein the externally placed magnetizing coil operates as a coil for the magnetization of the first cylinders, wherein, further, a magnetizing auxiliary coil incorporated in the superconducting magnet apparatus operates as a coil for the magnetization of the second cylinders, and wherein the magnetization is performed by setting the magnetization polarity of the magnetizing auxiliary coil so as to be being opposite to the magnetization polarity of the externally placed magnetizing coil and by simultaneously controlling both the magnetizing auxiliary coil and the externally placed magnetizing coil.

60. A method of regulating magnetization of a superconducting magnet apparatus, according to claim 54, wherein each of the first and second cylinders is divided in the direction of thickness thereof into two cylinders, wherein a temperature regulating device is added to each of the cylinders, wherein, first, between the two cylinders, the cylinder having a larger diameter is magnetized by the magnetizing coil in such a way as to have a magnetization value which is $(1/n)$ of the final magnetization value, wherein, subsequently, the cylinder of a smaller diameter is magnetized by a magnetizing magnetic field obtained by adding the magnetizing magnetic field which is caused by the magnetizing coil and has a magnetization value equal to $(1/n)$ of the final magnetization value, to the magnetizing magnetic field, which is caused by the cylinder of a large diameter having a magnetization value equal to $(1/n)$ of the final magnetization value, in such a manner as to have a magnetization value which is $(2/n)$ of the final magnetization value, wherein thus, the cylinder is magnetized in such a way as to have a magnetization value which is $(2/n)$ of the final magnetization value, wherein this operation is repeated sequentially n times, and wherein, each of the cylinders is magnetized by using the magnetizing coil to a magnetization value which is $(1/n)$ of the final magnetization value, in such a manner as to obtain a final magnetization value.

61. A method of regulating magnetization of a superconducting magnet apparatus recited in claim 14, wherein magnetizing auxiliary coils are incorporated in the first and second small cylinders, and wherein, furthermore, the magnetization of the apparatus is performed by superimposing the strength of a magnetizing magnetic field, which is caused by a magnetizing auxiliary coil, on the strength of a magnetizing magnetic field which is caused by an externally placed magnetizing coil.

62. A method of regulating magnetization of a superconducting magnet apparatus recited in claim 5, wherein the temperature of the cylinders or disks of the first and second cylinders and said further cylinder is raised by the temperature regulating devices before the magnetization thereof, wherein the state thereof is changed from the superconducting state into the normal conducting state, and wherein, thereafter, an initializing step of eliminating a past residual magnetic field is performed by stopping the heating thereof and by then performing cooling so as to change the state thereof into the superconducting state again.

63. A method of regulating magnetization of a superconducting magnet apparatus according to claim 62, wherein the magnetization is controlled so that the cylinders or disks are held in a state exhibiting normal conducting characteristics from an initializing step to completion of regulation of magnetization, and after completion of regulation of magnetization, the cylinders or disks are returned to a state exhibiting superconducting characteristics.

64. A method of regulating magnetization of a superconducting magnet apparatus, according to claim 62 or 63, wherein a step of imparting a desired magnetization value to the cylinders is performed by carrying out a control operation of gradually lowering an exciting current for the magnetizing coil to zero upon completion of a control operation of raising an exciting current for the magnetizing coil and making the strength of the magnetizing magnetic field reach a desired value and thereafter holding this state and stopping the heating by means of the temperature regulating devices to thereby cool the cylinders and change the state thereof from the normal conducting state to the superconducting state, in addition to a control operation of raising the temperature of the cylinders and disks and changing the state thereof from the superconducting state to the normal conducting state by using the temperature regulating devices after performing an initializing step.

65. A method of regulating magnetization of a superconducting magnet apparatus according to claim 64, wherein an operation of controlling the temperature of the cylinders and disks by means of the temperature regulating devices is performed according to a setting value by which the cylinders and disks are held in a normal conducting state at a temperature close to a temperature in a superconducting state, thereby minimizing a consumed amount of freezing mixture and cooling energy.

66. A method of regulating magnetization of a superconducting magnet apparatus according to claim 64, wherein a controlled amount of exciting electric current for a magnetizing coil per unit of time is less than an allowable value based on characteristics of the superconducting composite plate of which the cylinders are formed and is set in a range in which a magnetization regulating time is minimized, thereby minimizing an amount of freezing mixture and cooling energy.

67. A method of regulating magnetization of a superconducting magnet apparatus according to claims 55, 56, 60 or 61, wherein a magnetization value of each cylinder is controlled individually by performing an initializing step of raising the temperature of each of the cylinders, which are to be magnetized, by operating the temperature regulating device before magnetization is performed, thus changing the state thereof from a superconducting state to a normal conducting state, and thereafter stopping the raising of the temperature and performing cooling to thereby return the state thereof to a superconducting state; and a magnetizing step of changing the state of the cylinder by operating the temperature regulating device from a superconducting state to the normal conducting state and increasing an exciting electric current for the magnetizing coil to thereby obtain a desired strength of a magnetic field, and subsequently holding this state and cooling the cylinder by causing the temperature regulating device to stop heating the cylinder, and then returning the state of the cylinder from a normal conducting state to a superconducting state again, and thereafter decreasing an exciting current for the magnetizing coil gradually to thereby impart a desired magnetization value to the cylinder; and repeatedly performing a process consisting of the initializing step and the magnetizing step on the cylinders, thereby controlling the magnetization value of each of the cylinders individually.

68. A method of regulating magnetization of a superconducting magnet apparatus according to claim 64, further comprising in the case of a magnetization regulating process in which an extremely high density current occurs in edge portions of the cylinders and disks composing the first and second cylinders, a step of reducing the extremely high density current by performing a temperature-controlling of only edge portions of the cylinders by using the temperature regulating devices for regulating the edge portions after the magnetizing step is performed.

69. A method of regulating magnetization of a superconducting magnet apparatus according to claim 68, wherein a temperature-controlling of only auxiliary cylinders is enabled by forming each of the cylinders in such a manner as to have a cylindrical central portion and auxiliary cylinders respectively provided at both ends thereof, and by adding temperature regulating devices for regulating the edge portions to said auxiliary cylinders, respectively.

70. A method of regulating magnetization of a superconducting magnet apparatus according to one of claim 69, wherein, upon completion of the magnetizing step or the edge-portion regulating step, in the case that a difference between the magnetization values of left-side and right-side magnetic fields, which are caused by the first and second cylinders arranged in the longitudinal direction of the superconducting magnet apparatus on the left-side and the right-side of the center line in the longitudinal direction thereof, is beyond a predetermined range, there is further performed a step of raising the temperature of the temperature regulating devices added to the cylinders on one side which generate a magnetic field causing a higher magnetization value, to thereby heat the cylinders and lower the magnetization value thereof in such a manner as to balance the magnetization value thereof with the magnetization value of the cylinders on the other side.

71. A method of regulating magnetization of a superconducting magnet apparatus according to claim 70, wherein, upon completion of the magnetizing step, or the edge-portion regulating step or the balance regulating step, there is performed a step of obtaining a predetermined magnetization value due to a magnetic field by raising the temperature of the entirety of each of the cylinders and disks composing the first and second cylinders, fifth groups of cylinders, or the seventh and eighth groups of by means of the temperature regulating device added thereto, and regulating the temperature thereof.

72. A method of regulating magnetization of a superconducting magnet apparatus according to claim 71, wherein, an upper limit value of a range of setting temperatures of the cylinders or the edge portions of the cylinders is set at a minimum value in a range thereof by which the cylinders do not lose superconducting properties, thereby preventing the magnetizing magnetic field from being eliminated when regulating magnetization.

73. A method of regulating magnetization of a superconducting magnet apparatus recited in claim 19, which is performed by combining an externally placed magnetizing coil and a magnetizing auxiliary coil with the magnetization power supply, and performing an operation process which consists of a magnetizing step I, an edge-portion regulating step II, a balance regulating step III, an overall regulation process IV and a magnetic-field distribution fixing step V, wherein, in the magnetizing step I, the temperature regulating devices for the groups of cylinders and the groups of disks of the superconducting magnet apparatus, a magnetic-field measuring instrument and the magnetizing coils are connected with a magnetizing power supply, wherein, then, the power supply of the magnetizing power supply is turned on, wherein, subsequently, after a lapse of a time period of a predetermined length, the regulation of magnetization is initiated, wherein, moreover, current output values of the magnetizing coils and the temperature regulating devices, other than the edge-portion temperature regulating devices, are set at previously set values, respectively, wherein, currents flowing through the temperature regulating devices except for the edge-portion temperature regulating devices are controlled so that the temperature of each of the cylinders and the disks of the superconducting magnet apparatus is raised and the states thereof are changed from a superconducting state to a normal conducting state, wherein, thereafter, a previously set magnetization value is set after a lapse of a predetermined time, wherein, then, a direct current is introduced to each of the magnetizing coils and is gradually increased, wherein, after the direct current reaches a predetermined value, electric currents respectively flowing in the temperature regulating devices, other than the edge-portion temperature regulating devices, are controlled in such a way as to be decreased gradually to zero, wherein thus, the properties of the cylinders and the disks are returned from the normal conducting state to the superconducting state, wherein, then, the direct currents flowing through the magnetizing coils are controlled in such a manner as to be decreased gradually to zero, wherein, thus, a persistent current is generated in the circumferential direction of the cylinders and the disks and is held therein, wherein, thus, the uniform magnetic field region is magnetized to a strength which is not less than a desired value, wherein, thereafter, the strength of a magnetic field is measured at a controlled point in the uniform magnetic field region, wherein, then, it is judged in the magnetizing power supply whether or not the measured strength of the magnetic field reaches a predetermined value, wherein, if a result of this judgement shows that the measured strength has not reached said predetermined value, the magnetization value is set again, and then the magnetization is repeated, wherein, when it has reached said predetermined value, the operation proceeds to the next step, wherein, in the edge-portion regulating step II, first, it is determined in each superconducting magnet apparatus whether or not the regulation of the edge portions is necessary, wherein if regulation is not necessary, it is determined that the regulation of the edge portions is unnecessary, wherein if regulation is necessary, the value of a direct current which is to flow through the edge-portion temperature regulating device is set, wherein, then, the edge potions of the cylinder are heated by causing the electric current, which has the set value, to flow through the edge-portion temperature regulating device, wherein, thus, a persistent current flowing through the edge portions is regulated, wherein, in the balance regulating step III, it is first judged from a value which is measured at a controlled point in the uniform magnetic field region and is previously fetched, whether or not a balance between magnetization values respectively corresponding to the left-side and right-side groups of the two facing groups of cylinders is achieved, wherein, then, it is determined whether or not balance regulation is necessary, wherein if balance regulation is unnecessary, it is determined that the balance regulation is unnecessary, wherein if balance regulation is necessary, the value of a direct current to flow through the temperature regulating device of the group or set of cylinders or disks having a higher magnetic-field strength is computed from measured values of magnetic field strength and a computed value is set, wherein, then, electric currents which are caused to flow through the temperature regulating devices are controlled, so that persistent currents flowing through the cylinders and disks are regulated, wherein, in the overall regulation step IV, first, a target value, to which a magnetization value is to be reduced, is set, wherein, then, the difference between the set value and a present magnetization value is computed, wherein direct currents to be made to flow through the temperature regulating devices of the cylinder and disks are set according to a result of computation, wherein, further, the electric currents flowing through the temperature regulating devices are controlled, wherein, persistent currents flowing through the cylinders and the disks are controlled, wherein, as a result, the magnetization value is changed, wherein, thereafter, the magnetization value is measured, wherein, further, it is checked whether or not a value measured after a change reaches a predetermined value, wherein if said predetermined value is not reached, the same step is performed repeatedly, wherein, in contrast, if said predetermined value is reached, the operation proceeds to the next step, and wherein, in the magnetic-field-distribution fixation step V, the electric currents flowing through the temperature regulating devices of the cylinders and the disks for compensating magnetic field distribution are stopped, wherein, moreover, heating of the cylinders and the disks for compensating said magnetic field distribution is stopped, and wherein, instead, a state of the cylinders and the disks for compensating magnetic field distribution are returned from a normal conducting state to a superconducting state by performing cooling thereof.

74. A method of regulating magnetization of a superconducting magnet apparatus according to claim 73, wherein, when setting each electric current value, limit values are determined corresponding to all of the set values, respectively, and wherein, further, this method further comprises a step of checking whether or not a set value corresponding to each electric current exceeds said limit value.

75. A method of regulating magnetization of a superconducting magnet apparatus according to claim 73, wherein set values of a control direct electric current for each temperature regulating device and a direct electric current for the magnetizing coil are divided by n, and wherein, further, when performing a control operation of controlling the electric currents, a control operation is carried out by repeatedly performing a procedure of increasing each of the electric currents by (1/n) of the corresponding set value thereof at appropriate time intervals until reaching a corresponding set value.

76. A method of regulating magnetization of a superconducting magnet apparatus, according to claim 51, wherein the controlling of the temperature of said superconducting composite elements by controlling said temperature regulating device includes controlling a current flowing through said temperature regulating device, thereby adjusting an induced magnetization value of said static-magnetic field generating means in such a manner as to be within a desired range.

* * * * *